US012745560B2

(12) United States Patent
Han et al.

(10) Patent No.: US 12,745,560 B2
(45) Date of Patent: Sep. 22, 2026

(54) ORGANIC LIGHT EMITTING DEVICE

(71) Applicant: LG CHEM, LTD., Seoul (KR)

(72) Inventors: Su Jin Han, Daejeon (KR); Dong Hoon Lee, Daejeon (KR); Sang Duk Suh, Daejeon (KR); Min Woo Jung, Daejeon (KR); Jungha Lee, Daejeon (KR); Seulchan Park, Daejeon (KR); Sunghyun Hwang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 926 days.

(21) Appl. No.: 17/926,721

(22) PCT Filed: Aug. 4, 2021

(86) PCT No.: PCT/KR2021/010267

§ 371 (c)(1),
(2) Date: Nov. 21, 2022

(87) PCT Pub. No.: WO2022/031033

PCT Pub. Date: Feb. 10, 2022

(65) Prior Publication Data

US 2023/0240140 A1 Jul. 27, 2023

(30) Foreign Application Priority Data

Aug. 4, 2020 (KR) ........................ 10-2020-0097618
Aug. 3, 2021 (KR) ........................ 10-2021-0102171

(51) Int. Cl.
*H10K 85/60* (2023.01)
*H10K 50/11* (2023.01)

(52) U.S. Cl.
CPC ....... *H10K 85/654* (2023.02); *H10K 85/6572* (2023.02); *H10K 85/6574* (2023.02); *H10K 50/11* (2023.02)

(58) Field of Classification Search
CPC ............. H10K 85/654; H10K 85/6572; H10K 2101/90; H10K 85/657
See application file for complete search history.

(56) References Cited

U.S. PATENT DOCUMENTS

2004/0251816 A1 12/2004 Leo et al.
2012/0126221 A1 5/2012 Kitamura et al.
(Continued)

FOREIGN PATENT DOCUMENTS

CN 107075360 A 8/2017
CN 108336239 A 7/2018
(Continued)

OTHER PUBLICATIONS

Machine Translation of KR20200083171A (Year: 2020).*

*Primary Examiner* — Jenna N Chandhok
(74) *Attorney, Agent, or Firm* — Bryan Cave Leighton Paisner LLP

(57) ABSTRACT

Provided is an organic light emitting device comprising: an anode; a cathode; and a light-emitting layer disposed between the anode and the cathode, wherein the light-emitting layer comprises a compound of the following Chemical Formula 1, a compound of the following Chemical Formula 2, and a compound of the following Chemical Formula 3;

[Chemical Formula 1]

(Continued)

-continued

[Chemical Formula 2]

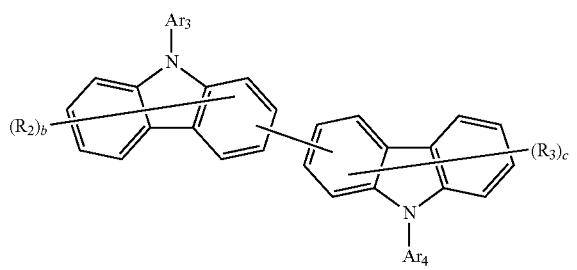

[Chemical Formula 3]

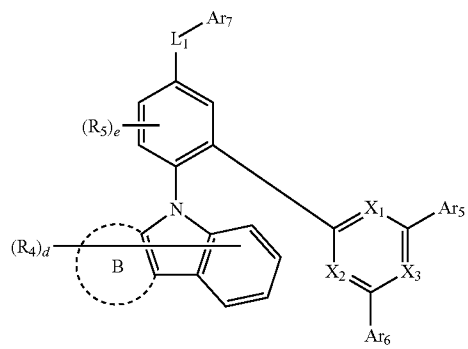

as defined in the specification.

18 Claims, 2 Drawing Sheets

(56) References Cited

U.S. PATENT DOCUMENTS

| | | | | |
|---|---|---|---|---|
| 2016/0118590 | A1 | 4/2016 | Ito et al. | |
| 2017/0098778 | A1 | 4/2017 | Oh et al. | |
| 2017/0117486 | A1 | 4/2017 | Cho et al. | |
| 2017/0309829 | A1 | 10/2017 | Jung et al. | |
| 2020/0212314 | A1 | 7/2020 | Numata et al. | |
| 2022/0006022 | A1 | 1/2022 | Suh et al. | |
| 2022/0271233 | A1 | 8/2022 | Yoon et al. | |
| 2022/0376188 | A1 * | 11/2022 | Choi .................... | C07D 209/86 |

FOREIGN PATENT DOCUMENTS

| | | | | |
|---|---|---|---|---|
| CN | 110741064 | A | 1/2020 | |
| EP | 3428164 | A1 | 1/2019 | |
| JP | 4590020 | | 12/2010 | |
| KR | 10-2000-0051826 | | 8/2000 | |
| KR | 10-2017-0001398 | A | 1/2017 | |
| KR | 10-2017-0049714 | | 5/2017 | |
| KR | 10-1926771 | | 12/2018 | |
| KR | 10-1948709 | | 2/2019 | |
| KR | 10-2054806 | | 12/2019 | |
| KR | 10-2020-0047418 | | 5/2020 | |
| KR | 10-2020-0083171 | | 7/2020 | |
| KR | 20200083171 | A * | 7/2020 | ......... H10K 85/6574 |
| WO | 2003-012890 | A2 | 2/2003 | |
| WO | 2020-032424 | | 2/2020 | |
| WO | 2020-085842 | A1 | 4/2020 | |

* cited by examiner

[FIG. 1]
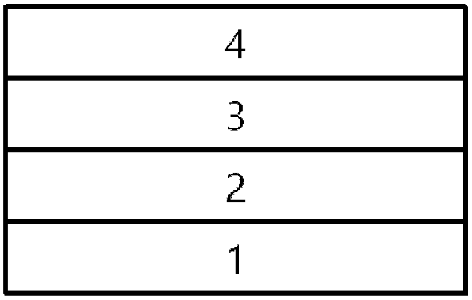
[FIG. 2]
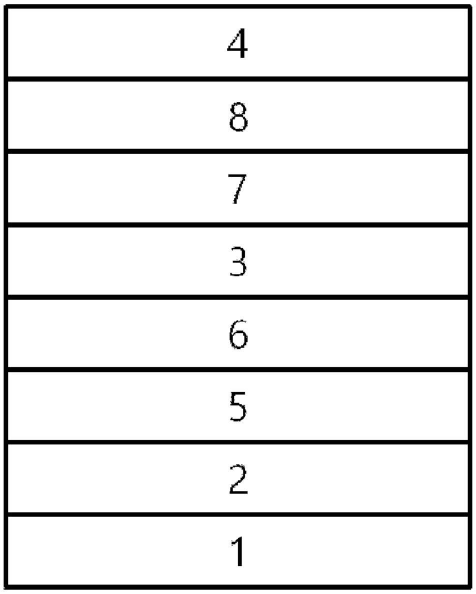

[FIG. 3]
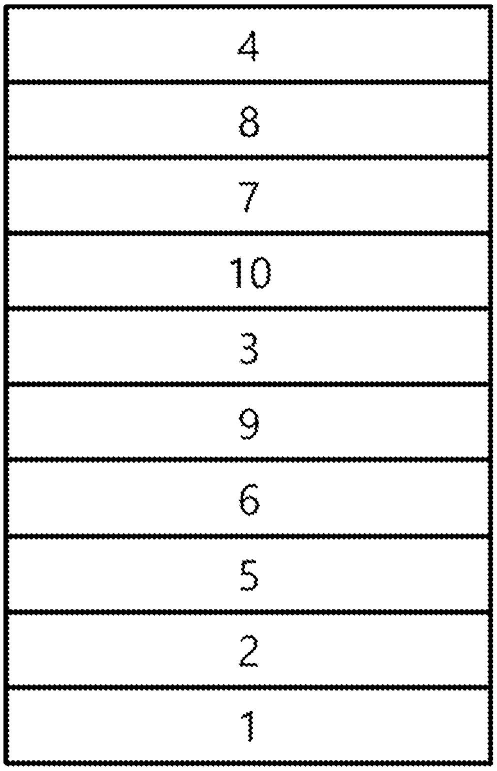

ORGANIC LIGHT EMITTING DEVICE

CROSS-REFERENCE TO RELATED APPLICATION(S)

This application is a National Stage Application of International Application No. PCT/KR2021/010267 filed on Aug. 4, 2021, which claims the benefit of Korean Patent Application No. 10-2020-0097618 filed on Aug. 4, 2020 and Korean Patent Application No. 10-2021-0102171 filed on Aug. 3, 2021 in the Korean Intellectual Property Office, the disclosures of which are incorporated herein by reference in their entirety.

TECHNICAL FIELD

The present disclosure relates to an organic light emitting device.

BACKGROUND

In general, an organic light emitting phenomenon refers to a phenomenon where electric energy is converted into light energy by using an organic material. The organic light emitting device using the organic light emitting phenomenon has characteristics such as a wide viewing angle, an excellent contrast, a fast response time, an excellent luminance, driving voltage and response speed, and thus many studies have proceeded.

The organic light emitting device generally has a structure which comprises an anode, a cathode, and an organic material layer interposed between the anode and the cathode. The organic material layer frequently has a multilayered structure that comprises different materials in order to enhance efficiency and stability of the organic light emitting device, and for example, the organic material layer can be formed of a hole injection layer, a hole transport layer, a light emitting layer, an electron transport layer, an electron injection layer and the like. In the structure of the organic light emitting device, if a voltage is applied between two electrodes, the holes are injected from an anode into the organic material layer and the electrons are injected from the cathode into the organic material layer, and when the injected holes and electrons meet each other, an exciton is formed, and light is emitted when the exciton falls to a ground state again.

There is a continuous need to develop new materials for organic materials used in the organic light emitting device as described above.

Prior Art Literature

Patent Literature (Patent Literature 1) Korean Unexamined Patent Publication No. 10-2000-0051826

BRIEF DESCRIPTION

Technical Problem

The present disclosure relates to an organic light emitting device having improved driving voltage, efficiency and lifetime.

Technical Solution

In order to achieve the above object, the present disclosure provides the following organic light emitting device:

An organic light emitting device comprising:

an anode, a cathode, and a light emitting layer between the anode and the cathode, wherein the light emitting layer comprises a compound of the following Chemical Formula 1, a compound of the following Chemical Formula 2, and a compound of the following Chemical Formula 3:

[Chemical Formula 1]

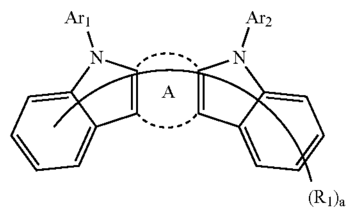

wherein in Chemical Formula 1:

A is a benzene ring fused with two adjacent pentagonal rings;

$Ar_1$ and $Ar_2$ are each independently a substituted or unsubstituted $C_{6-60}$ aryl or a substituted or unsubstituted $C_{2-60}$ heteroaryl containing any one or more heteroatoms selected from the group consisting of N, O and S;

$R_1$ is hydrogen, deuterium, a substituted or unsubstituted $C_{1-60}$ alkyl, a substituted or unsubstituted $C_{6-60}$ aryl, or a substituted or unsubstituted $C_{2-60}$ heteroaryl containing any one or more heteroatoms selected from the group consisting of N, O and S; and a is an integer of 0 to 10;

[Chemical Formula 2]

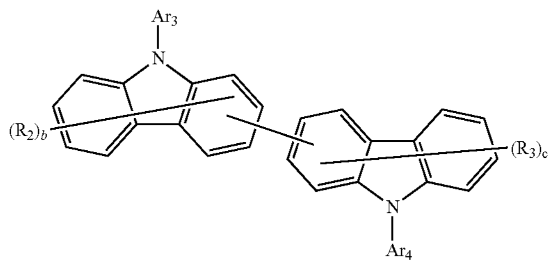

wherein in Chemical Formula 2:

$Ar_3$ and $Ar_4$ are each independently a substituted or unsubstituted $C_{6-60}$ aryl or a substituted or unsubstituted $C_{2-60}$ heteroaryl containing any one or more heteroatoms selected from the group consisting of N, O and S;

$R_2$ and $R_3$ are each independently hydrogen, deuterium, a substituted or unsubstituted $C_{1-60}$ alkyl, a substituted or unsubstituted $C_{6-60}$ aryl, or a substituted or unsubstituted $C_{2-60}$ heteroaryl containing any one or more heteroatoms selected from the group consisting of N, O and S; and b and c are each independently an integer of 0 to 7;

[Chemical Formula 3]

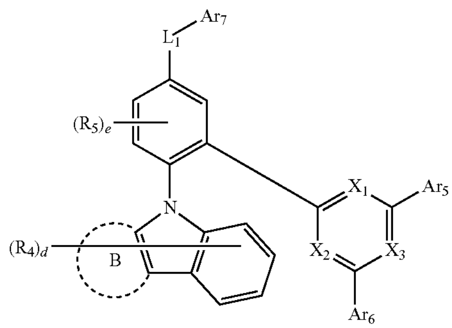

wherein in Chemical Formula 3:

B is a substituted or unsubstituted $C_{6-60}$ aromatic ring fused with an adjacent pentagonal ring, or a substituted or unsubstituted $C_{2-60}$ heteroaromatic ring fused with an adjacent pentagonal ring containing any one or more heteroatoms selected from the group consisting of N, O and S;

$X_1$ to $X_3$ are each independently N or CH, provided that at least one of $X_1$ to $X_3$ is N;

$Ar_5$ and $Ar_6$ are each independently a substituted or unsubstituted $C_{6-60}$ aryl or a substituted or unsubstituted $C_{2-60}$ heteroaryl containing any one or more heteroatoms selected from the group consisting of N, O and S;

$Ar_7$ is a substituted or unsubstituted $C_{6-60}$ aryl or a substituted or unsubstituted $C_{2-60}$ heteroaryl containing any one or more heteroatoms selected from the group consisting of N, O and S;

$L_1$ is a single bond, a substituted or unsubstituted $C_{6-60}$ arylene, or a substituted or unsubstituted $C_{2-60}$ heteroarylene containing any one or more heteroatoms selected from the group consisting of N, O and S;

$R_4$ and $R_5$ are each independently hydrogen, deuterium, a substituted or unsubstituted $C_{1-60}$ alkyl, a substituted or unsubstituted $C_{6-60}$ aryl, or a substituted or unsubstituted $C_{2-60}$ heteroaryl containing any one or more heteroatoms selected from the group consisting of N, O and S;

d is an integer of 0 to 10; and e is an integer of 0 to 3.

Advantageous Effects

The above-mentioned organic light emitting device has excellent driving voltage, efficiency and lifetime.

DESCRIPTION OF THE DRAWINGS

FIG. 1 shows an example of an organic light emitting device comprising a substrate 1, an anode 2, a light emitting layer 3, and a cathode 4.

FIG. 2 shows an example of an organic light emitting device comprising a substrate 1, an anode 2, a hole injection layer 5, a hole transport layer 6, a light emitting layer 3, an electron transport layer 7, an electron injection layer 8, and a cathode 4.

FIG. 3 shows an example of an organic light emitting device comprising a substrate 1, an anode 2, a hole injection layer 5, a hole transport layer 6, an electron blocking layer 9, a light emitting layer 3, a hole blocking layer 10, an electron transport layer 7, an electron injection layer 8, and a cathode 4.

DETAILED DESCRIPTION

Hereinafter, embodiments of the present disclosure will be described in more detail to assist in the understanding of the invention.

As used herein, the notation or means a bond linked to another substituent group.

As used herein, the term "substituted or unsubstituted" means being unsubstituted or substituted with one or more substituents selected from the group consisting of deuterium, a halogen group, a nitrile group, a nitro group, a hydroxy group, a carbonyl group, an ester group, an imide group, an amino group, a phosphine oxide group, an alkoxy group, an aryloxy group, an alkylthioxy group, an arylthioxy group, an alkylsulfoxy group, an arylsulfoxy group, a silyl group, a boron group, an alkyl group, a cycloalkyl group, an alkenyl group, an aryl group, an aralkyl group, an aralkenyl group, an alkylaryl group, an alkylamine group, an aralkylamine group, a heteroarylamine group, an arylamine group, an arylphosphine group, or a heteroaryl containing at least one of N, O and S atoms, or being unsubstituted or substituted with a substituent to which two or more substituents of the above-exemplified substituents are connected. For example, "a substituent in which two or more substituents are connected" can be a biphenyl group. Namely, a biphenyl group can be an aryl group, or it can also be interpreted as a substituent in which two phenyl groups are connected.

In the present disclosure, the carbon number of a carbonyl group is not particularly limited, but is preferably 1 to 40. Specifically, the carbonyl group can be a substituent having the following structural formulas, but is not limited thereto:

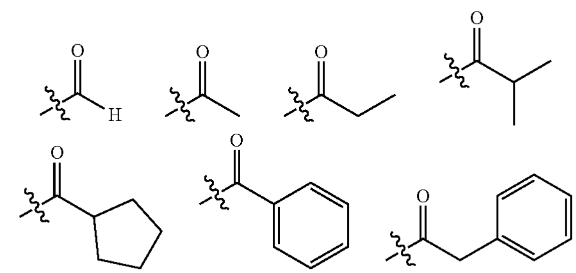

In the present disclosure, an ester group can have a structure in which oxygen of the ester group can be substituted by a straight-chain, branched, or cyclic alkyl group having 1 to 25 carbon atoms, or an aryl group having 6 to 25 carbon atoms. Specifically, the ester group can be a substituent having the following structural formulas, but is not limited thereto:

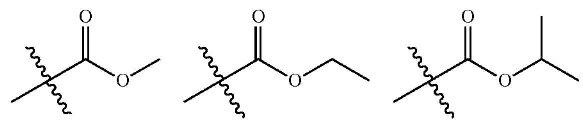

-continued

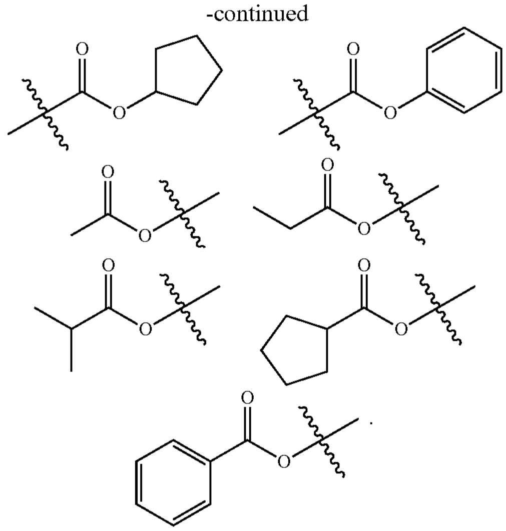

In the present disclosure, the carbon number of an imide group is not particularly limited, but is preferably 1 to 25. Specifically, the imide group can be a substituent having the following structural formulas, but is not limited thereto:

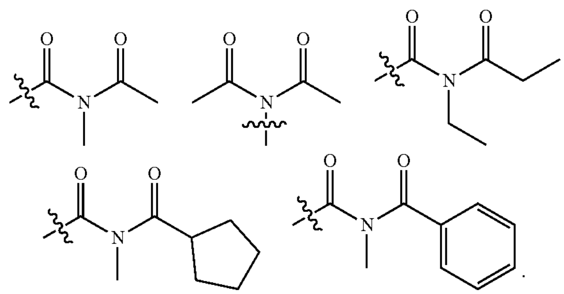

In the present disclosure, a silyl group specifically includes a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group and the like, but is not limited thereto.

In the present disclosure, a boron group specifically includes a trimethylboron group, a triethylboron group, a t-butyldimethylboron group, a triphenylboron group, and a phenylboron group, but is not limited thereto.

In the present disclosure, examples of a halogen group include fluorine, chlorine, bromine, or iodine.

In the present disclosure, the alkyl group can be straight-chain or branched-chain, and the carbon number thereof is not particularly limited, but is preferably 1 to 40. According to one embodiment, the carbon number of the alkyl group is 1 to 20. According to another embodiment, the carbon number of the alkyl group is 1 to 10. According to another embodiment, the carbon number of the alkyl group is 1 to 6. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohectylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methyl-hexyl, and the like, but are not limited thereto.

In the present disclosure, the alkenyl group can be straight-chain or branched-chain, and the carbon number thereof is not particularly limited, but is preferably 2 to 40. According to one embodiment, the carbon number of the alkenyl group is 2 to 20. According to another embodiment, the carbon number of the alkenyl group is 2 to 10. According to still another embodiment, the carbon number of the alkenyl group is 2 to 6. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

In the present disclosure, a cycloalkyl group is not particularly limited, but the carbon number thereof is preferably 3 to 60. According to one embodiment, the carbon number of the cycloalkyl group is 3 to 30. According to another embodiment, the carbon number of the cycloalkyl group is 3 to 20. According to still another embodiment, the carbon number of the cycloalkyl group is 3 to 6. Specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present disclosure, an aryl group is not particularly limited, but the carbon number thereof is preferably 6 to 60, and it can be a monocyclic aryl group or a polycyclic aryl group. According to one embodiment, the carbon number of the aryl group is 6 to 30. According to one embodiment, the carbon number of the aryl group is 6 to 20. The aryl group can be a phenyl group, a biphenyl group, a terphenyl group or the like as the monocyclic aryl group, but is not limited thereto. The polycyclic aryl group includes a naphthyl group, an anthracenyl group, a phenanthryl group, a pyrenyl group, a perylenyl group, a chrysenyl group, a fluorenyl group, and the like, but is not limited thereto.

In the present disclosure, the fluorenyl group can be substituted, and two substituents can be linked with each other to form a spiro structure. In the case where the fluorenyl group is substituted,

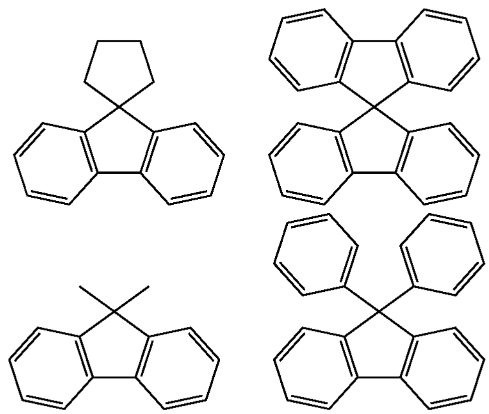

-continued

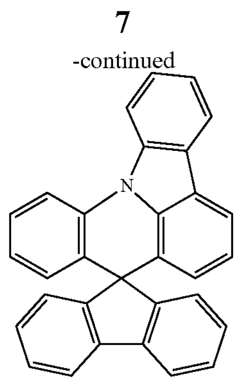

and the like can be formed. However, the structure is not limited thereto.

In the present disclosure, a heterocyclic group is a heterocyclic group containing one or more of O, N, Si and S as a heteroatom, and the carbon number thereof is not particularly limited, but is preferably 2 to 60. Examples of the heterocyclic group include a thiophene group, a furan group, a pyrrole group, an imidazole group, a thiazole group, an oxazol group, an oxadiazol group, a triazol group, a pyridyl group, a bipyridyl group, a pyrimidyl group, a triazine group, an acridyl group, a pyridazine group, a pyrazinyl group, a quinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzoimidazole group, a benzothiazol group, a benzocarbazole group, a benzothiophene group, a dibenzothiophene group, a benzofuranyl group, a phenanthroline group, an isoxazolyl group, a thiadiazolyl group, a phenothiazinyl group, a dibenzofuranyl group, and the like, but are not limited thereto.

In the present disclosure, the aryl group in the aralkyl group, the aralkenyl group, the alkylaryl group and the arylamine group is the same as the aforementioned examples of the aryl group. In the present disclosure, the alkyl group in the aralkyl group, the alkylaryl group and the alkylamine group is the same as the aforementioned examples of the alkyl group. In the present disclosure, the heteroaryl in the heteroarylamine can be applied to the aforementioned description of the heterocyclic group. In the present disclosure, the alkenyl group in the aralkenyl group is the same as the aforementioned examples of the alkenyl group. In the present disclosure, the aforementioned description of the aryl group can be applied except that the arylene is a divalent group. In the present disclosure, the aforementioned description of the heteroaryl group can be applied except that the heteroarylene is a divalent group. In the present disclosure, the aforementioned description of the aryl group or cycloalkyl group can be applied except that the hydrocarbon ring is not a monovalent group but formed by combining two substituent groups. In the present disclosure, the aforementioned description of the heterocyclic group can be applied, except that the heterocyclic group is not a monovalent group but formed by combining two substituent groups.

Hereinafter, the present disclosure will be described in detail for each configuration.

Anode and Cathode

The anode and cathode used in the present disclosure mean electrodes used in an organic light emitting device.

As the anode material, generally, a material having a large work function is preferably used so that holes can be smoothly injected into the organic material layer. Specific examples of the anode material include metals such as vanadium, chrome, copper, zinc, and gold, or an alloy thereof; metal oxides such as zinc oxides, indium oxides, indium tin oxides (ITO), and indium zinc oxides (IZO); a combination of metals and oxides, such as ZnO:Al or $SNO_2$:Sb; conductive polymers such as poly(3-methylthiophene), poly[3,4-(ethylene-1,2-dioxy)thiophene](PEDOT), polypyrrole, and polyaniline, and the like, but are not limited thereto.

As the cathode material, generally, a material having a small work function is preferably used so that electrons can be easily injected into the organic material layer. Specific examples of the cathode material include metals such as magnesium, calcium, sodium, potassium, titanium, indium, yttrium, lithium, gadolinium, aluminum, silver, tin, and lead, or an alloy thereof; a multilayered structure material such as LiF/Al or $LiO_2$/Al and the like, but are not limited thereto.

Light Emitting Layer

The light emitting layer used in the present disclosure means a layer that can emit light in the visible light region by combining holes and electrons transported from the anode and the cathode. Generally, the light emitting layer includes a host material and a dopant material. In the present disclosure, a compound of Chemical Formula 1, a compound of Chemical Formula 2, and a compound of Chemical Formula 3 are used as the host.

The indolocarbazole-based compound of Chemical Formula 1, and the biscarbazole-based compound of Chemical Formula 2 each have excellent hole transport capability and thus serves as a P-type host, and the compound of Chemical Formula 3 in which carbazole and triazine are bonded at ortho positions serves as an N-type host.

Generally, when a P-type host and an N-type host are mixed and applied as a host of the light emitting layer, an exciplex is formed, whereby when all the compounds of the three types are mixed and used as a host, the characteristics of the device can be improved as compared with the case where only one of the P-type host and the N-type host is applied.

Preferably, the Chemical Formula 1 can be any one of the following Chemical Formulas 1-1 to Chemical Formula 1-5:

[Chemical Formula 1-1]

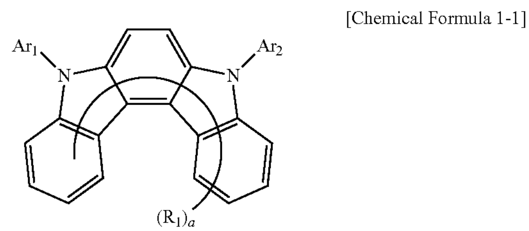

[Chemical Formula 1-2]

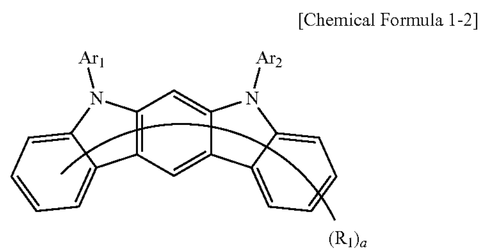

-continued

[Chemical Formula 1-3]

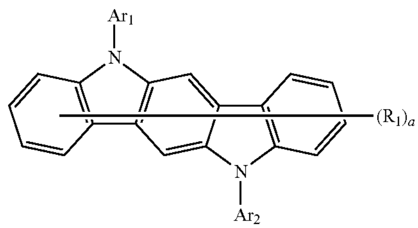

[Chemical Formula 1-4]

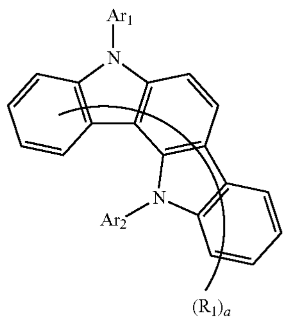

[Chemical Formula 1-5]

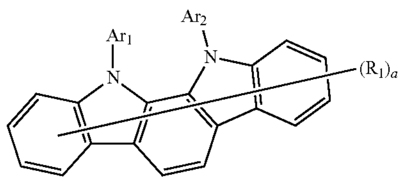

wherein in Chemical Formulas 1-1 to 1-5:

$Ar_1$, $Ar_2$, $R_1$ and a are as defined in Chemical Formula 1.

Preferably, $Ar_1$ and $Ar_2$ can be each independently a substituted or unsubstituted $C_{6-20}$ aryl or a substituted or unsubstituted $C_{2-20}$ heteroaryl containing any one or more heteroatoms selected from the group consisting of N, O and S.

More preferably, $Ar_1$ and $Ar_2$ can be each independently phenyl, biphenylyl, phenyl biphenylyl, terphenylyl, dimethylfluorenyl, dimethylfluorenyl phenyl, dibenzofuranyl phenyl, dibenzothiophenyl phenyl, dibenzofuranyl, dibenzothiophenyl, phenyl substituted with 5 deuterium, biphenylyl substituted with 5 deuteriums, or terphenylyl substituted with 5 deuteriums.

Most preferably, $Ar_1$ and $Ar_2$ can be each independently any one substituent selected from the group consisting of the following substituents:

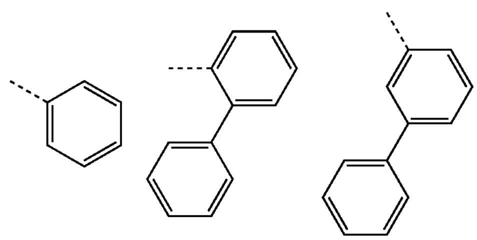

-continued

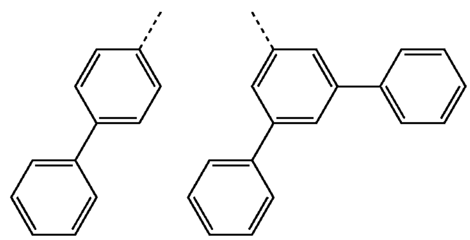

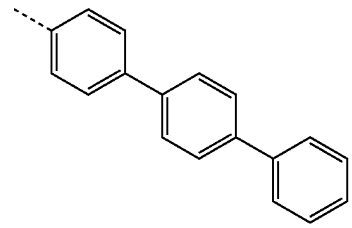

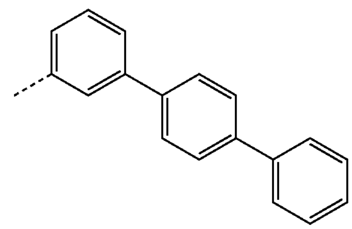

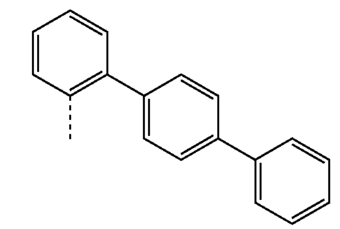

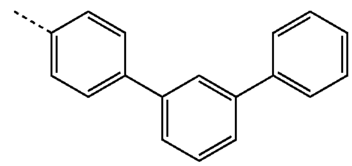

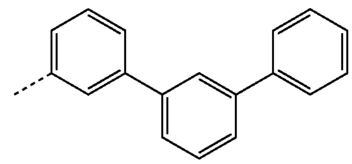

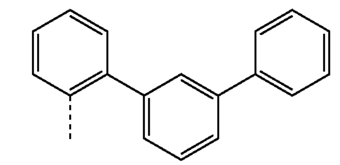

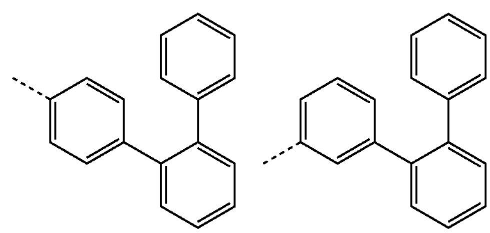

-continued
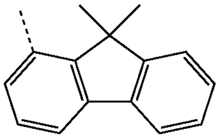
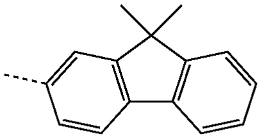
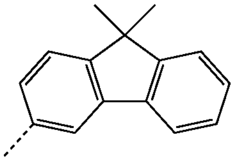
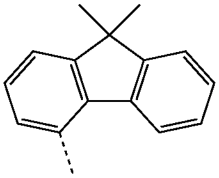
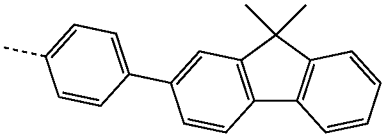
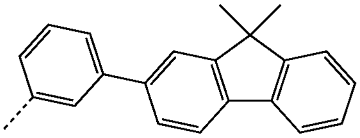
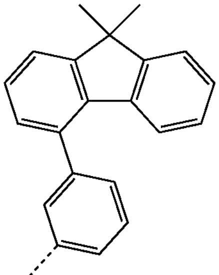
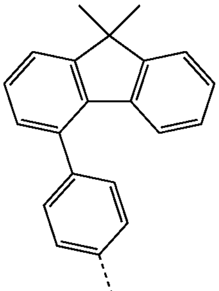
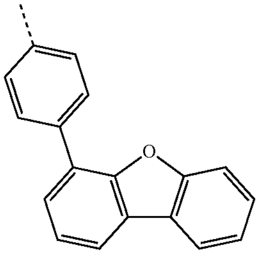
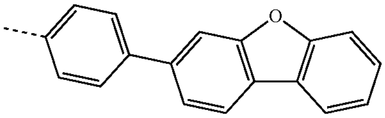
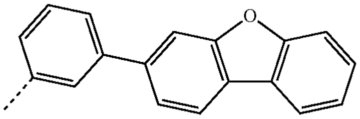
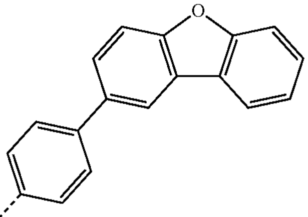
-continued
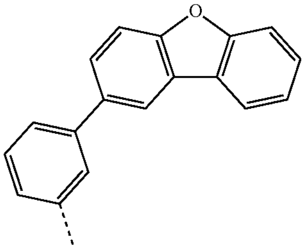
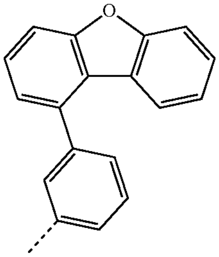
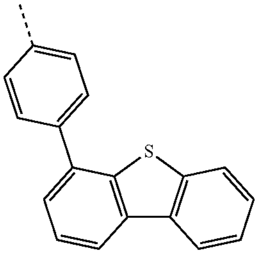
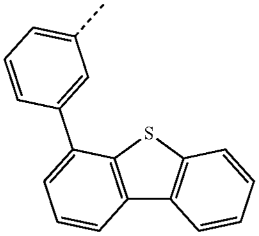
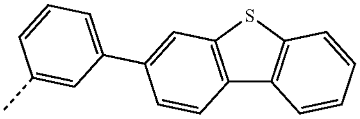
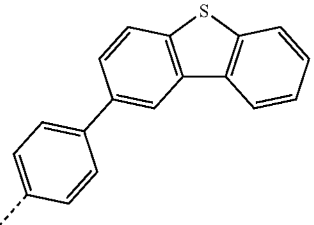
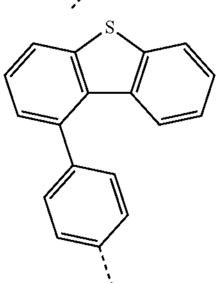
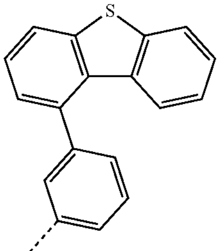
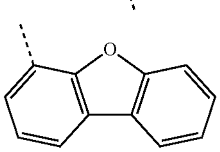
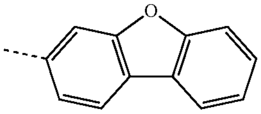
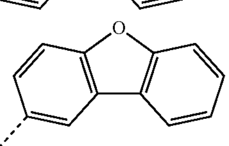
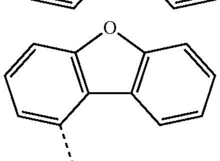
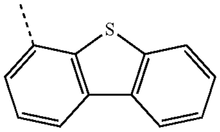
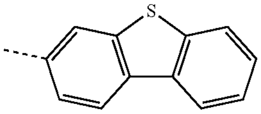
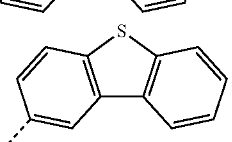
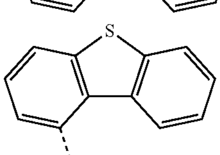

-continued

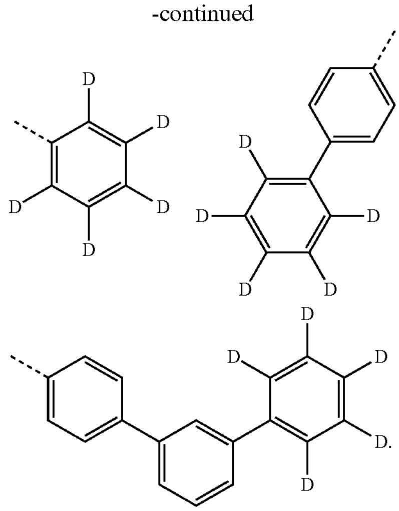

Preferably, at least one of $Ar_1$ and $Ar_2$ can be a substituted or unsubstituted $C_{6-20}$ aryl, and more preferably, at least one of $Ar_1$ and $Ar_2$ can be phenyl, biphenylyl, terphenylyl, phenyl substituted with 5 deuteriums, or biphenylyl substituted with 5 deuteriums.

Preferably, $R_1$ can be hydrogen, deuterium, a substituted or unsubstituted $C_{1-10}$ alkyl, a substituted or unsubstituted $C_{6-20}$ aryl, or a substituted or unsubstituted $C_{2-20}$ heteroaryl containing any one or more heteroatoms selected from the group consisting of N, O and S, and more preferably, $R_1$ can be hydrogen or deuterium.

Preferably, a is an integer of 0, 1, or 8.

Representative examples of the compound of Chemical Formula 1 are as follows:

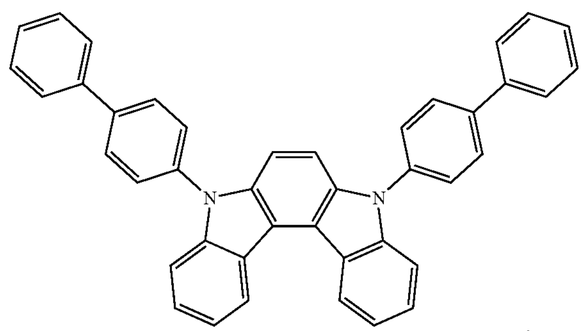

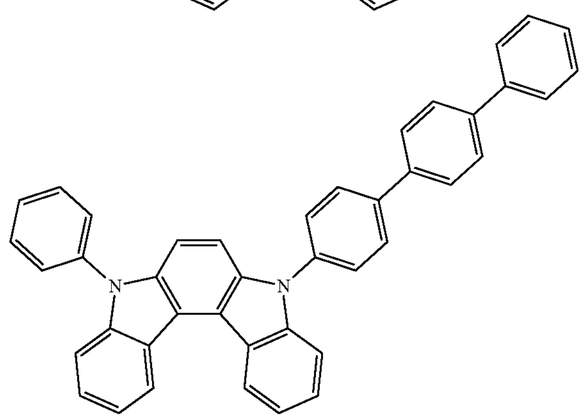

-continued

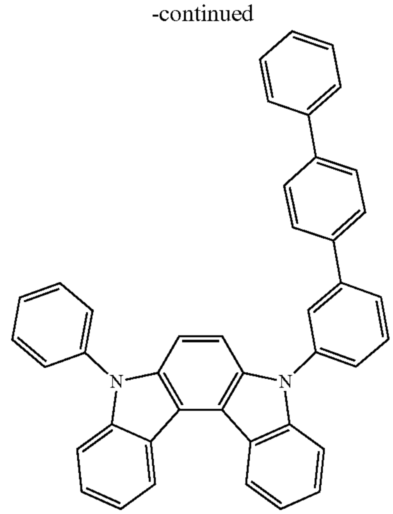

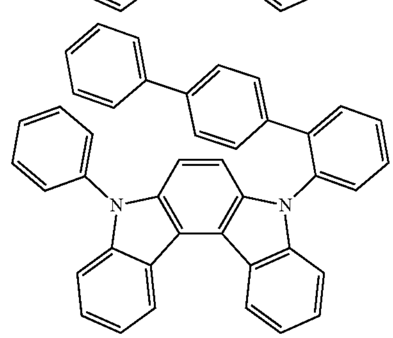

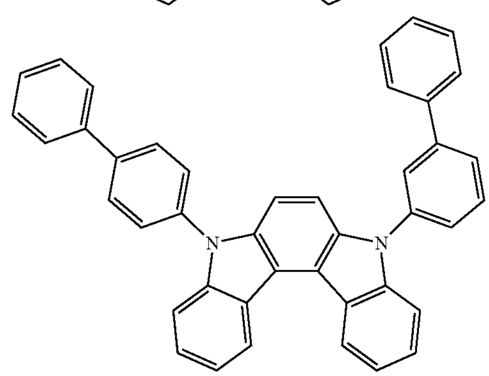

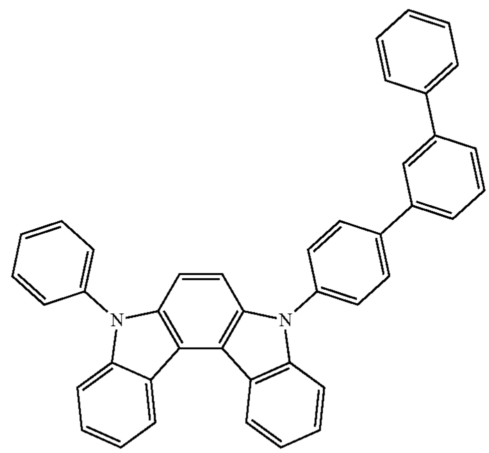

-continued
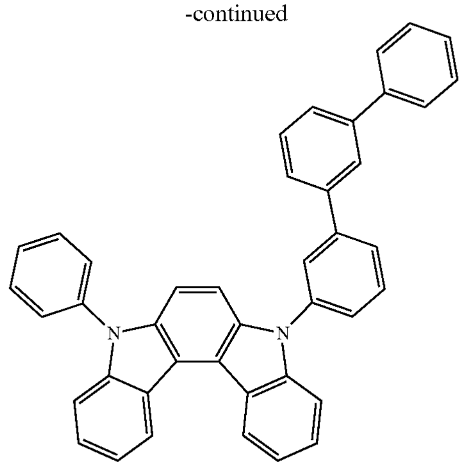
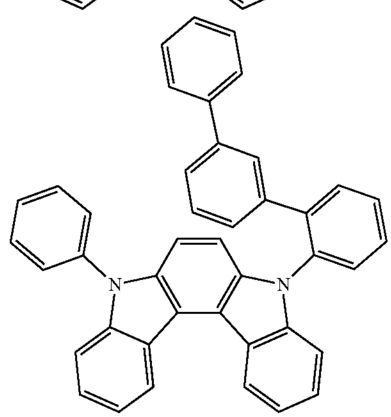
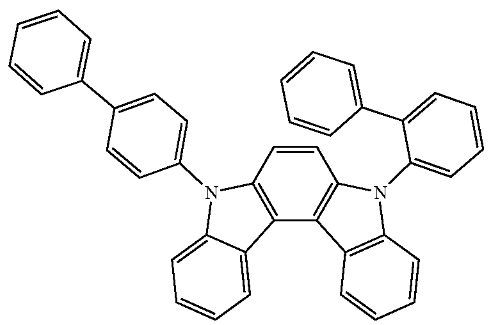
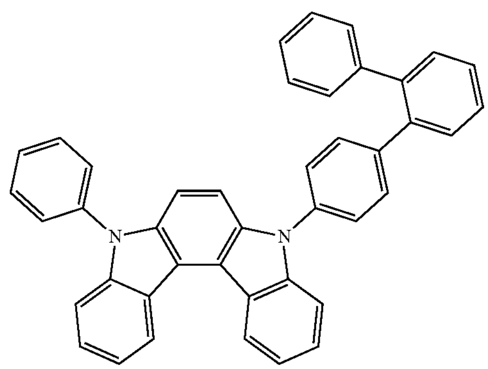
-continued
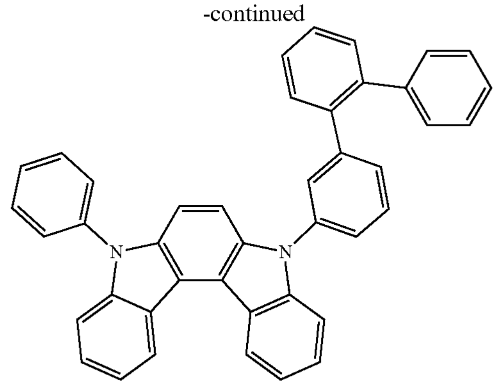
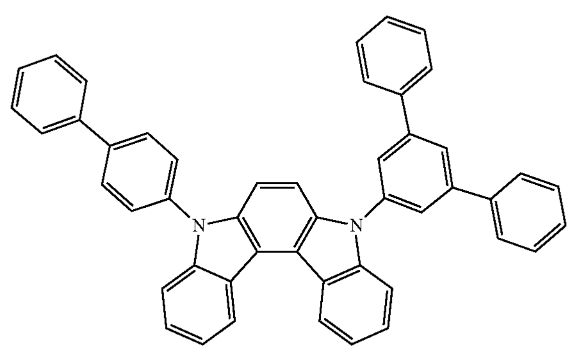
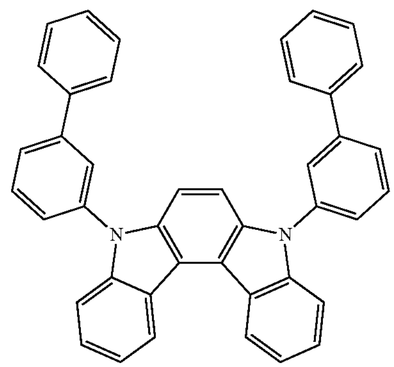
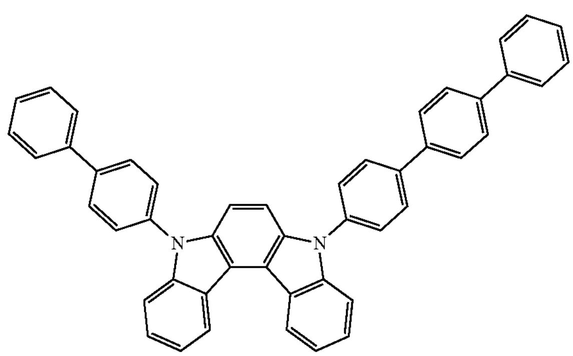

-continued
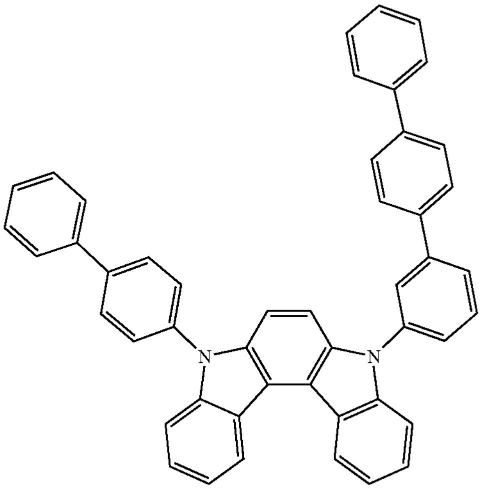
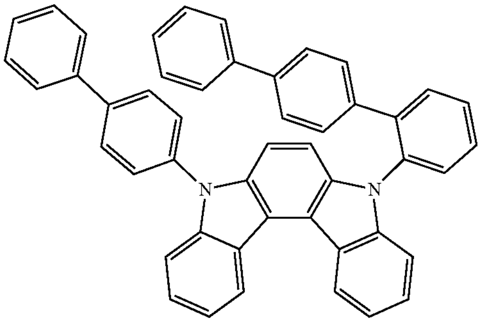
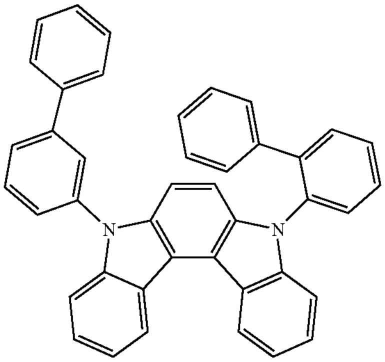
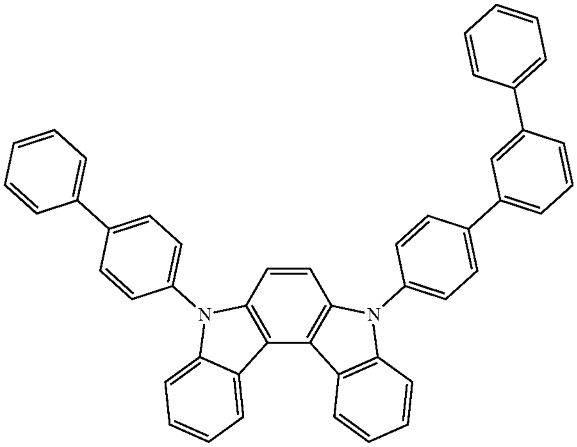
-continued
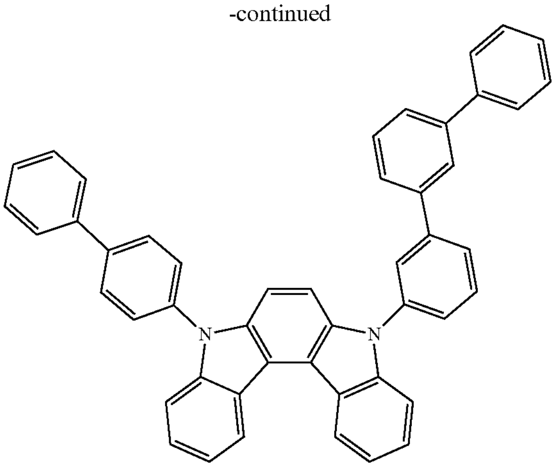
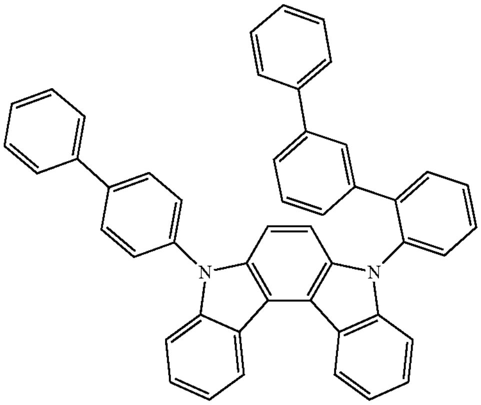
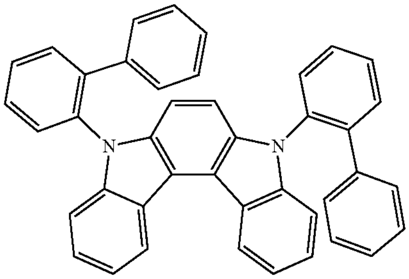
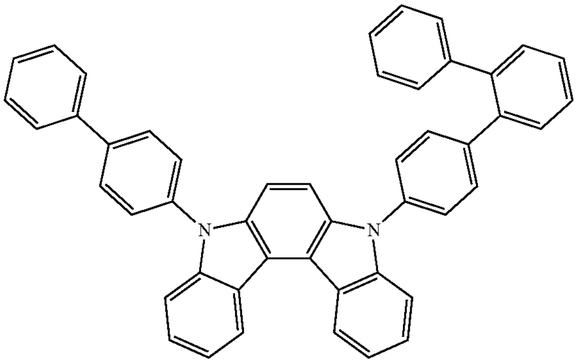

-continued
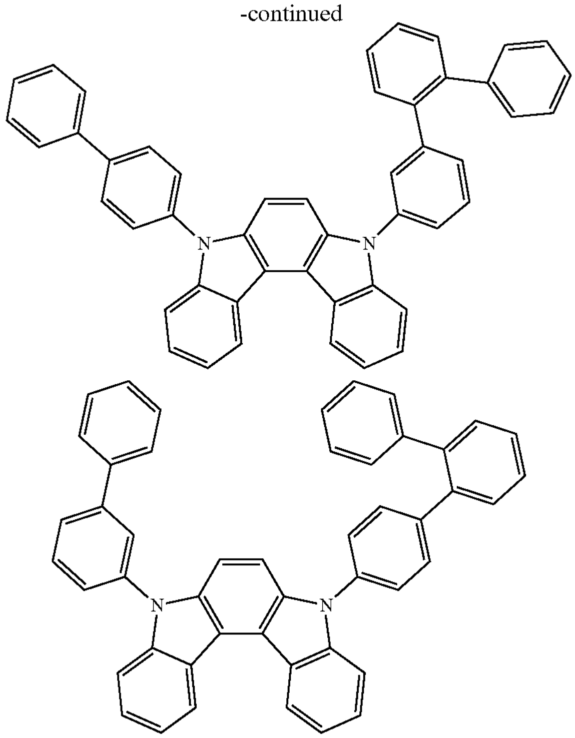
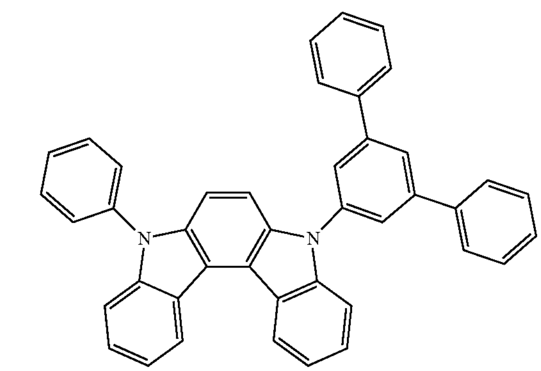
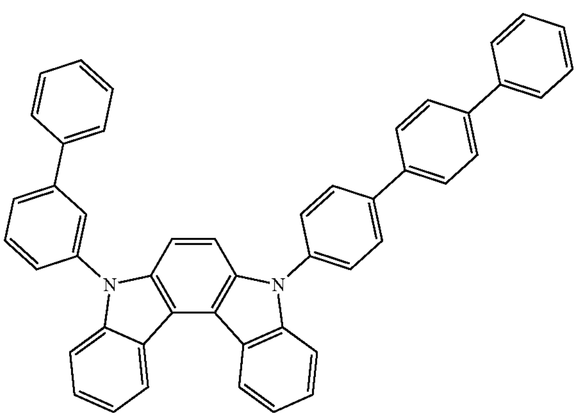
-continued
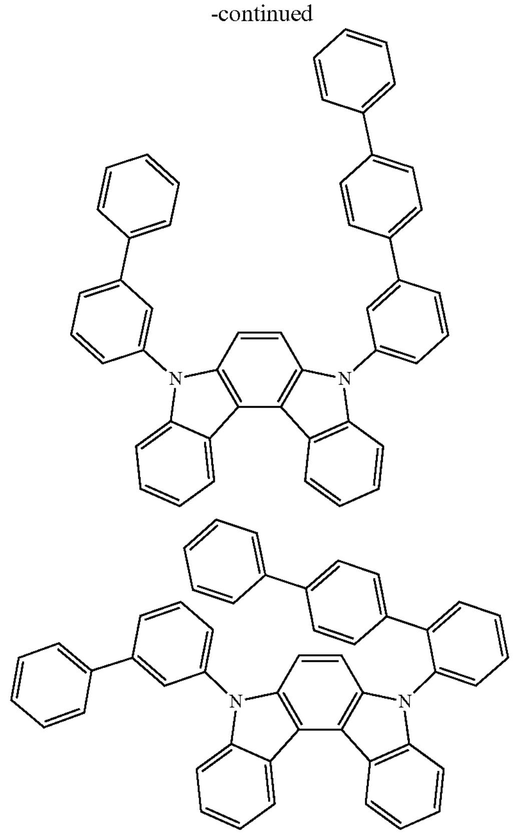
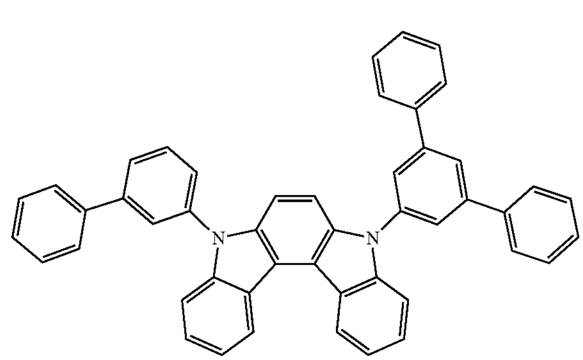
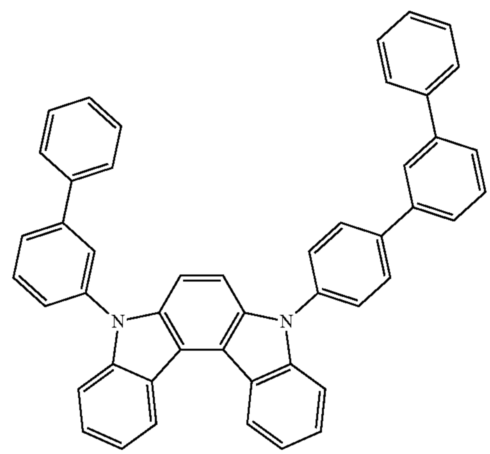

-continued
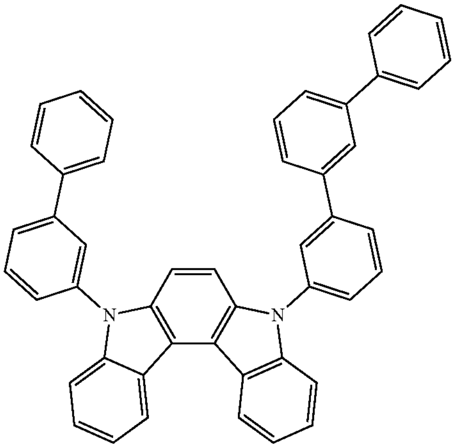
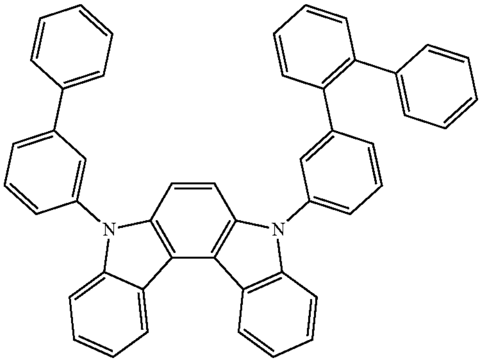
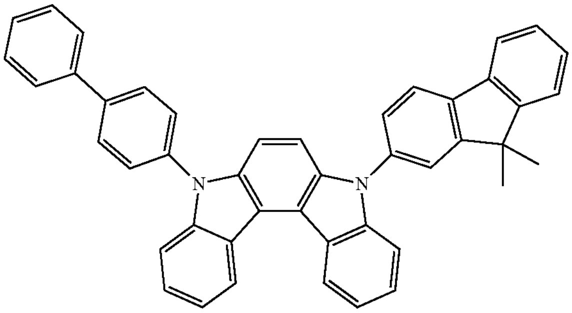
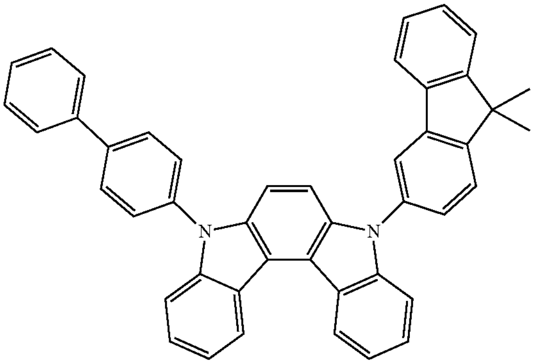
-continued
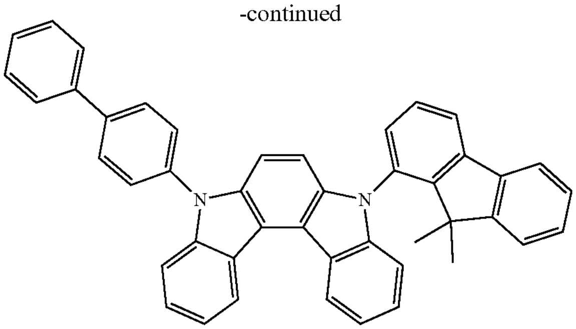
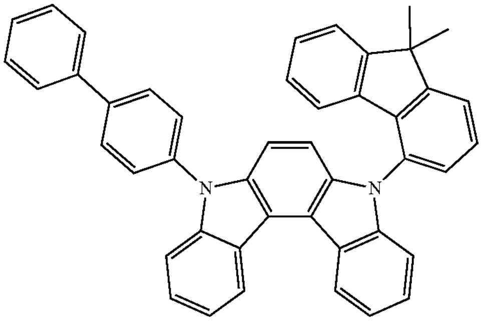
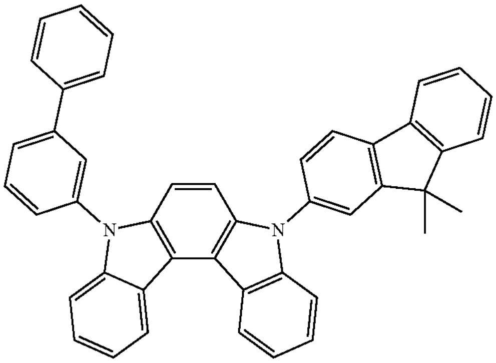
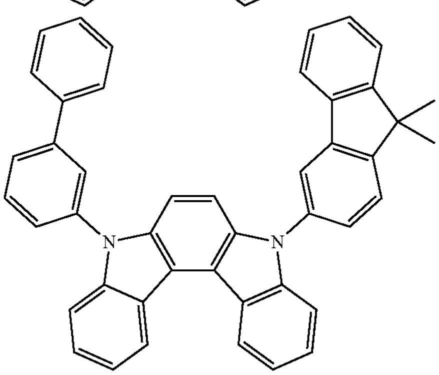
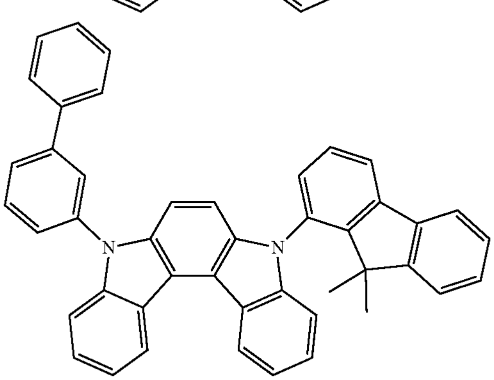

-continued
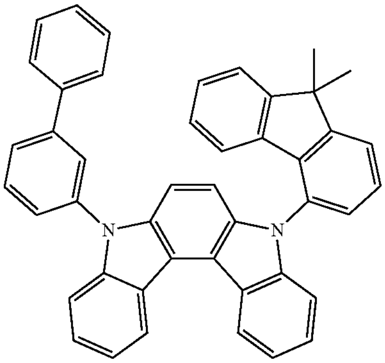
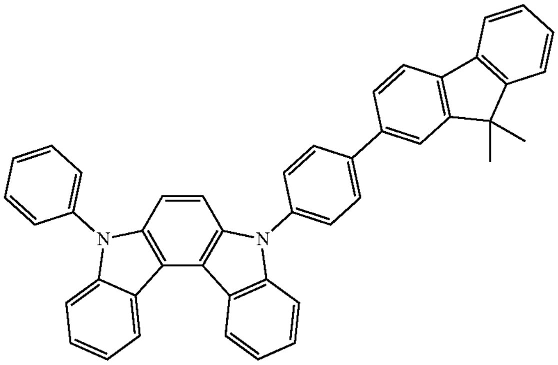
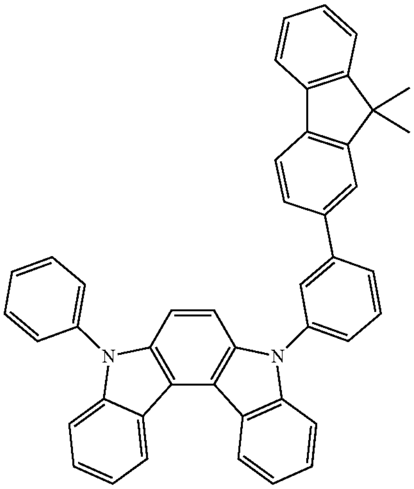
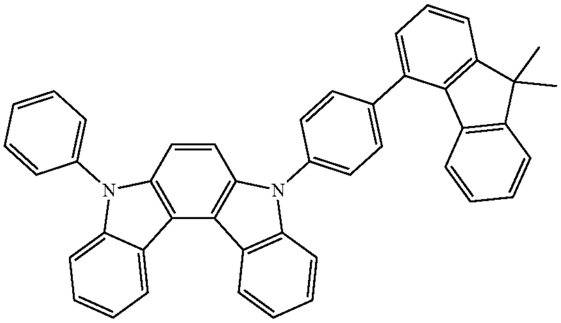
-continued
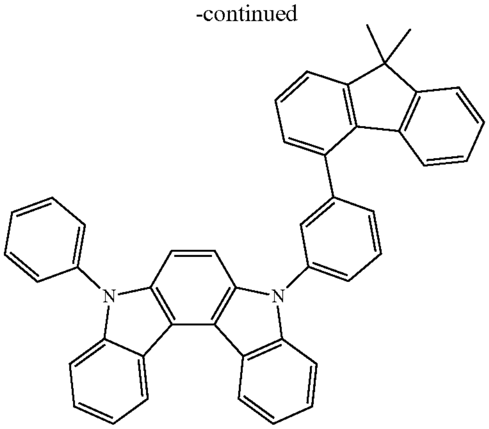
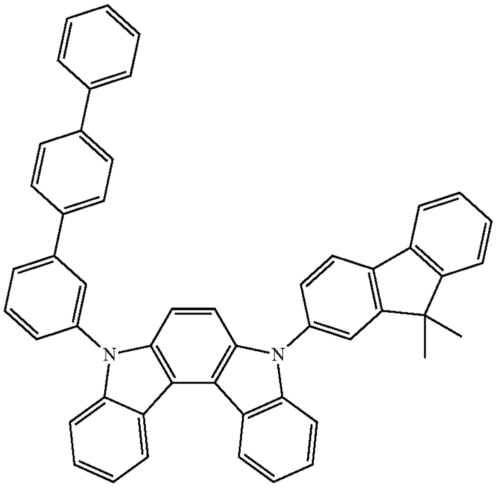
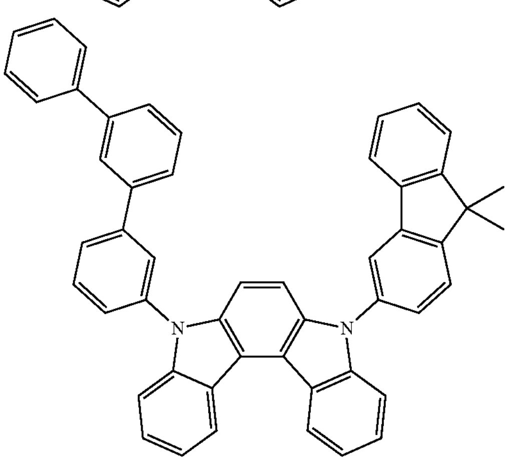
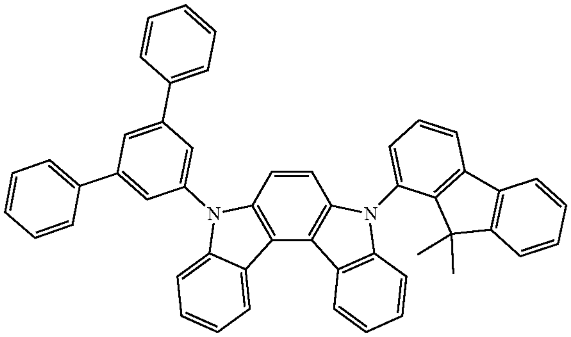

-continued
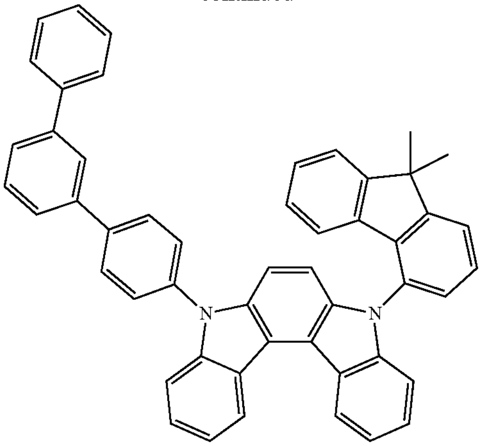
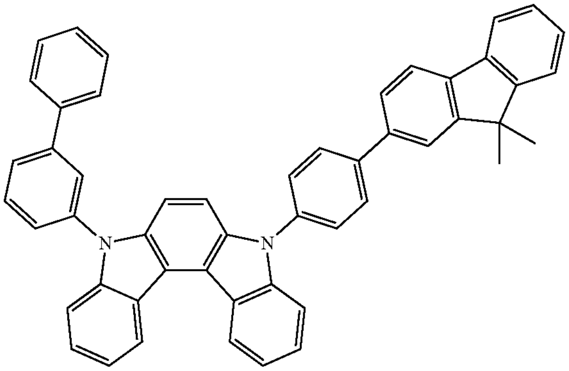
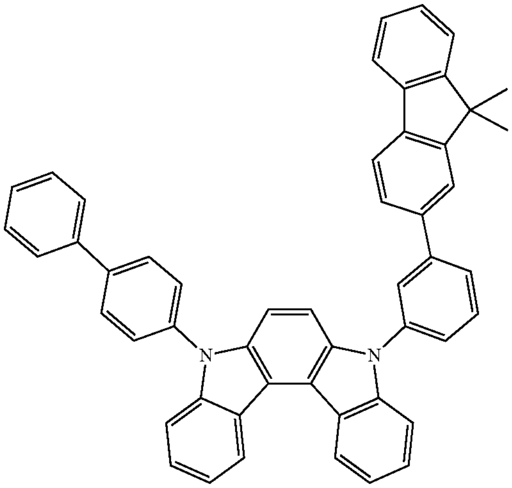
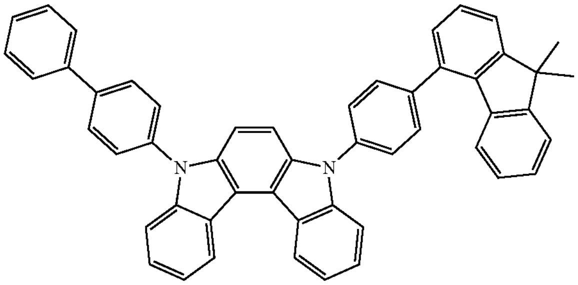
-continued
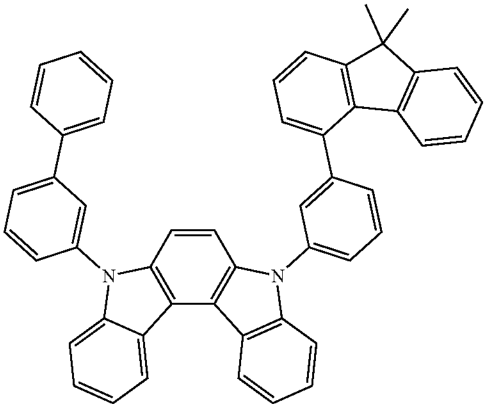
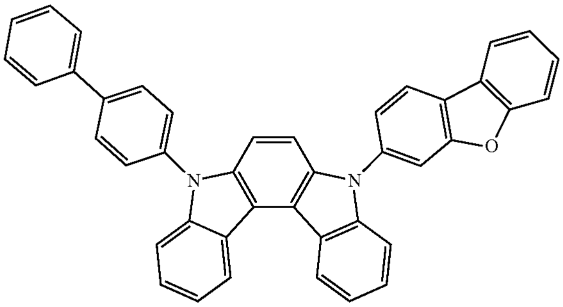
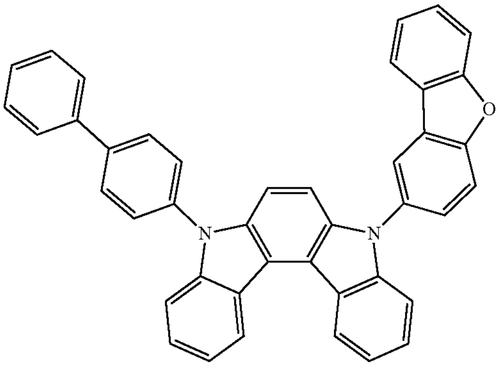
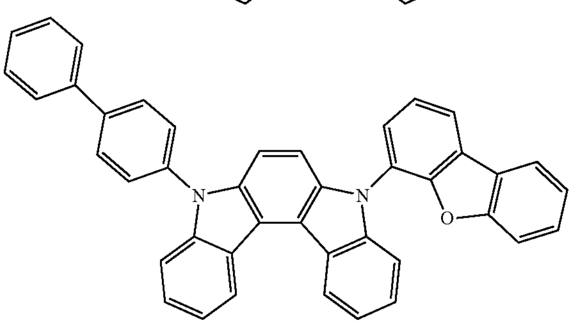
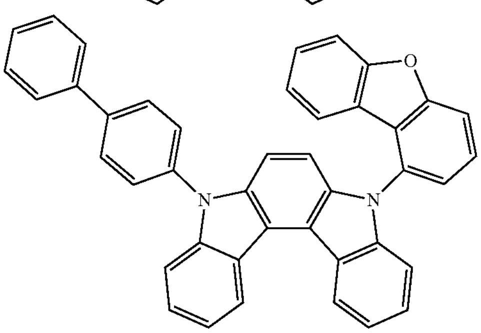

-continued
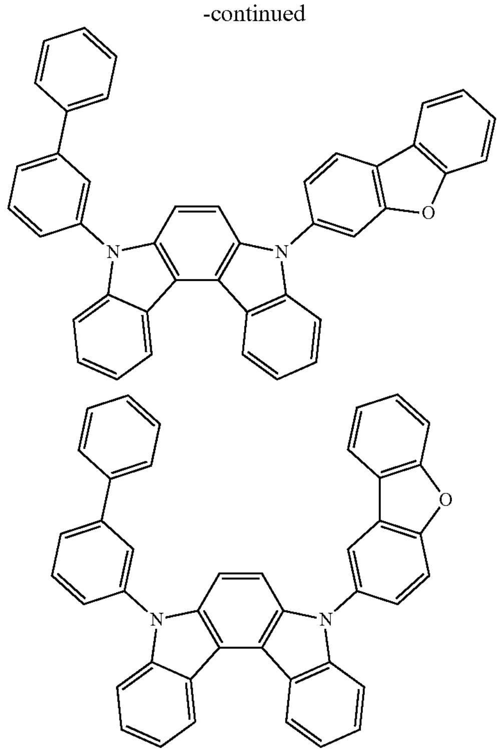
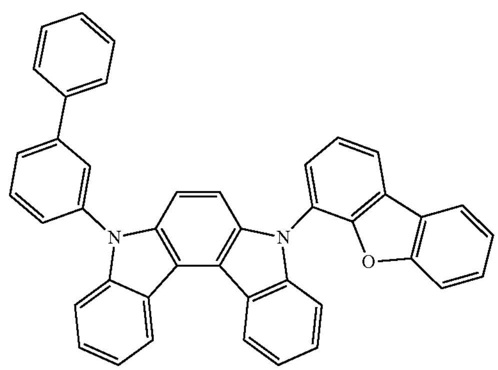
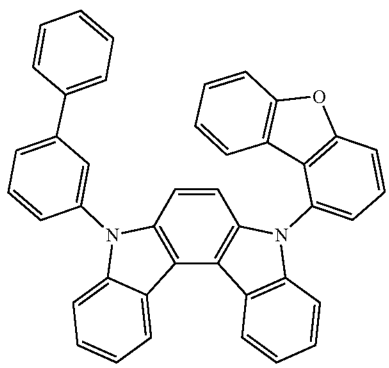
-continued
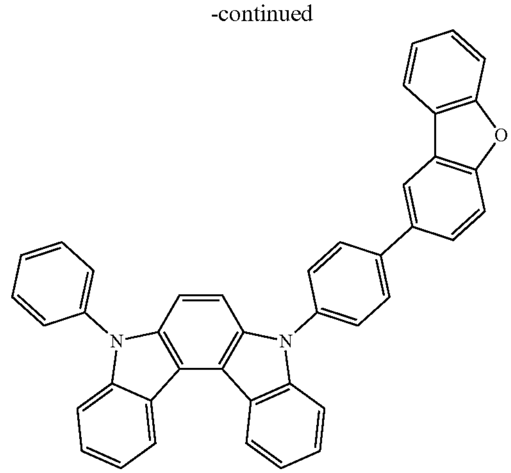
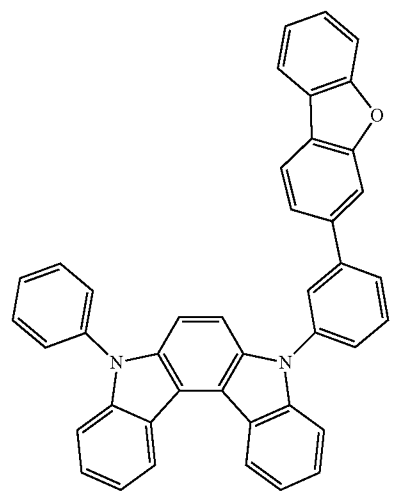
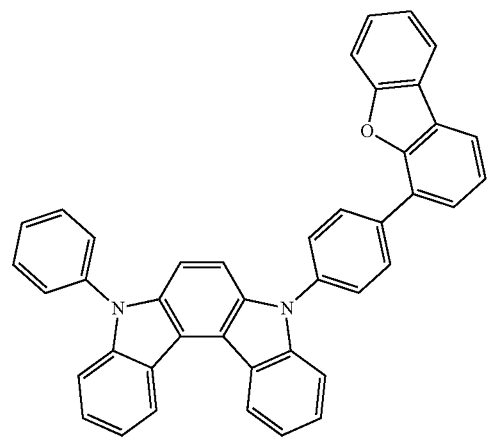

-continued
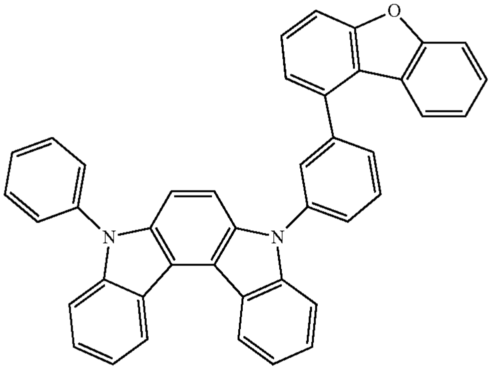
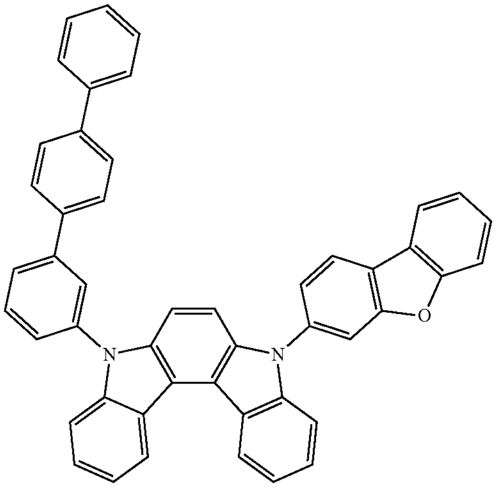
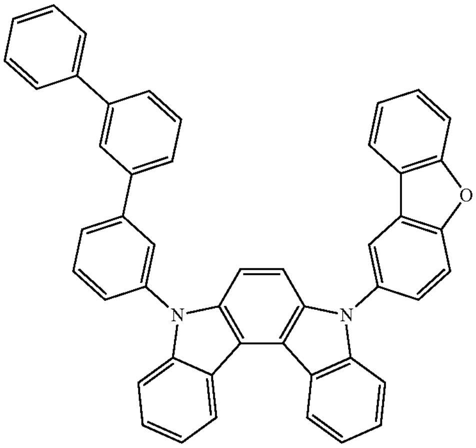
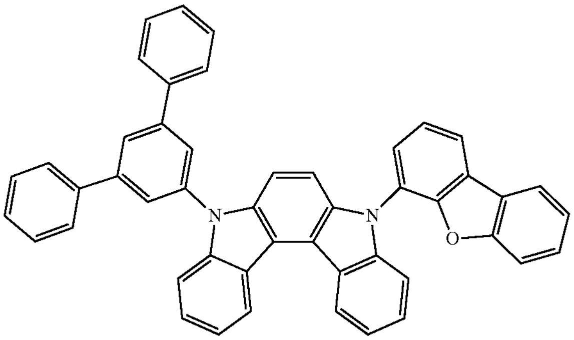
-continued
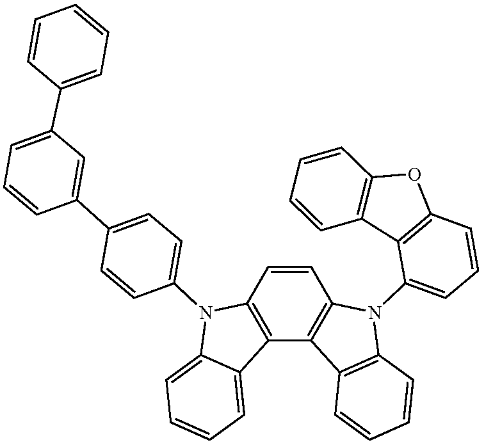
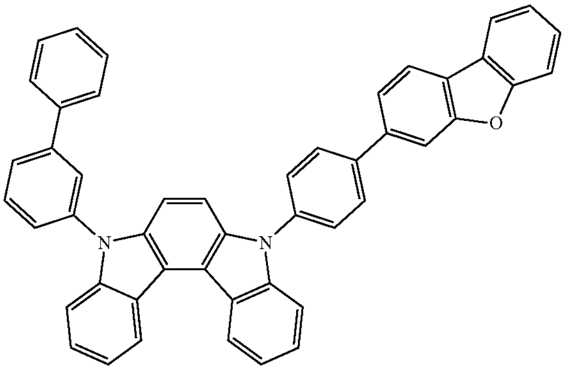
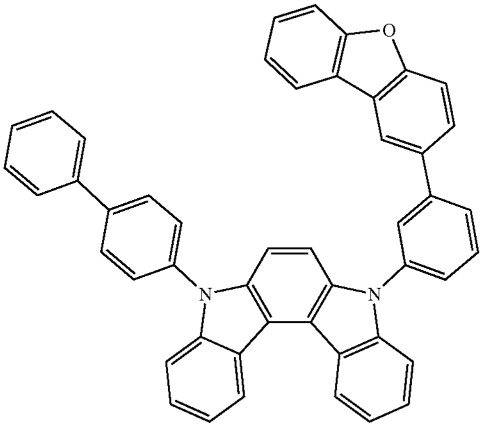
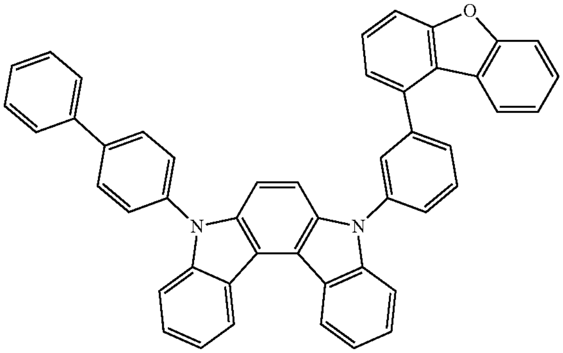

-continued
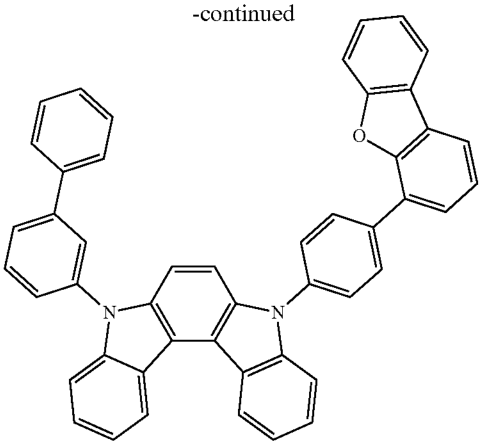
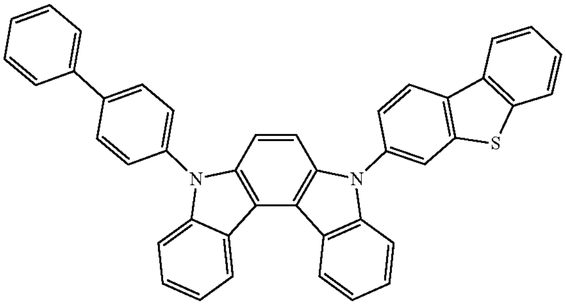
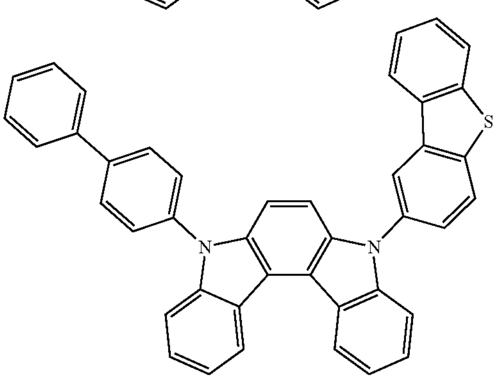
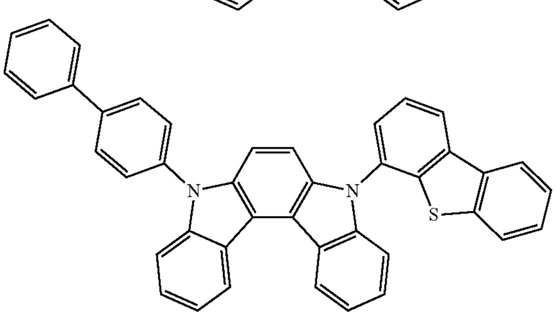
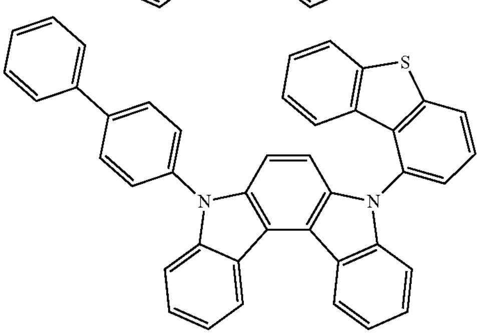
-continued
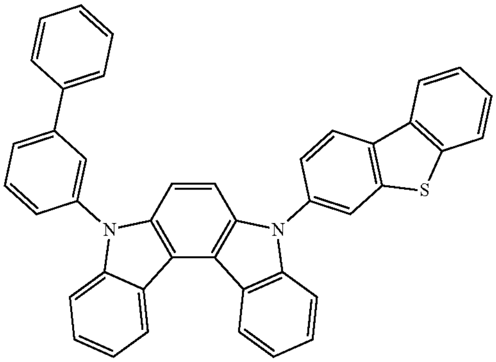
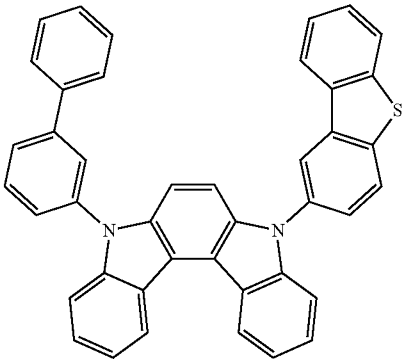
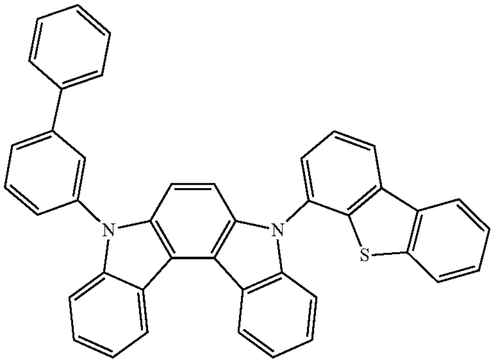
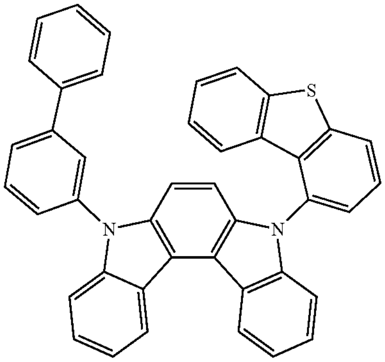

-continued
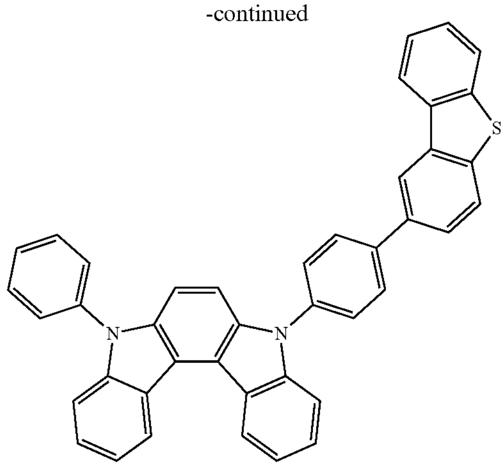
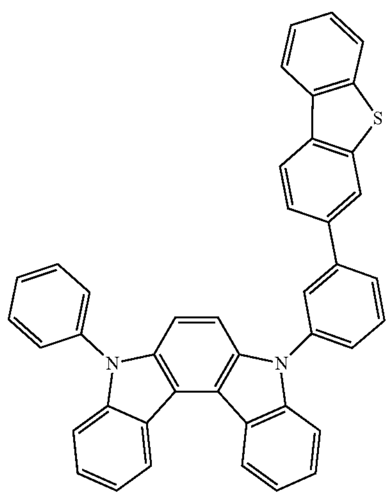
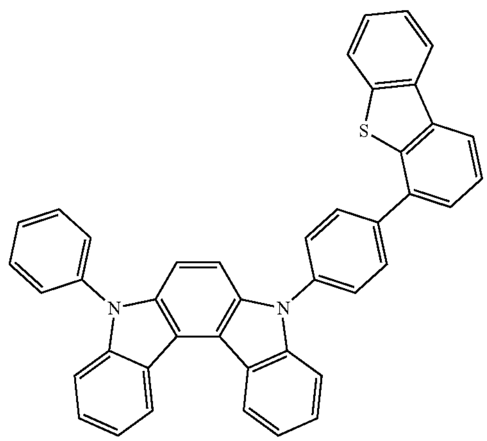
-continued
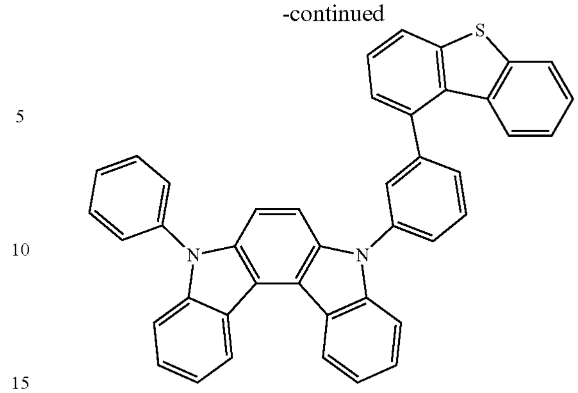
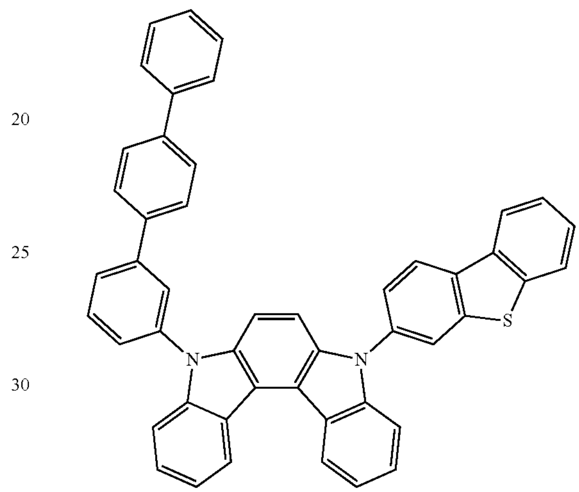
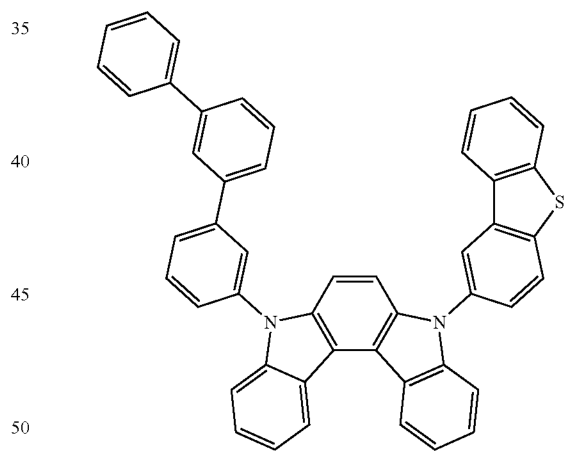
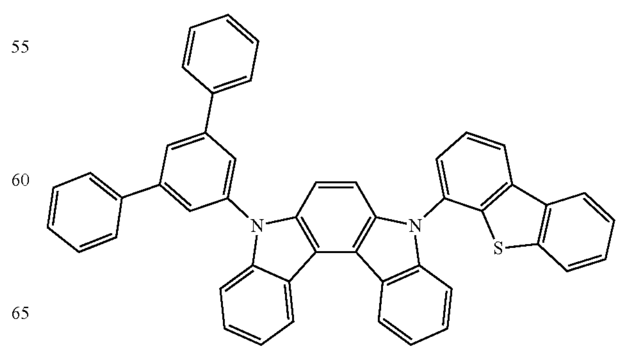

-continued
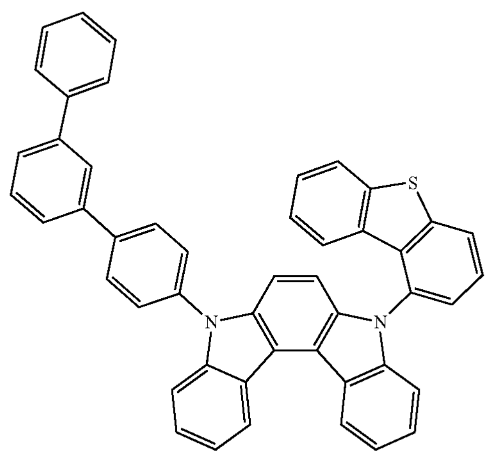
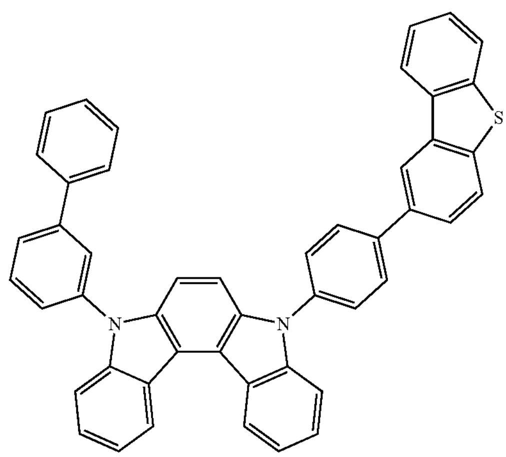
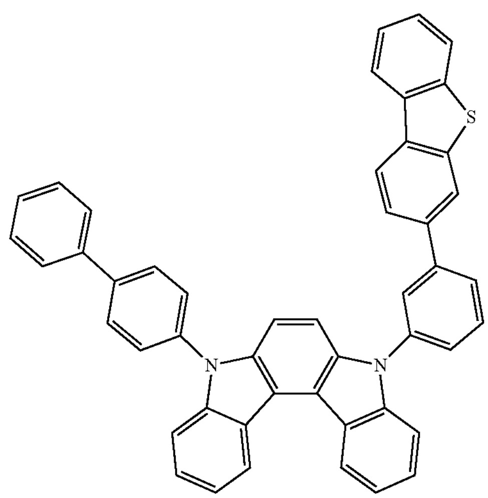
-continued
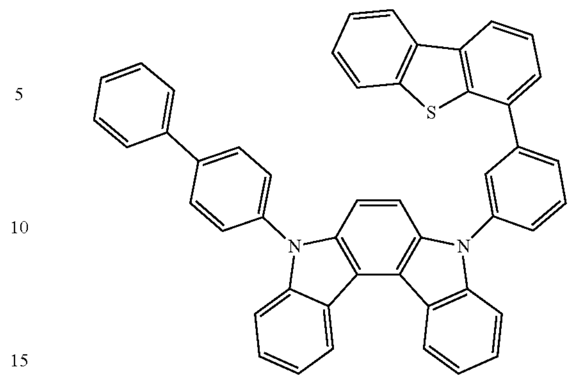
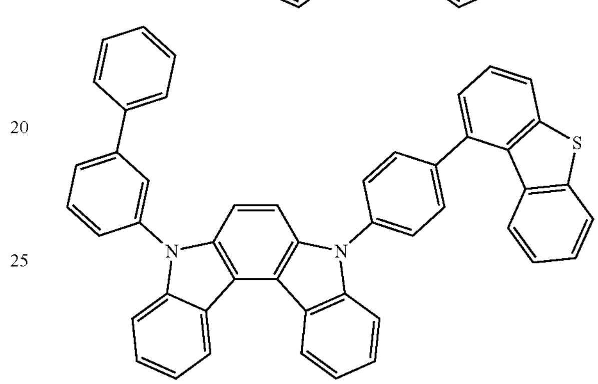
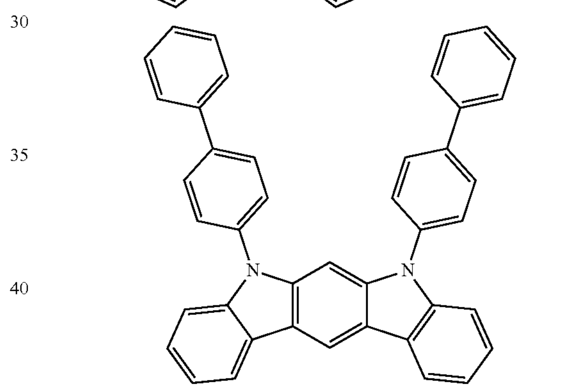
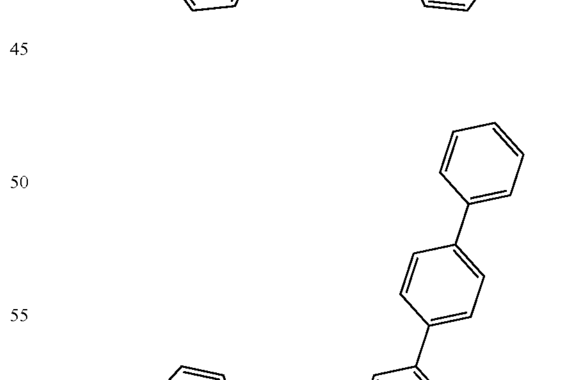
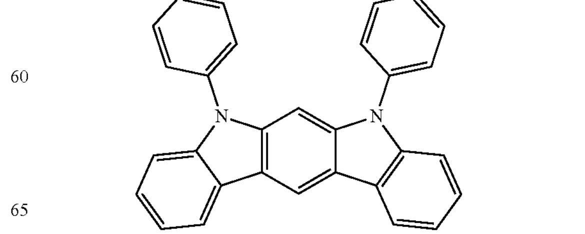

-continued
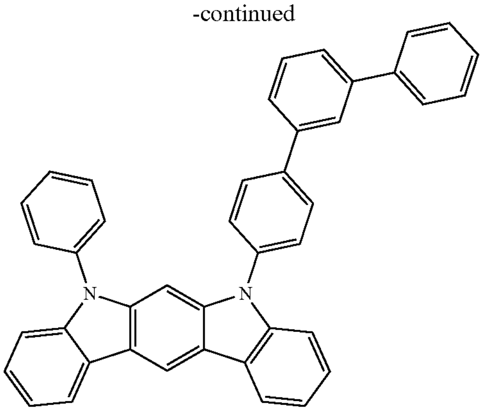
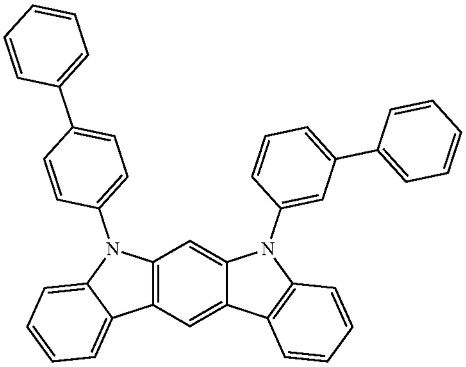
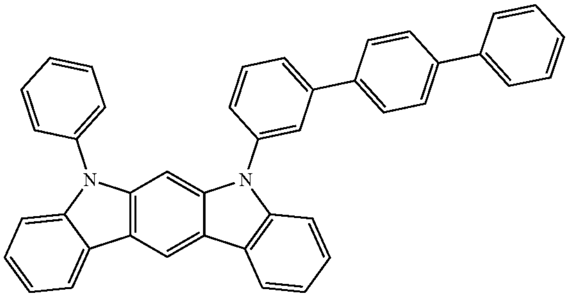
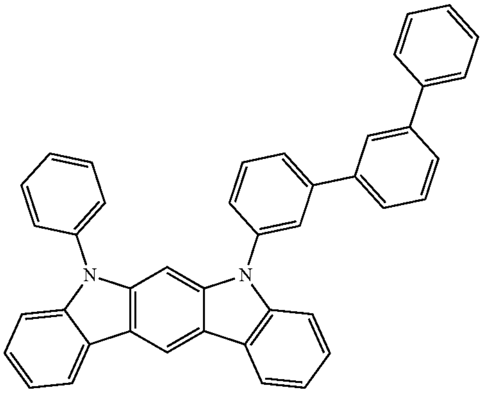
-continued
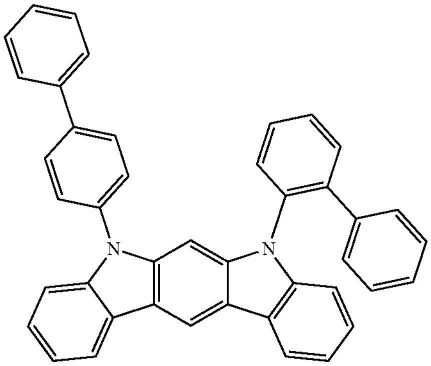
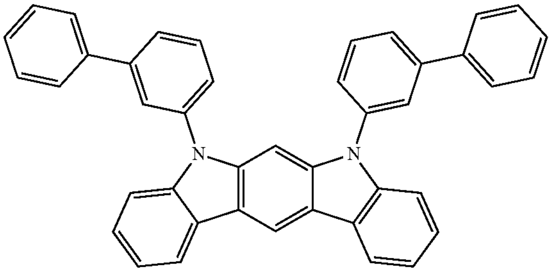
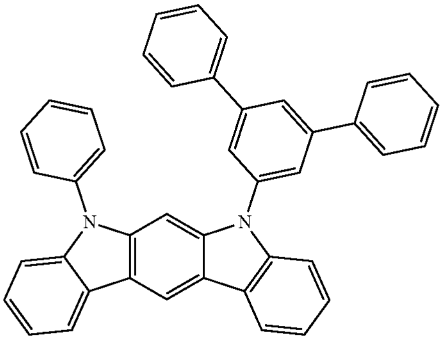
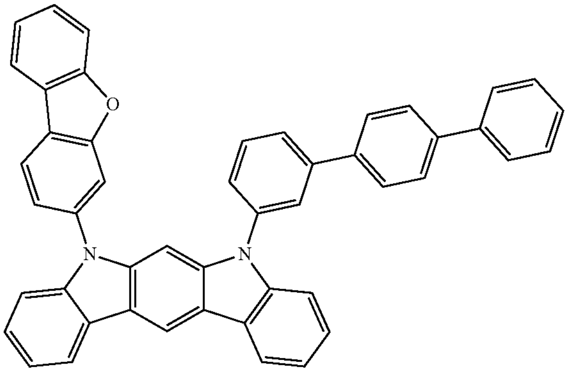

-continued
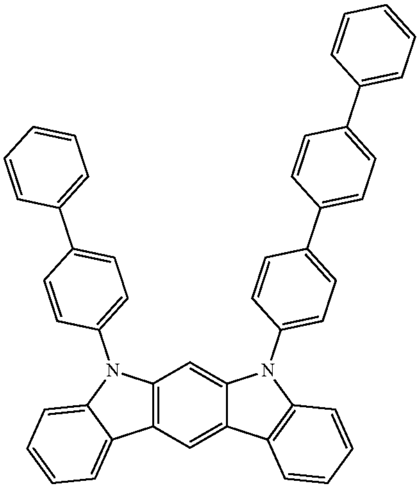
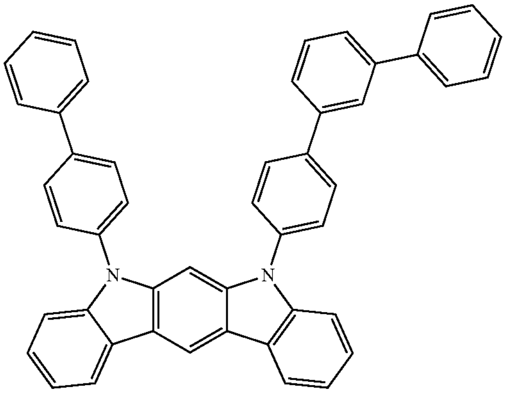
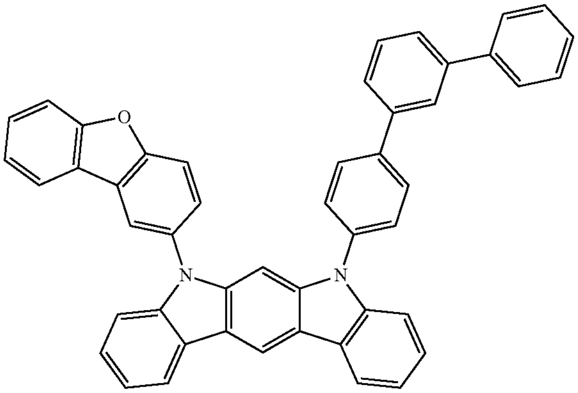
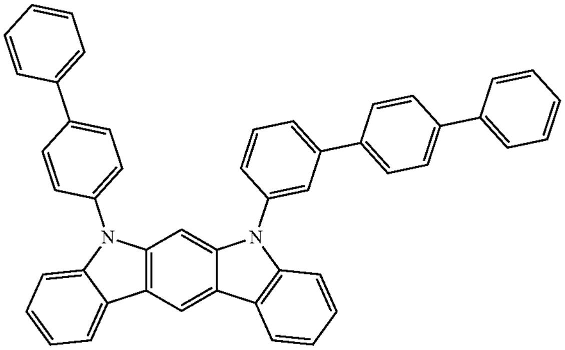
-continued
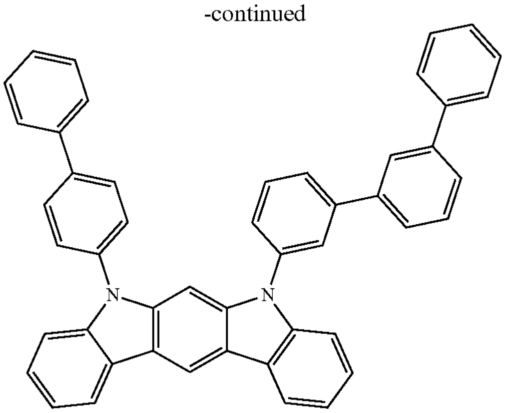
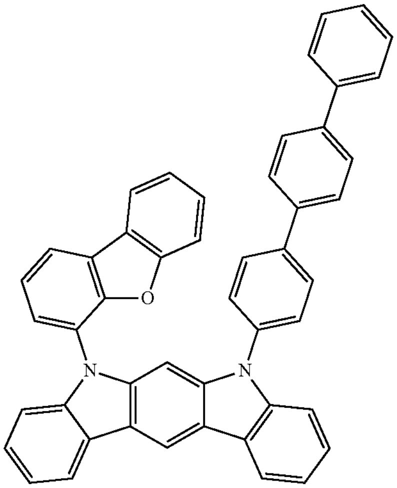
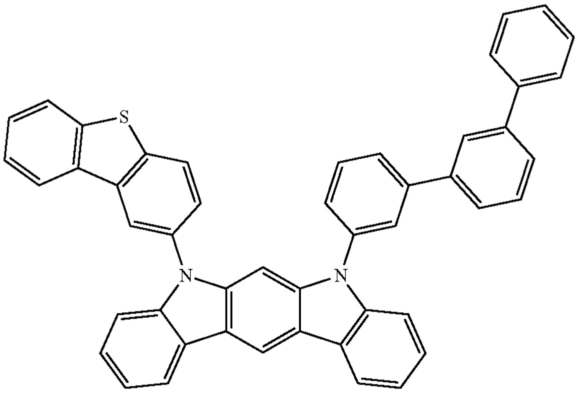
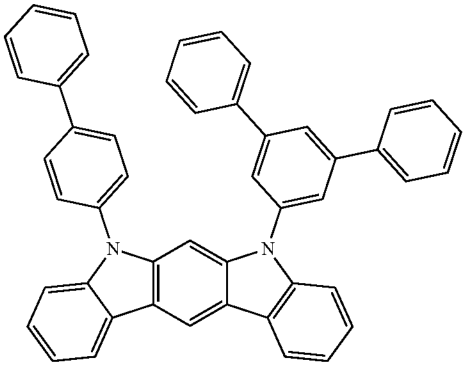

-continued
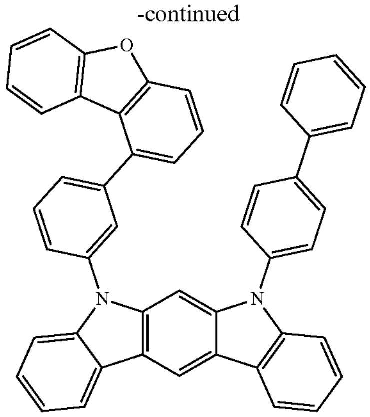
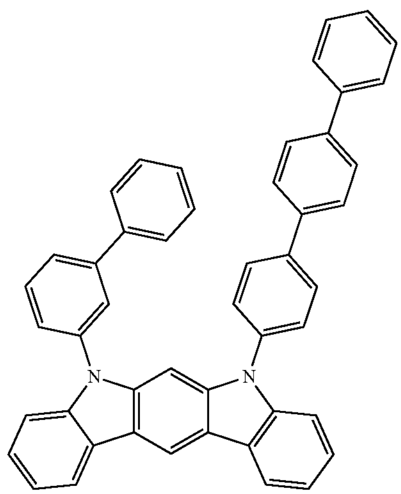
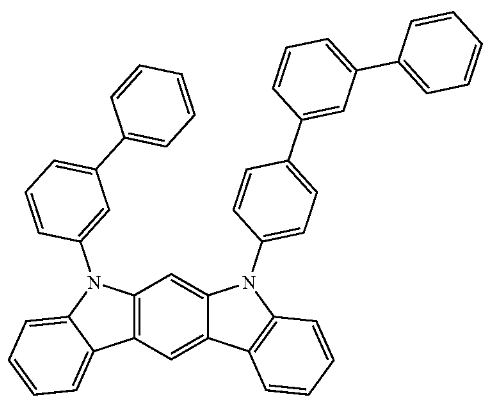
-continued
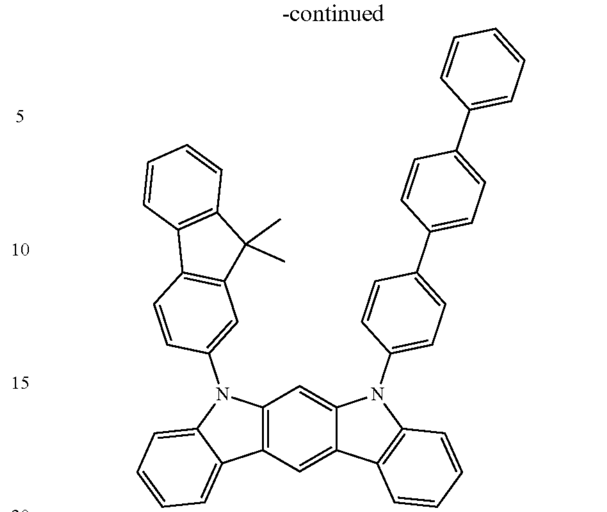
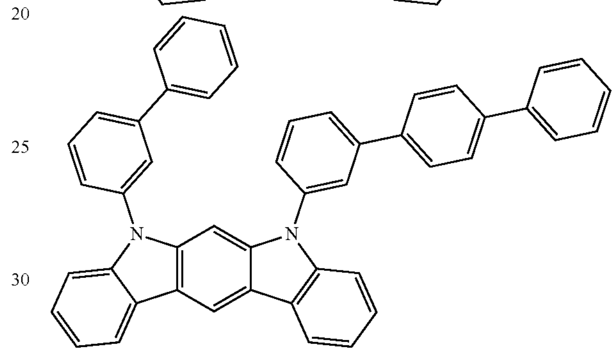
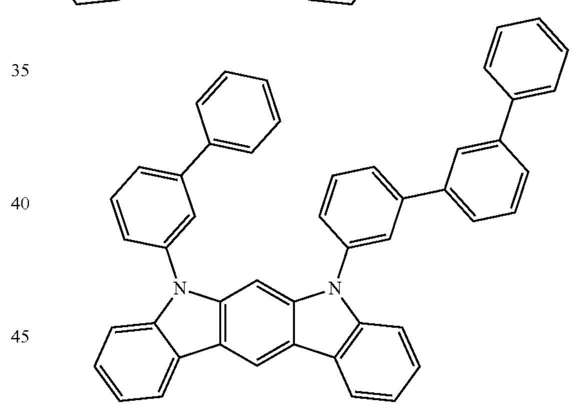
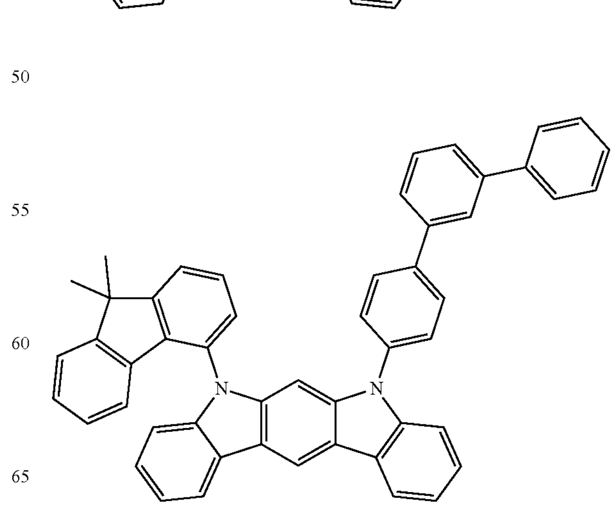

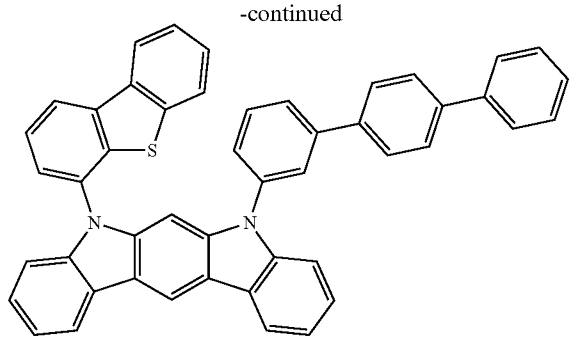
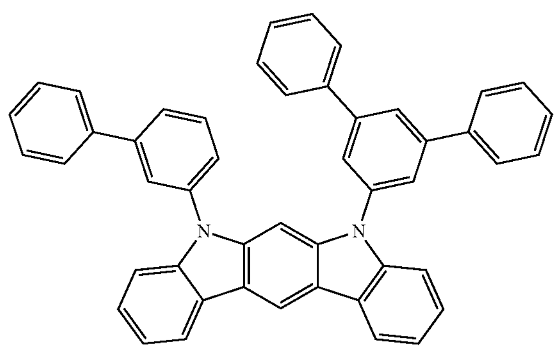
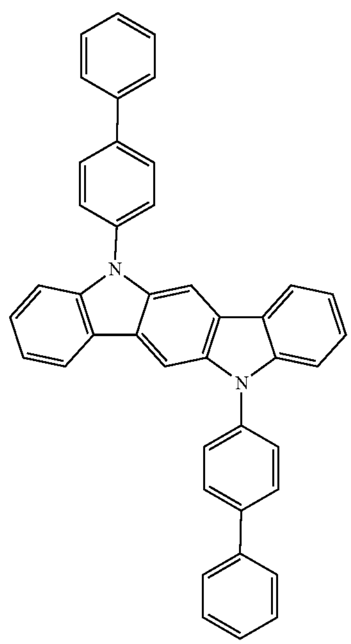
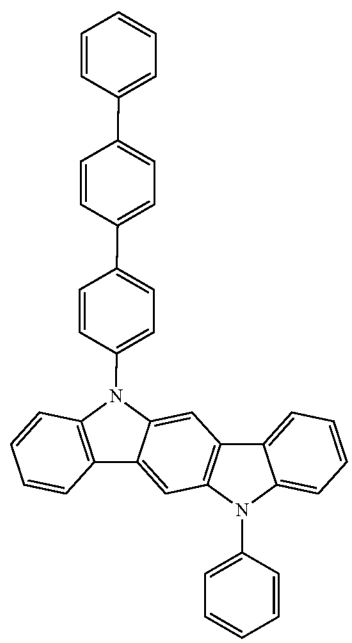
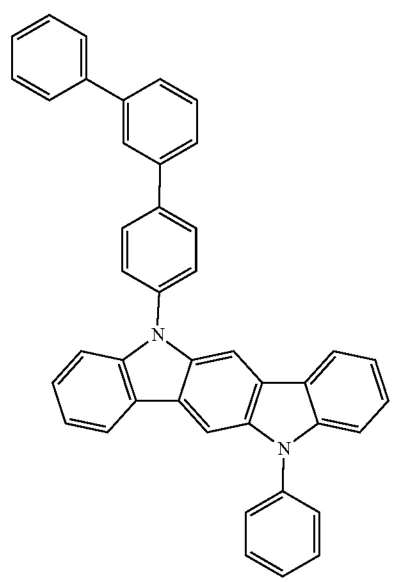

-continued
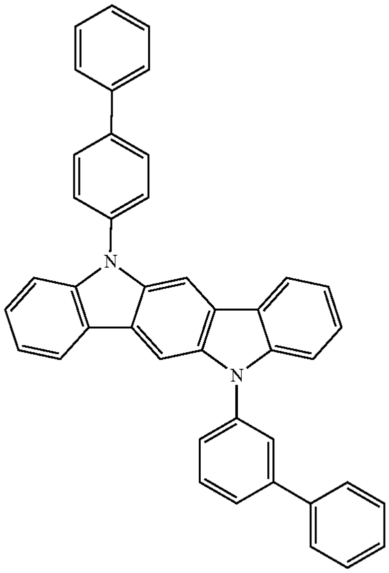
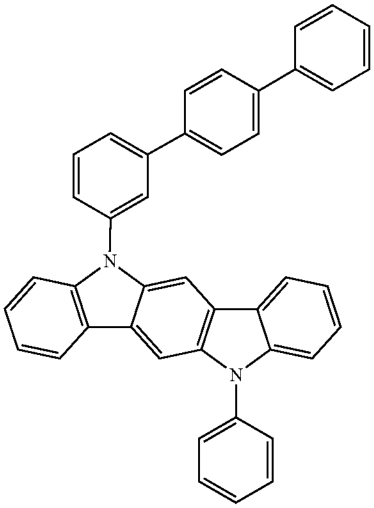
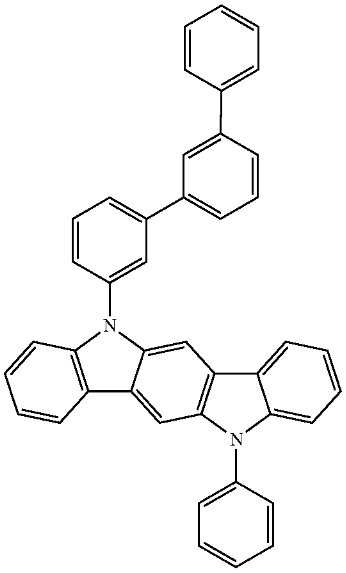
-continued
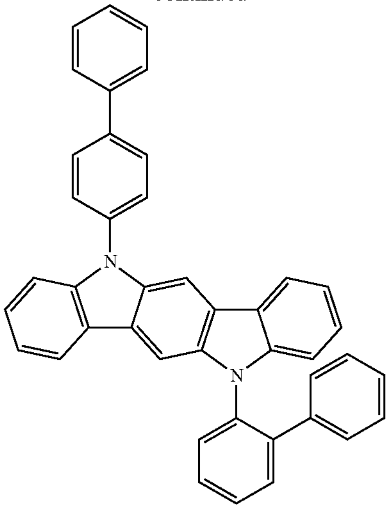
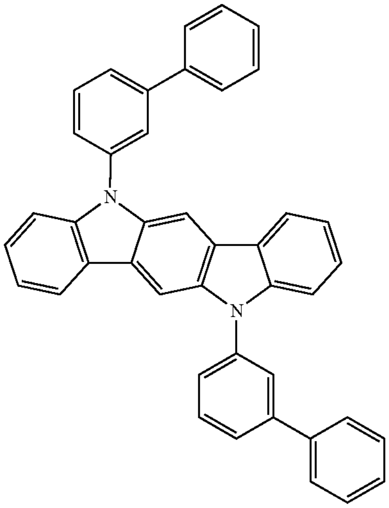
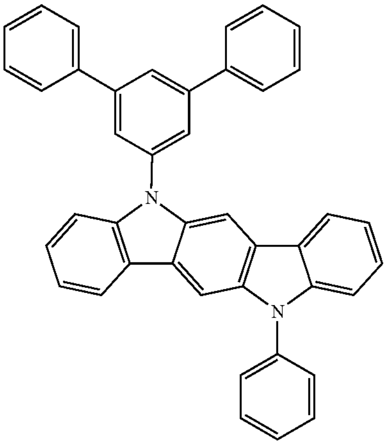

-continued
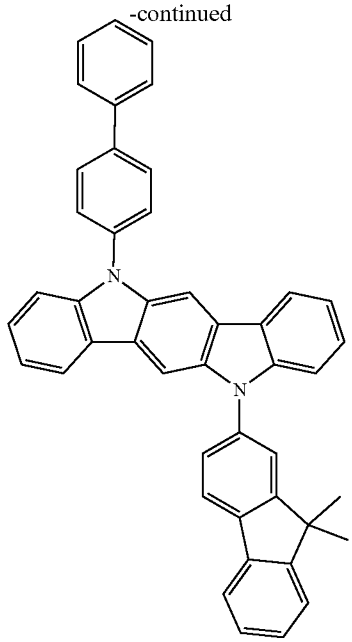
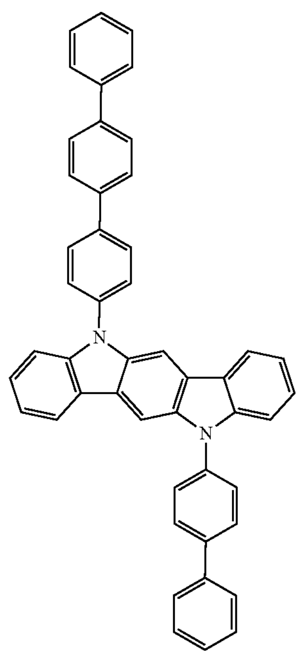
-continued
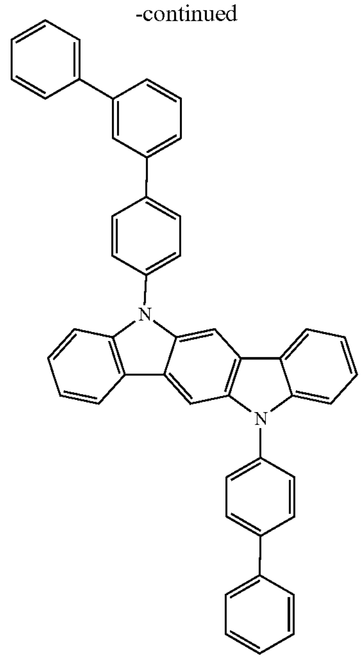
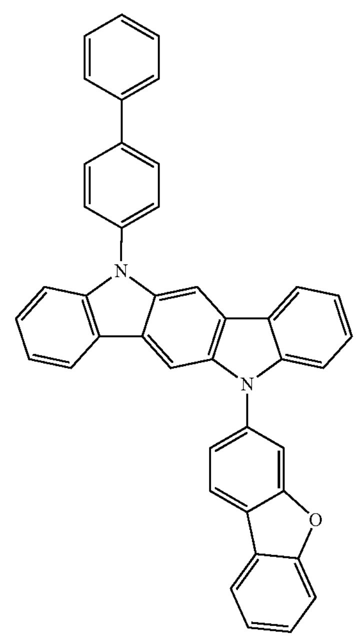

-continued
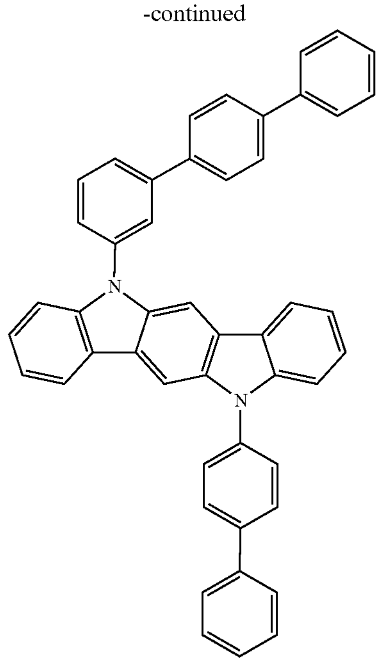
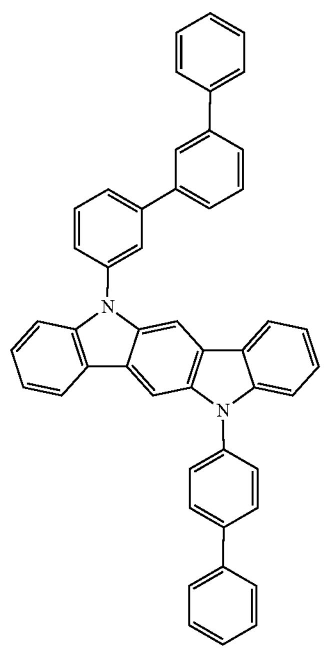
-continued
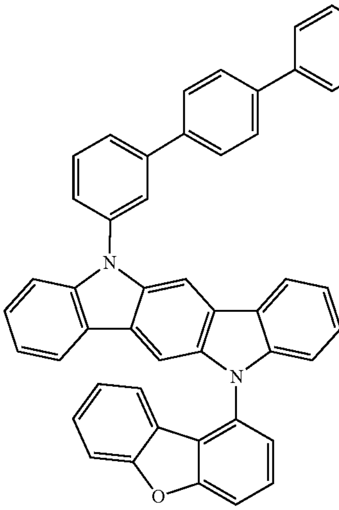
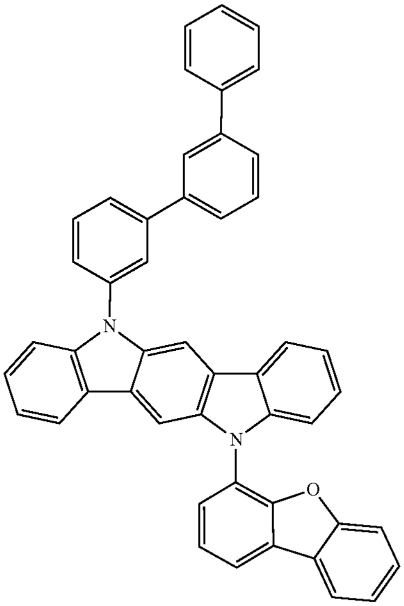
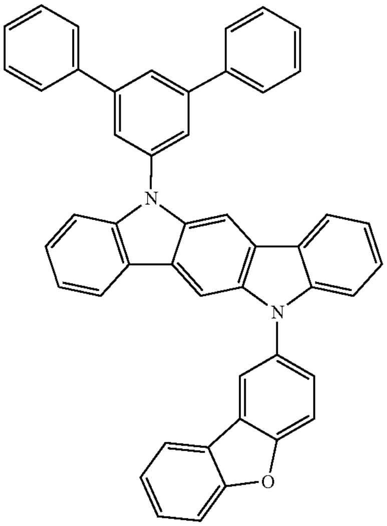

-continued
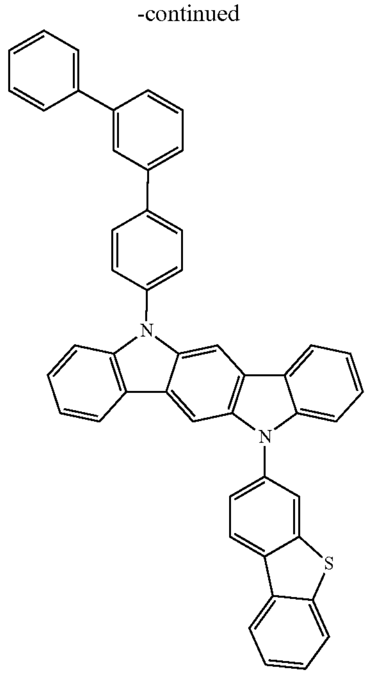
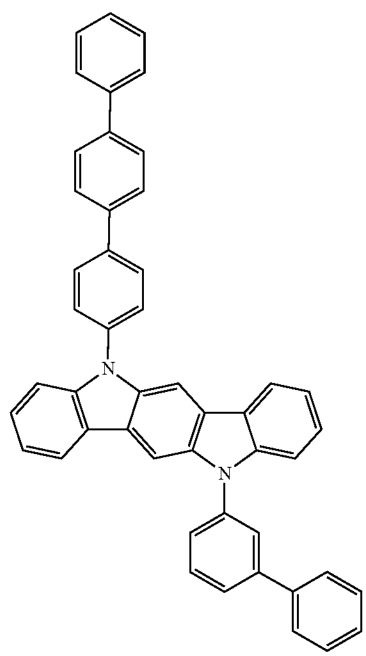
-continued
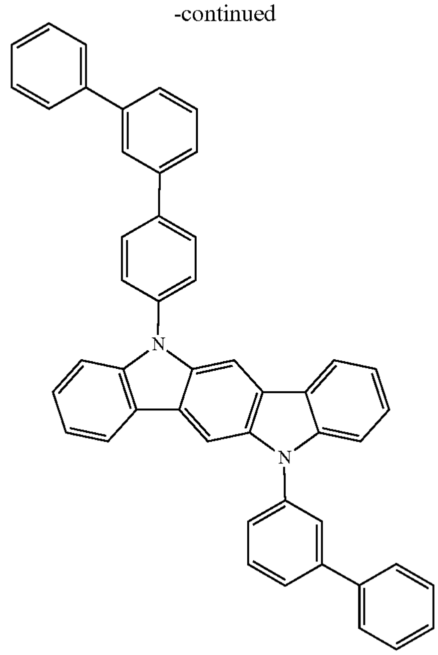
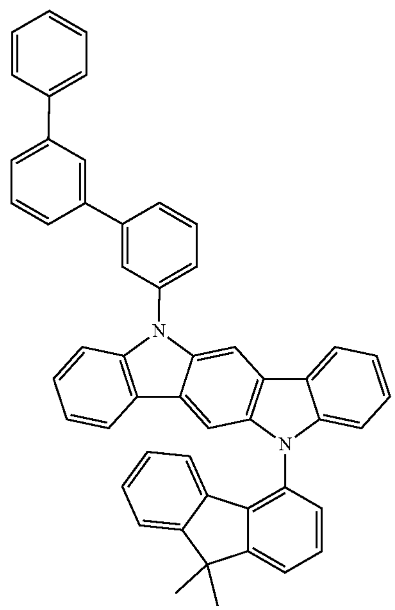

-continued
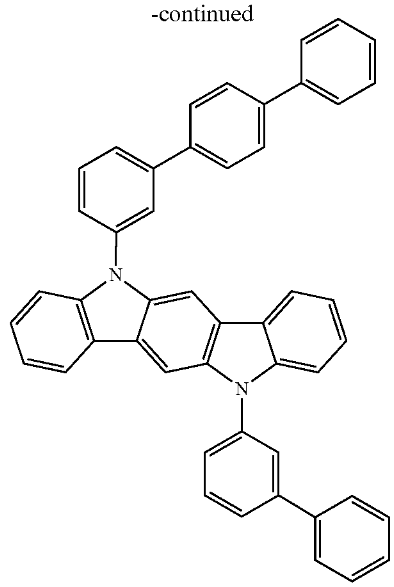
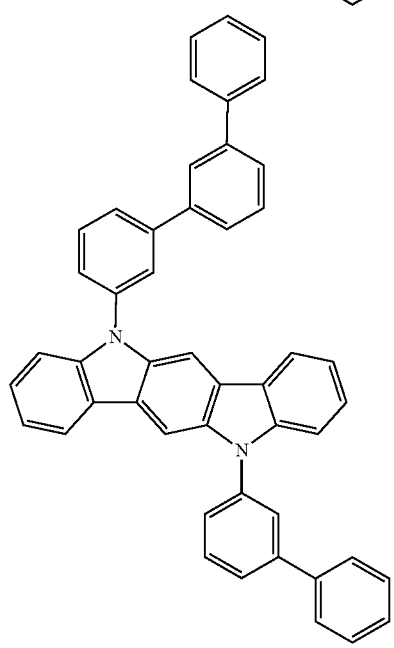
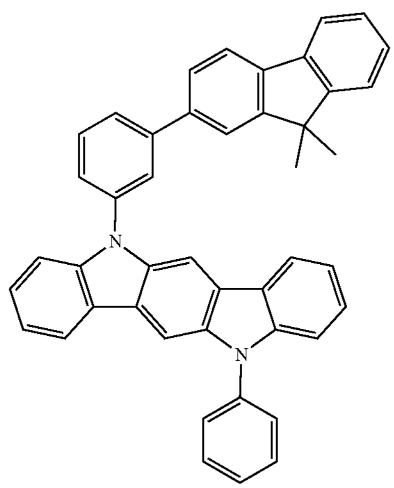
-continued
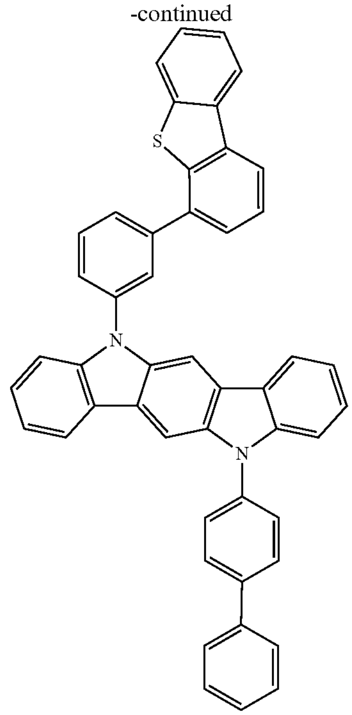
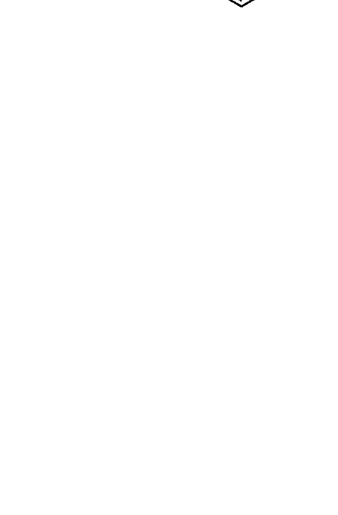
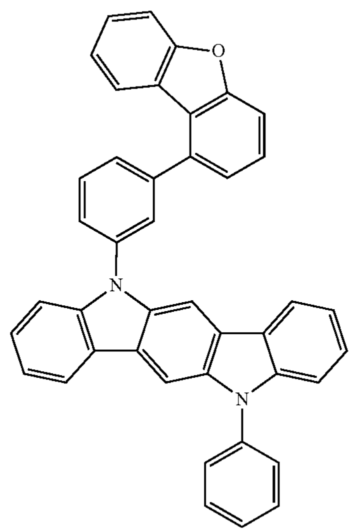

-continued
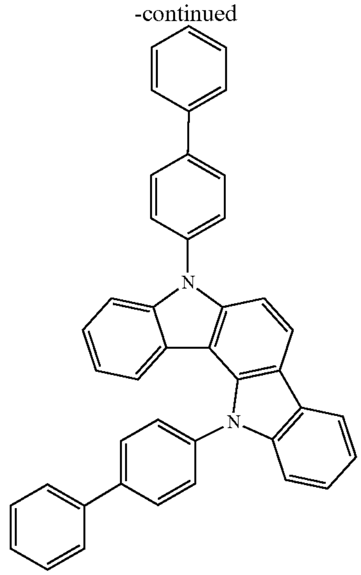
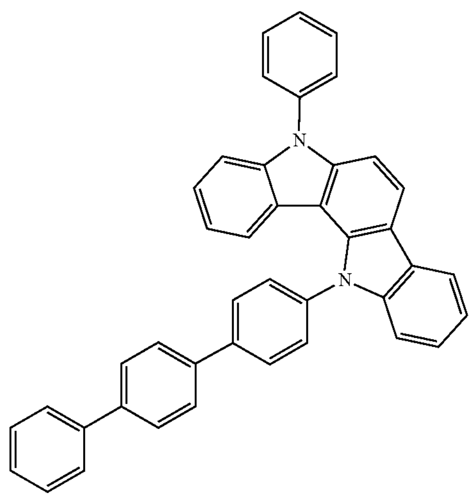
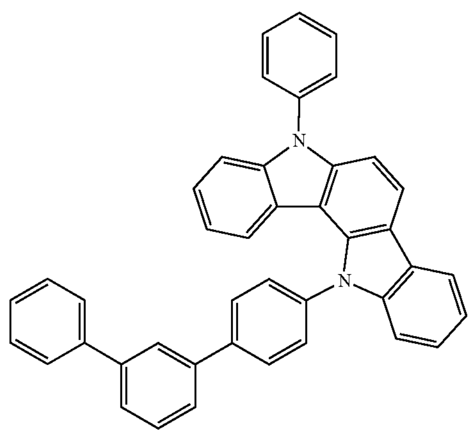
-continued
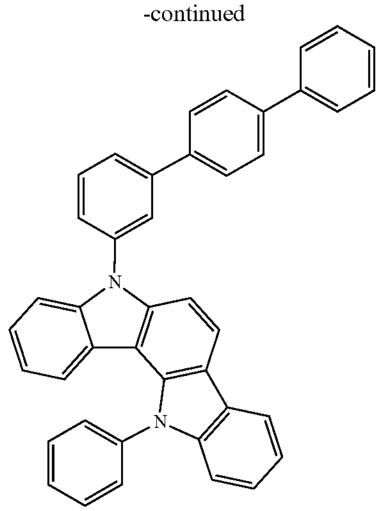
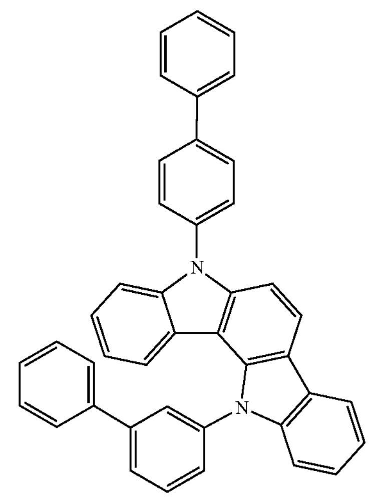
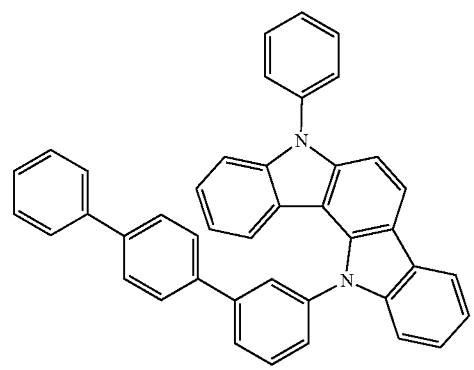
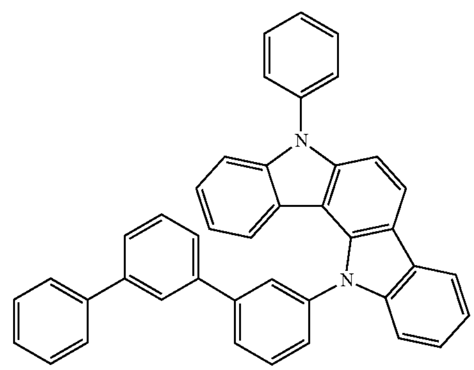

-continued
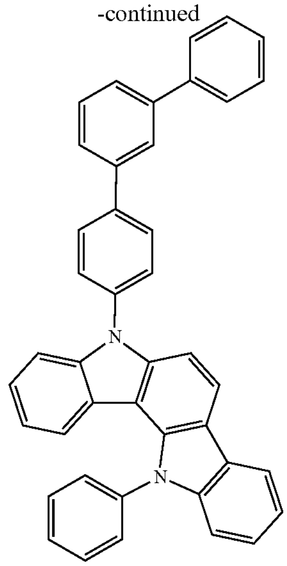
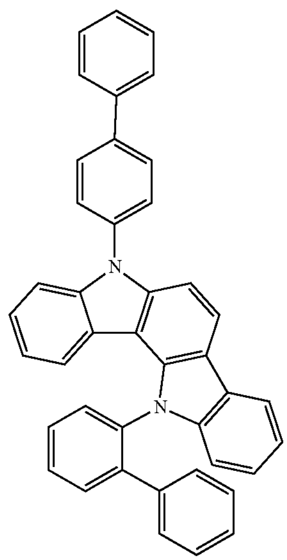
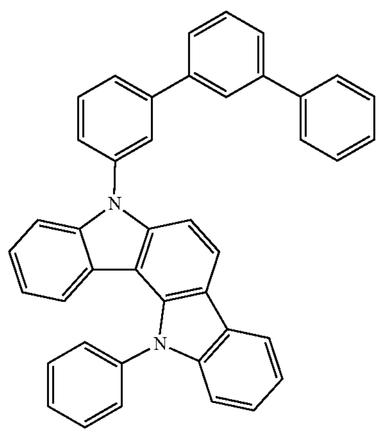
-continued
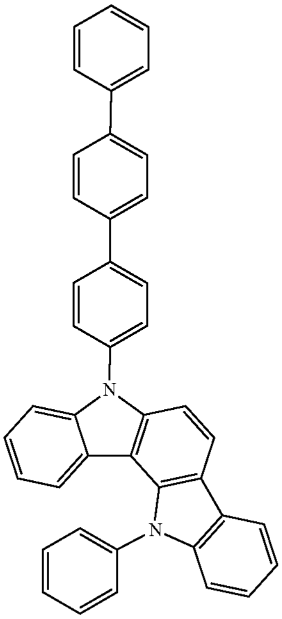
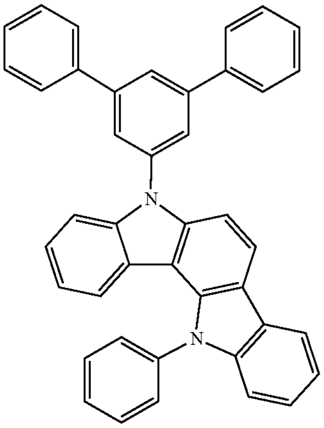
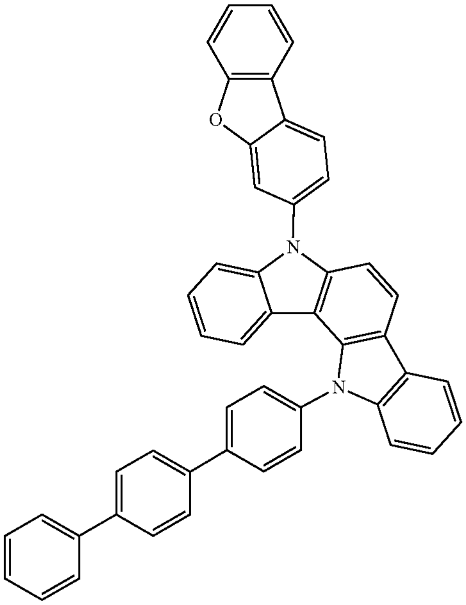

-continued
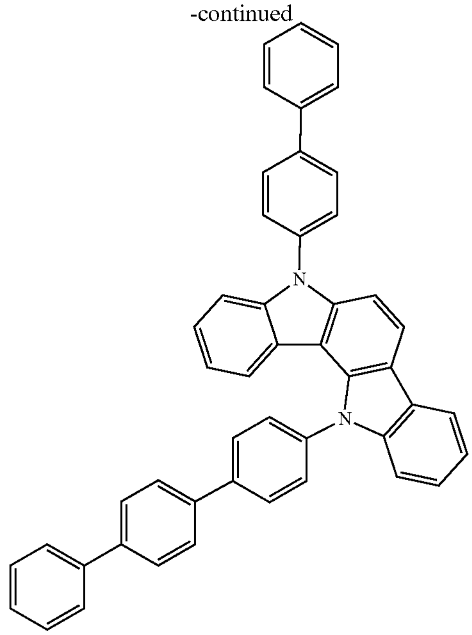
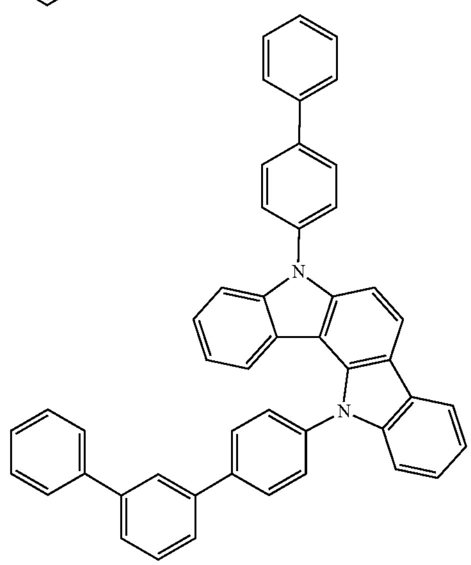
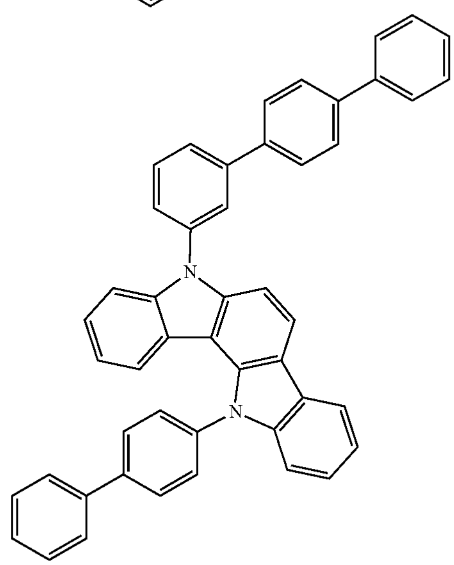
-continued
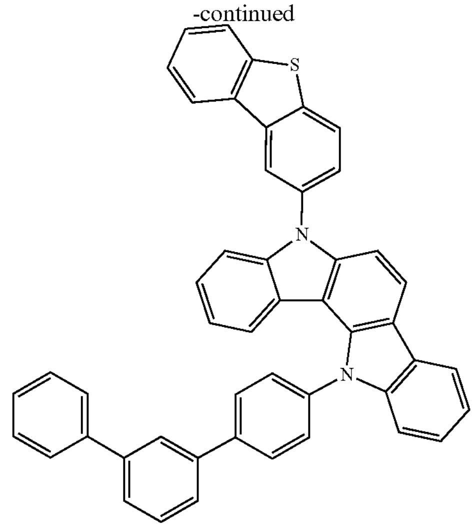
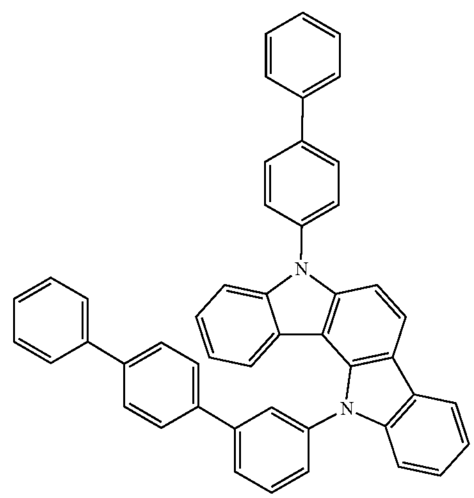
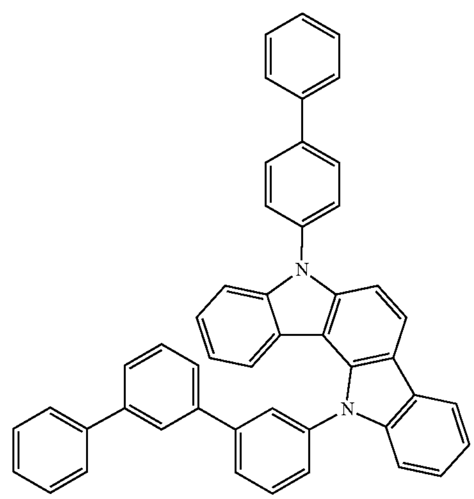

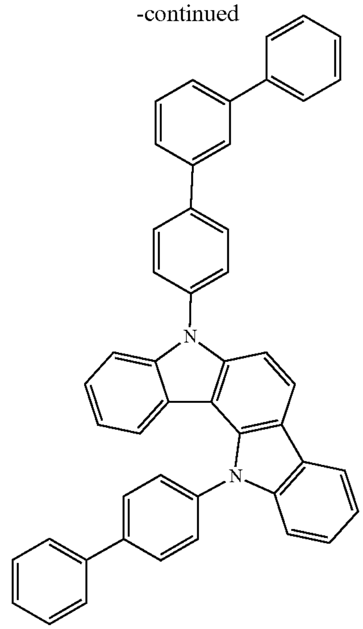
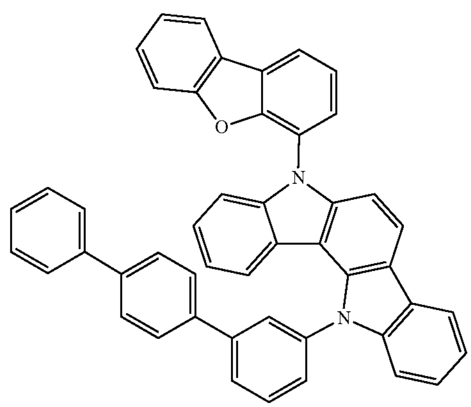
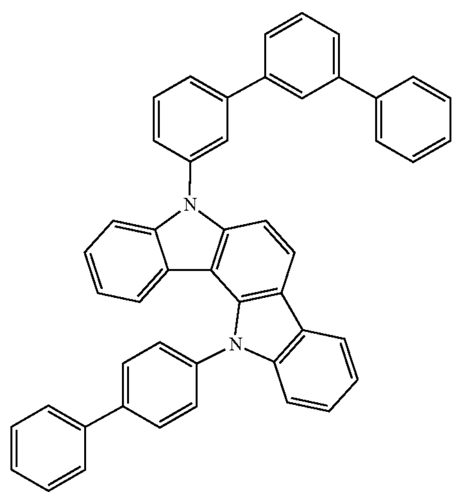
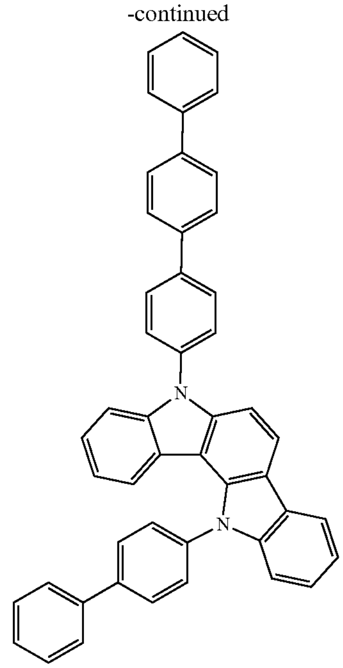
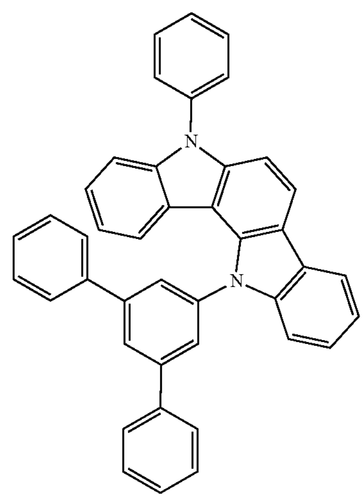
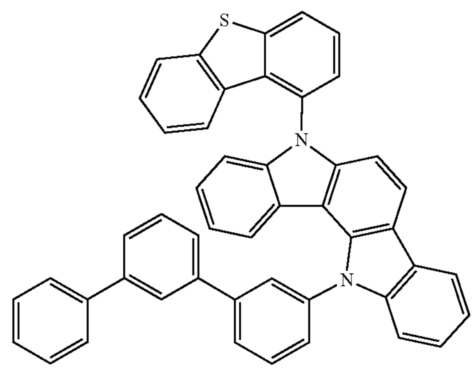

-continued
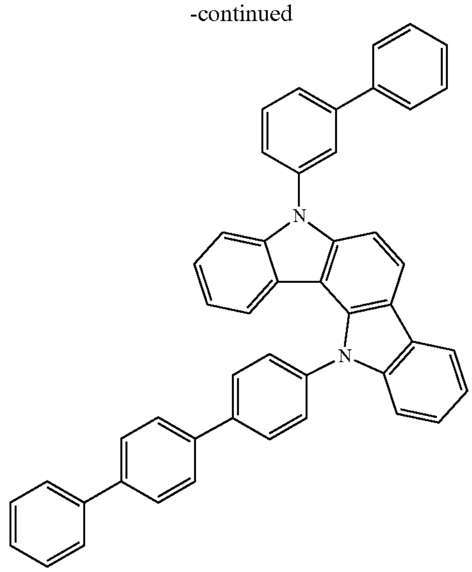
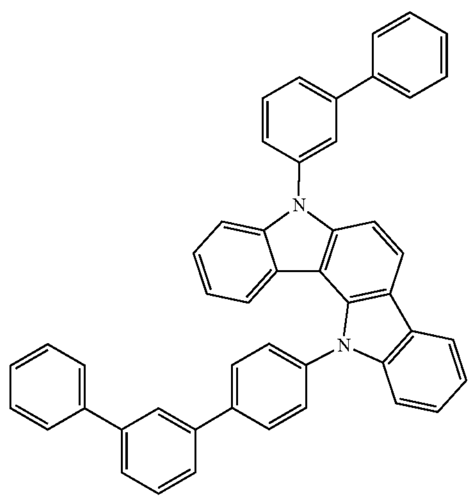
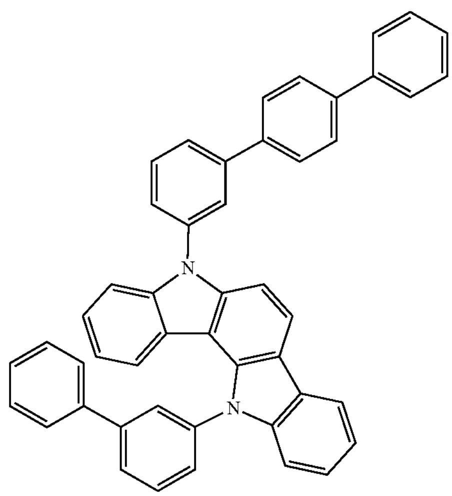
-continued
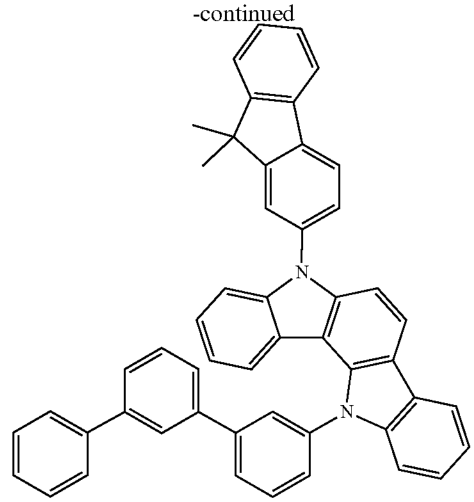
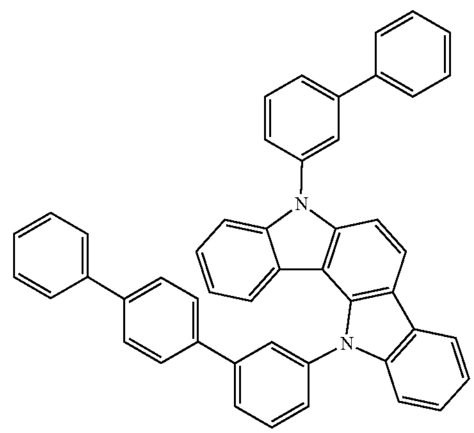
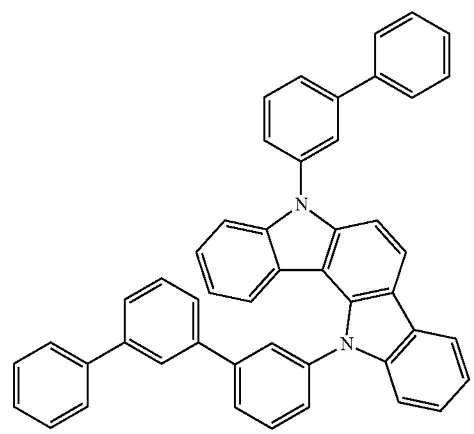

-continued
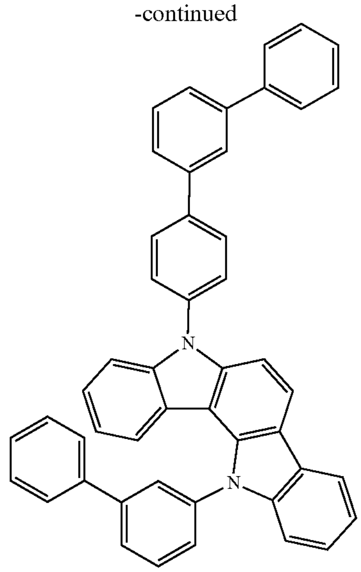
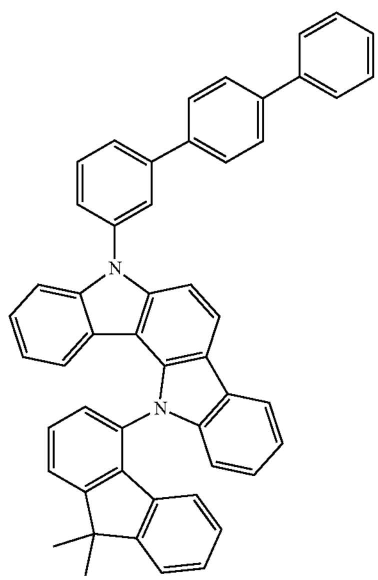
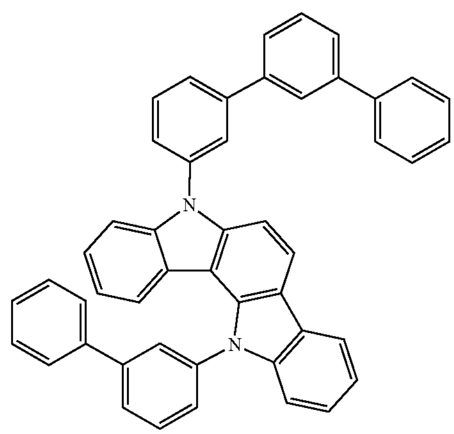
-continued
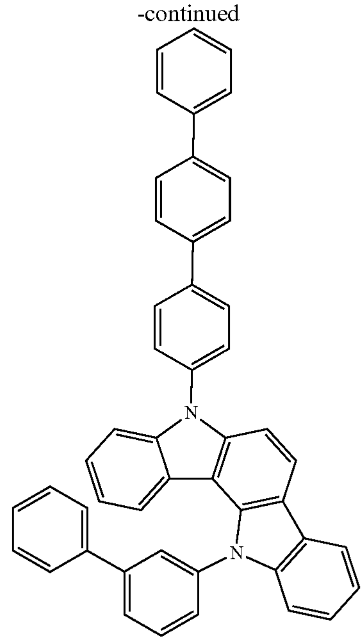
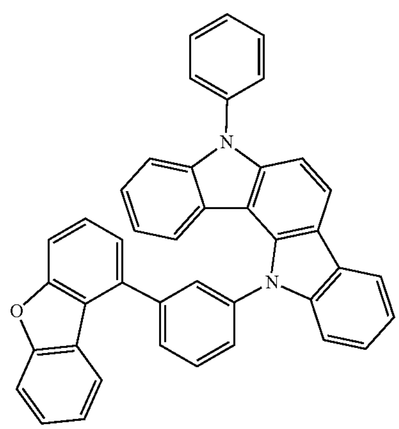
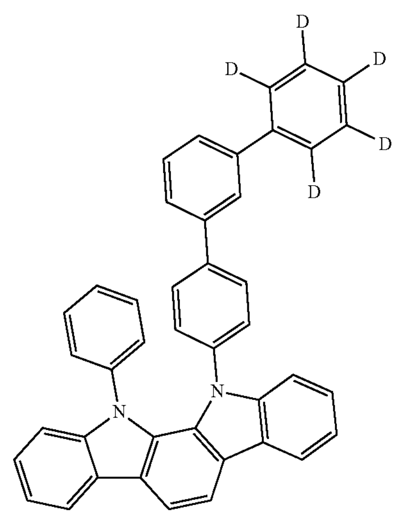

-continued
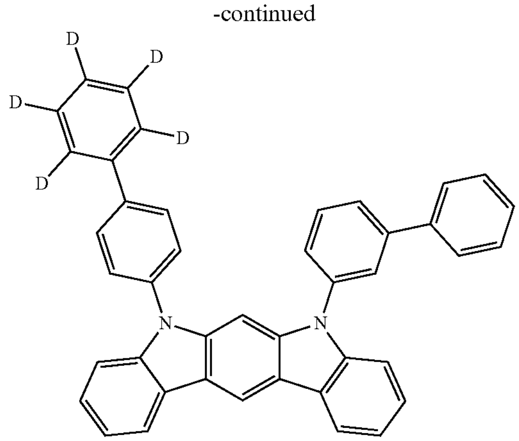
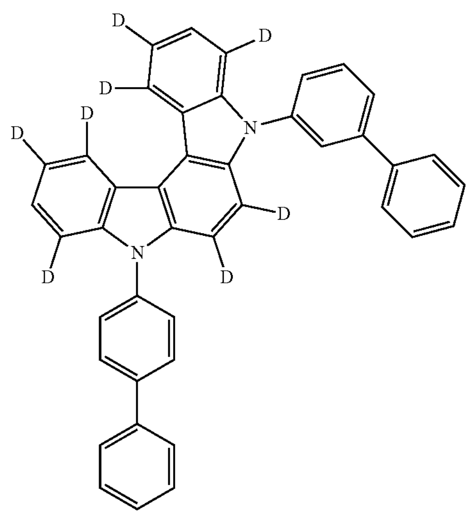
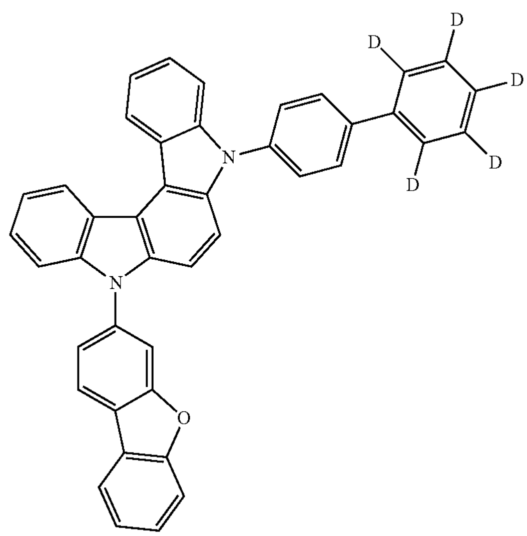
-continued
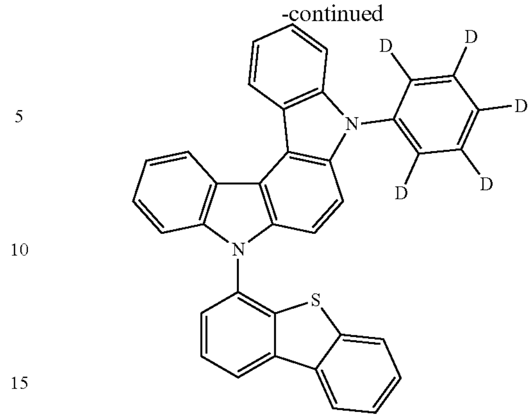
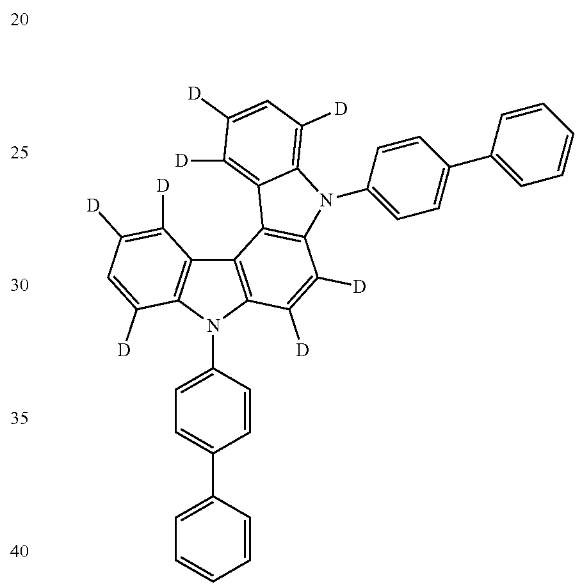
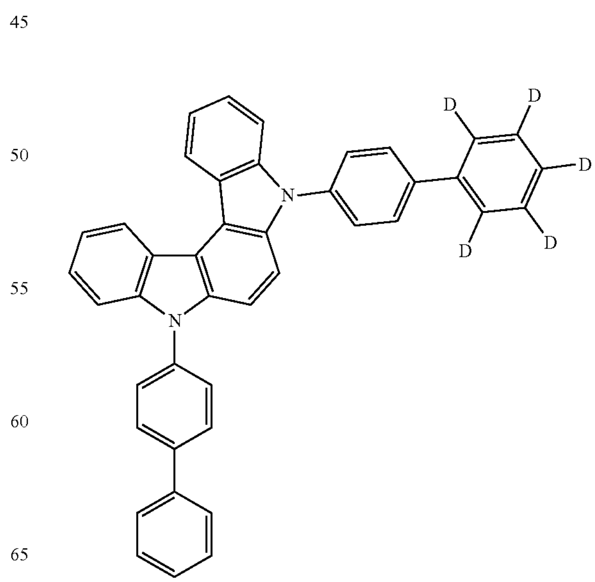

-continued

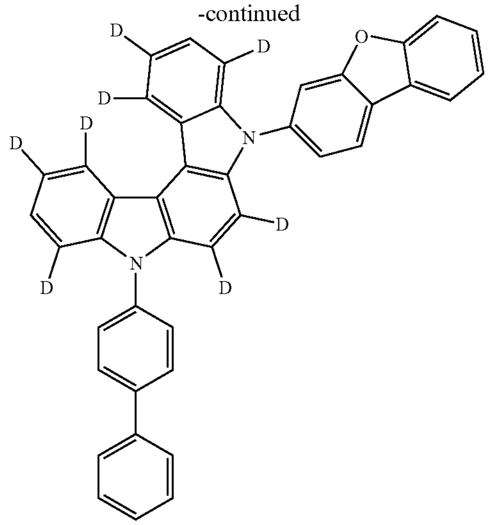

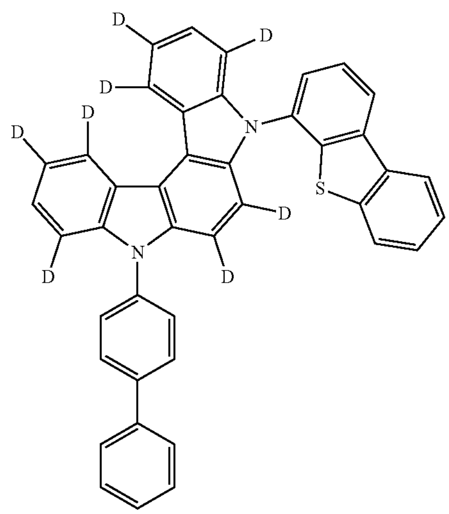

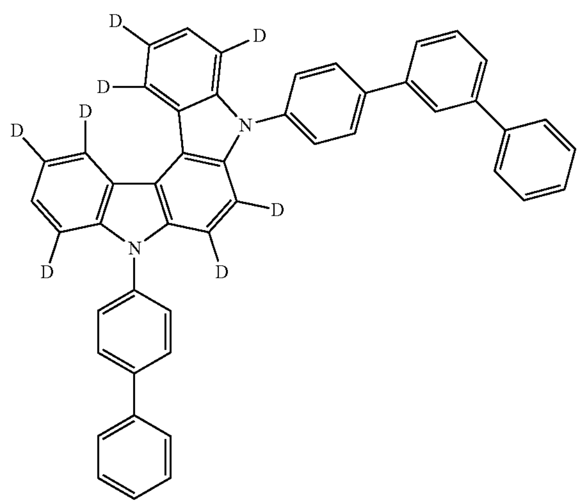

-continued

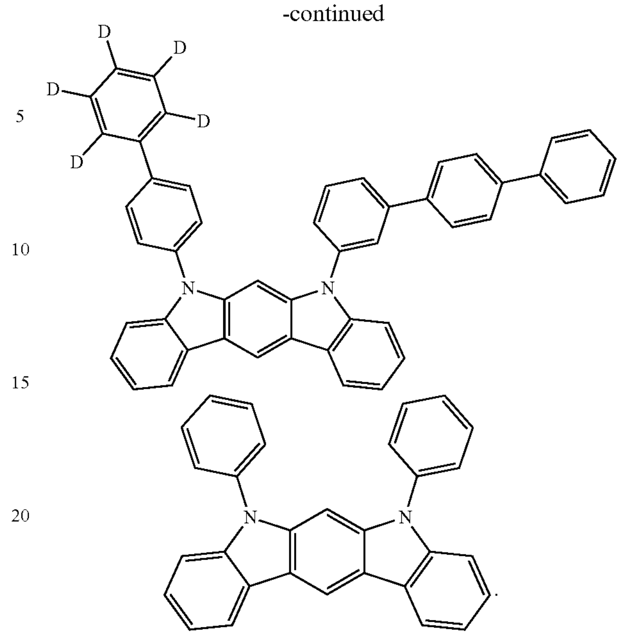

The compound of Chemical Formula 1 can be prepared, for example, by a preparation method as shown in the following Reaction Scheme 1, and the other remaining compound can be prepared in a similar manner.

[Reaction Scheme 1]

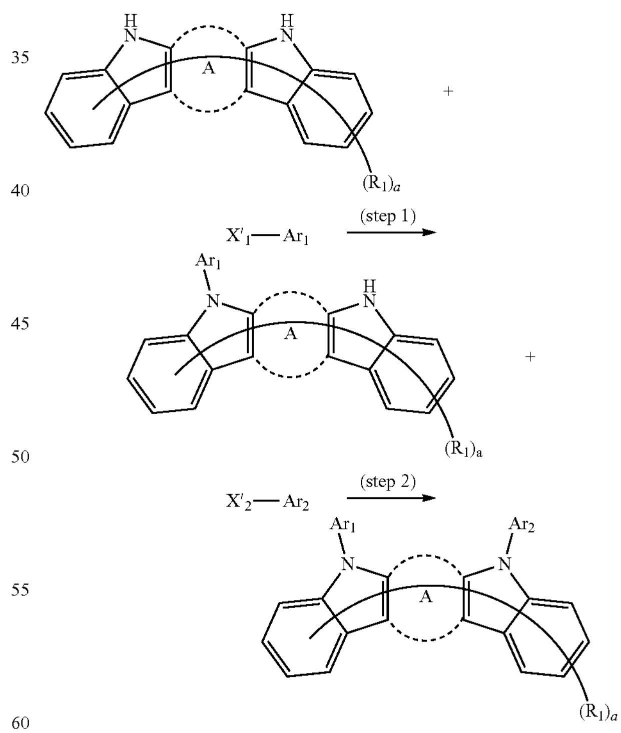

In Reaction Scheme 1, A, $Ar_1$, $Ar_2$, $R_1$ and a are as defined in Chemical Formula 1, $X'_1$ and $X'_2$ are each independently halogen, and more preferably, $X'_1$ and $X'_2$ are each independently chloro or bromo.

Steps 1 and 2 of Reaction Scheme 1 are amine substitution reactions which are preferably carried out in the presence of a palladium catalyst and a base, and a reactive group for the amine substitution reaction can be modified as known in the art. The above preparation method can be further embodied in Preparation Examples described hereinafter.

Preferably, the Chemical Formula 2 can be the following Chemical Formula 2-1:

[Chemical Formula 2-1]

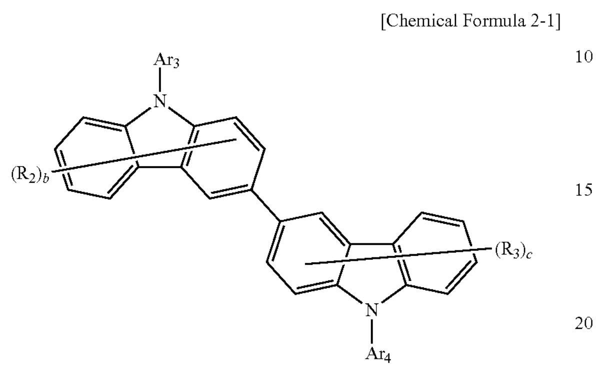

wherein in Chemical Formula 2-1:

$Ar_3$, $Ar_4$, $R_2$, $R_3$, b and c are as defined in Chemical Formula 2.

Preferably, $Ar_3$ and $Ar_4$ can be each independently a substituted or unsubstituted $C_{6-20}$ aryl or a substituted or unsubstituted $C_{2-20}$ heteroaryl containing any one or more heteroatoms selected from the group consisting of N, O and S.

More preferably, $Ar_3$ and $Ar_4$ can be each independently phenyl, biphenylyl, phenyl biphenylyl, terphenylyl, naphthyl, dimethylfluorenyl, dibenzofuranyl, dibenzothiophenyl, or phenyl substituted with 5 deuterium, biphenylyl substituted with 1 to 5 deuteriums.

Preferably, $R_2$ and $R_3$ can be each independently hydrogen, deuterium, a substituted or unsubstituted $C_{1-10}$ alkyl, a substituted or unsubstituted $C_{6-20}$ aryl, or a substituted or unsubstituted $C_{2-20}$ heteroaryl containing any one or more heteroatoms selected from the group consisting of N, O and S.

More preferably, $R_2$ and $R_3$ can be each independently hydrogen, deuterium or phenyl.

Preferably, b and c can be each independently 0, 1 or 5.

Representative examples of the compound of Chemical Formula 2 are as follows:

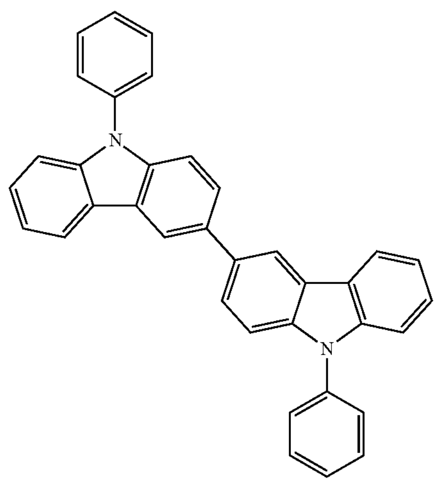

-continued

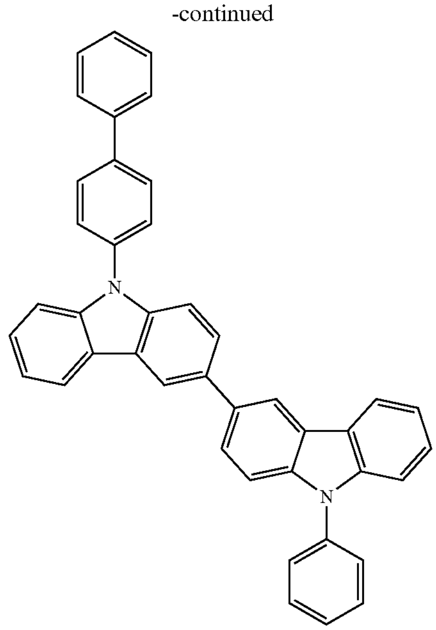

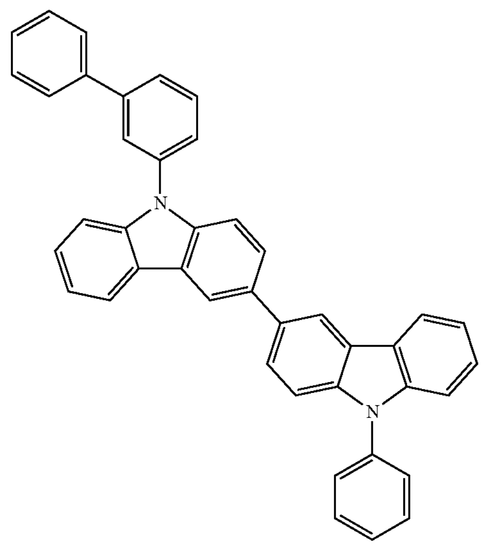

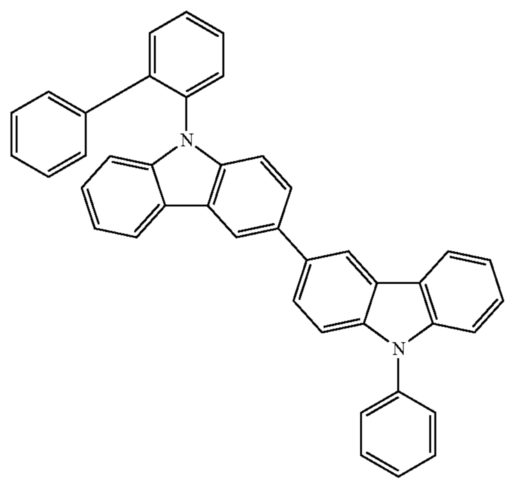

-continued
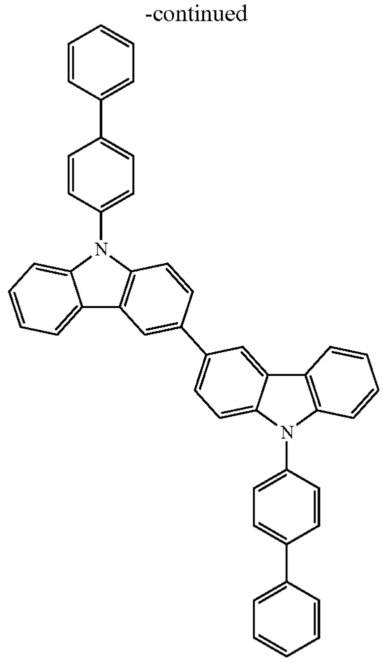
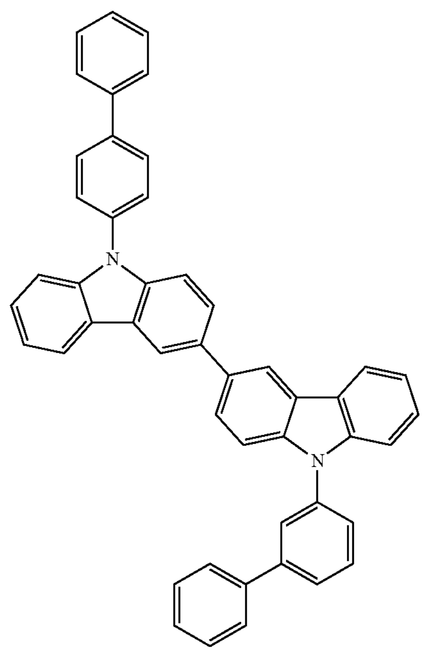
-continued
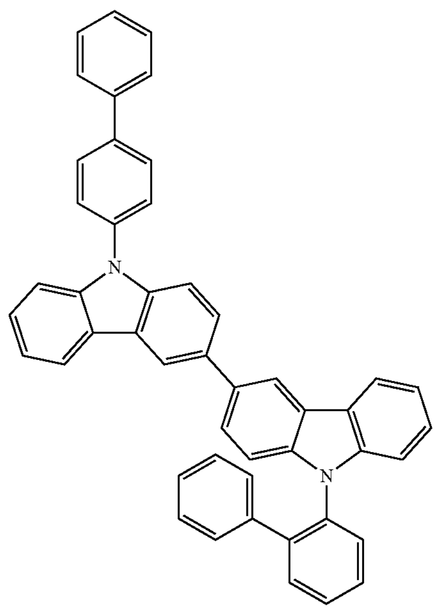
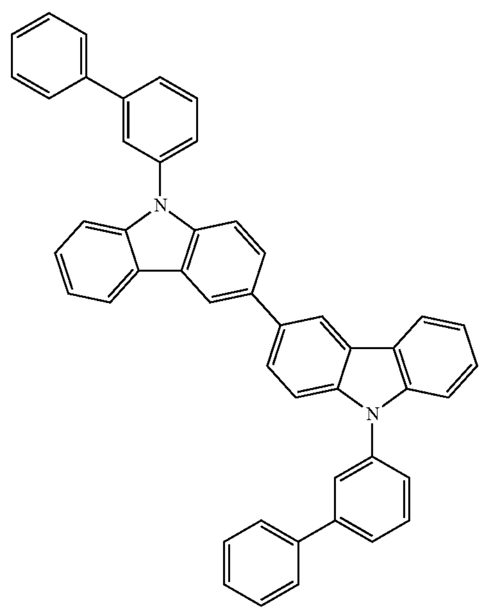

-continued
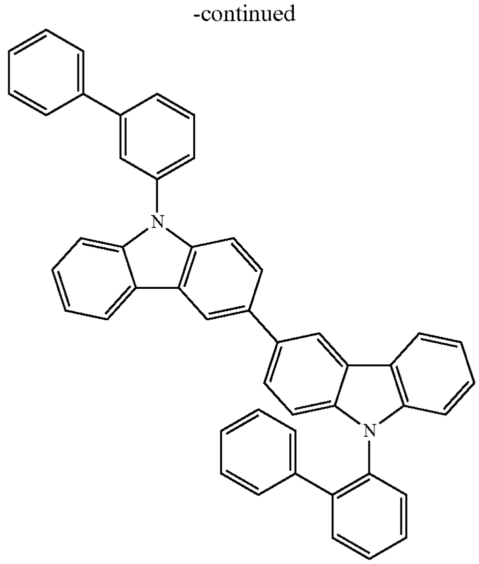
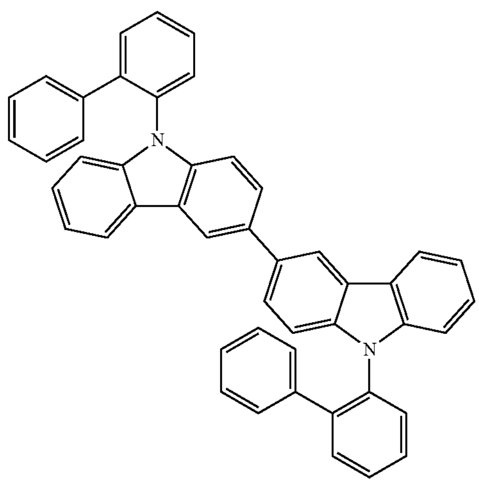
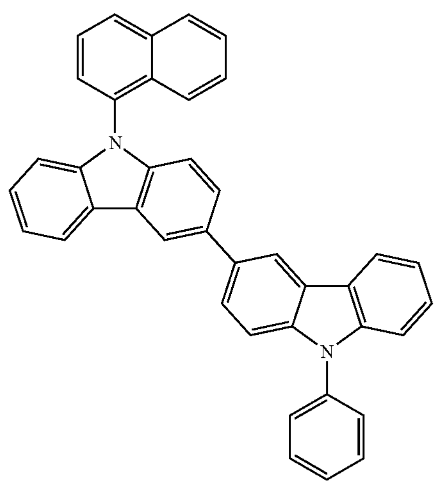
-continued
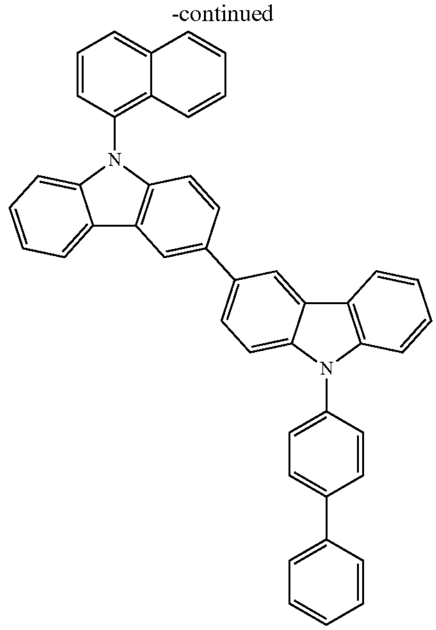
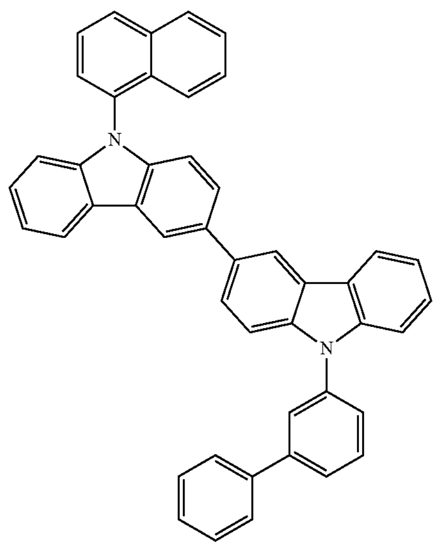
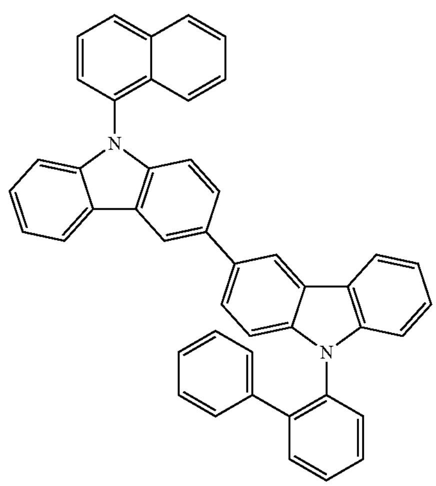

-continued
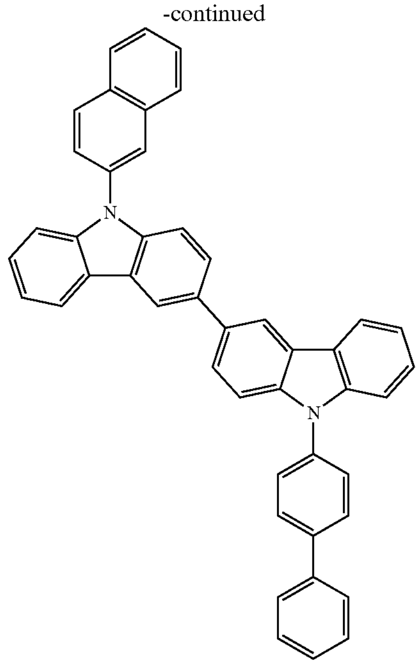
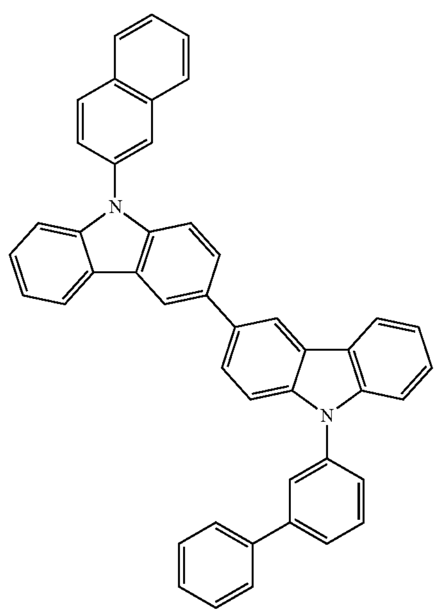
-continued
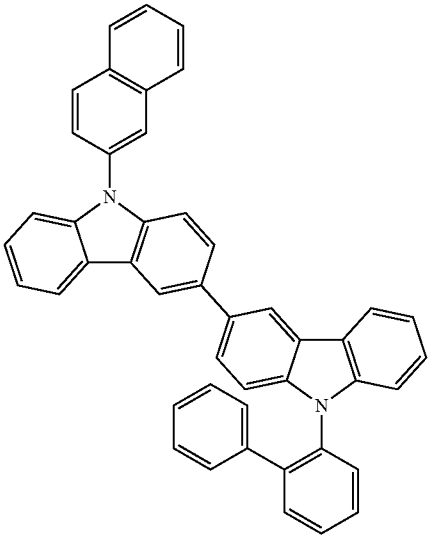
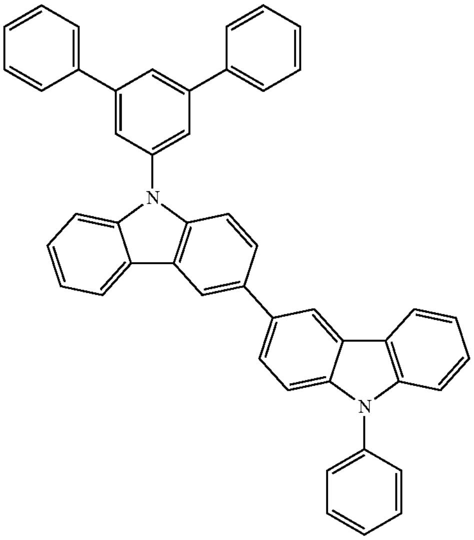
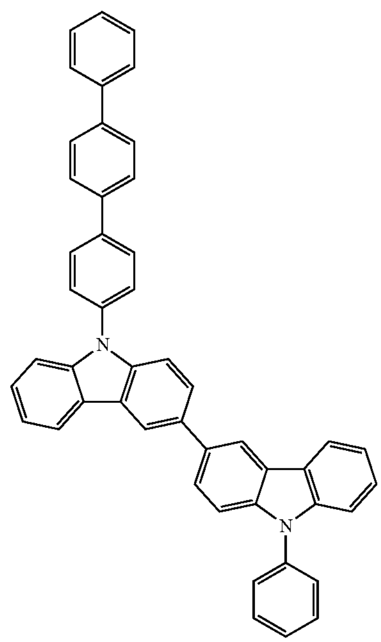

-continued
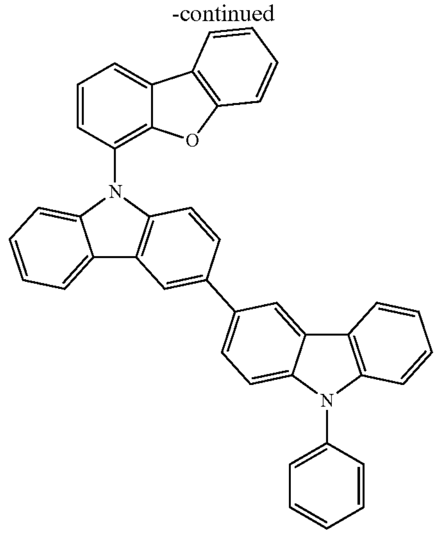
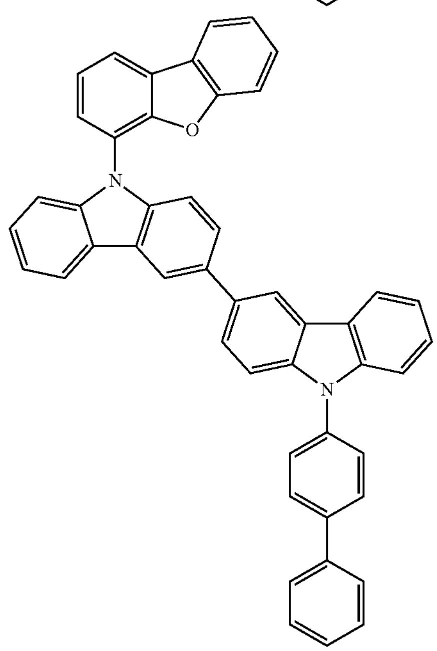
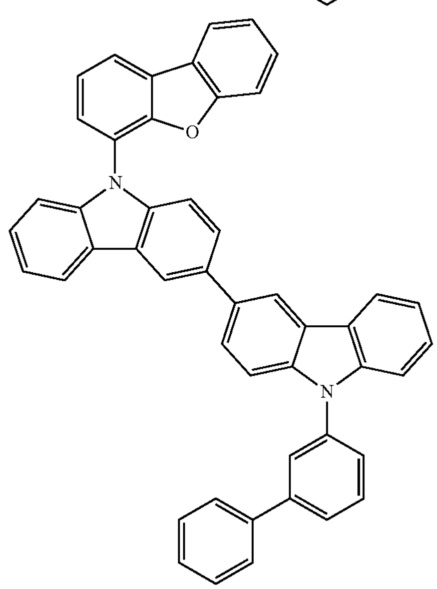
-continued
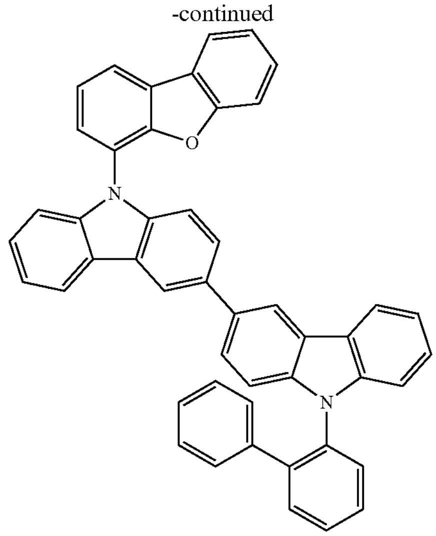
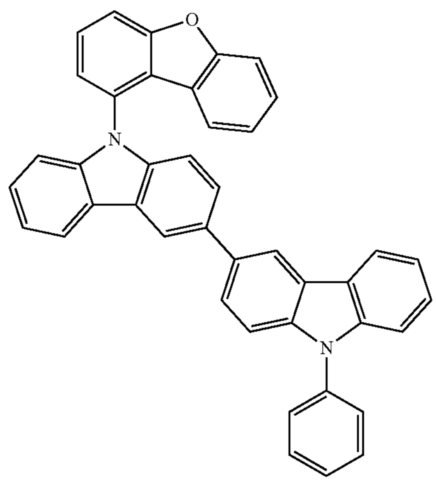
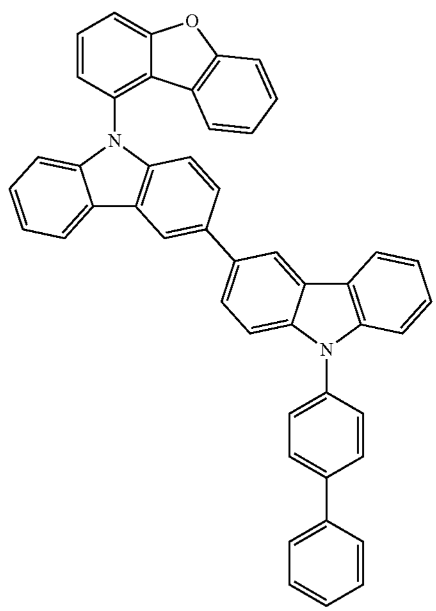

-continued
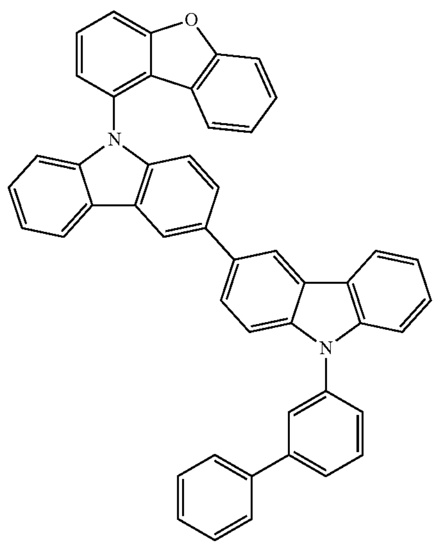
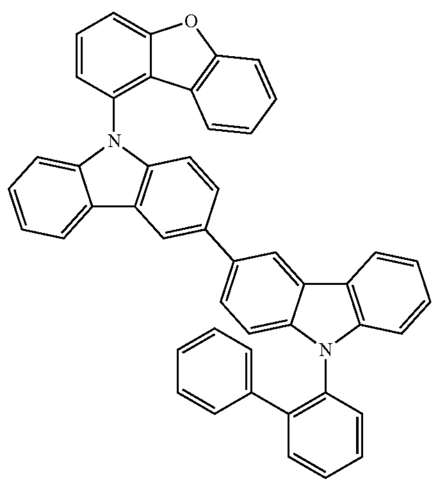
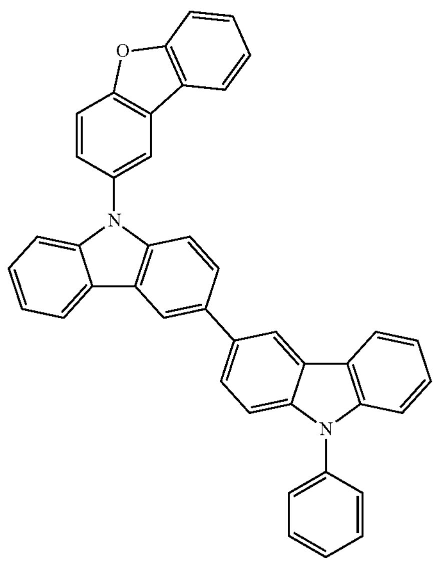
-continued
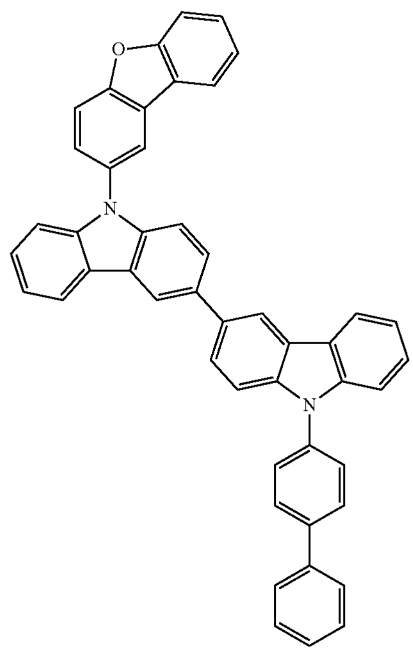
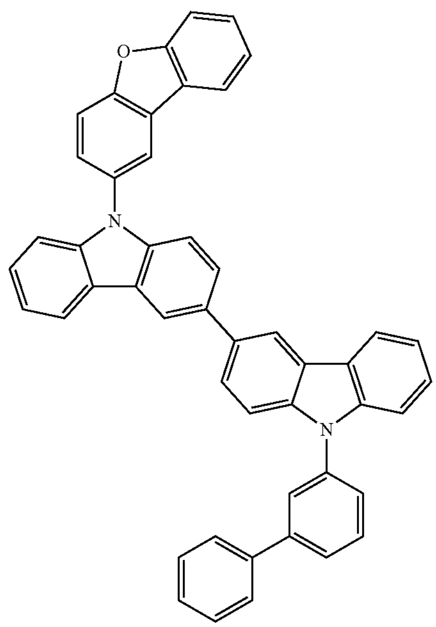

-continued
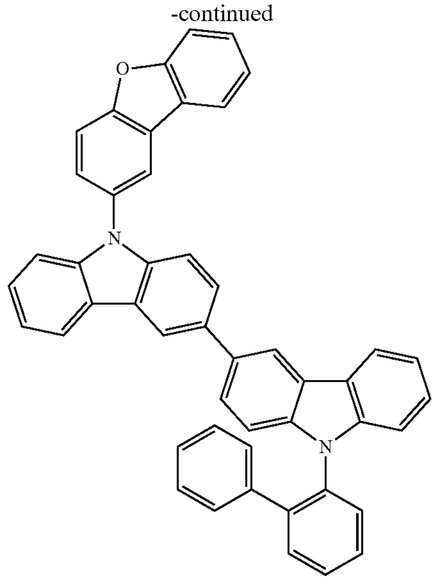
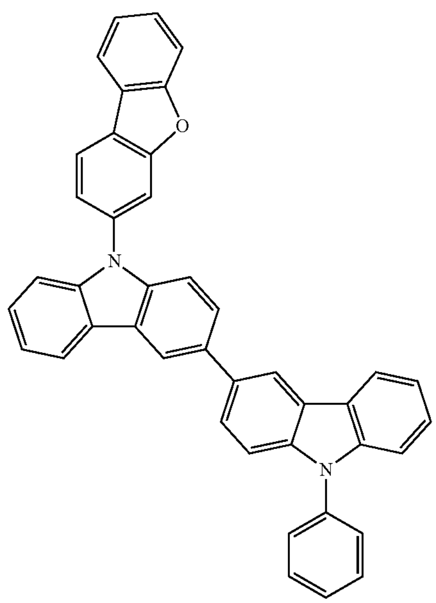
-continued
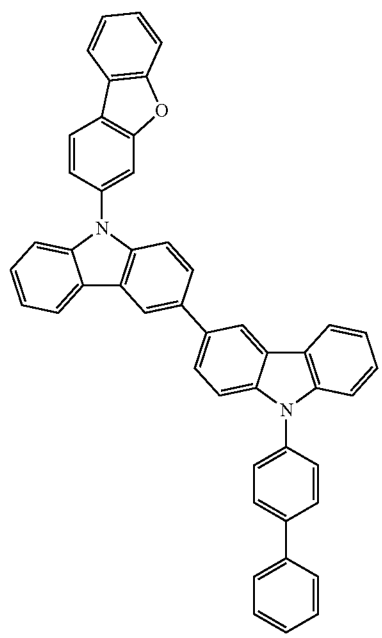
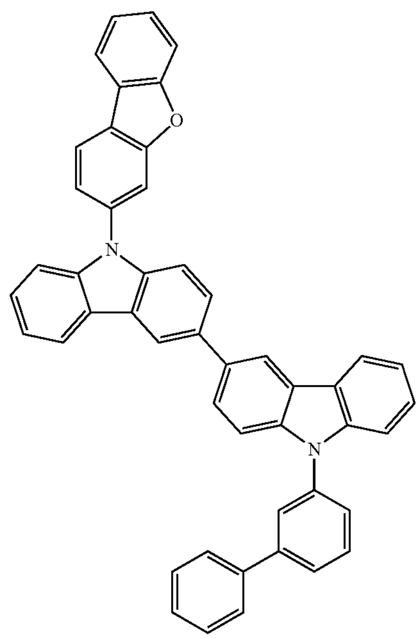

-continued
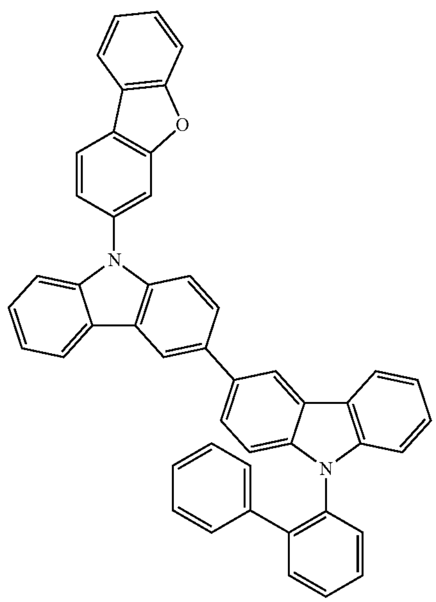
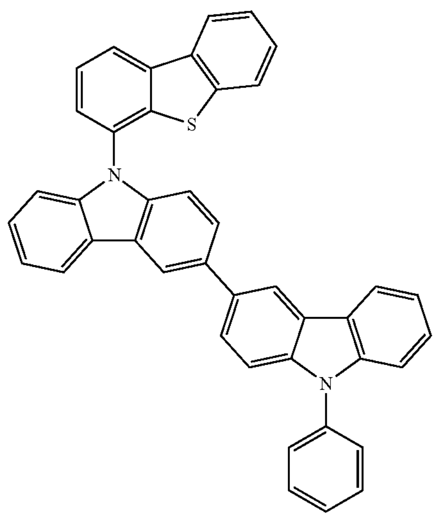
-continued
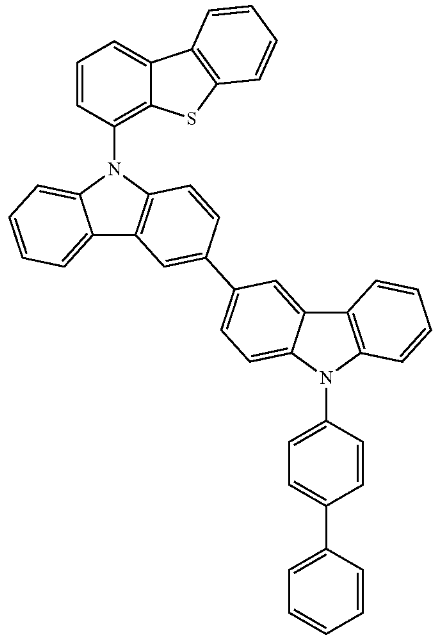
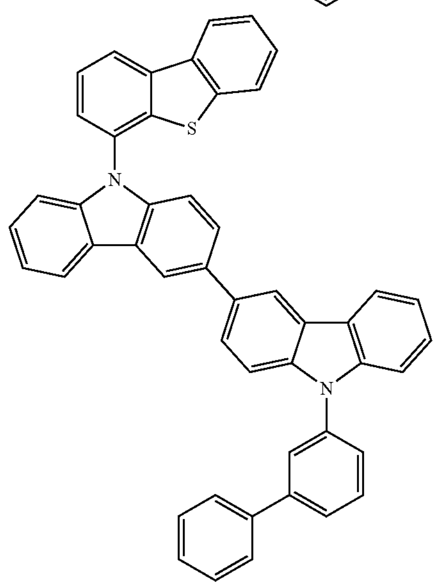
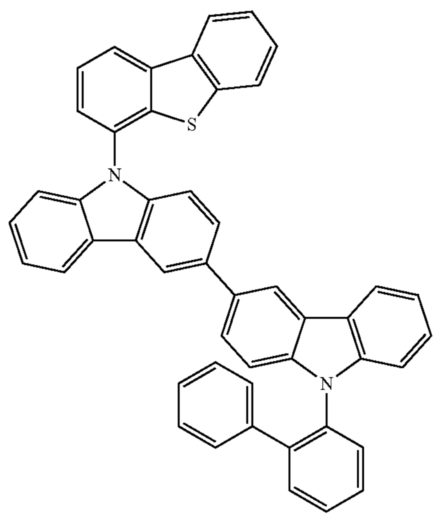

-continued
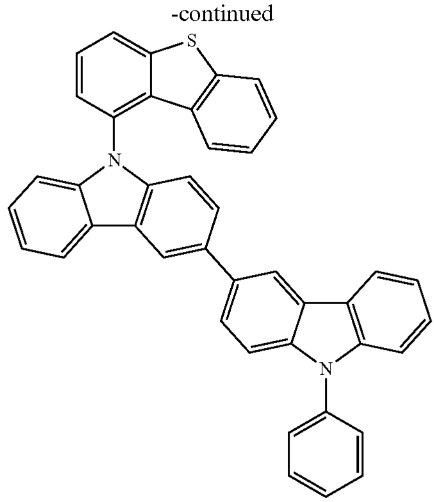
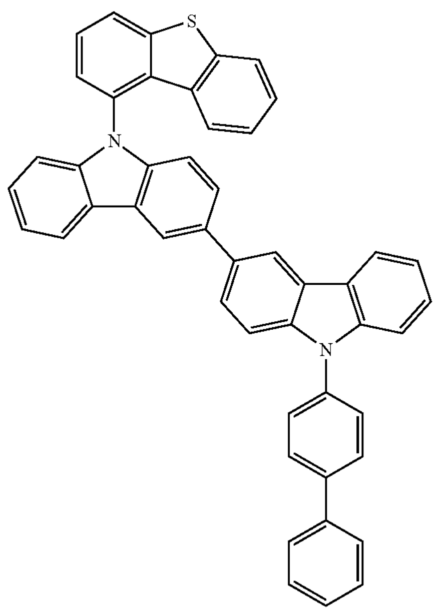
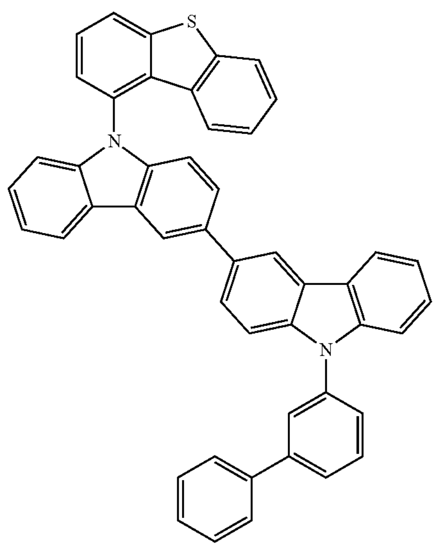
-continued
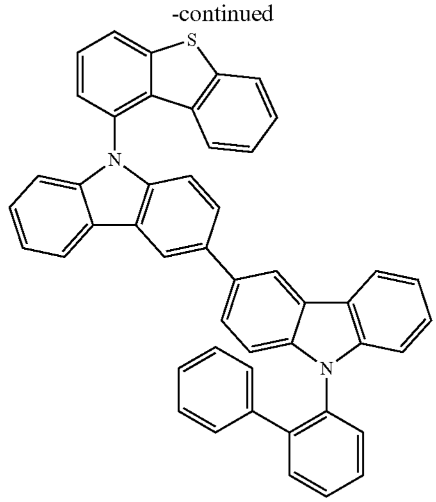
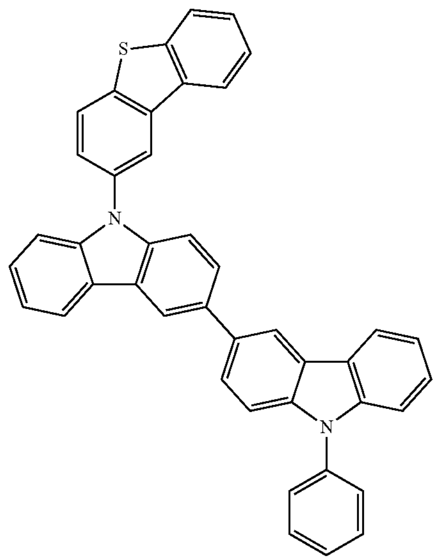
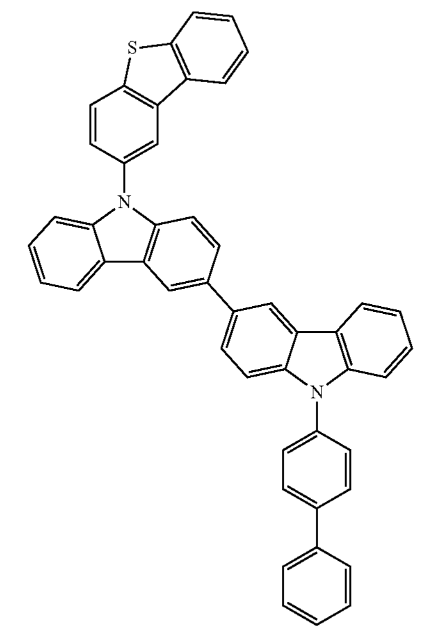

-continued
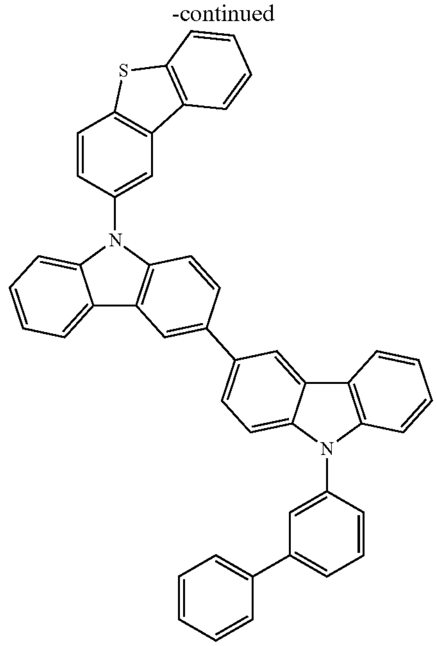
-continued
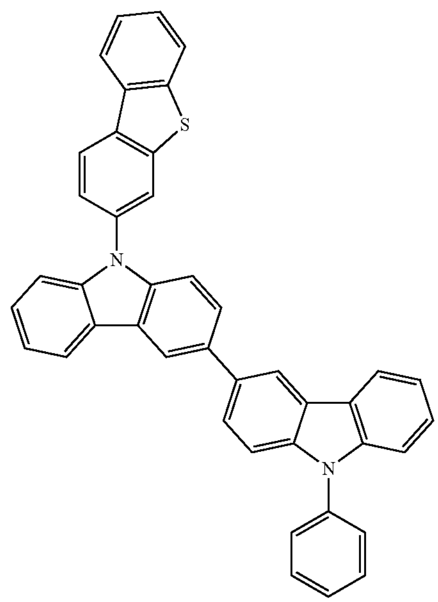
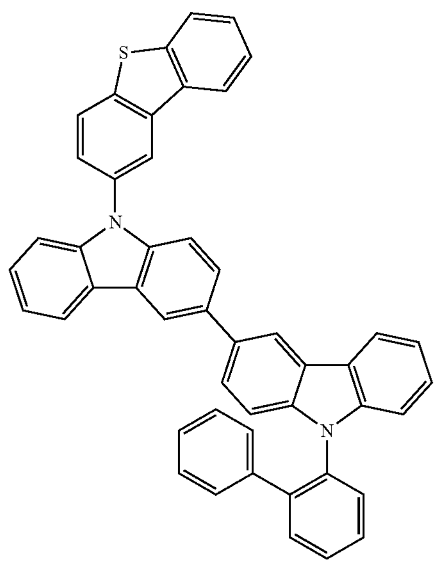
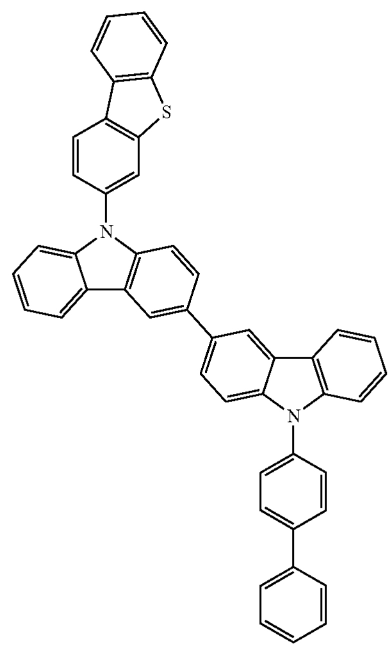

-continued
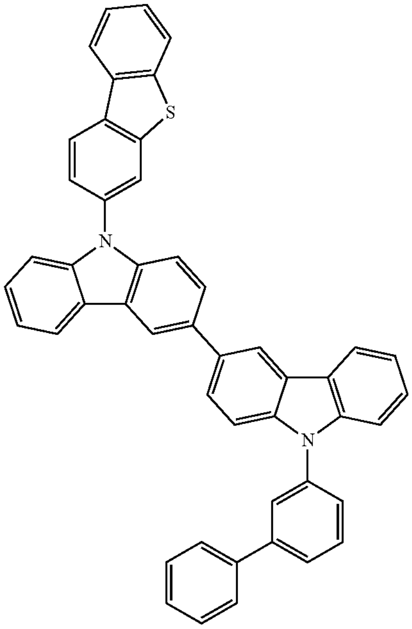
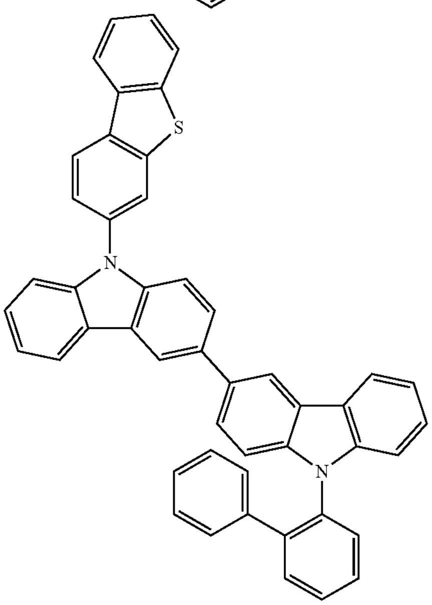
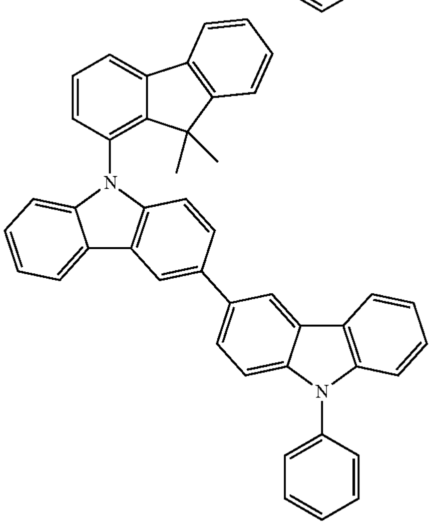
-continued
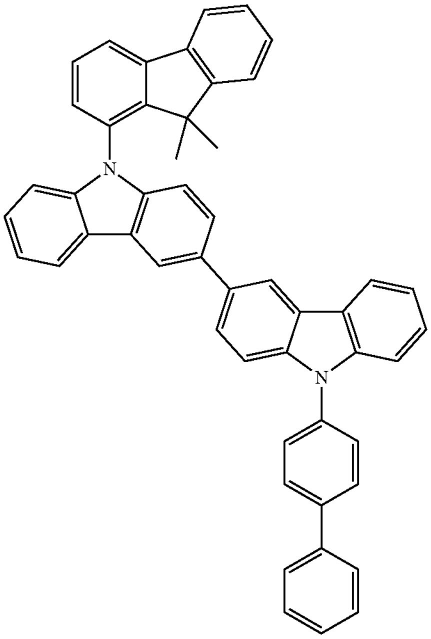
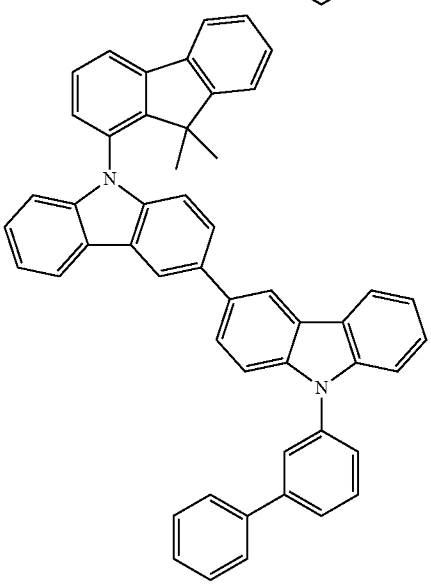
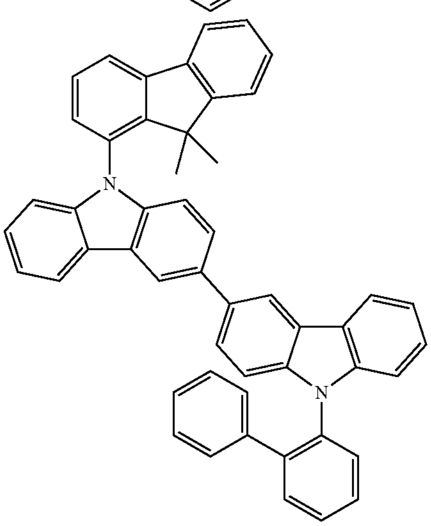

-continued
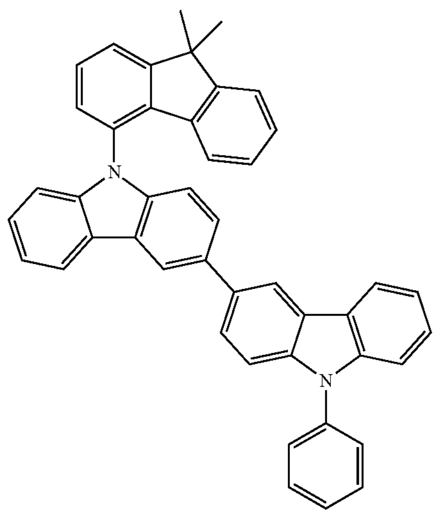
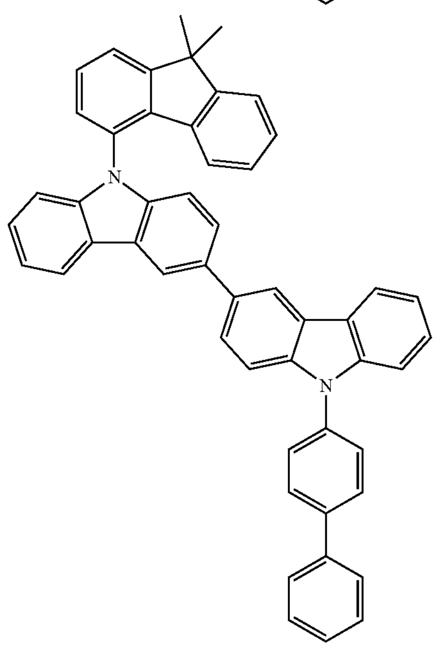
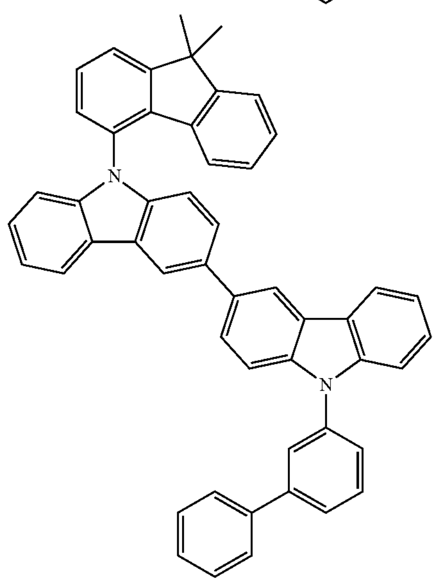
-continued
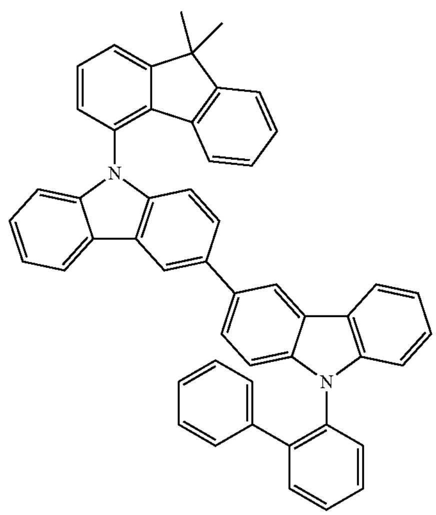
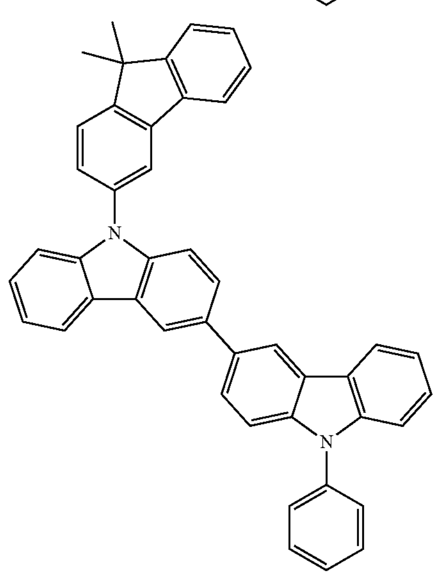
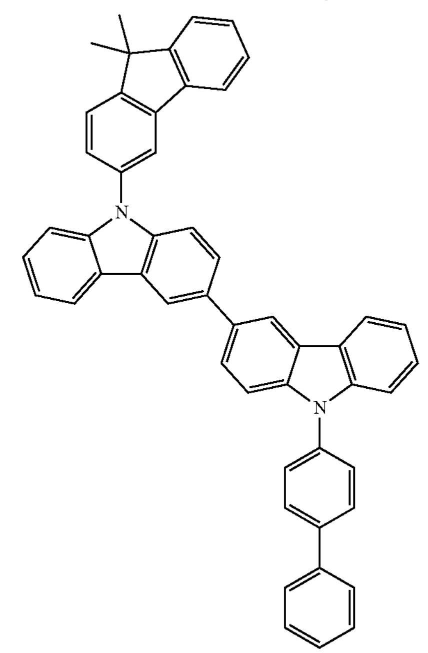

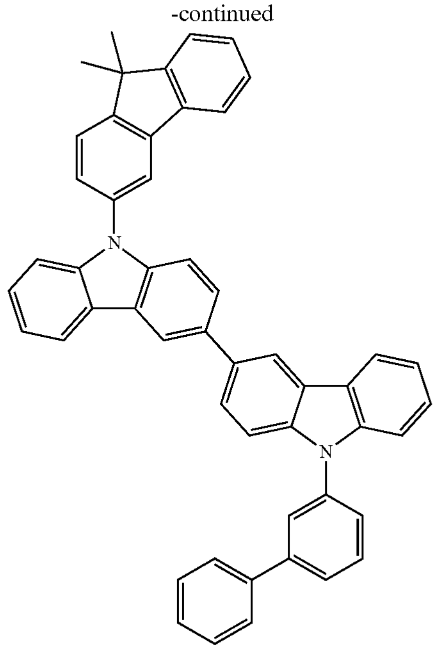
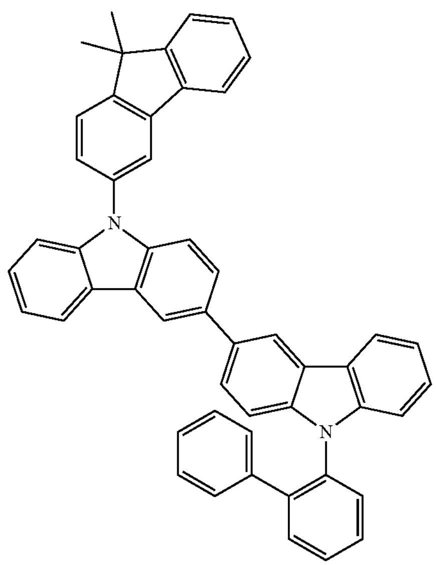
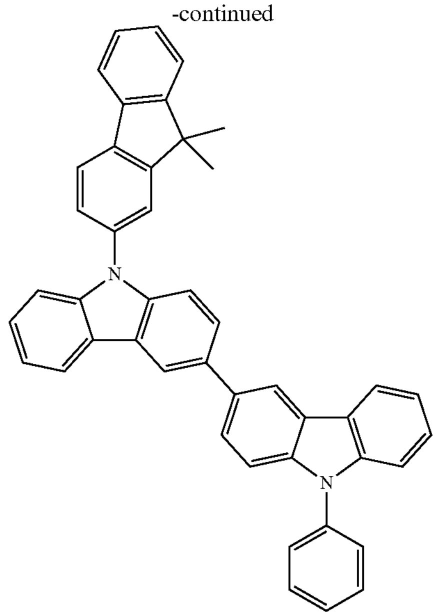
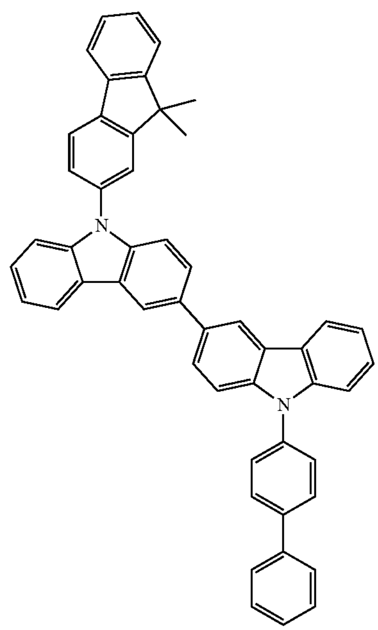

-continued
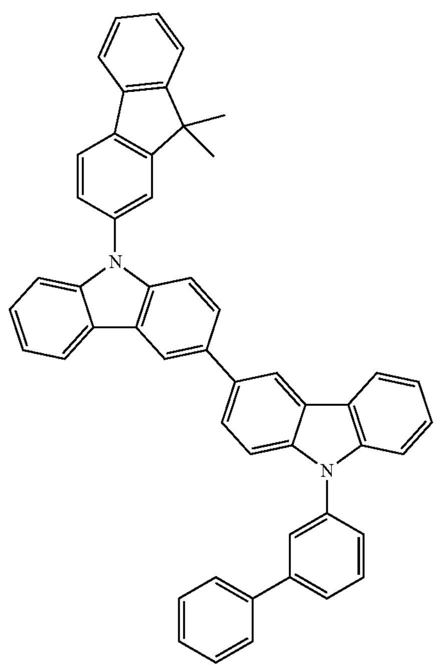
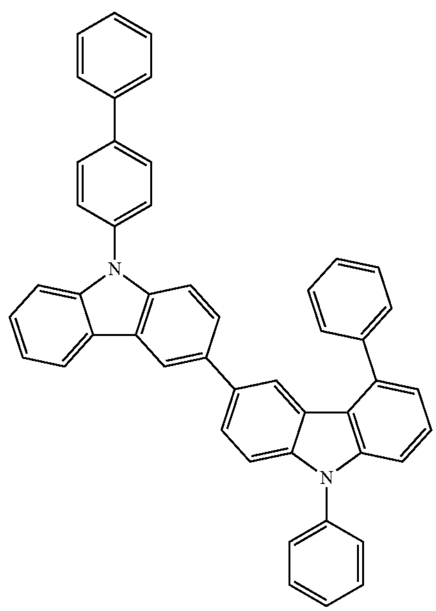
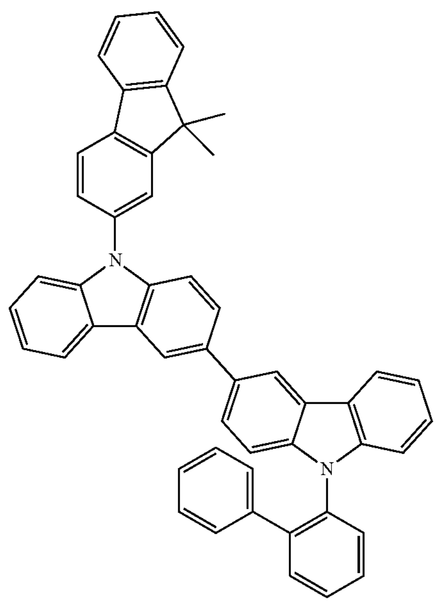
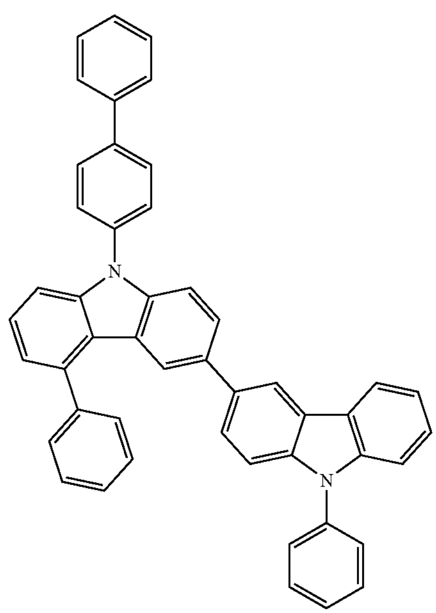
-continued

-continued
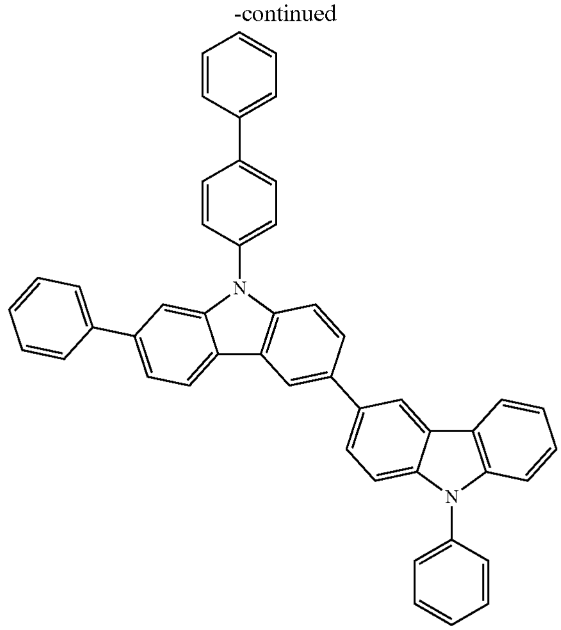
-continued
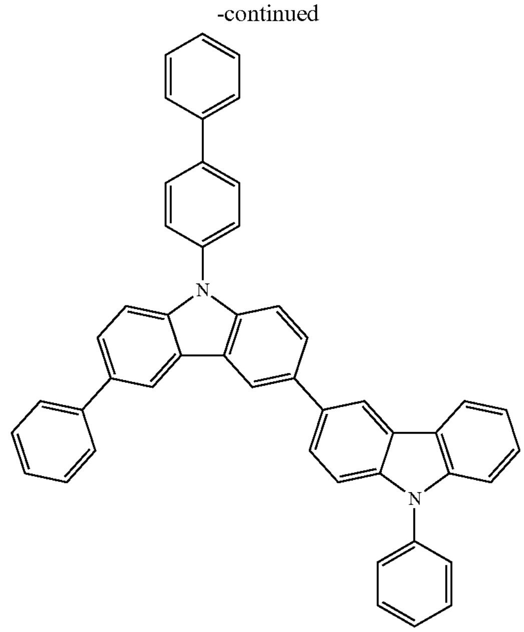
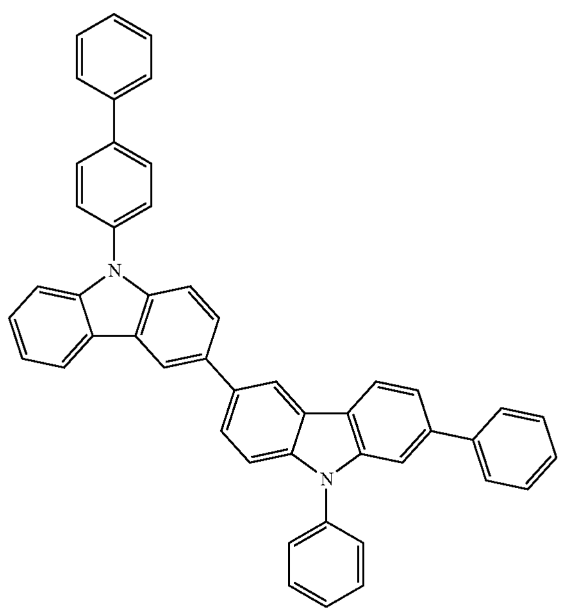
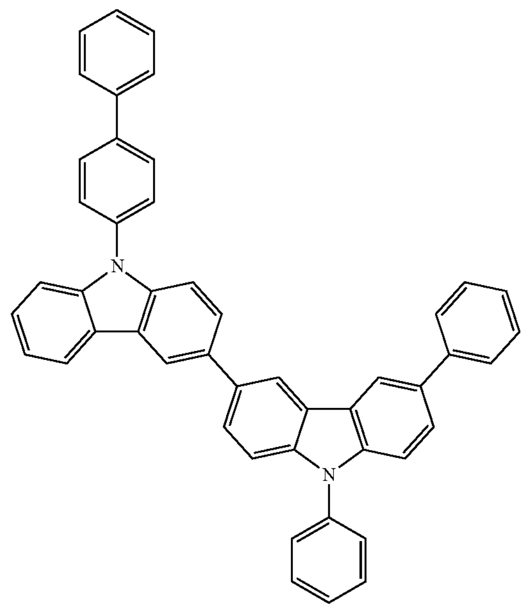

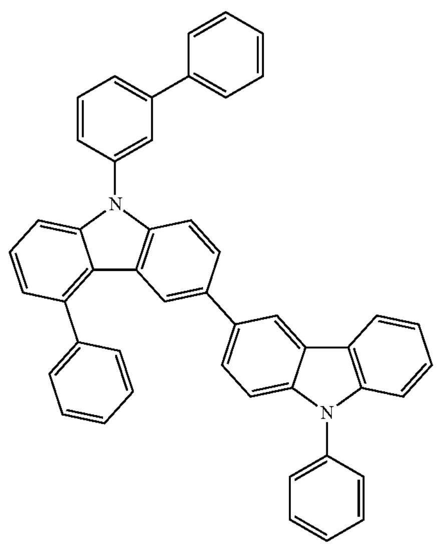
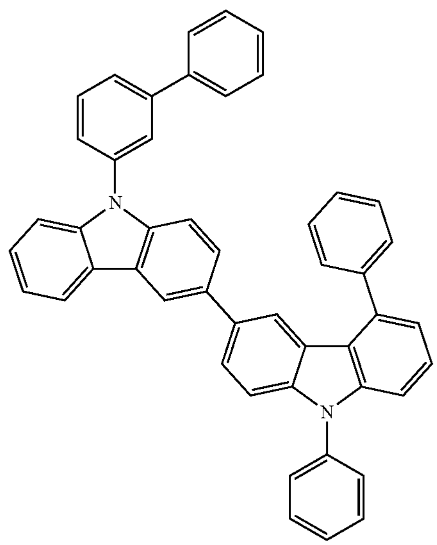
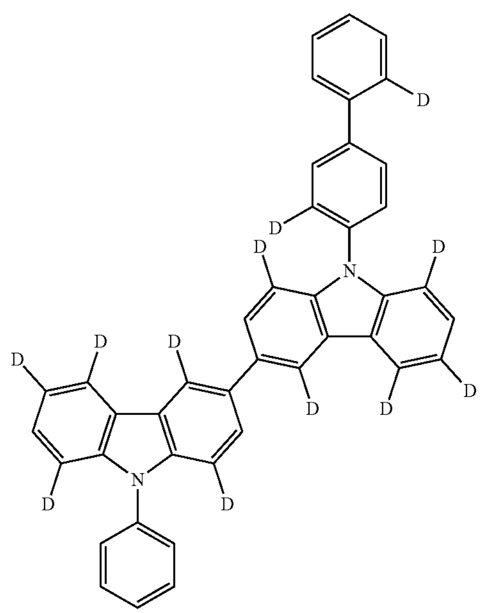
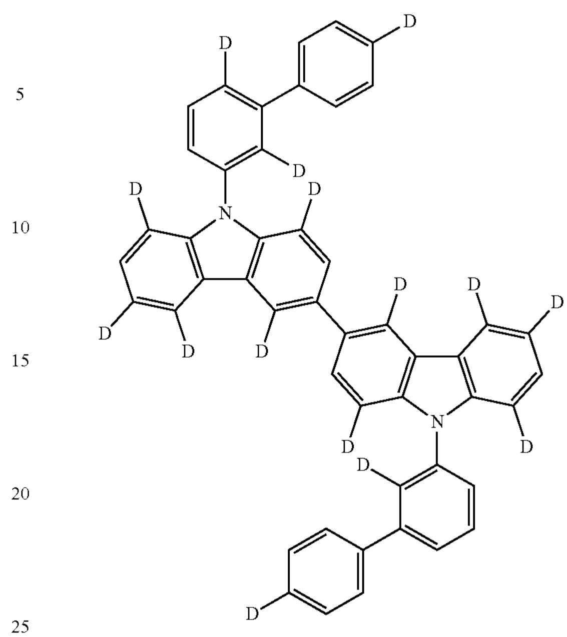
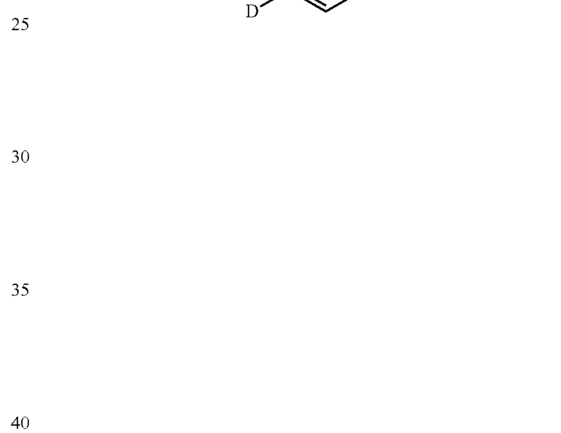
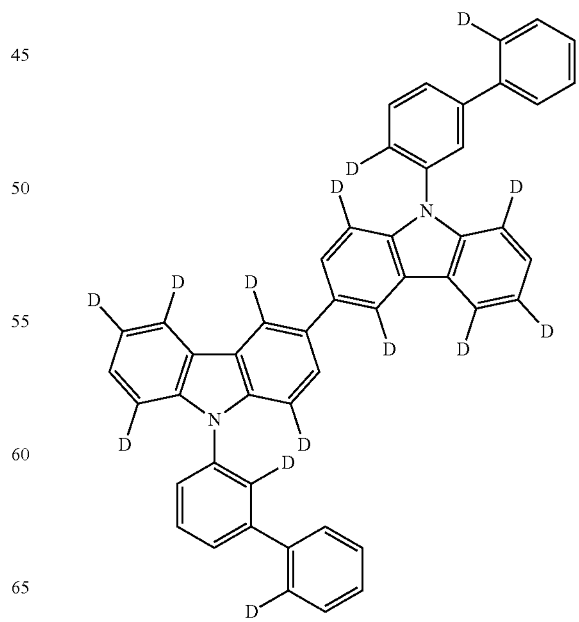

-continued
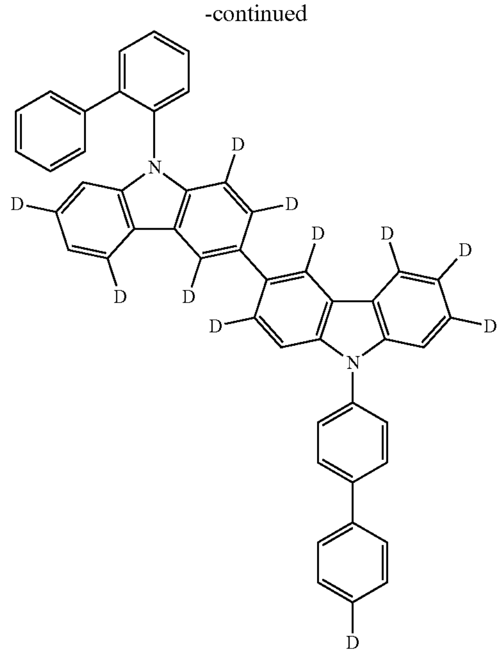
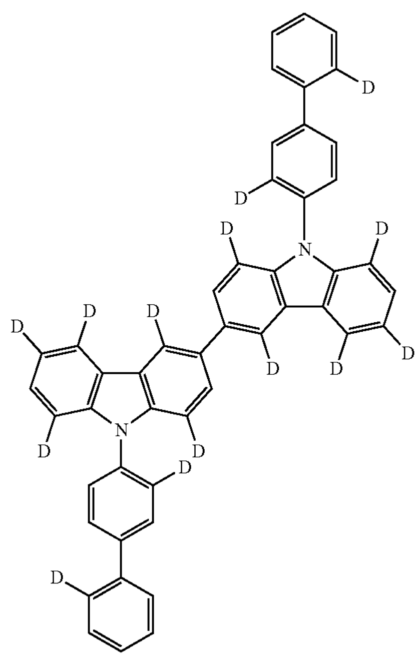
-continued
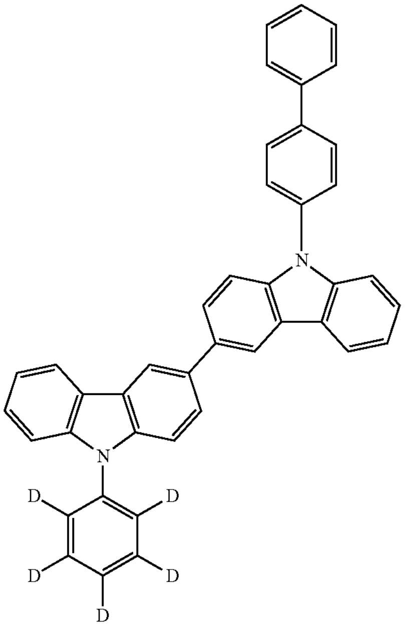
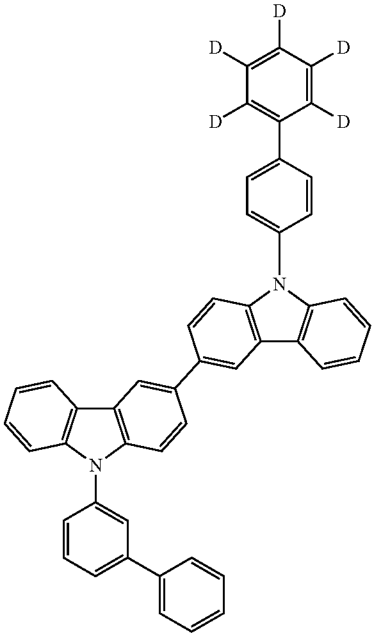

-continued

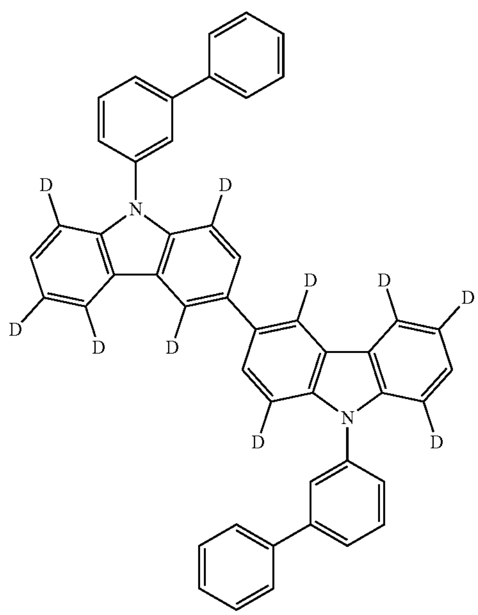

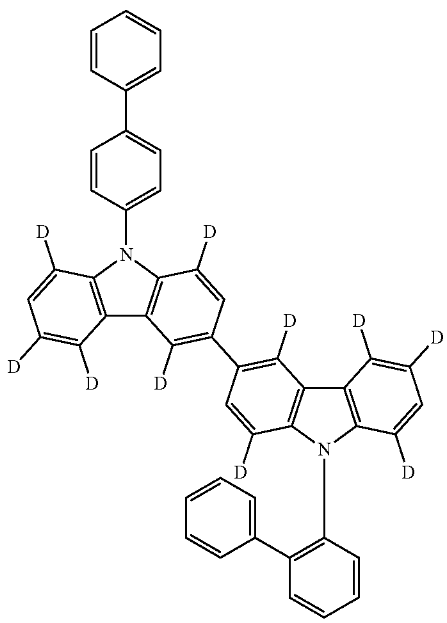

-continued

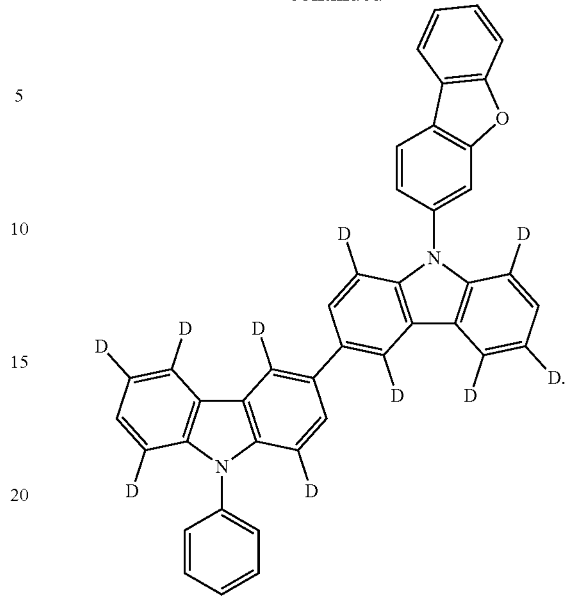

The compound of Chemical Formula 2 can be prepared, for example, by a preparation method as shown in the following Reaction Scheme 2, and the other remaining compound can be prepared in a similar manner.

[Reaction Scheme 2]

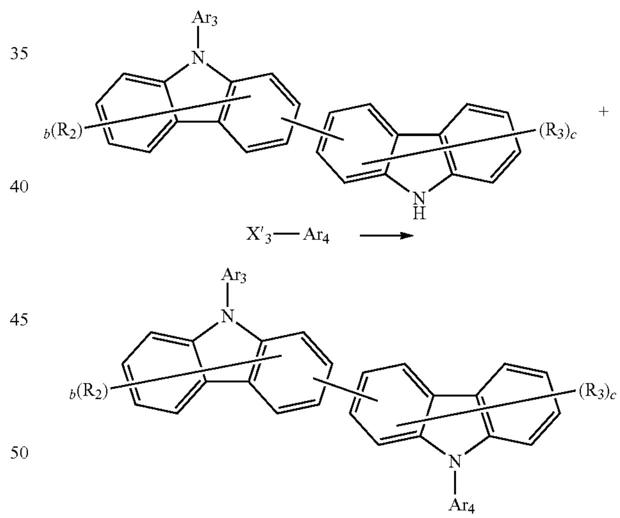

In Reaction Scheme 2, $Ar_3$, $Ar_4$, $R_2$, $R_3$, b and c are as defined in Chemical Formula 2, $X'_3$ is halogen, and more preferably, $X'_3$ is chloro or bromo.

The Reaction Scheme 2 is an amine substitution reaction which is preferably carried out in the presence of a palladium catalyst and a base, and a reactive group for the amine substitution reaction can be modified as known in the art. The above preparation method can be further embodied in Preparation Examples described hereinafter.

Meanwhile, the compound of Chemical Formula 3 is used as an N-type host, and carbazole having hole transport characteristics and triazine having electron transport characteristics are adjacent to each other at the ortho position, and thus, the intra charge transfer can be easily performed. Consequently, the stability of the molecule is high, and it is advantageous for both hole and electron transport. Further, various nitrogen-containing heterocyclic rings are additionally substituted in $Ar_5$ and $Ar_6$ of Chemical Formula 3, so that the electron transport characteristics can be variously controlled, which is advantageous in matching balance of electric charges according to the change of the common layer.

Preferably, B can be a benzene ring, a naphthalene ring, a phenanthrene ring, a triphenylene ring, a phenyl carbazole ring, a dimethylfluorene ring, a dibenzofuran ring, or a dibenzothiophene ring.

More preferably, the Chemical Formula 3 can be any one of the following Chemical Formula 3-1 to Chemical Formula 3-10:

3-1

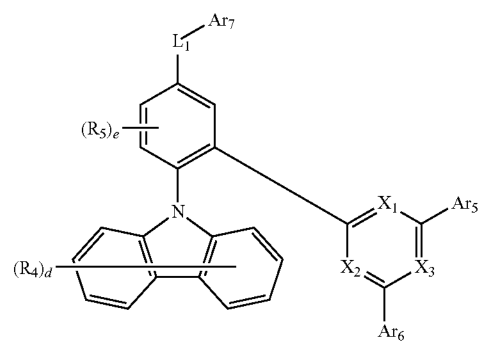

3-2

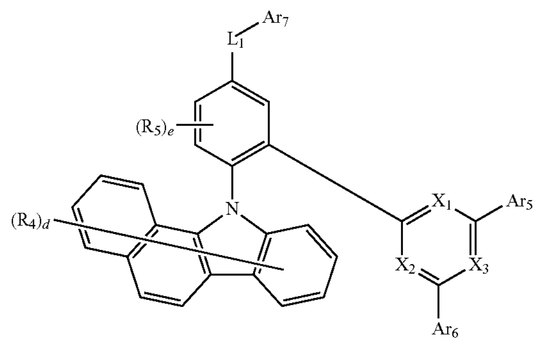

3-3

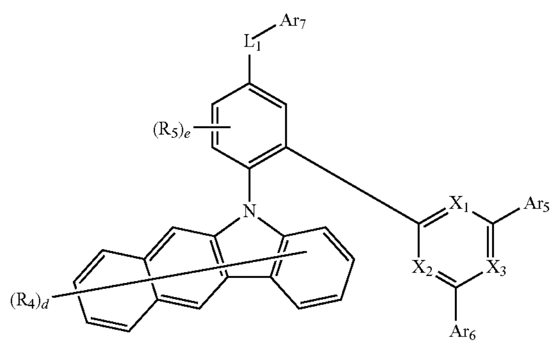

-continued 3-4

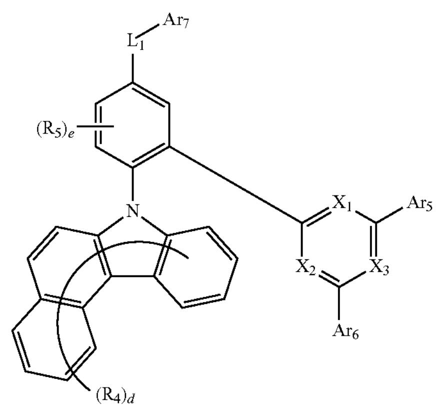

3-5

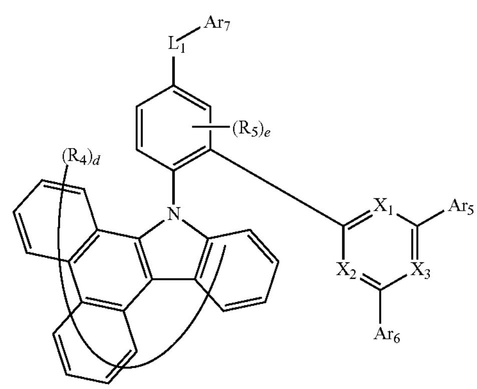

3-6

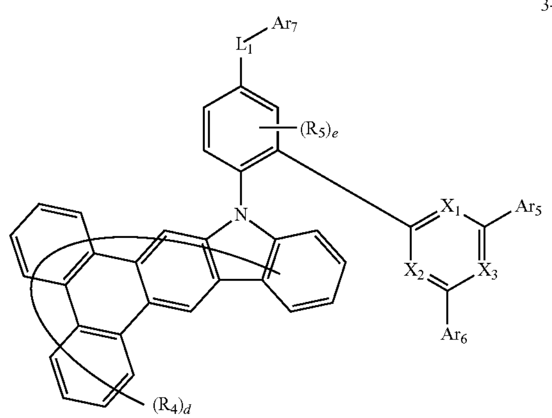

-continued 3-7

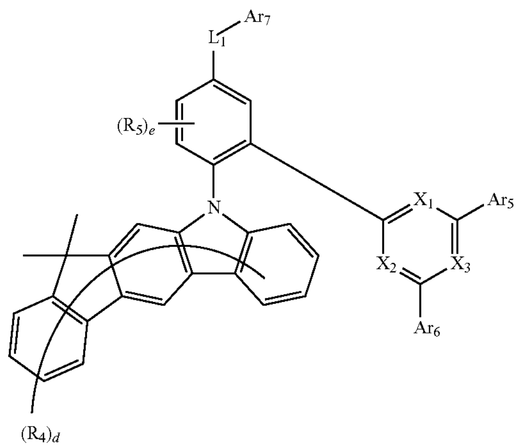

3-8

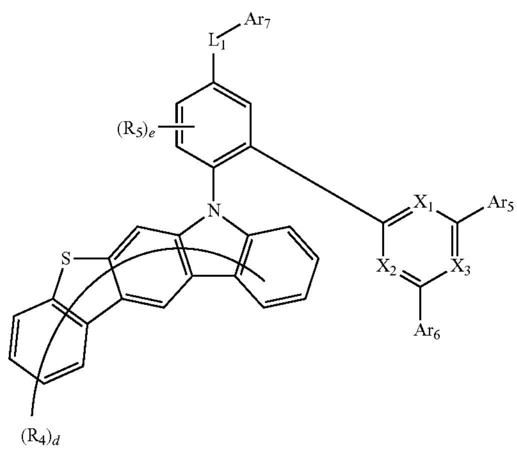

3-9

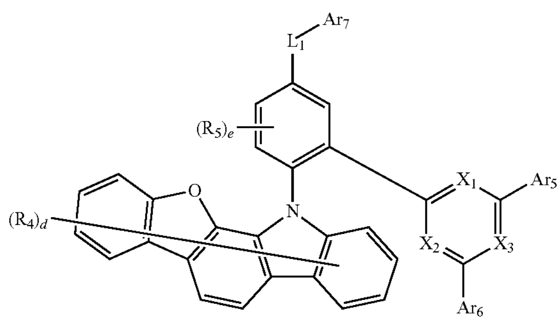

3-10

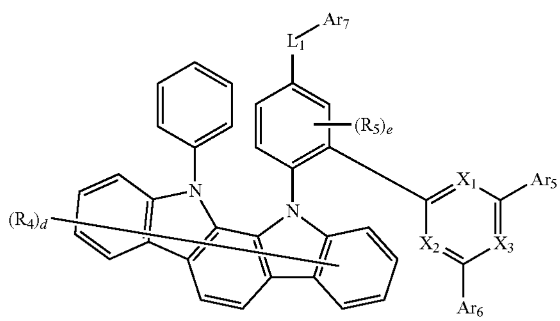

wherein in Chemical Formulas 3-1 to 3-10:

$X_1$ to $X_3$, $Ar_5$, $Ar_6$, $Ar_7$, $L_1$, $R_4$, $R_5$, d and e are as defined in Chemical Formula 3 above.

Preferably, at least two of $X_1$ to $X_3$ can be N.

Preferably, $Ar_5$ and $Ar_6$ can be each independently a substituted or unsubstituted $C_{6-20}$ aryl or a substituted or unsubstituted $C_{2-20}$ heteroaryl containing any one or more heteroatoms selected from the group consisting of N, O and S.

More preferably, $Ar_5$ and $Ar_6$ can be each independently phenyl, phenyl substituted with 5 deuteriums, naphthyl, phenanthrenyl, triphenylenyl, dimethylfluorenyl, carbazolyl, carbazolyl substituted with 8 deuteriums, dibenzofuranyl, dibenzothiophenyl, or

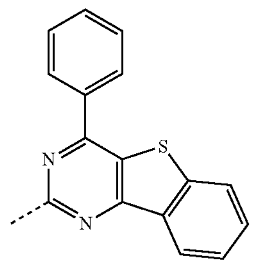

Preferably, $Ar_7$ can be a substituted or unsubstituted $C_{6-20}$ aryl or a substituted or unsubstituted $C_{2-20}$ heteroaryl containing any one or more heteroatoms selected from the group consisting of N, O and S.

More preferably, $Ar_7$ can be dibenzothiophenyl, or any one substituent selected from the group consisting of the following substituents:

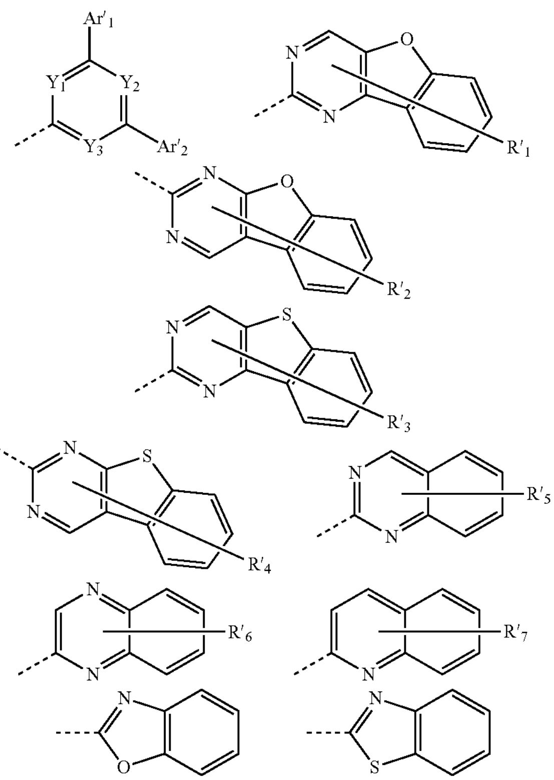

-continued

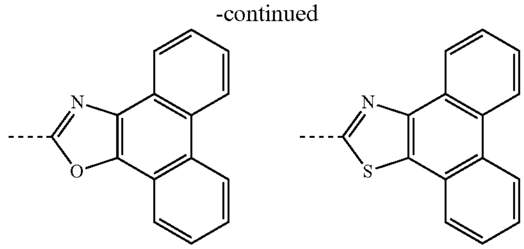

wherein in the above group of substituents:

$Y_1$ to $Y_3$ are each independently N or CH, provided that at least one of $Y_1$ to $Y_3$ is N;

$Ar'_1$ and $Ar'_2$ are each independently a substituted or unsubstituted $C_{6-60}$ aryl or a substituted or unsubstituted $C_{2-60}$ heteroaryl containing any one or more heteroatoms selected from the group consisting of N, O and S; and $R'_1$ to $R'_7$ are each independently hydrogen, deuterium, a substituted or unsubstituted $C_{6-60}$ aryl, or a substituted or unsubstituted $C_{2-60}$ heteroaryl containing any one or more heteroatoms selected from the group consisting of N, O and S.

Preferably, $Ar'_1$ and $Ar'_2$ can be each independently a substituted or unsubstituted $C_{6-20}$ aryl or a substituted or unsubstituted $C_{2-20}$ heteroaryl containing any one or more heteroatoms selected from the group consisting of N, O and S.

More preferably, $Ar'_1$ and $Ar'_2$ can be each independently phenyl, biphenylyl, naphthyl, phenanthrenyl, triphenylenyl, phenyl substituted with 5 deuteriums, phenyl substituted with one cyano, phenyl substituted with one trifluoromethyl, benzothiophenyl, dibenzofuranyl, or dibenzothiophenyl.

Preferably, $R'_1$ to $R'_7$ can be each independently hydrogen, deuterium, a substituted or unsubstituted $C_{6-20}$ aryl, or a substituted or unsubstituted $C_{2-20}$ heteroaryl containing any one or more heteroatoms selected from the group consisting of N, O and S.

More preferably, $R'_1$ to $R'_7$ can be each independently hydrogen, deuterium, or phenyl.

Preferably, $L_1$ can be a single bond, a substituted or unsubstituted $C_{6-20}$ arylene, or a substituted or unsubstituted $C_{2-20}$ heteroarylene containing any one or more heteroatoms selected from the group consisting of N, O and S.

More preferably, $L_1$ can be a single bond, phenylene, naphthyldiyl, dibenzofuranyldiyl, or dibenzothiophenyldiyl.

Preferably, $R_4$ and $R_5$ can be each independently hydrogen, deuterium, a substituted or unsubstituted $C_{1-10}$ alkyl, a substituted or unsubstituted $C_{6-20}$ aryl, or a substituted or unsubstituted $C_{2-20}$ heteroaryl containing any one or more heteroatoms selected from the group consisting of N, O and S.

More preferably, $R_4$ and $R_5$ can be each independently hydrogen, deuterium, phenyl, naphthyl, carbazolyl, benzothiophenyl, dibenzofuranyl, dibenzothiophenyl, phenyl substituted with 4 deuteriums, or phenyl substituted with 5 deuteriums.

Representative examples of the compound of Chemical Formula 3 are as follows:

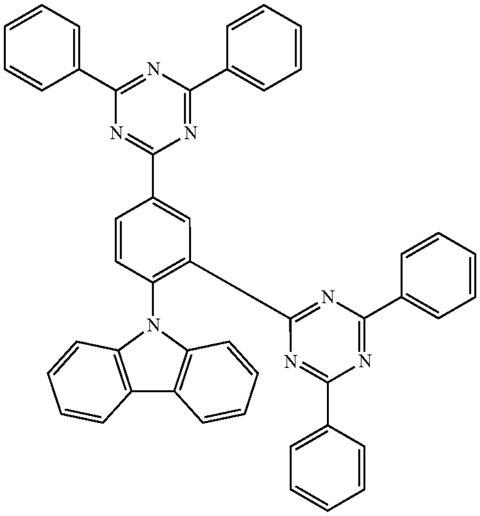

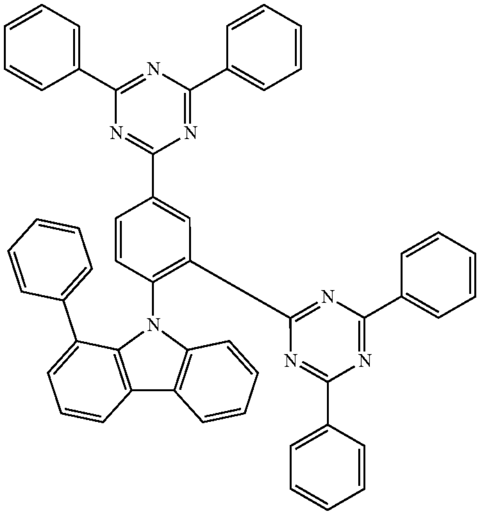

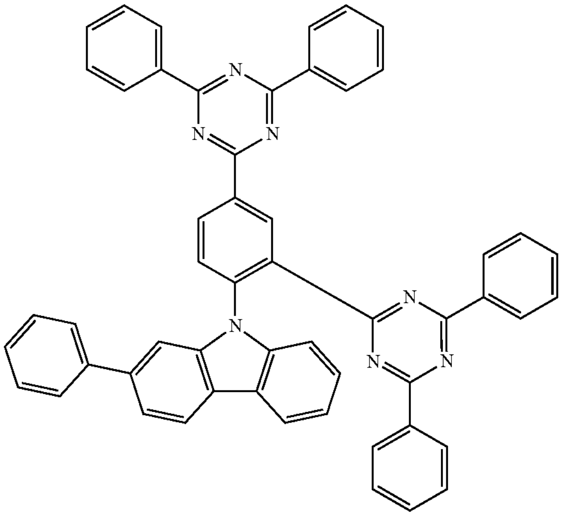

-continued
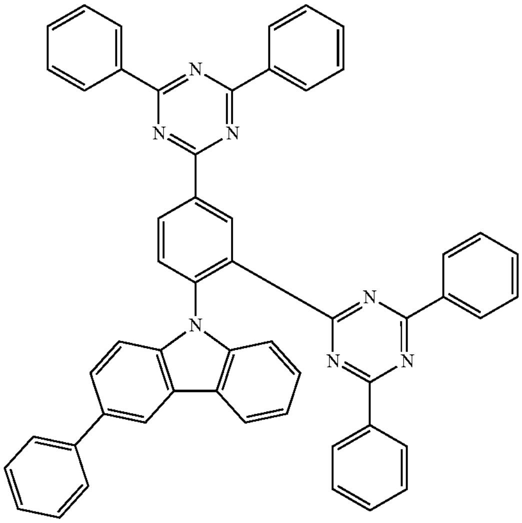
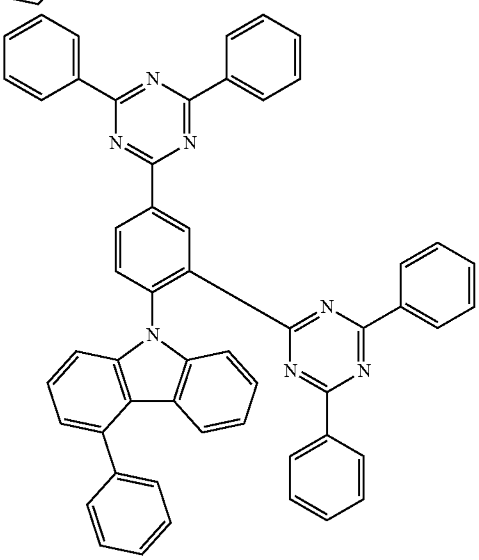
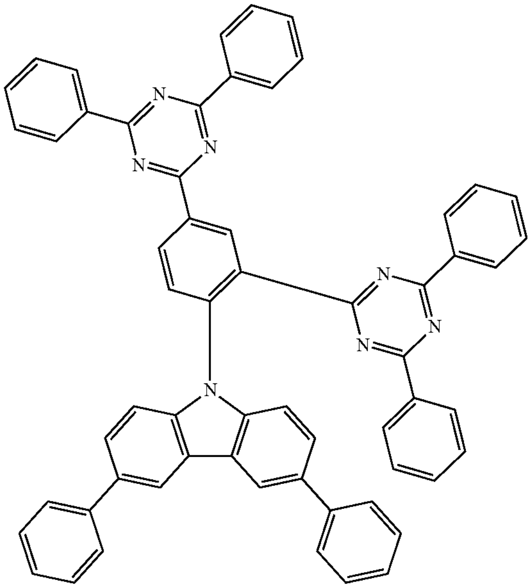
-continued
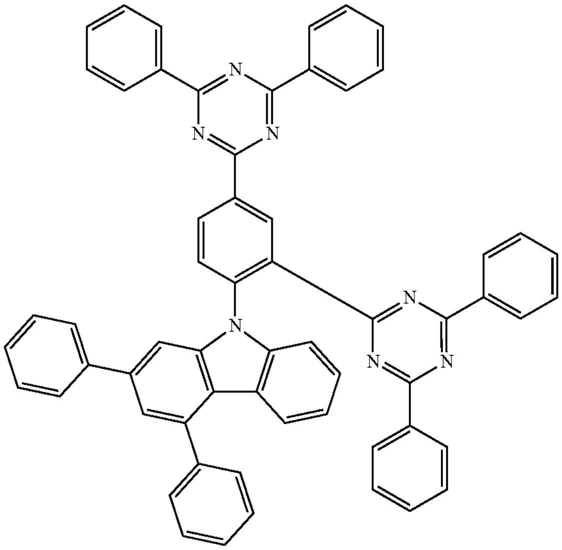
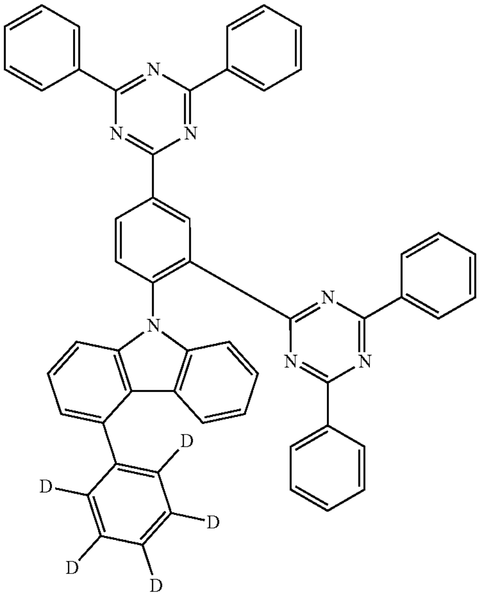
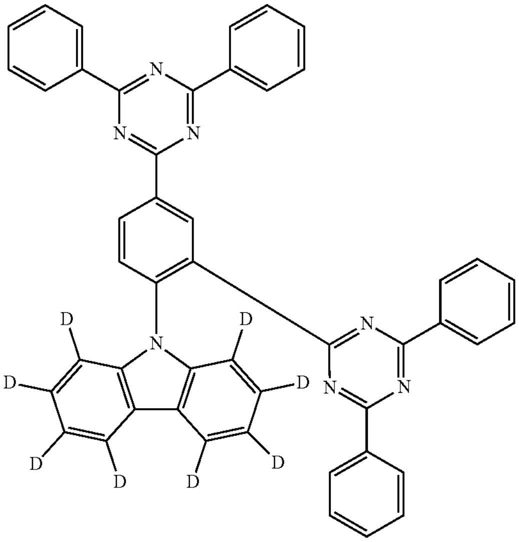

-continued
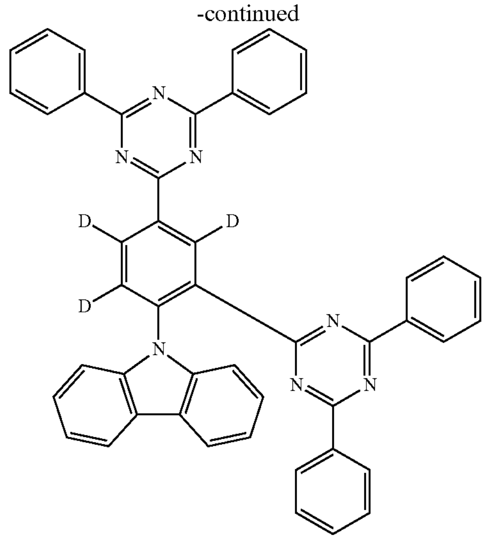
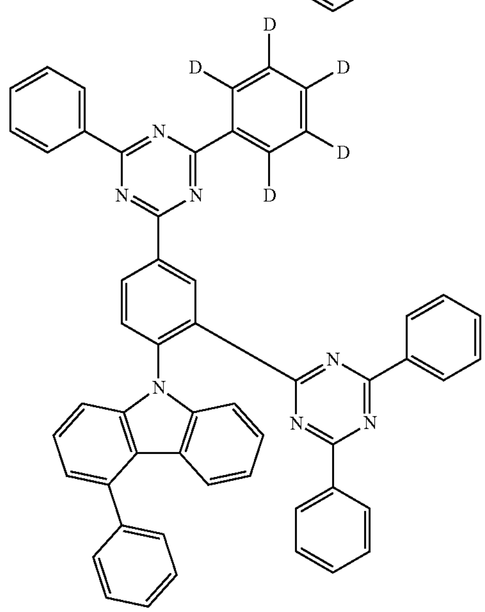
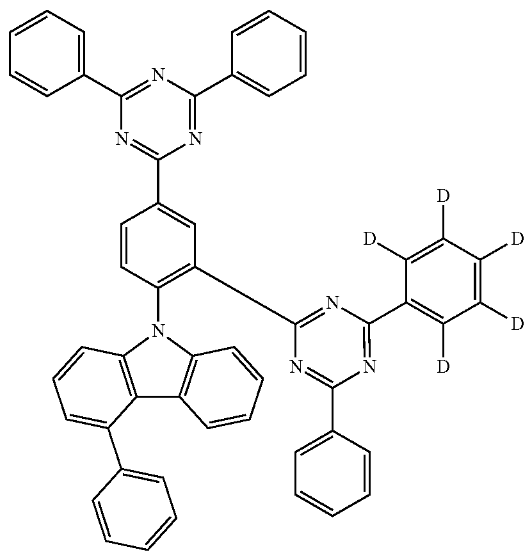
-continued
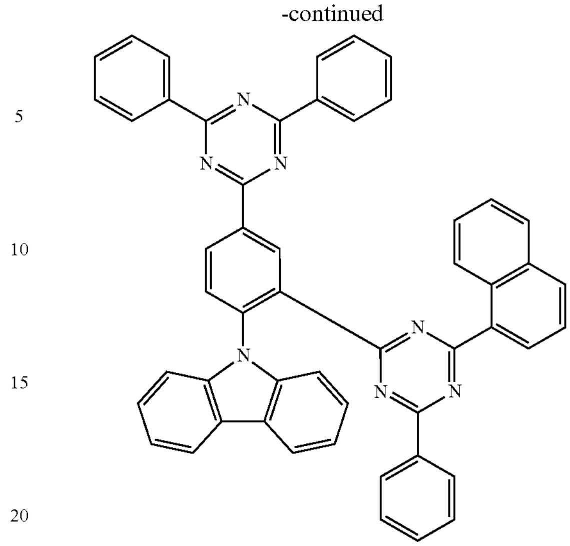
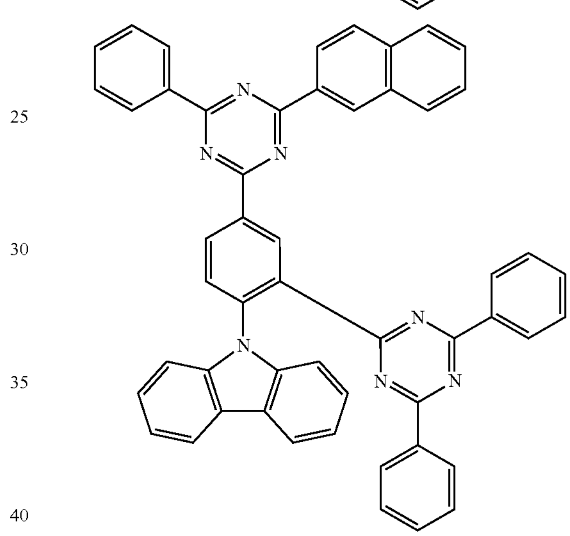
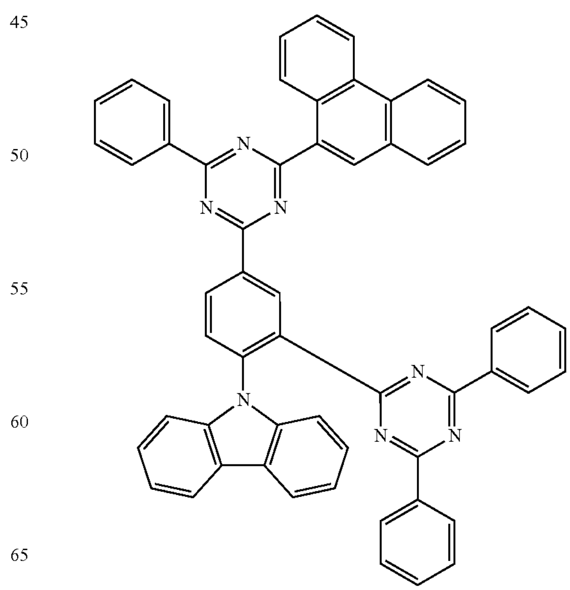

-continued
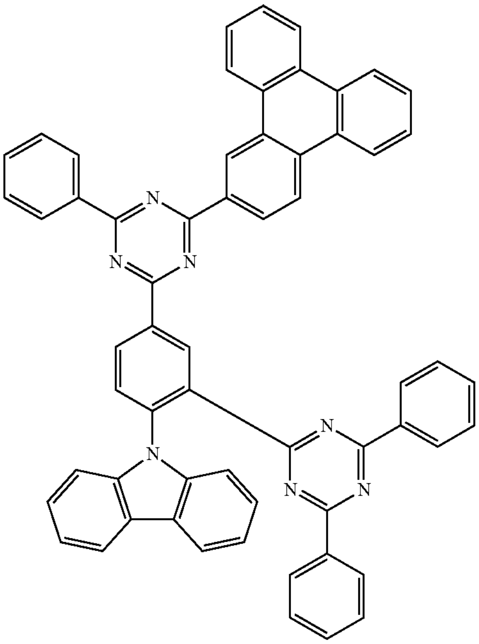
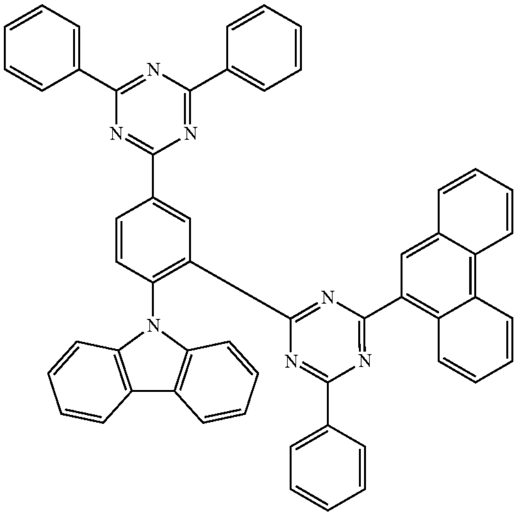
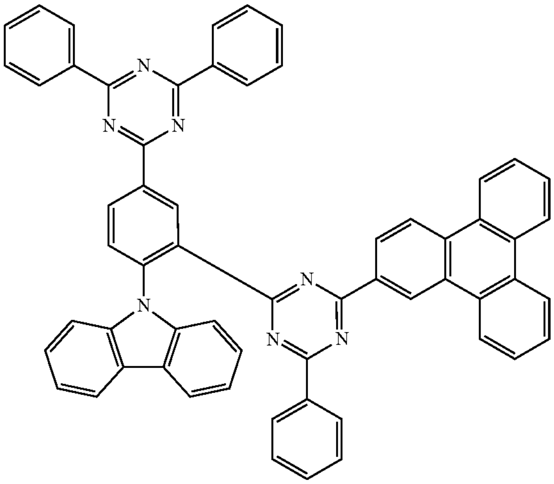
-continued
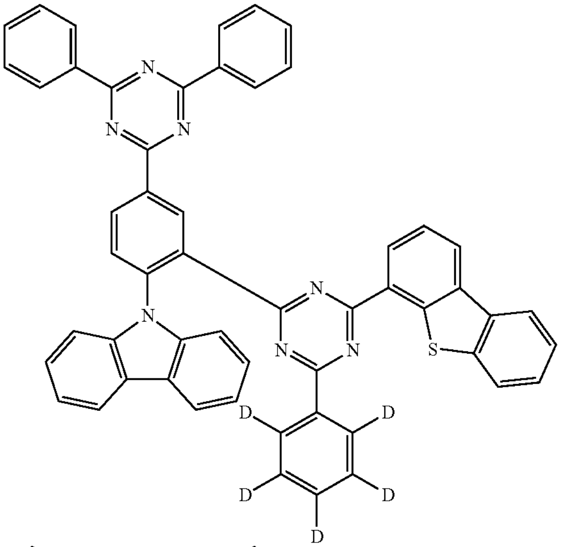
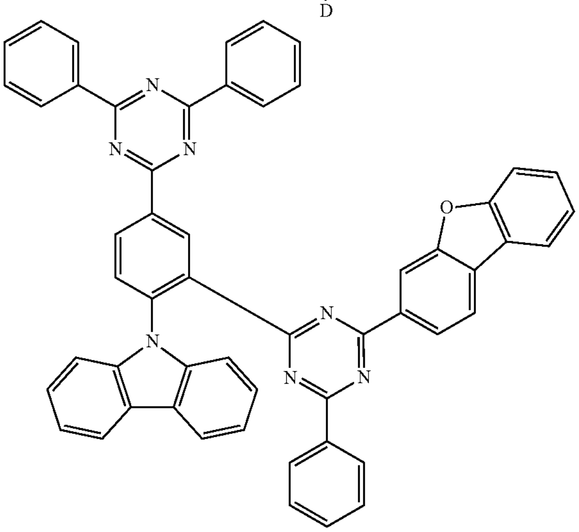
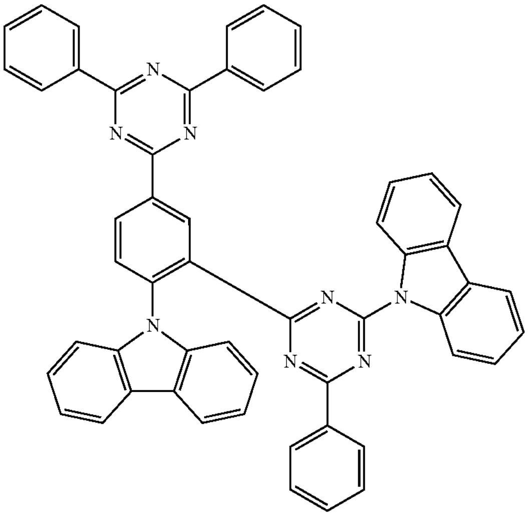

-continued
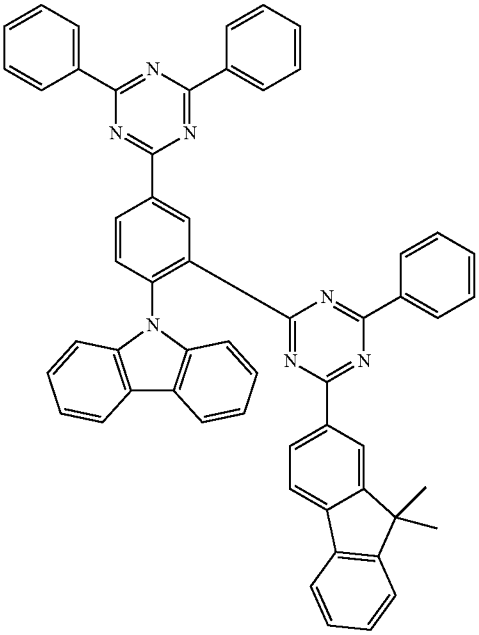
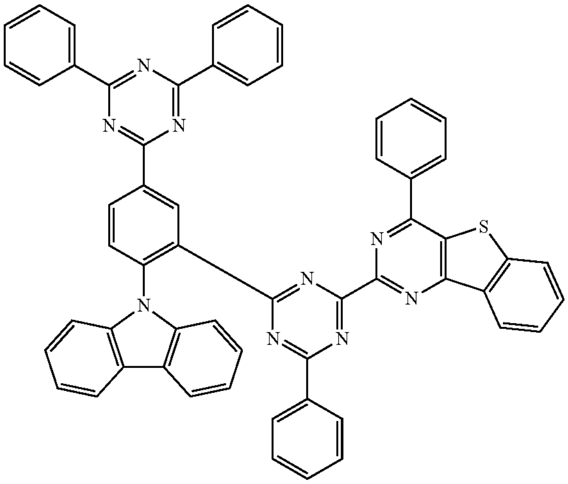
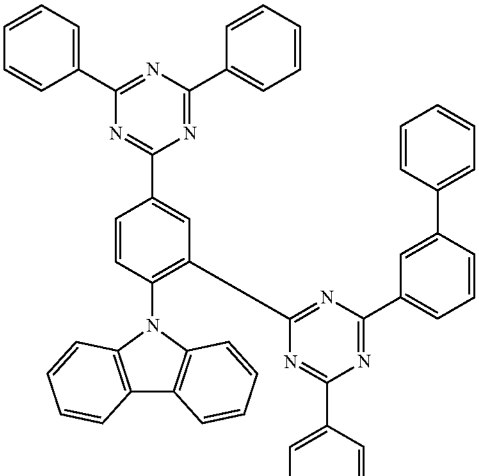
-continued
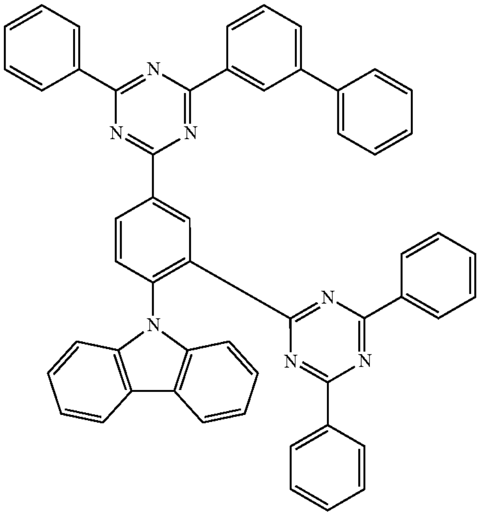
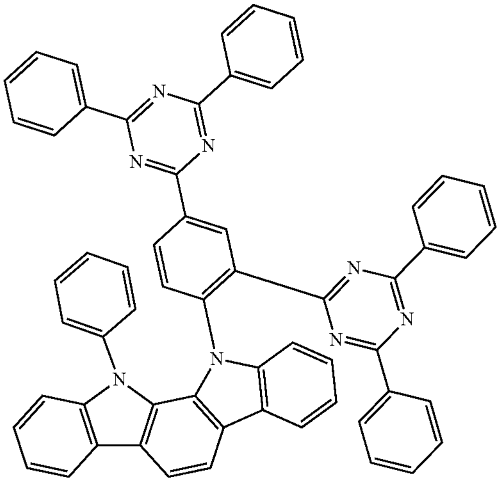
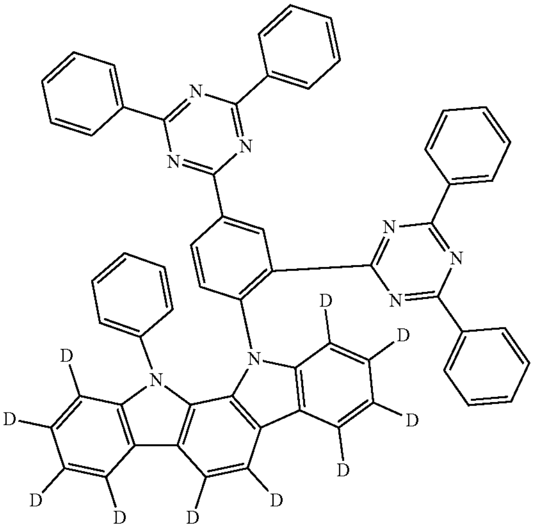

-continued
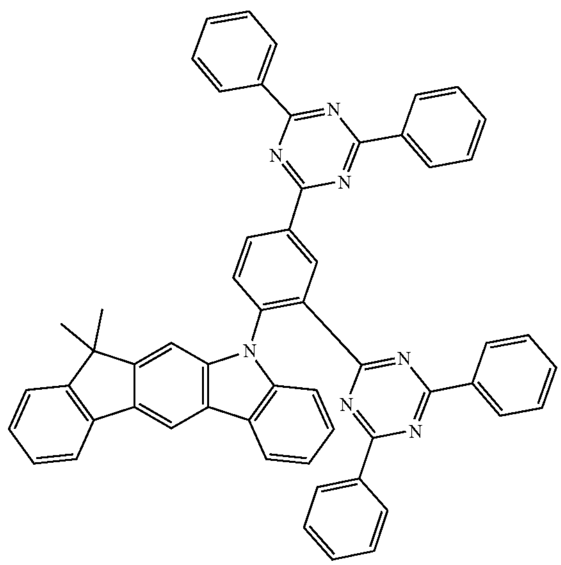
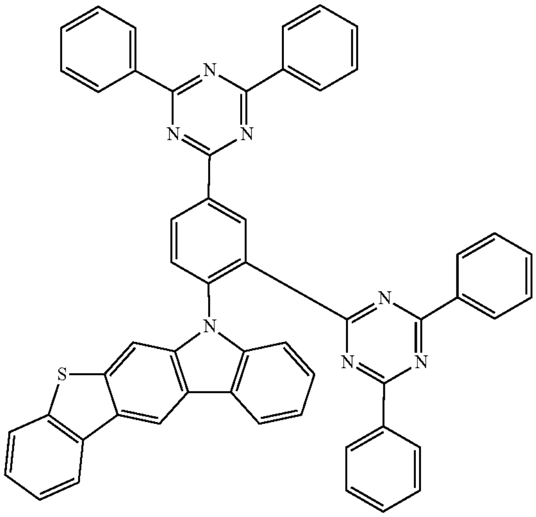
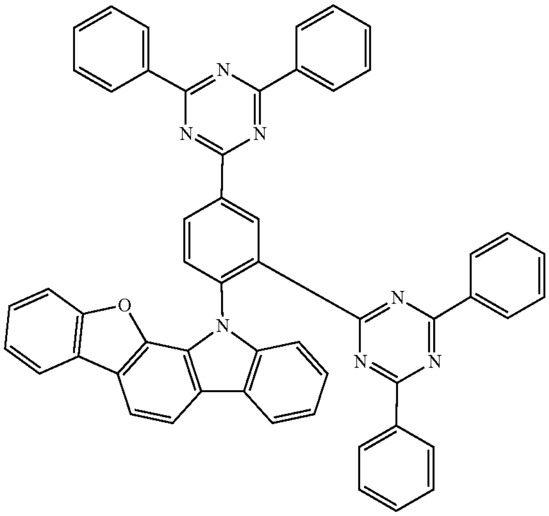
-continued
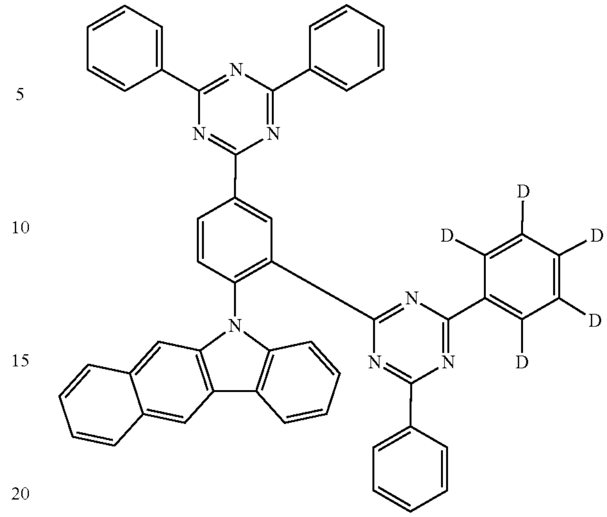
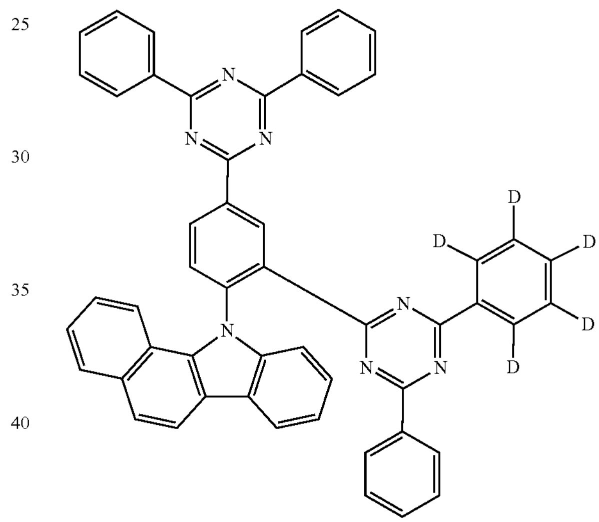
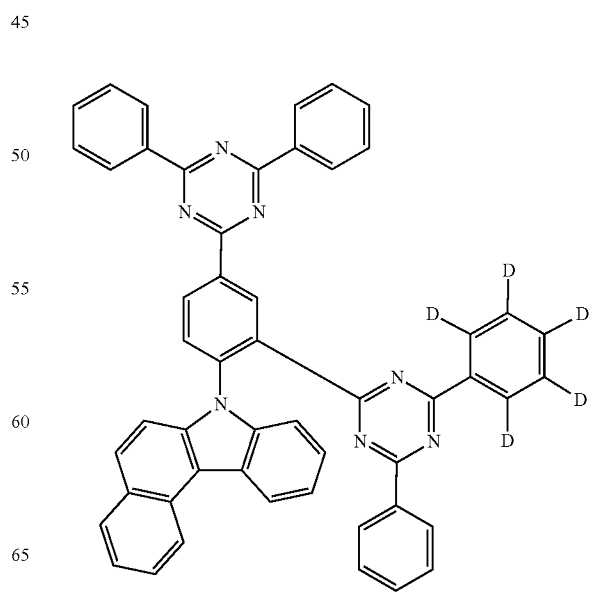

-continued
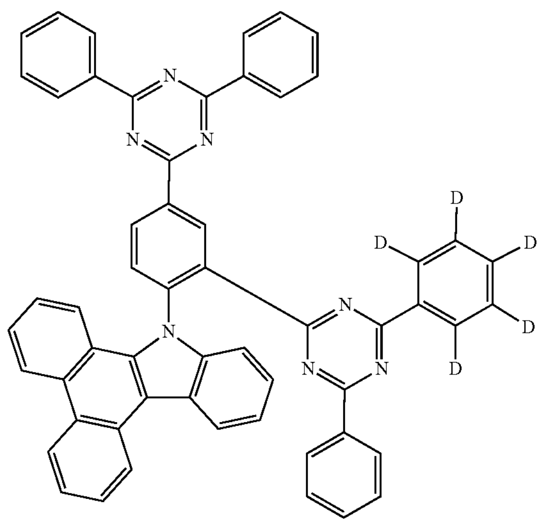
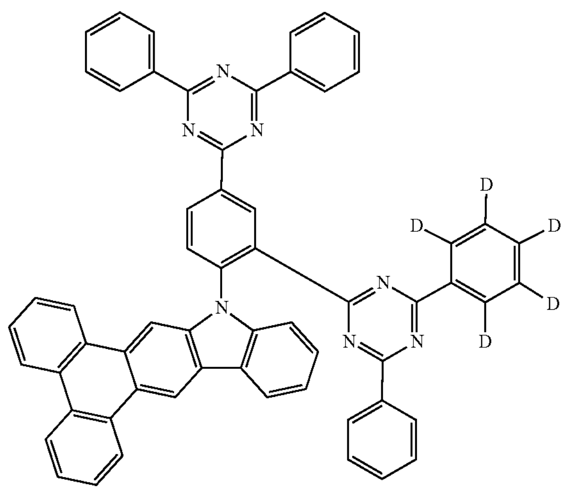
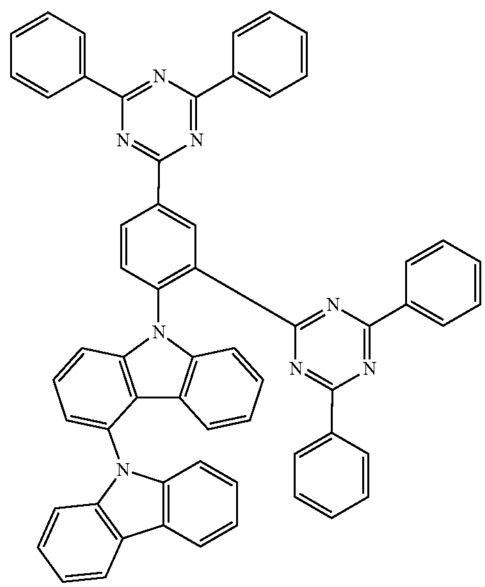
-continued
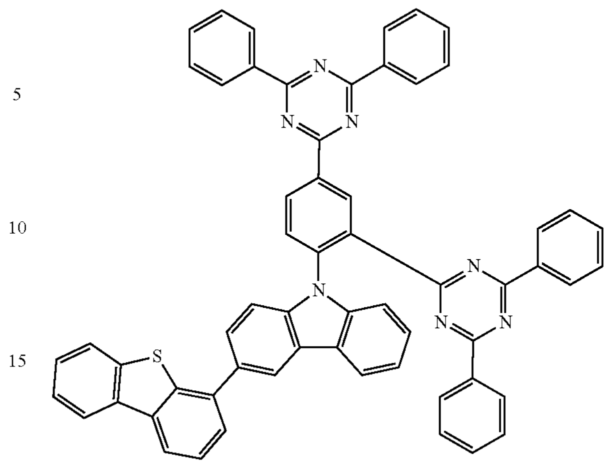
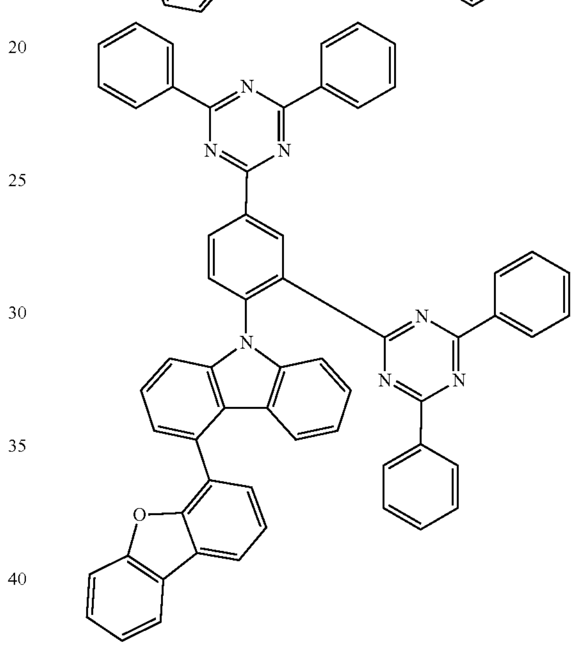
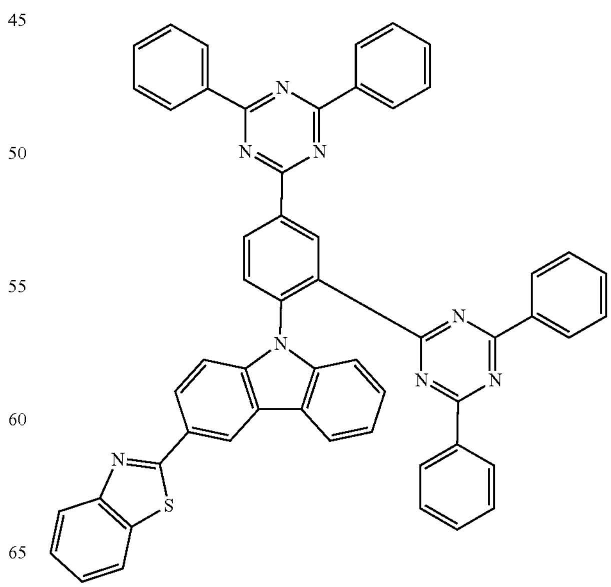

-continued
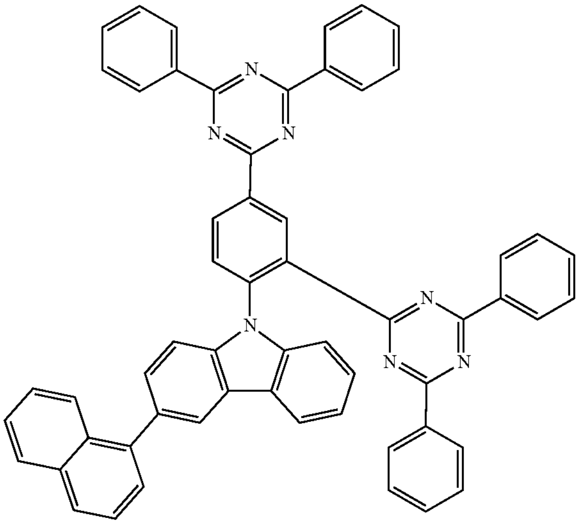
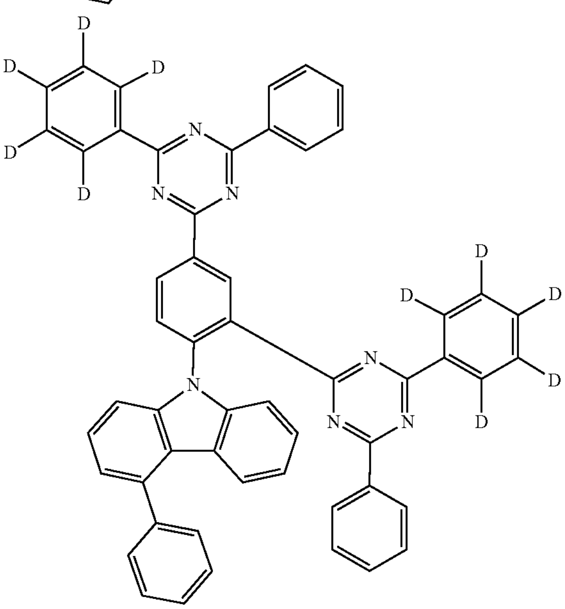
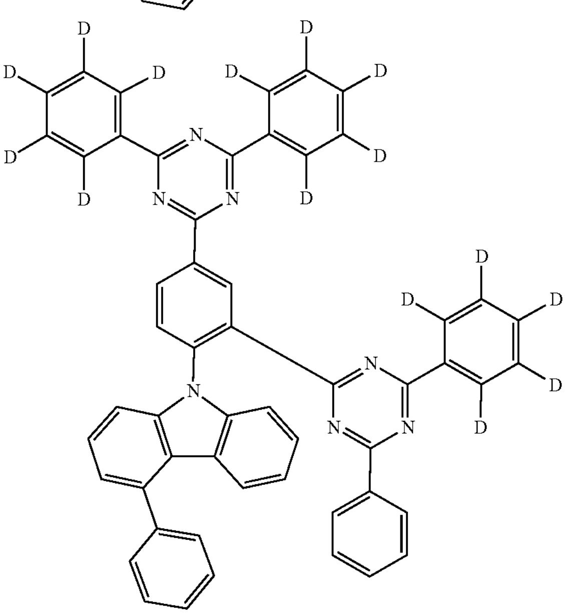
-continued
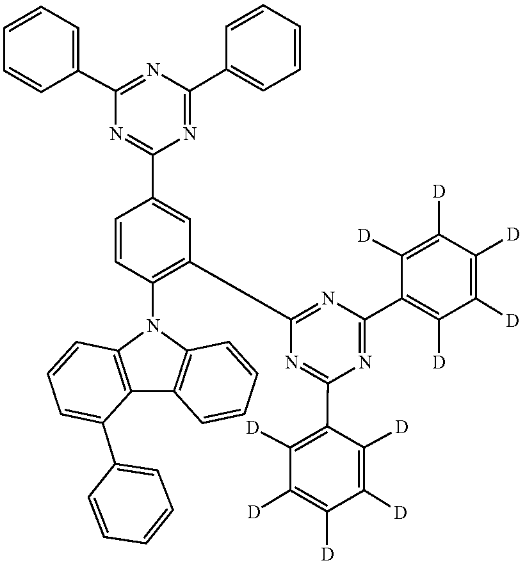
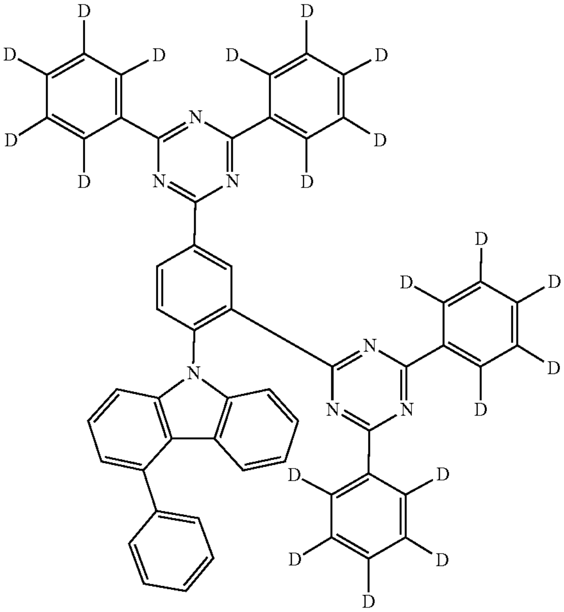

-continued
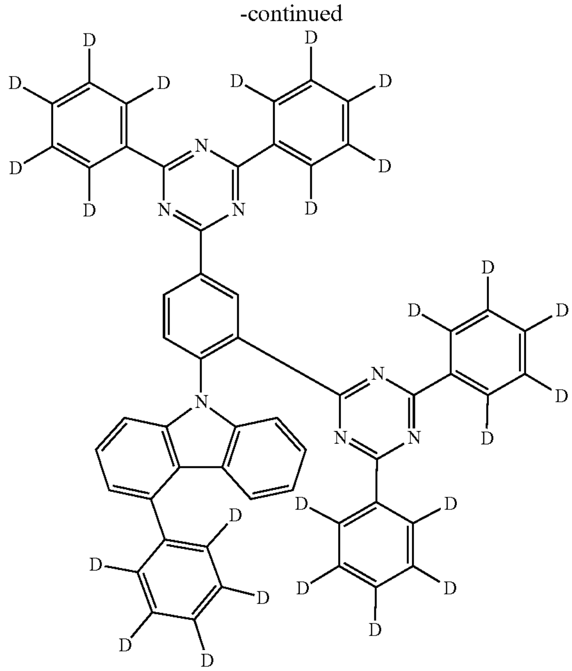
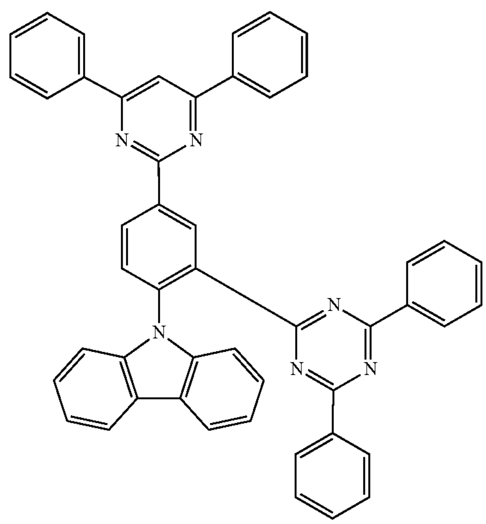
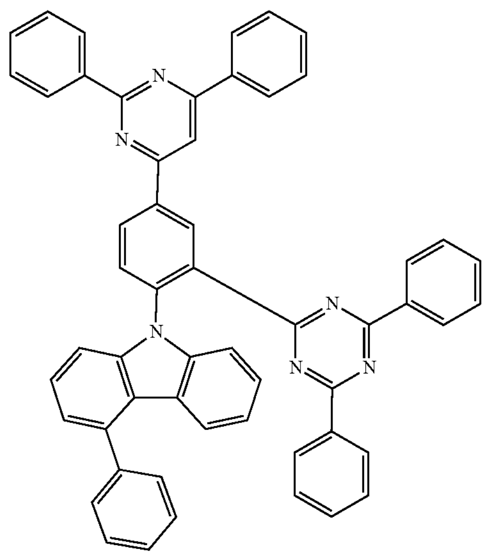
-continued
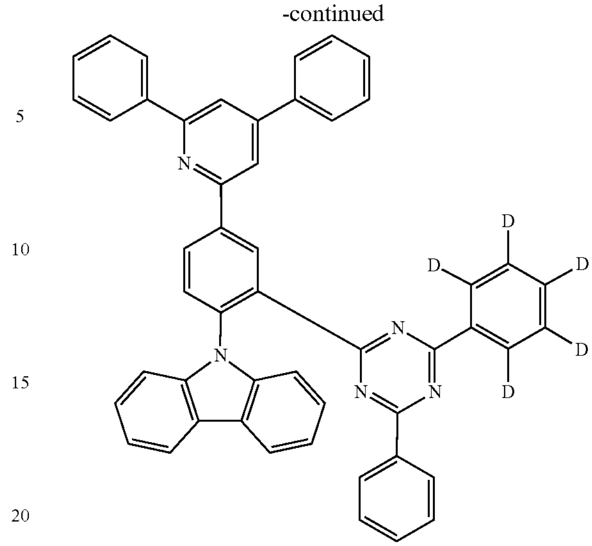
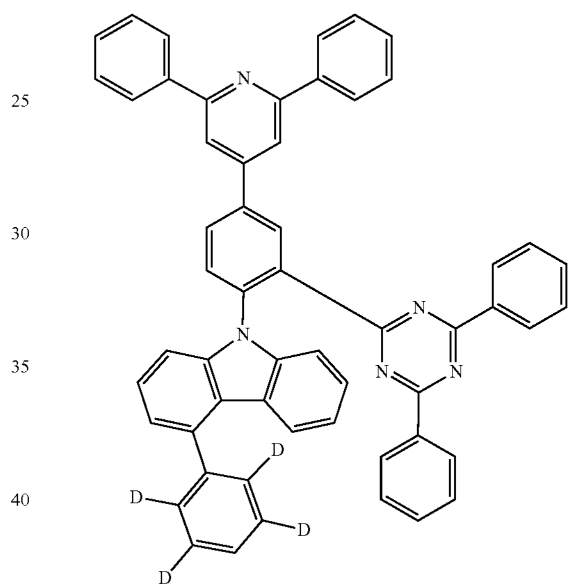
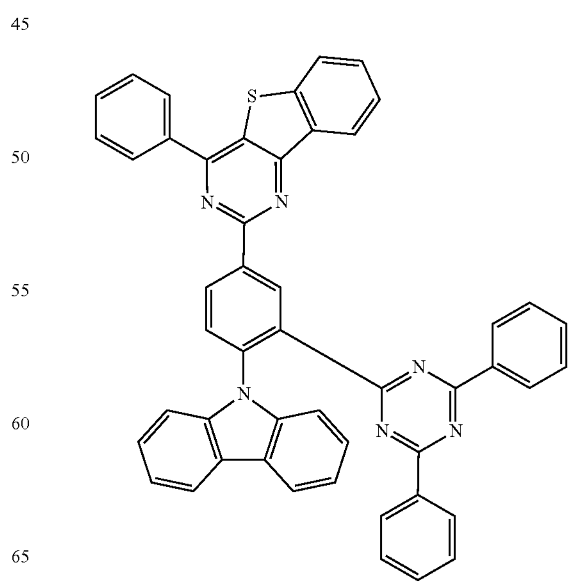

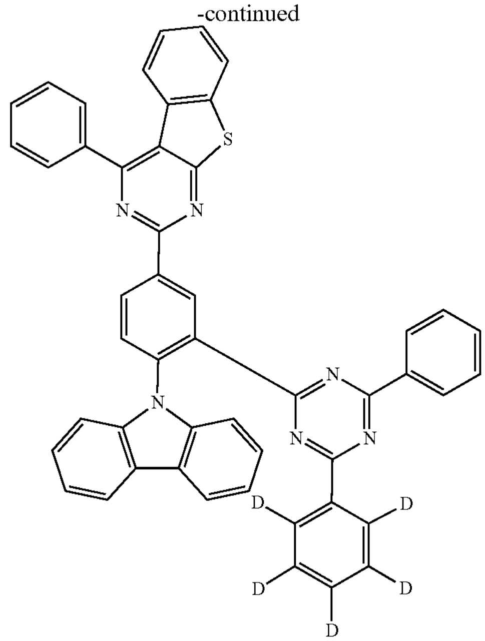
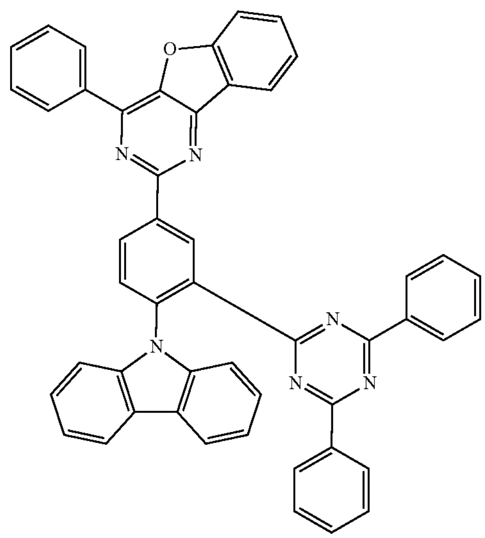
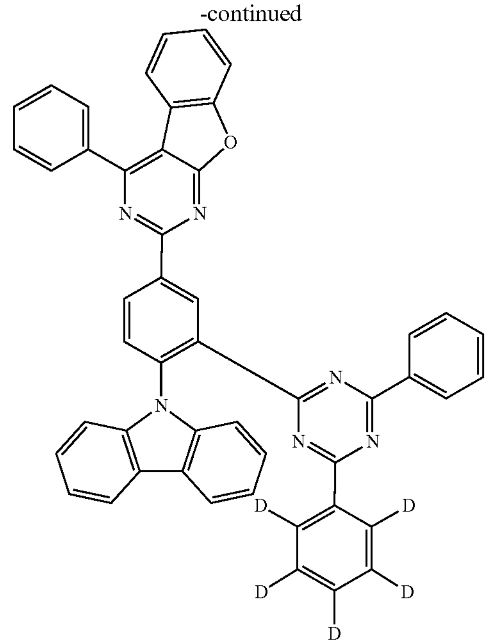
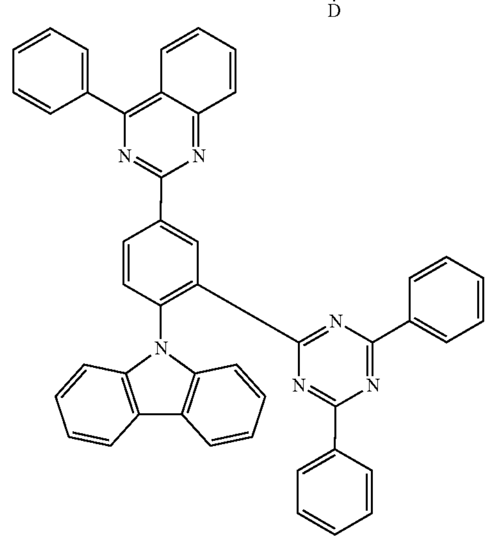
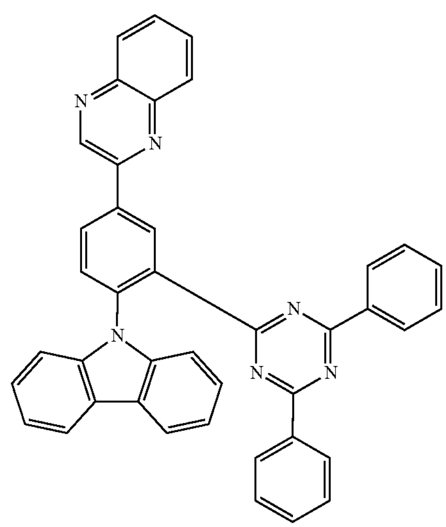

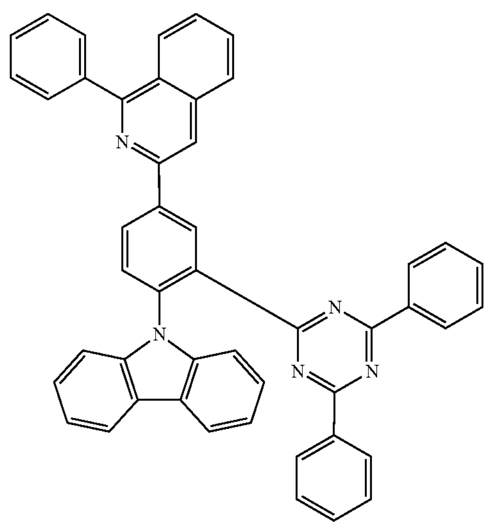
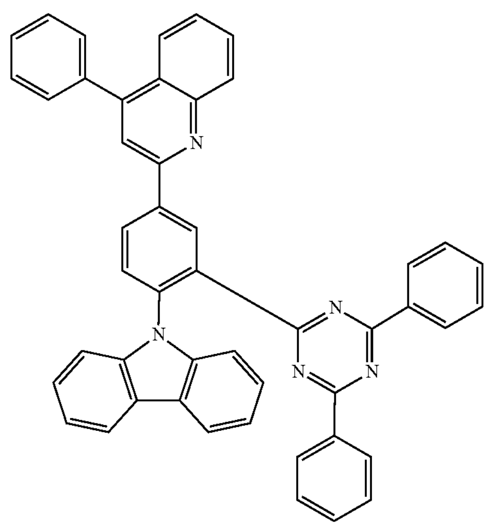
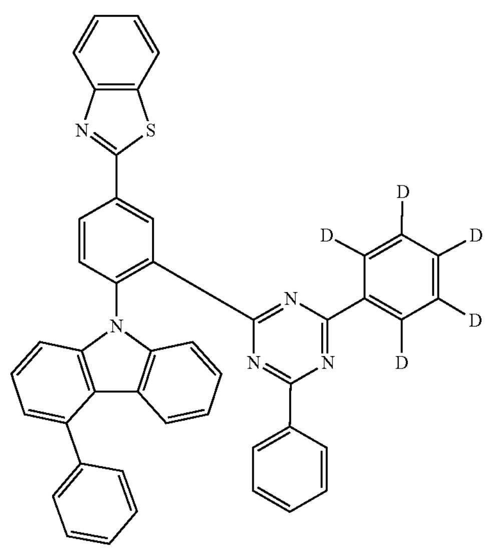
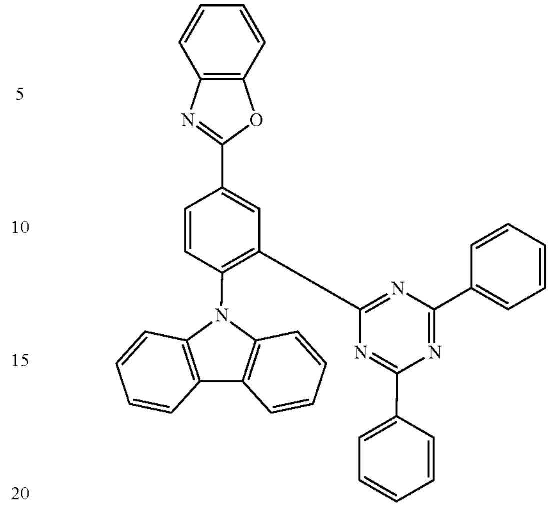
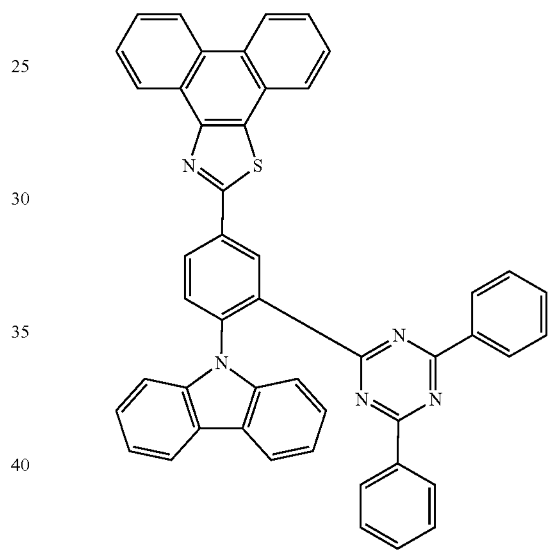
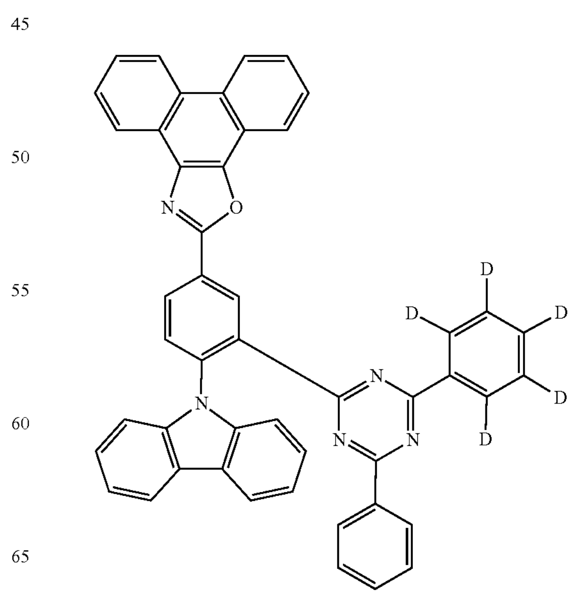

-continued
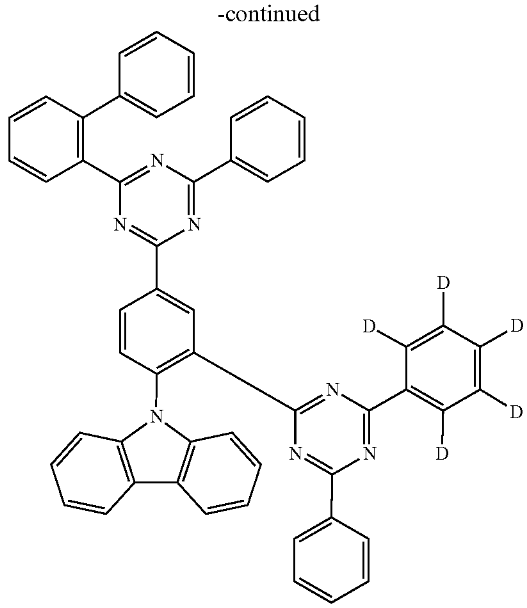
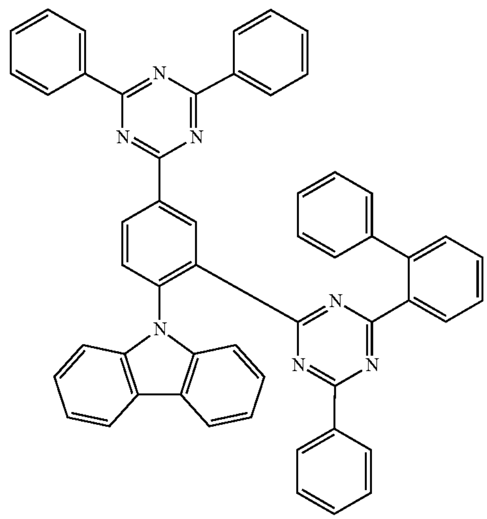
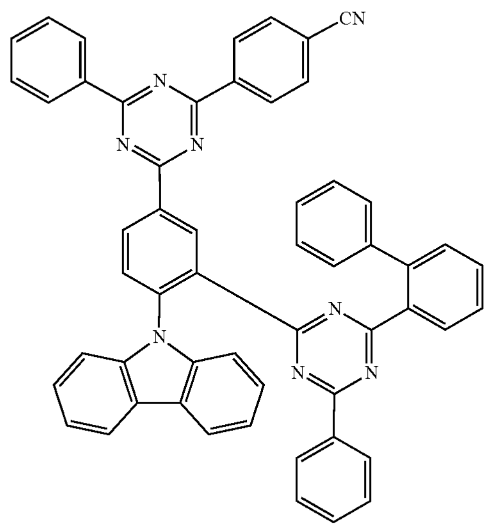
-continued
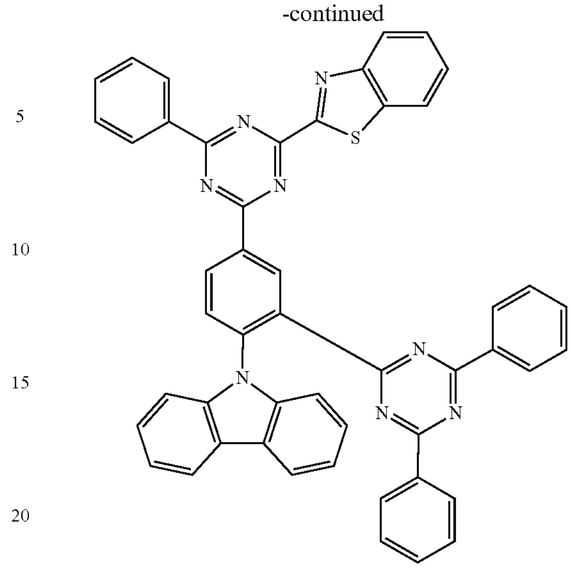
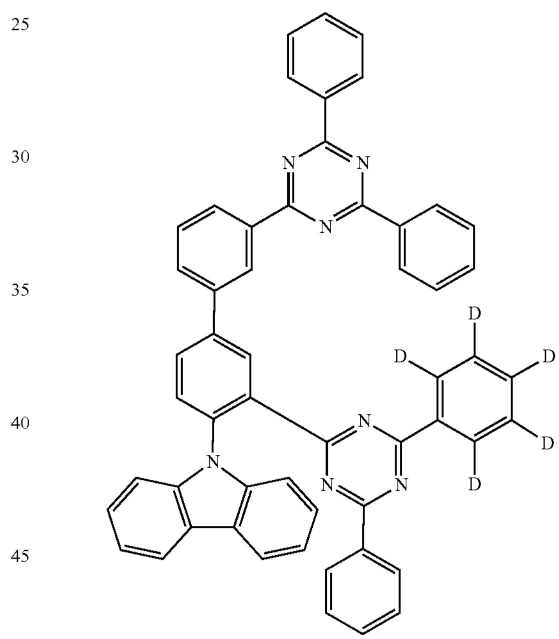
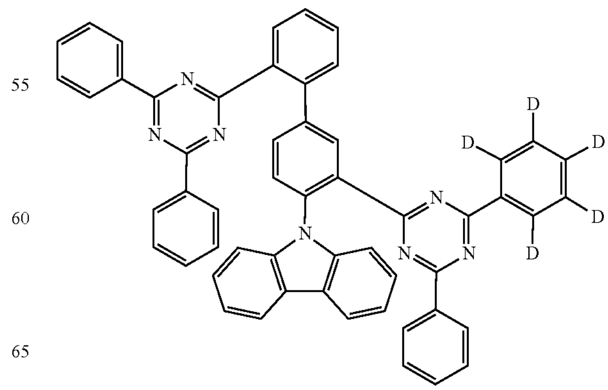

-continued
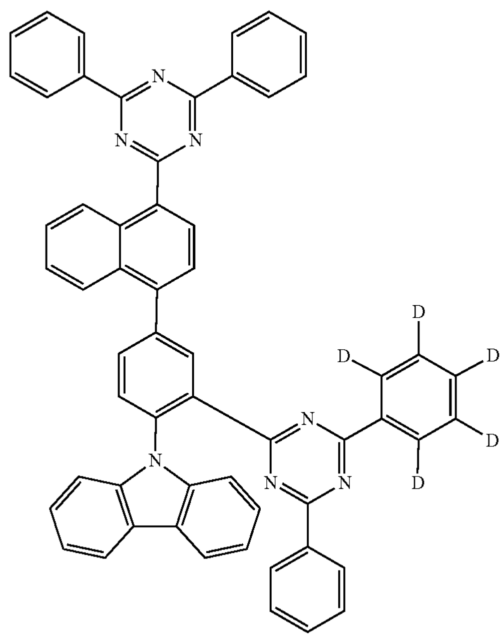
-continued
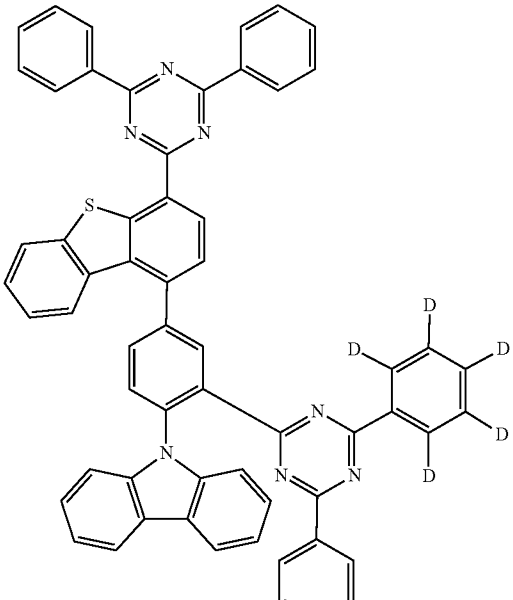
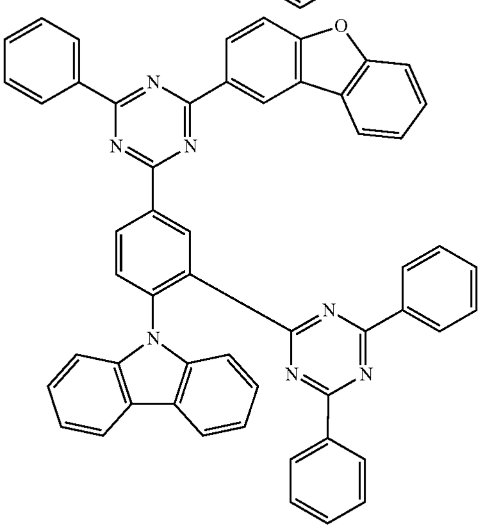
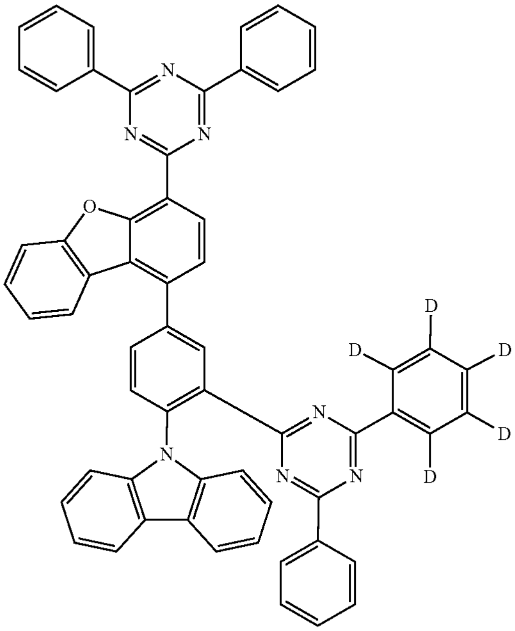
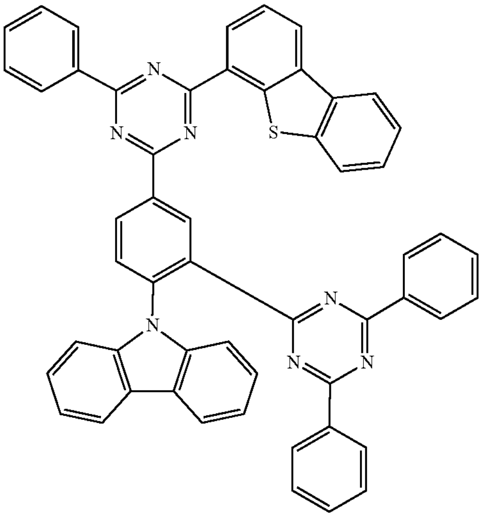

-continued
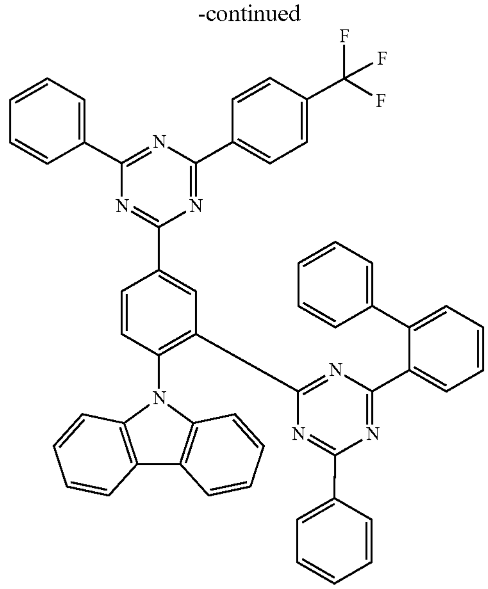
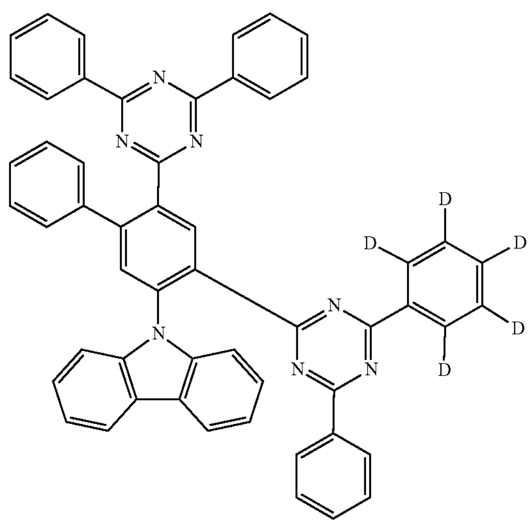
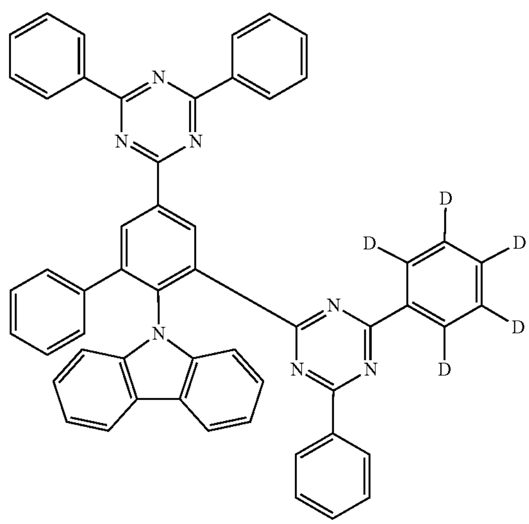
-continued
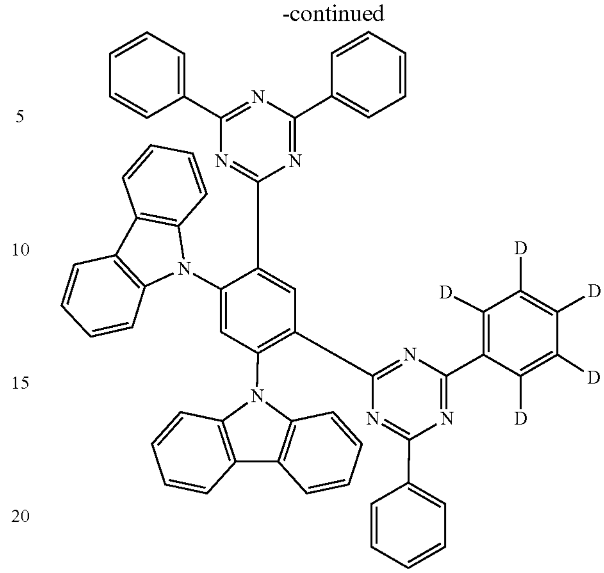
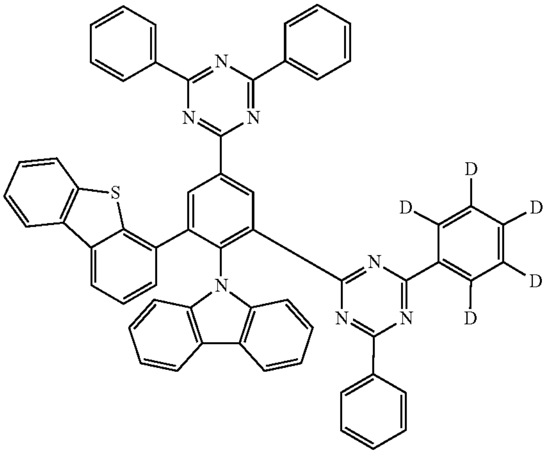
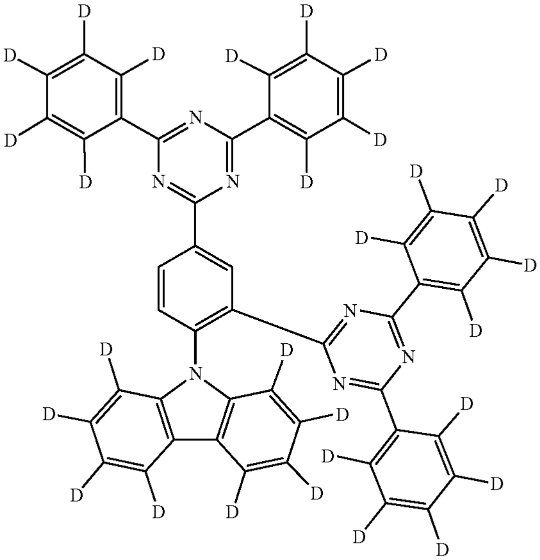

-continued
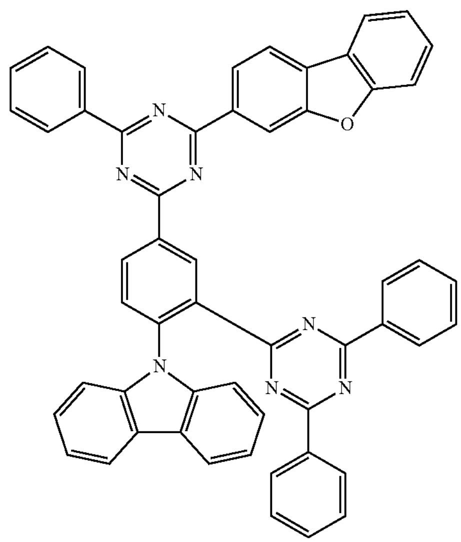
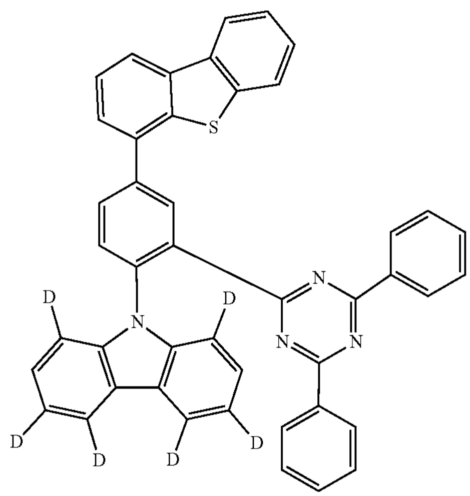
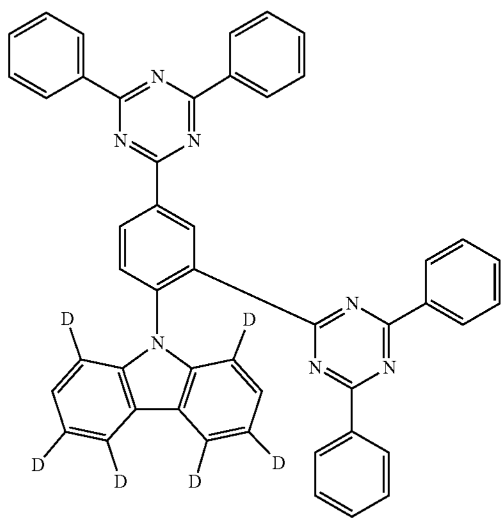
-continued
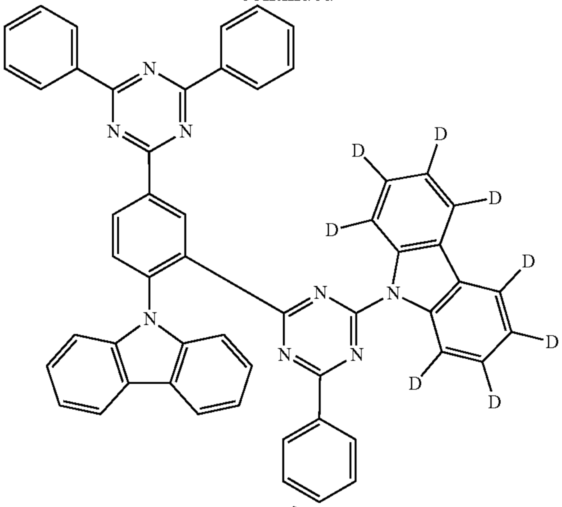
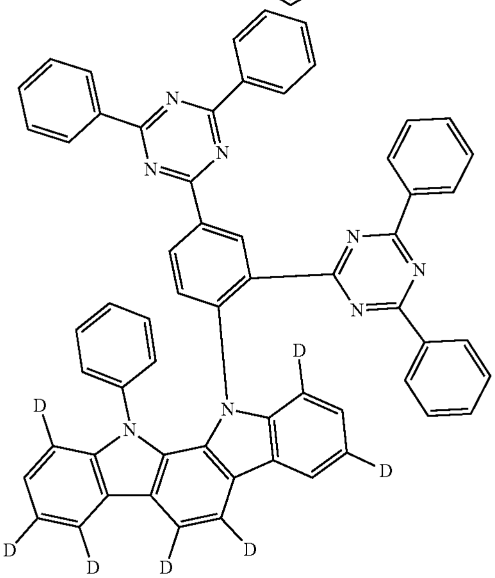
The compound of Chemical Formula 3 can be prepared, for example, by a preparation method as shown in the following Reaction Scheme 3, and the other remaining compound can be prepared in a similar manner.
[Reaction Scheme 3]
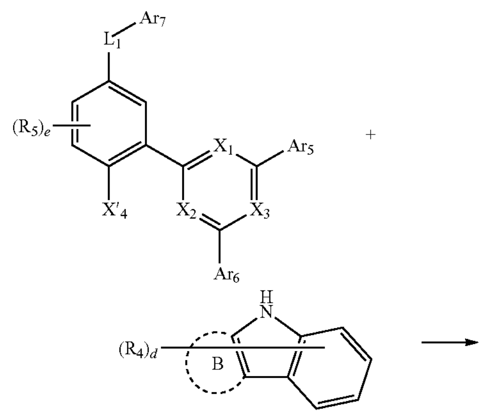

-continued

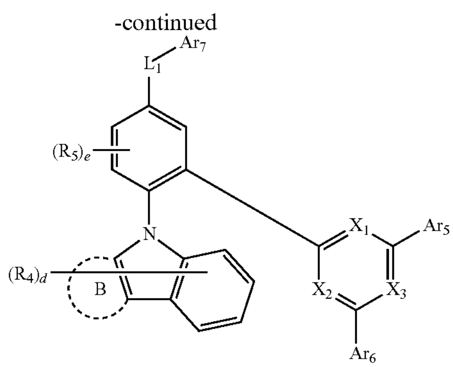

In Reaction Scheme 3, $Ar_5$ to $Ar_7$, $L_1$, $R_4$, $R_5$, $X_1$ to $X_3$, d and e are as defined in Chemical Formula 2, $X'_4$ is halogen, and more preferably, $X'_4$ is fluoro or chloro.

The Reaction Scheme 3 is an amine substitution reaction which is preferably carried out in the presence of a palladium catalyst and a base, and a reactive group for the amine substitution reaction can be modified as known in the art. The above preparation method can be further embodied in Preparation Examples described hereinafter.

In the light emitting layer, the weight ratio between the compound of Chemical Formula 1 and the compound of Chemical Formula 2 is 1:99 to 99:1, 5:95 to 95:5, or 10:90 to 90:10.

In the light emitting layer, the weight ratio between the compound of Chemical Formula 1 and the compound of Chemical Formula 3 is 1:99 to 99:1, 5:95 to 95:5, or 10:90 to 90:10.

The dopant material is not particularly limited as long as it is a material used for the organic light emitting device. As an example, an aromatic amine derivative, a styrylamine compound, a boron complex, a fluoranthene compound, a metal complex, and the like can be mentioned. Specific examples of the aromatic amine derivatives include substituted or unsubstituted fused aromatic ring derivatives having an arylamino group, examples thereof include pyrene, anthracene, chrysene, and periflanthene having the arylamino group, and the like. The styrylamine compound is a compound where at least one arylvinyl group is substituted in substituted or unsubstituted arylamine, wherein one or two or more substituent groups selected from the group consisting of an aryl group, a silyl group, an alkyl group, a cycloalkyl group and an arylamino group are substituted or unsubstituted. Specific examples thereof include styrylamine, styryldiamine, styryltriamine, styryltetramine, and the like, but are not limited thereto. Further, examples of the metal complex include an iridium complex, a platinum complex, and the like, but are not limited thereto Hole Injection Layer The organic light emitting device according to the present disclosure can further include a hole injection layer between the anode and the hole transport layer, if necessary.

The hole injection layer is a layer injecting holes from an electrode, and the hole injection material is preferably a compound which has a capability of transporting the holes, a hole injection effect in the anode and an excellent hole injection effect to the light emitting layer or the light emitting material, prevents movement of an exciton generated in the light emitting layer to the electron injection layer or the electron injection material, and has an excellent thin film forming ability. It is preferable that a HOMO (highest occupied molecular orbital) of the hole injection material is between the work function of the anode material and a HOMO of a peripheral organic material layer.

Specific examples of the hole injection material include metal porphyrine, oligothiophene, an arylamine-based organic material, a hexanitrilehexaazatriphenylene-based organic material, a quinacridone-based organic material, a perylene-based organic material, anthraquinone, polyaniline and polythiophene-based conductive polymer, and the like, but are not limited thereto.

Hole Transport Layer

The organic light emitting device according to the present disclosure can include a hole transport layer between the light emitting layer or an electron blocking layer and a hole injection layer described later.

The hole transport layer is a layer that receives holes from a hole injection layer and transports the holes to the light emitting layer. The hole transport material is suitably a material having large mobility to the holes, which can receive holes from the anode or the hole injection layer and transfer the holes to the light emitting layer.

Specific examples of the hole transport material can include an arylamine-based organic material, a conductive polymer, a block copolymer in which a conjugate portion and a non-conjugate portion are present together, and the like, but are not limited thereto.

Electron Blocking Layer

The organic light emitting device according to the present disclosure can include an electron blocking layer between the hole injection layer and the light emitting layer.

The electron blocking layer is a layer provided between the hole transport layer and the light emitting layer in order to prevent the electrons injected in the cathode from being transferred to the hole transport layer without being recombined in the light emitting layer, which can also be referred to as an electron inhibition layer. The electron blocking layer is preferably a material having a smaller electron affinity than the electron transport layer.

Hole Blocking Layer

The organic light emitting device according to the present disclosure can include a hole blocking layer between the light emitting layer and an electron transport layer described later.

The hole blocking layer is a layer provided between the electron transport layer and the light emitting layer in order to prevent the holes injected in the anode from being transferred to the electron transport layer without being recombined in the light emitting layer, which can also be referred to as a hole inhibition layer. The hole blocking layer is preferably a material having a large ionization energy.

Electron Transport Layer

The organic light emitting device according to the present disclosure can include an electron transport layer between the light emitting layer and the cathode.

The electron transport layer is a layer that receives electrons from a cathode and an electron injection layer formed on the cathode and transports the electrons to the light emitting layer, and that suppresses the transfer of holes from the light emitting layer, and an electron transport material is suitably a material which can receive electrons well from a cathode and transfer the electrons to a light emitting layer, and has a large mobility for electrons.

Specific examples of the electron transport material include: an Al complex of 8-hydroxyquinoline, a complex including $Alq_3$, an organic radical compound, a hydroxyflavone-metal complex, and the like, but are not limited thereto. The electron transport layer can be used with any desired cathode material, as used according to a conventional technique. In particular, appropriate examples of the cathode material are a typical material which has a low work function, followed by an aluminum layer or a silver layer. Specific examples thereof include cesium, barium, calcium, ytterbium, and samarium, in each case followed by an aluminum layer or a silver layer.

Electron Injection Layer

The organic light emitting device according to the present disclosure can further include an electron injection layer between the electron transport layer and the cathode, if necessary.

The electron injection layer is a layer which injects electrons from an electrode, and is preferably a compound which has a capability of transporting electrons, has an effect of injecting electrons from a cathode and an excellent effect of injecting electrons into a light emitting layer or a light emitting material, prevents excitons produced from the light emitting layer from moving to a hole injection layer, and is also excellent in the ability to form a thin film.

Specific examples of the materials that can be used as the electron injection layer include fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, a metal complex compound, a nitrogen-containing 5-membered ring derivative, and the like, but are not limited thereto.

Examples of the metal complex compound include 8-hydroxy-quinolinato lithium, bis(8-hydroxyquinolinato)zinc, bis(8-hydroxyquinolinato)-copper, bis(8-hydroxyquinolinato)manganese, tris(8-hydroxyquinolinato)-aluminum, tris (2-methyl-8-hydroxyquinolinato)aluminum, tris(8-hydroxyquinolinato)gallium, bis(10-hydroxybenzo[h]quinolinato) beryllium, bis(10-hydroxybenzo[h]quinolinato)zinc, bis(2-methyl-8-quinolinato)chlorogallium, bis(2-methyl-8-quinolinato)(o-cresolato)gallium, bis(2-methyl-8-quinolinato)-(1-naphtholato)aluminum, bis(2-methyl-8-quinolinato)(2-naphtholato)gallium, and the like, but are not limited thereto.

Organic Light Emitting Device

The structure of the organic light emitting device according to the present disclosure is illustrated in FIGS. 1 to 3. FIG. 1 shows an example of an organic light emitting device comprising a substrate 1, an anode 2, a light emitting layer 3, and a cathode 4. FIG. 2 shows an example of an organic light emitting device comprising a substrate 1, an anode 2, a hole injection layer 5, a hole transport layer 6, a light emitting layer 3, an electron transport layer 7, an electron injection layer 8, and a cathode 4. FIG. 3 shows an example of an organic light emitting device comprising a substrate 1, an anode 2, a hole injection layer 5, a hole transport layer 6, an electron blocking layer 9, a light emitting layer 3, a hole blocking layer 10, an electron transport layer 7, an electron injection layer 8, and a cathode 4.

The organic light emitting device according to the present disclosure can be manufactured by sequentially stacking the above-described structures. In this case, the organic light emitting device can be manufactured by depositing a metal, metal oxides having conductivity, or an alloy thereof on the substrate by using a PVD (physical vapor deposition) method such as a sputtering method or an e-beam evaporation method to form the anode, forming the respective layers described above thereon, and then depositing a material that can be used as the cathode thereon.

In addition to such a method, the organic light emitting device can be manufactured by sequentially depositing from the cathode material to the anode material on a substrate in the reverse order of the above-mentioned configuration (WO 2003/012890). Further, the light emitting layer can be formed by subjecting hosts and dopants to a vacuum deposition method and a solution coating method. Herein, the solution coating method means a spin coating, a dip coating, a doctor blading, an inkjet printing, a screen printing, a spray method, a roll coating, or the like, but is not limited thereto.

On the other hand, the organic light emitting device according to the present disclosure can be a bottom emission type device, a top emission type device, or a double side emission type device, and in particular, it can be a bottom emission type light emitting device that requires relatively high luminous efficiency.

Hereinafter, preferred examples are presented to assist in the understanding of the present disclosure. However, the following examples are only provided for a better understanding of the present disclosure, and is not intended to limit the content of the present disclosure.

SYNTHESIS EXAMPLES

Synthesis Example 1: Synthesis of Compound 1-1

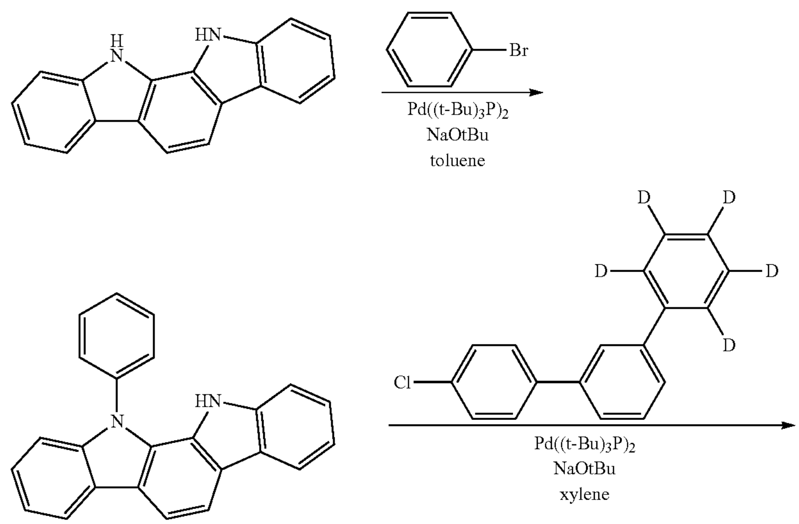

1-1-a

-continued

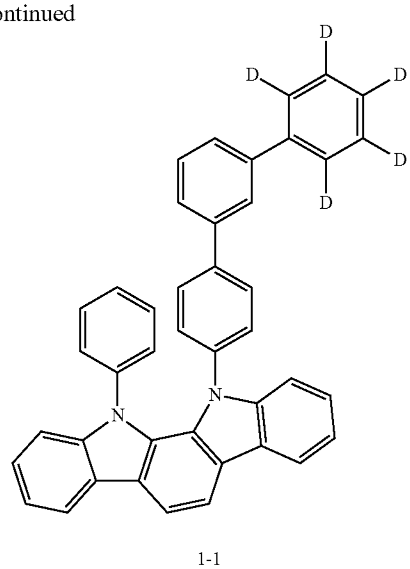

1-1

Step 1) Synthesis of Compound 1-1-a 11,12-dihydroindolo[2,3-a]carbazole (30 g, 117 mmol) and bromobenzene (18.4 g, 117 mmol) were added to 600 ml of toluene under a nitrogen atmosphere, and the mixture was stirred and refluxed. Then, sodium tert-butoxide (33.8 g, 351.1 mmol) was added thereto, and the mixture was sufficiently stirred and then bis(tri-tert-butylphosphine)palladium (1.8 g, 3.5 mmol) was added. After reacting for 5 hours, the reaction mixture was cooled to room temperature, and the organic layer was filtered to remove salts, and then the filtered organic layer was distilled. This was again added to and dissolved in 389 ml (10 times the amount) of chloroform, washed twice with water, and then the organic layer was separated, anhydrous magnesium sulfate was added thereto, stirred, and then filtered, and the filtrate was distilled under reduced pressure. The concentrated compound was purified through a silica column using chloroform and ethyl acetate to prepare a yellow solid Compound 1-1-a (30 g, yield: 77%, MS: $[M+H]^+$=333.4).

Step 2) Synthesis of Compound 1-1

Compound 1-1-a (30 g, 90.2 mmol) and 4-chloro-1,1':3',1"-terphenyl-2",3",4",5",6"-d5 (23.2 g, 90.2 mmol) were added to 600 ml of xylene under a nitrogen atmosphere, and the mixture was stirred and refluxed. Then, sodium tert-butoxide (26 g, 270.7 mmol) was added thereto, and the mixture was sufficiently stirred and then bis(tri-tert-butylphosphine)palladium (1.4 g, 2.7 mmol) was added. After reacting for 4 hours, the reaction mixture was cooled to room temperature, and the organic layer was filtered to remove salts, and then the filtered organic layer was distilled. This was again added to and dissolved in 511 ml (10 times the amount) of chloroform, washed twice with water, and then the organic layer was separated, anhydrous magnesium sulfate was added thereto, stirred, and then filtered, and the filtrate was distilled under reduced pressure. The concentrated compound was purified through a silica column using chloroform and ethyl acetate to prepare a white solid Compound 1-1 (39.3 g, yield: 77%, MS: $[M+H]^+$=566.7).

Synthesis Example 2: Synthesis of Compound 1-2

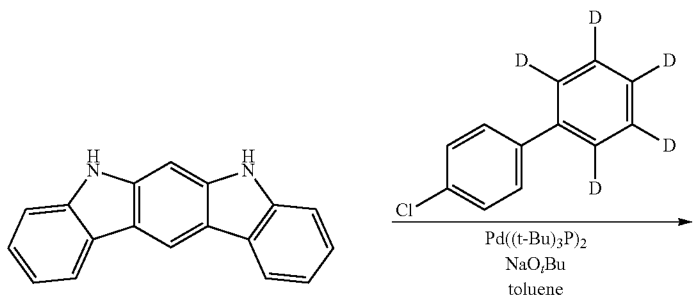

-continued
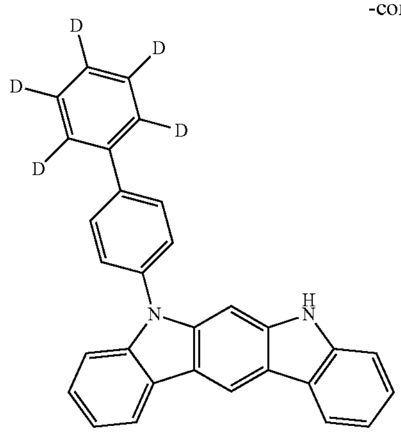
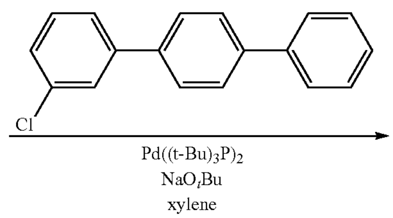
1-2-a
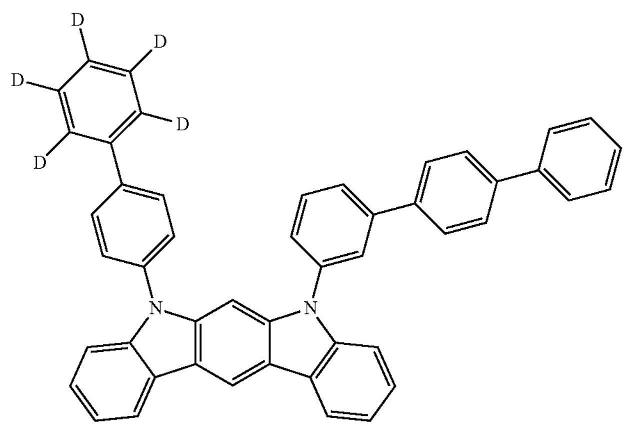
1-2
Compound 1-2 (MS: $[M+H]^+$=642.8) was prepared in the same manner as in the Preparation of Compound 1-1, except that in Synthesis Example 1, 11,12-dihydroindolo[2,3-a]carbazole, bromobenzene and 4-chloro-1,1':3',1"-terphenyl-2",3",4",5",6"-d5 were respectively changed to 1,3-dihydroindolo[2,3-b]carbazole, 4-chloro-1,1'-biphenyl-2',3',4',5',6'-d5 and 3-chloro-1,1':4',1"-terphenyl.
Synthesis Example 3: Synthesis of Compound 1-3
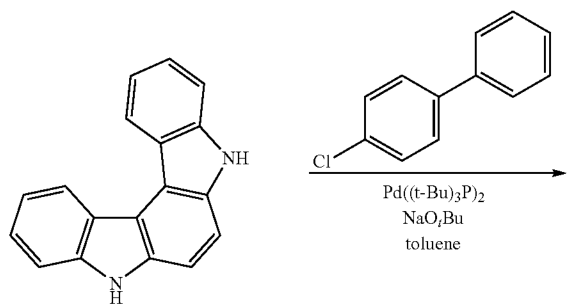

-continued

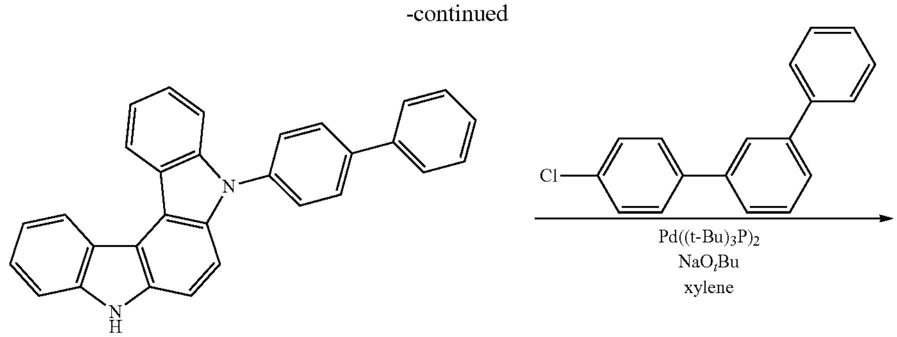

1-3-a

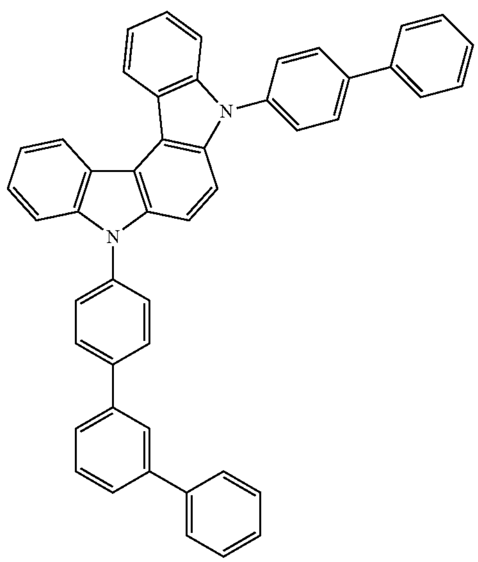

1-3

Compound 1-3 (MS: $[M+H]^+$=637.3) was prepared in the same manner as in the Preparation of Compound 1-1, except that in Synthesis Example 1, 11,12-dihydroindolo[2,3-a]carbazole, bromobenzene and 4-chloro-1,1':3',1"-terphenyl-2",3",4",5",6"-d5 were respectively changed to 5,8-dihydroindolo[2,3-c]carbazole, 4-chloro-1,1'-biphenyl and 4-chloro-1,1':3',1"-terphenyl.

Synthesis Example 4: Synthesis of Compound 1-4

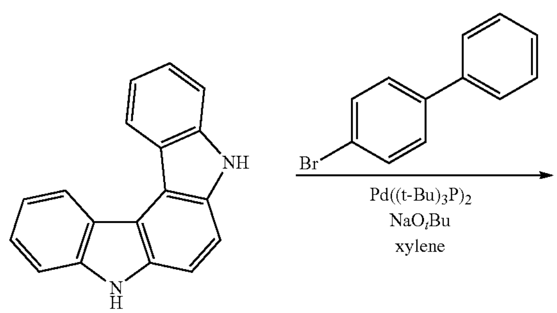

-continued

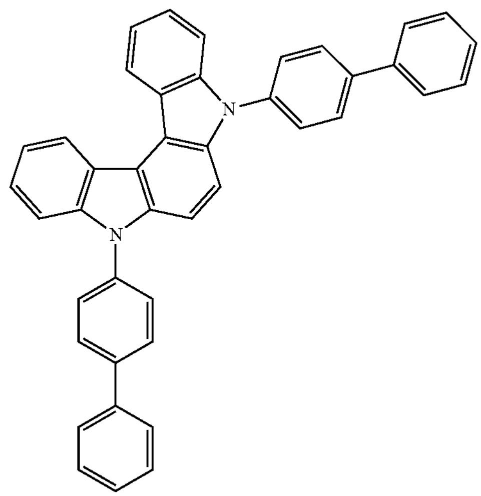

1-4

Compound 1-4 (MS: $[M+H]^+$=561.2) was prepared in the same manner as in the Preparation of Compound 1-1, except that in Synthesis Example 1, 11,12-dihydroindolo[2,3-a]carbazole was changed to 5,8-dihydroindolo[2,3-c]carbazole, and bromobenzene and 4-chloro-1,1':3',1"-terphenyl-2",3",4",5",6"-d5 were respectively changed to 4-bromo-1,1'-biphenyl.
Synthesis Example 5: Synthesis of Compound 1-5
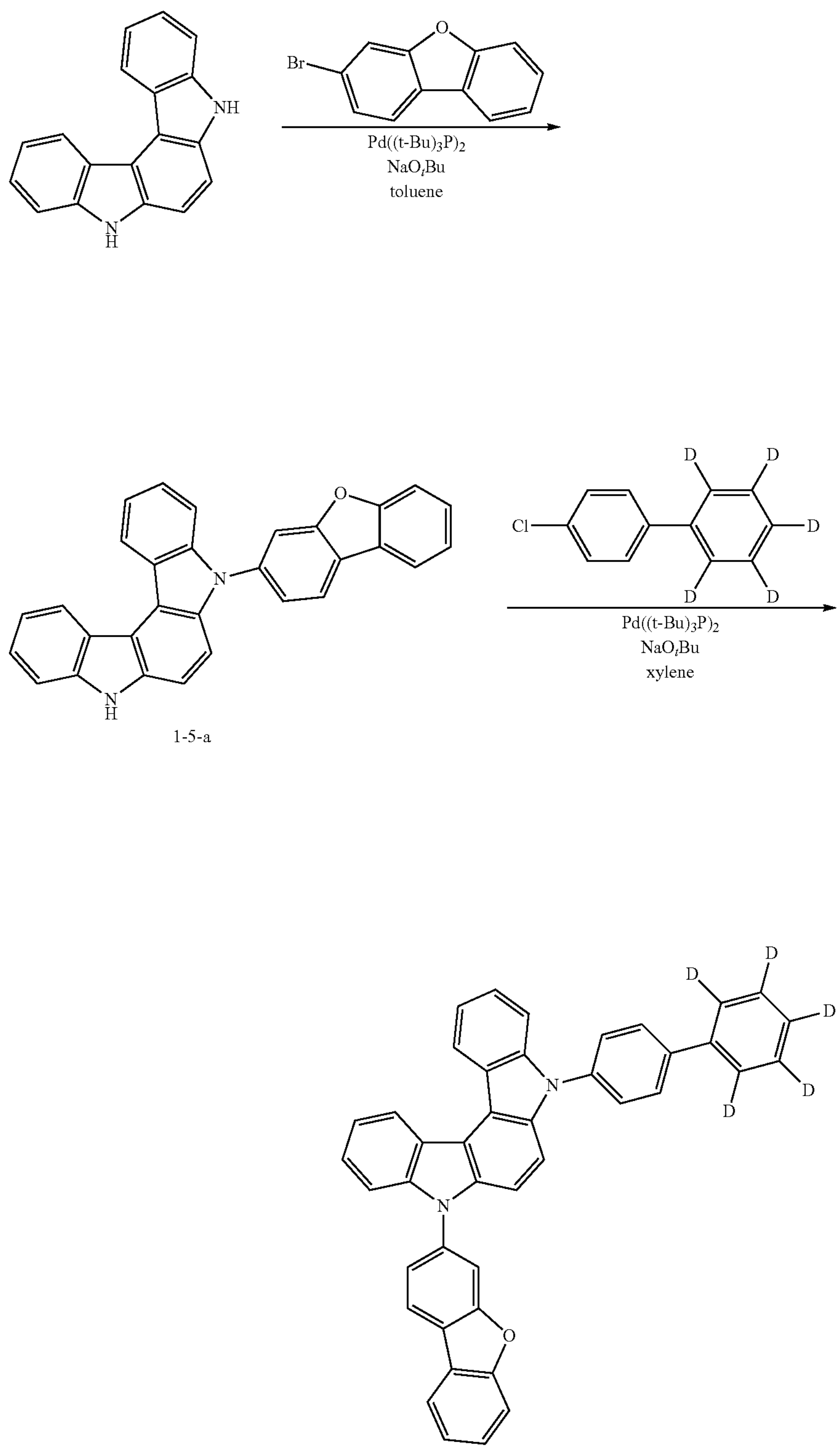
1-5-a
1-5

Compound 1-5 (MS: $[M+H]^+$=580.2) was prepared in the same manner as in the Preparation of Compound 1-1, except that in Synthesis Example 1, 11,12-dihydroindolo[2,3-a]carbazole, bromobenzene and 4-chloro-1,1':3',1"-terphenyl-2",3",4",5",6"-d5 were respectively changed to 5,8-dihydroindolo[2,3-c]carbazole, 3-bromodibenzo[b,d]furan and 4-chloro-1,1'-biphenyl-2',3',4',5',6'-d5.

Synthesis Example 6: Synthesis of Compound 1-6

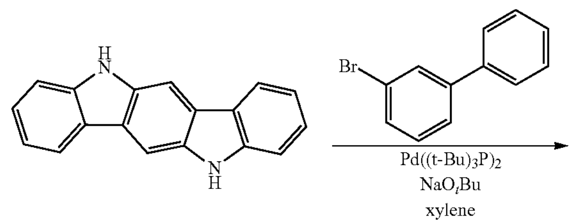

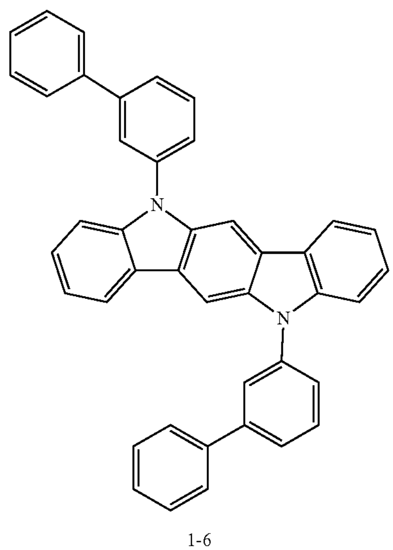

1-6

Compound 1-6 (MS: $[M+H]^+$=561.2) was prepared in the same manner as in the Preparation of Compound 1-1, except that in Synthesis Example 1, 11,12-dihydroindolo[2,3-a]carbazole was changed to 5,11-dihydroindolo[3,2-b]carbazole, and bromobenzene and 4-chloro-1,1':3',1"-terphenyl-2",3",4",5",6"-d5 were respectively changed to 3-bromo-1,1'-biphenyl.

Synthesis Example 7: Synthesis of Compound 1-7

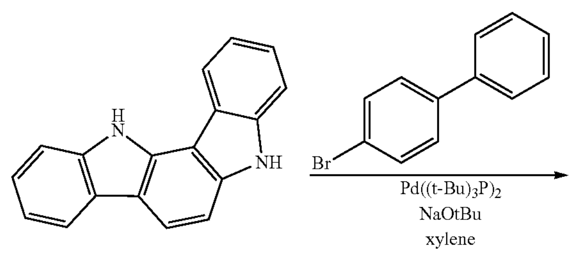

-continued

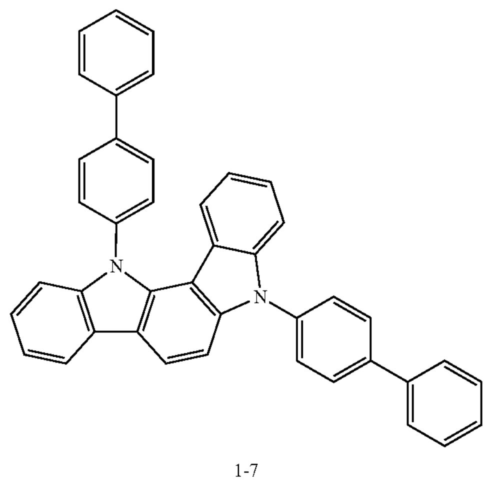

1-7

Compound 1-7 (MS: $[M+H]^+$=561.2) was prepared in the same manner as in the Preparation of Compound 1-1, except that in Synthesis Example 1, 11,12-dihydroindolo[2,3-a]carbazole was changed to 5,12-dihydroindolo[3,2-a]carbazole, and bromobenzene and 4-chloro-1,1':3',1"-terphenyl-2",3",4",5",6"-d5 were respectively changed to 4-bromo-1,1'-biphenyl.

Synthesis Example 8: Synthesis of Compound 1-8

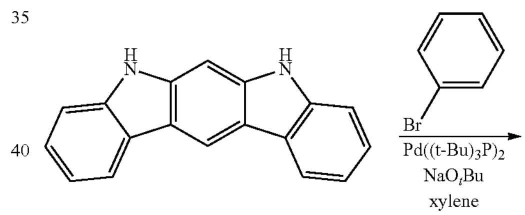

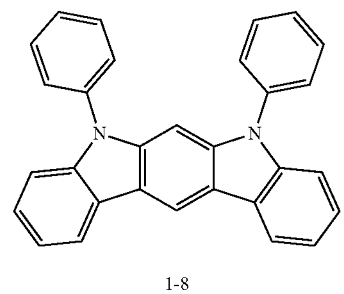

1-8

Compound 1-8 (MS: $[M+H]^+$=408.1) was prepared in the same manner as in the Preparation of Compound 1-1, except that in Synthesis Example 1, 11,12-dihydroindolo[2,3-a]carbazole was changed to 1,3-dihydroindolo[2,3-b]carbazole, and bromobenzene and 4-chloro-1,1':3',1"-terphenyl-2",3",4",5",6"-d5 were respectively changed to bromobenzene.

Synthesis Example 9: Synthesis of Compound 2-1

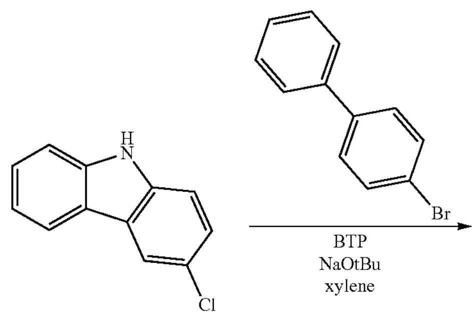

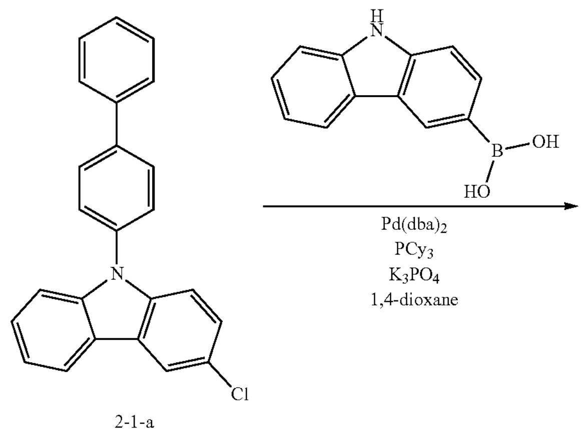

2-1-a

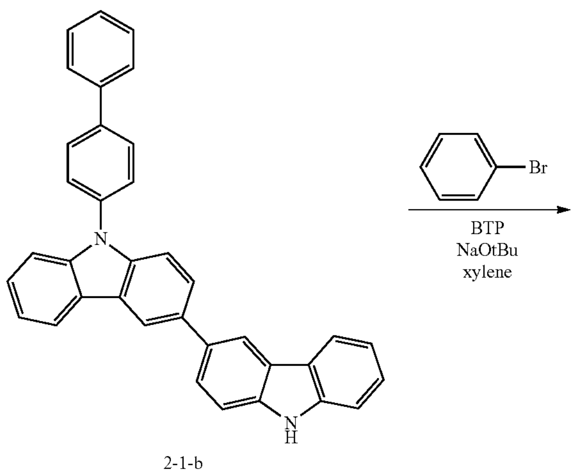

2-1-b

-continued

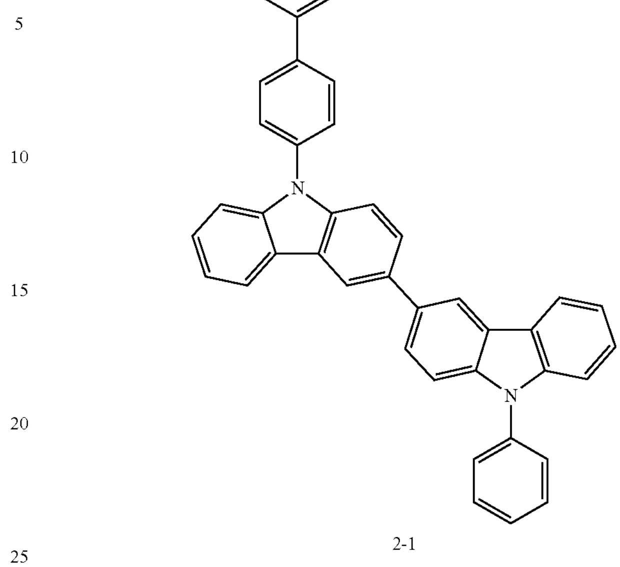

2-1

Step 1) Synthesis of Compound 2-1-a

3-Chloro-9H-carbazole (30 g, 148.8 mmol) and 4-bromo-1,1-biphenyl (34.7 g, 148.8 mmol) were added to 600 ml of xylene under a nitrogen atmosphere, and the mixture was stirred and refluxed. Then, sodium tert-butoxide (42.9 g, 446.3 mmol) was added thereto, and the mixture was sufficiently stirred and then bis(tri-tert-butylphosphine)palladium (BTP, 0.8 g, 1.5 mmol) was added. After reacting for 5 hours, the reaction mixture was cooled to room temperature, and the organic layer was filtered to remove salts, and then the filtered organic layer was distilled. This was again added to and dissolved in 526 ml (10 times the amount) of chloroform, washed twice with water, and then the organic layer was separated, anhydrous magnesium sulfate was added thereto, stirred, and then filtered, and the filtrate was distilled under reduced pressure. The concentrated compound was purified through a silica column using chloroform and ethyl acetate to prepare a white solid Compound 2-1-a (45.3 g, yield: 86%, MS: $[M+H]^+=354.8$).

Step 2) Synthesis of Compound 2-1-b

Compound 2-1-a (20 g, 56.5 mmol) and (9H-carbazol-3-yl)boronic acid (11.9 g, 56.5 mmol) were added to 400 ml of 1,4-dioxane under a nitrogen atmosphere, and the mixture was stirred and refluxed. Then, tripotassium phosphate (36 g, 169.6 mmol) was dissolved in 36 ml of water, added thereto, and the mixture was sufficiently stirred and then dibenzylideneacetonepalladium (1 g, 1.7 mmol) and tricyclohexylphosphine (1 g, 3.4 mmol) were added. After reacting for 5 hours, the reaction mixture was cooled to room temperature, and the resulting solid was filtered. The solid was added to and dissolved in 822 mL (30 times the amount) of chloroform, washed twice with water, the organic layer was separated, anhydrous magnesium sulfate was added, stirred, then filtered, and the filtrate was distilled under reduced pressure. The concentrated compound was recrystallized from chloroform and ethyl acetate to prepare a white solid Compound 2-1-b (20.8 g, 76%, MS: $[M+H]^+=485.6$).

Step 3) Synthesis of Compound 2-1

Compound 2-1-b (30 g, 61.9 mmol) and 4-bromobenzene (9.7 g, 61.9 mmol) were added to 600 ml of xylene under a nitrogen atmosphere, and the mixture was stirred and refluxed. Then, sodium tert-butoxide (17.9 g, 185.7 mmol) was added thereto, and the mixture was sufficiently stirred and then bis(tri-tert-butylphosphine)palladium (BTP, 0.3 g, 0.6 mmol) was added. After reacting for 4 hours, the reaction mixture was cooled to room temperature, and the organic layer was filtered to remove salts, and then the filtered organic layer was distilled. This was again added to and dissolved in 347 ml (10 times the amount) of chloroform, washed twice with water, and then the organic layer was separated, anhydrous magnesium sulfate was added thereto, stirred, and then filtered, and the filtrate was distilled under reduced pressure. The concentrated compound was purified through a silica column using chloroform and ethyl acetate to prepare a white solid Compound 2-1 (20.5 g, yield: 59%, MS: $[M+H]^+$=561.2).

Synthesis Example 10: Synthesis of Compound 2-2

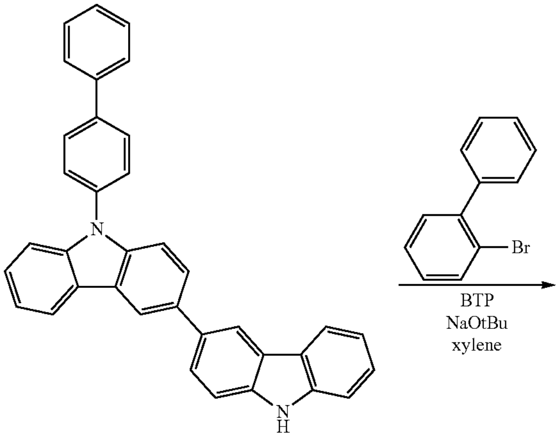

2-1-b

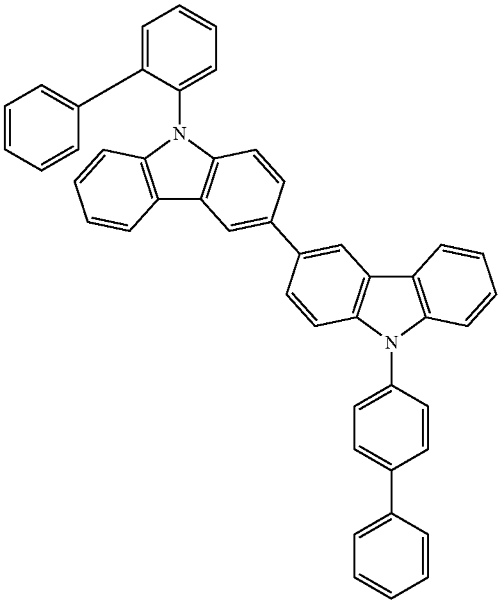

2-2

Compound 2-2 (MS: $[M+H]^+$=637.3) was prepared in the same manner as in the Preparation of Compound 2-1, except that in Synthesis Example 9, bromobenzene was changed to 2-bromo-1,1'-biphenyl.

Synthesis Example 11: Synthesis of Compound 2-3

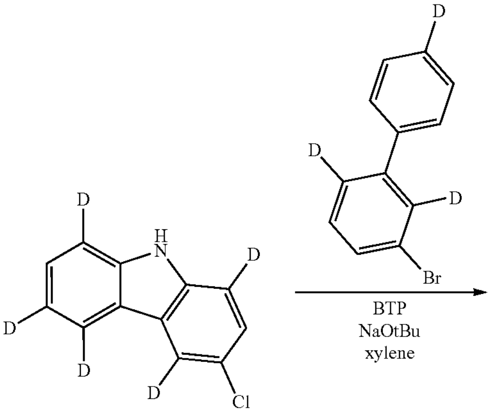

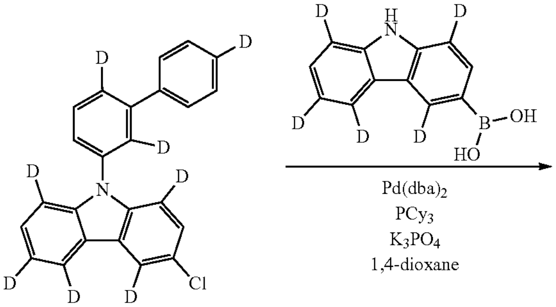

2-3-a

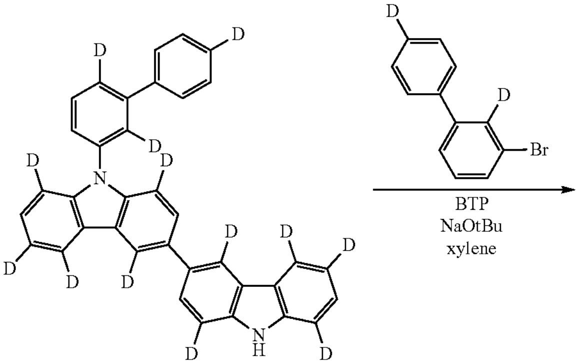

2-3-b

-continued

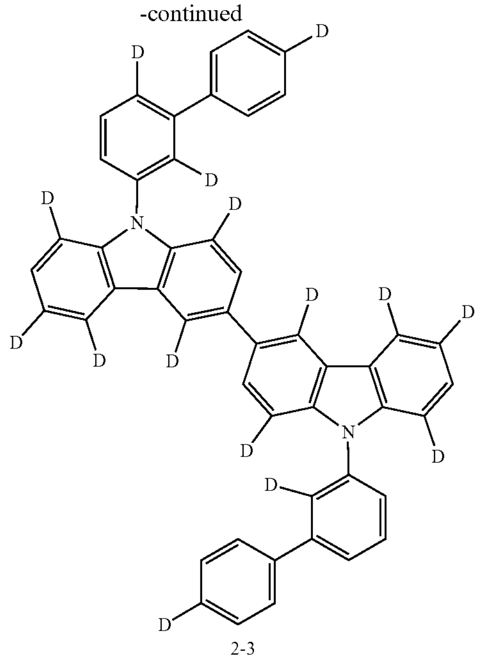

2-3

-continued

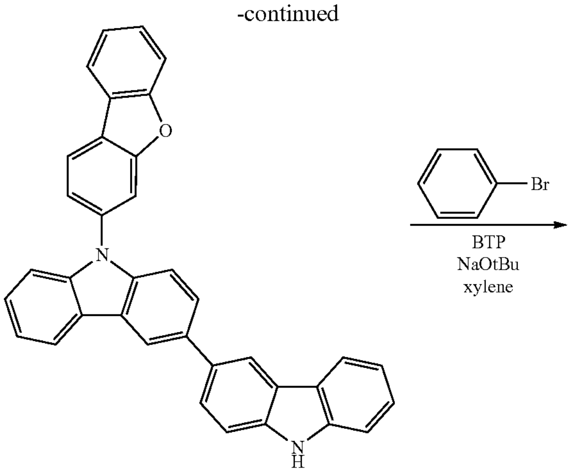

2-4-b

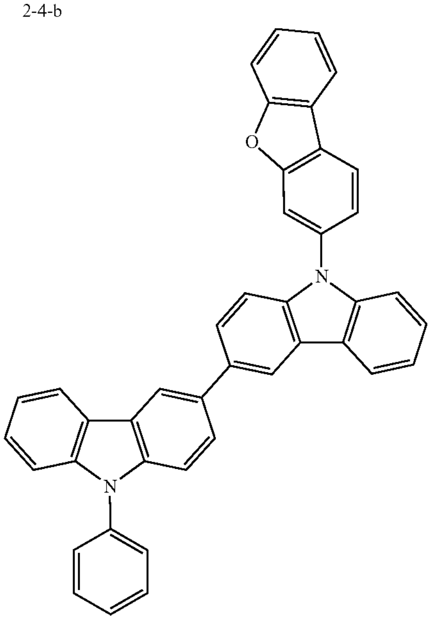

2-4

Compound 2-3 (MS: $[M+H]^+$=652.4) was prepared in the same manner as in the Preparation of Compound 2-1, except that in Synthesis Example 9, 3-chloro-9H-carbazole, 4-bromo-1,1'-biphenyl, (9H-carbazol-3-yl)boronic acid and 4-bromobenzene were changed to 3-chloro-9H-carbazole-1,4,5,6,8-d5, 3-bromo-1,1'-biphenyl-2,4',6-d3, (9H-carbazol-3-yl-1,4,5,6,8-d5)boronic acid and 3-bromo-1,1'-biphenyl-2,4'-d2.

Synthesis Example 12: Synthesis of Compound 2-4

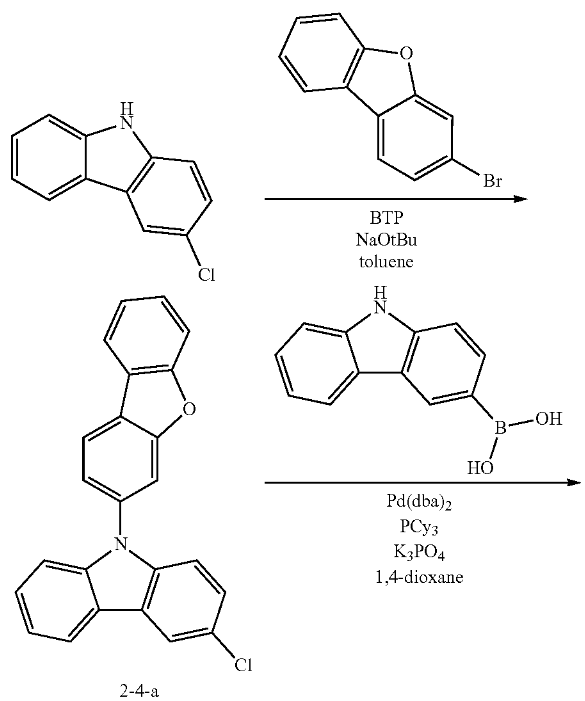

2-4-a

Compound 2-4 (MS: $[M+H]^+$=573.3) was prepared in the same manner as in the Preparation of Compound 2-1, except that in Synthesis Example 9, 4-bromo-1,1'-biphenyl was changed to 3-bromo-dibenzo[b,d]furan.

Synthesis Example 13: Synthesis of Compound 2-5

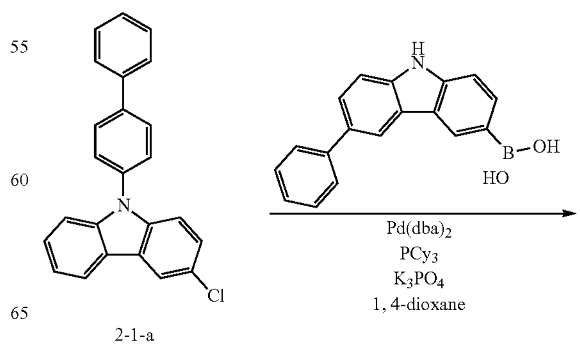

2-1-a

-continued
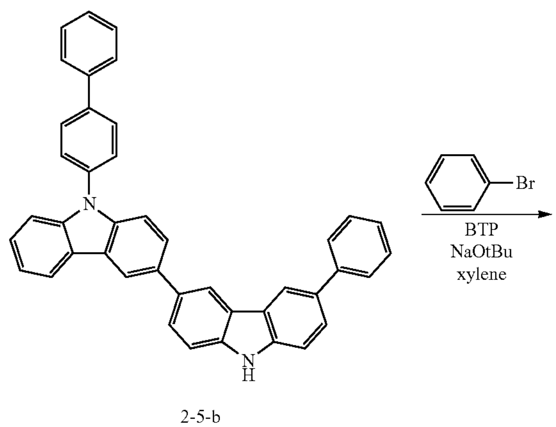
2-5-b
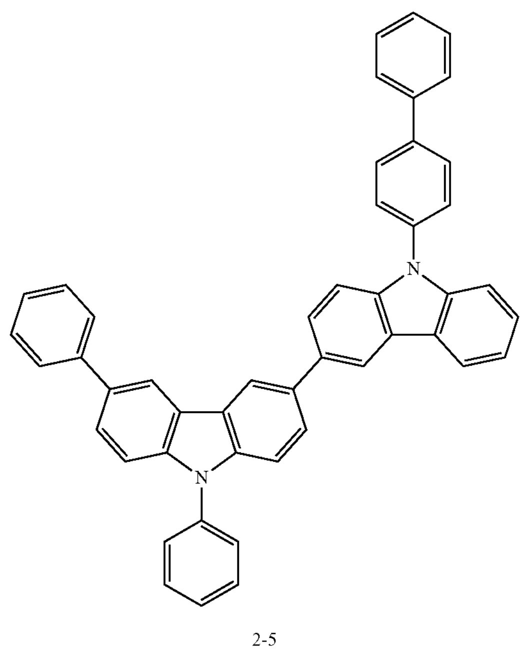
2-5
Compound 2-5 (MS[M+H]+=637.3) was prepared in the same manner as in the Preparation of Compound 2-1, except that in Synthesis Example 9, (9H-carbazol-3-yl)boronic acid was changed to (6-phenyl-9H-carbazol-3-yl)boronic acid.
Synthesis Example 14: Synthesis of Compound 3-1
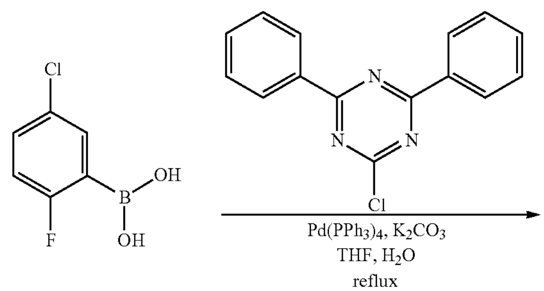
-continued
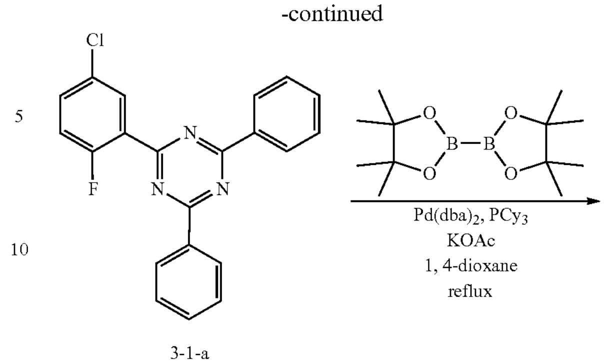
3-1-a
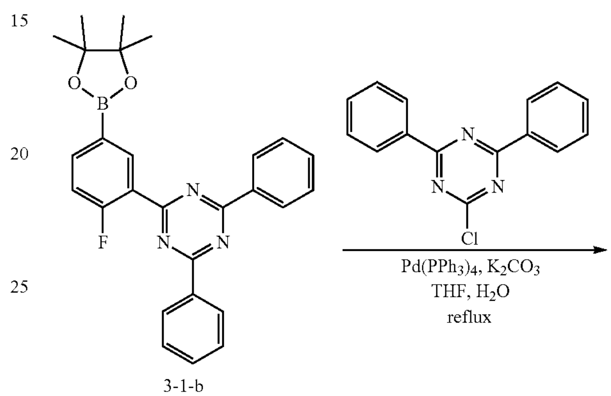
3-1-b
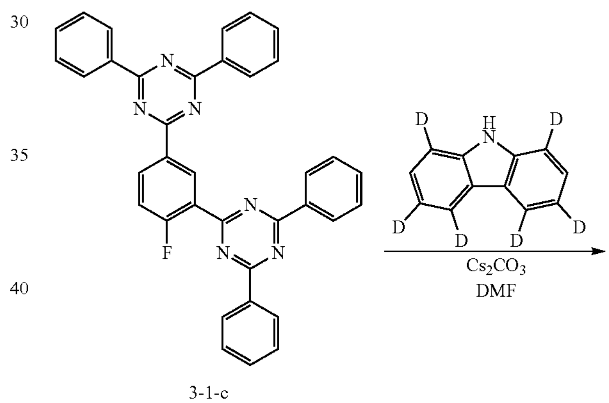
3-1-c
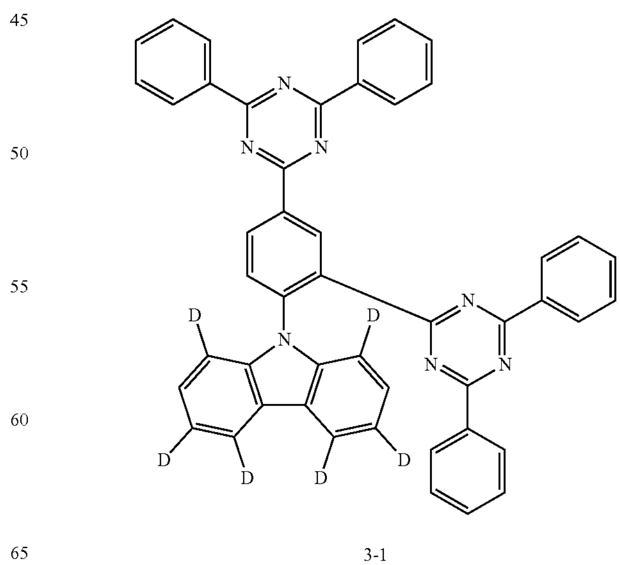
3-1

Step 1) Synthesis of Compound 3-1-a (5-Chloro-2-fuorophenyl)boronic acid (50 g, 286.8 mmol) and 2-chloro-4,6-diphenyl-1,3,5-triazine (76.8 g, 286.8 mmol) were added to 1000 ml of tetrahydrofuran under a nitrogen atmosphere, and the mixture was stirred and refluxed. Then, potassium carbonate (118.9 g, 860.3 mmol) was dissolved in 119 ml of water, added thereto, and the mixture was sufficiently stirred and then tetrakistriphenyl-phosphinopalladium (9.9 g, 8.6 mmol) was added. After reacting for 1 hour, the reaction mixture was cooled to room temperature, and the organic layer and the aqueous layer were separated and then the organic layer was distilled. This was again added to and dissolved in 2075 ml (20 times the amount) of chloroform, washed twice with water, and then the organic layer was separated, anhydrous magnesium sulfate was added thereto, stirred, and then filtered, and the filtrate was distilled under reduced pressure. The concentrated compound was recrystallized using chloroform and ethyl acetate to prepare a white solid Compound 3-1-a (89.2 g, yield: 86%, MS: $[M+H]^+$=362.8).

Step 2) Synthesis of Compound 3-1-b

Compound 3-1-a (30 g, 82.9 mmol) and bis(pinacolato) diboron (21.1 g, 82.9 mmol) were added to 600 ml of 1,4-dioxane under a nitrogen atmosphere, and the mixture was stirred and refluxed. Then, potassium acetate (52.8 g, 248.8 mmol) was added thereto, and the mixture was sufficiently stirred and then dibenzylideneacetone palladium (1.4 g, 2.5 mmol) and tricyclohexylphosphine (1.4 g, 5 mmol) were added. After reacting for 3 hours, the reaction mixture was cooled to room temperature, and the organic layer was filtered to remove salts, and then the filtered organic layer was distilled. This was again added to and dissolved in 376 ml (10 times the amount) of chloroform, washed twice with water, and then the organic layer was separated, anhydrous magnesium sulfate was added thereto, stirred, and then filtered, and the filtrate was distilled under reduced pressure. The concentrated compound was recrystallized from chloroform and ethanol to prepare a white solid Compound 3-1-b (29.7 g, yield: 79%, MS: $[M+H]^+$=454.3).

Step 3) Synthesis of Compound 3-1-c

Compound 3-1-b (50 g, 110.3 mmol) and 2-chloro-4,6-diphenyl-1,3,5-triazine (29.5 g, 110.3 mmol) were added to 1000 ml of tetrahydrofuran under a nitrogen atmosphere, and the mixture was stirred and refluxed. Then, potassium carbonate (45.7 g, 330.9 mmol) was dissolved in 46 ml of water, added thereto, and the mixture was sufficiently stirred and then tetrakistriphenyl-phosphinopalladium (3.8 g, 3.3 mmol) was added. After reacting for 1 hour, the reaction mixture was cooled to room temperature, and the organic layer and the aqueous layer were separated and then the organic layer was distilled. This was again added to and dissolved in 1232 ml (20 times the amount) of chloroform, washed twice with water, and then the organic layer was separated, anhydrous magnesium sulfate was added thereto, stirred, and then filtered, and the filtrate was distilled under reduced pressure. The concentrated compound was recrystallized from chloroform and ethyl alcohol to prepare a white solid Compound 3-1-c (46.2 g, yield: 75%, MS: $[M+H]^+$=559.6).

Step 4) Synthesis of Compound 3-1

Compound 3-1-c (20 g, 35.8 mmol) and 9H-carbazole-1,3,4,5,6,8-d6 (6.2 g, 35.8 mmol) were added to 400 ml of dimethylformamide under a nitrogen atmosphere, and the mixture was stirred and refluxed. Then, cesium carbonate (35 g, 107.4 mmol) was added, and the mixture was heated and stirred. After reacting for 3 hours, the reaction mixture was cooled to room temperature, and the resulting solid was filtered. The solid was added to and dissolved in 765 mL (30 times the amount) of chloroform, washed twice with water, the organic layer was separated, anhydrous magnesium sulfate was added, stirred, then filtered, and the filtrate was distilled under reduced pressure. The concentrated compound was purified through a silica column using chloroform and ethyl acetate to prepare a yellow solid Compound 3-1 (16.3 g, 64%, MS: $[M+H]^+$=712.9).

Synthesis Example 15: Synthesis of Compound 3-2

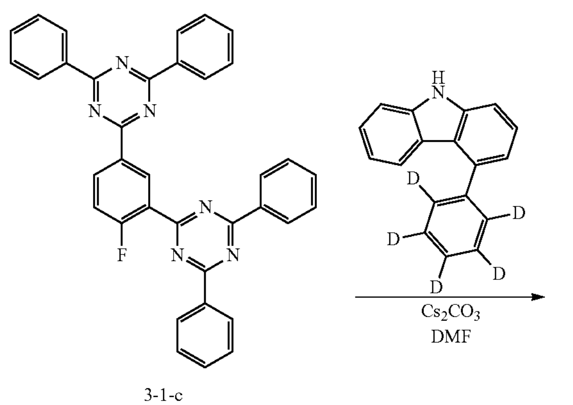

3-1-c

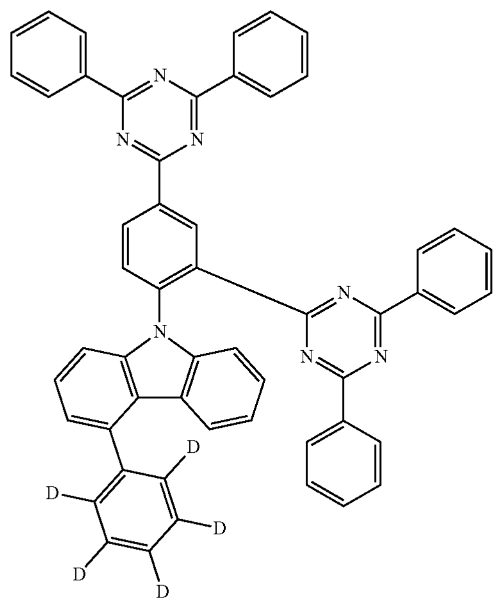

3-2

Compound 3-2 (MS: $[M+H]^+$=787.4) was prepared in the same manner as in the Preparation of Compound 3-1, except that in Synthesis Example 14, 9H-carbazole-1,3,4,5,6,8-d6 was changed to 3-(phenyl-d5)-9H-carbazole.

Synthesis Example 16: Synthesis of Compound 3-3
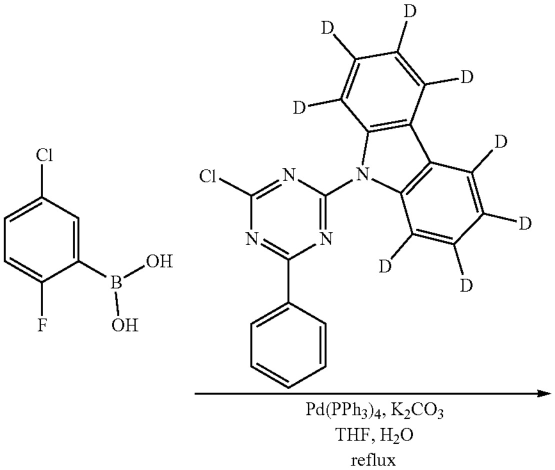
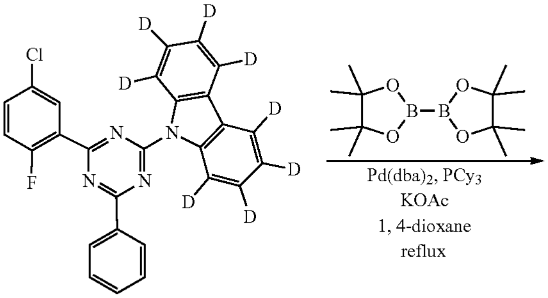
3-3-a
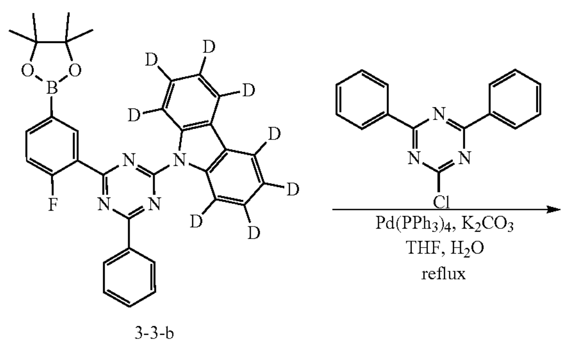
3-3-b
-continued
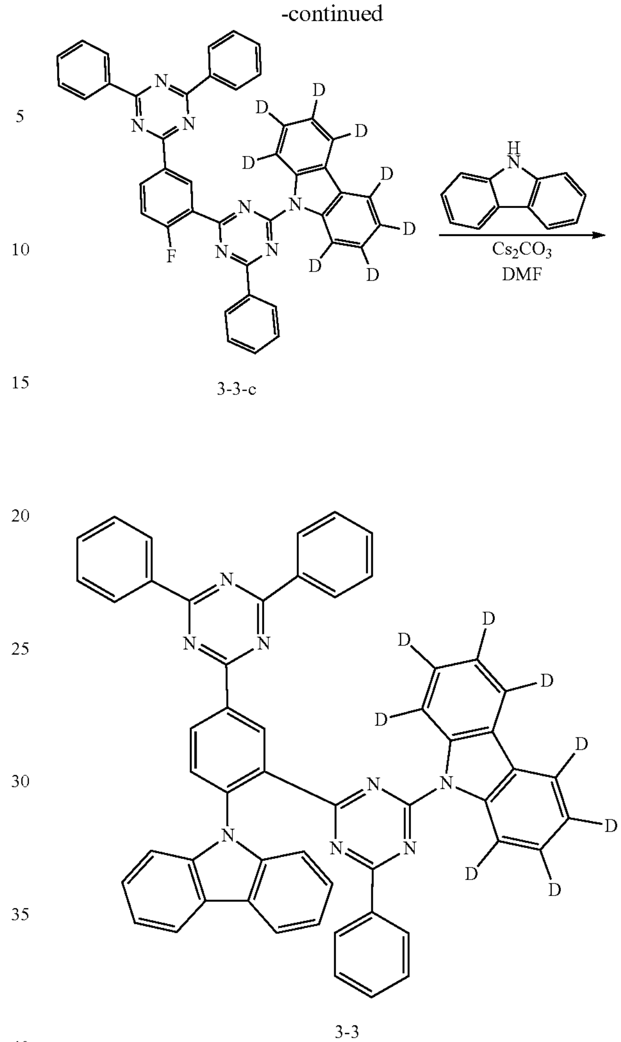
3-3-c
3-3
Compound 3-3 (MS: $[M+H]^+$=803.4) was prepared in the same manner as in the Preparation of Compound 3-1, except that in Synthesis Example 14, 2-chloro-4,6-diphenyl-1,3,5-triazine and 9H-carbazole-1,3,4,5,6,8-d6 were changed to 9-(4-chloro-6-phenyl-1,3,5-triazin-2-yl)-9H-carbazole-1,2,3,4,5,6,7,8-d8 and 9H-carbazole.
Synthesis Example 17: Synthesis of Compound 3-4
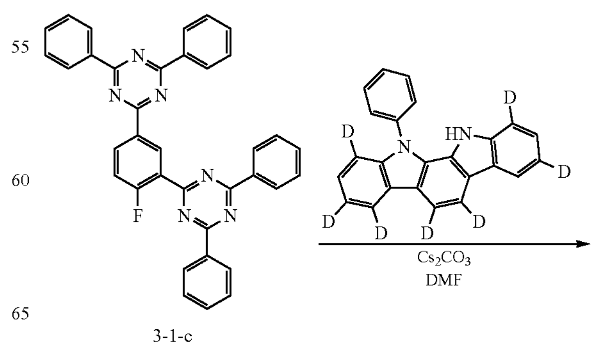
3-1-c -continued

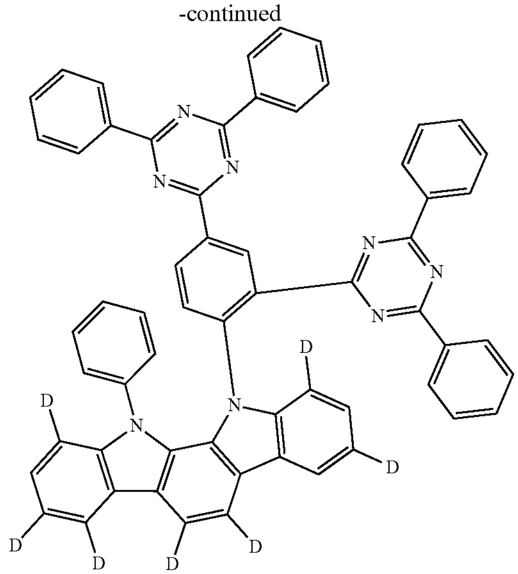

3-4

Compound 3-4 (MS: $[M+H]^+$=878.4) was prepared in the same manner as in the Preparation of Compound 3-1, except that in Synthesis Example 14, 9H-carbazole-1,3,4,5,6,8-d6 was changed to 11-phenyl-11,12-dihydro-indolo[2,3-a]carbazole-1,3,5,6,7,8,10-d7.

-continued

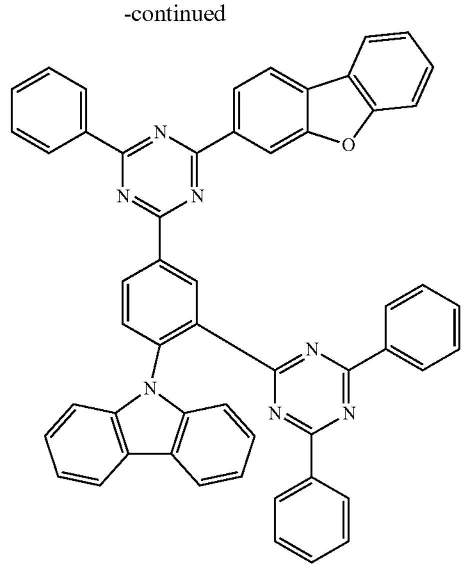

3-5

Compound 3-5 (MS: $[M+H]^+$=796.3) was prepared in the same manner as in the Preparation of Compound 3-1, except that in Synthesis Example 14, 2-chloro-4,6-diphenyl-1,3,5-triazine and 9H-carbazole-1,3,4,5,6,8-d6 were changed to 2-chloro-4-(dibenzo[b,d]furan-3-yl)-6-phenyl-1,3,5-triazine and 9H-carbazole.

Synthesis Example 18: Synthesis of Compound 3-5

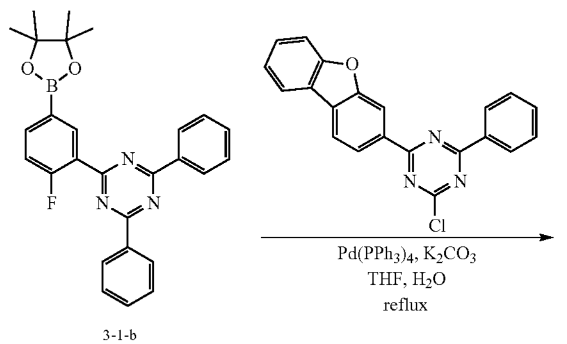

3-1-b

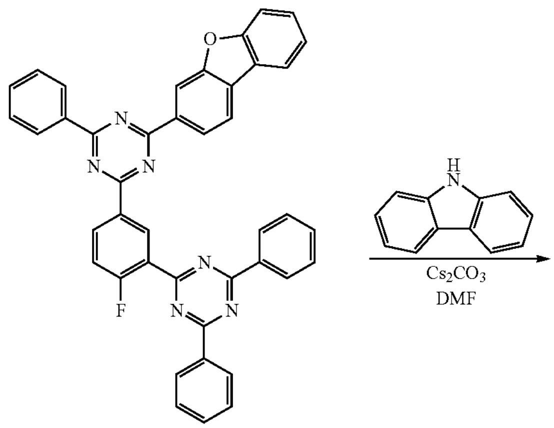

3-5-c

Synthesis Example 19: Synthesis of Compound 3-6

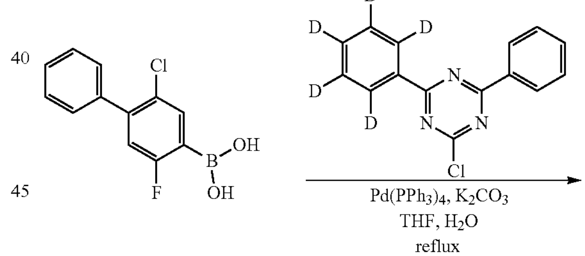

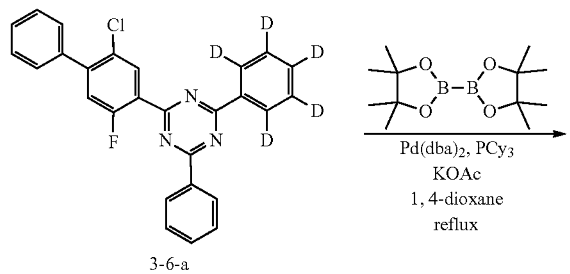

3-6-a

-continued

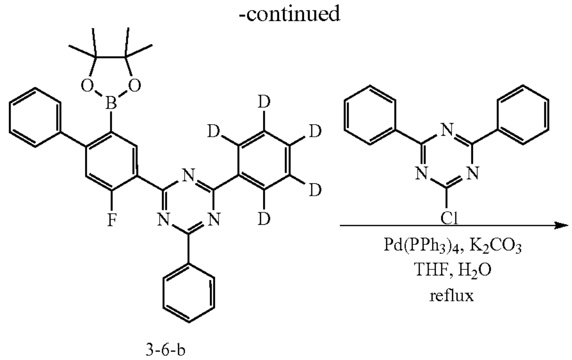

3-6-b

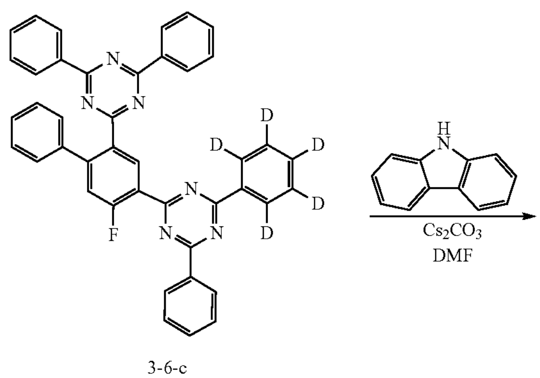

3-6-c

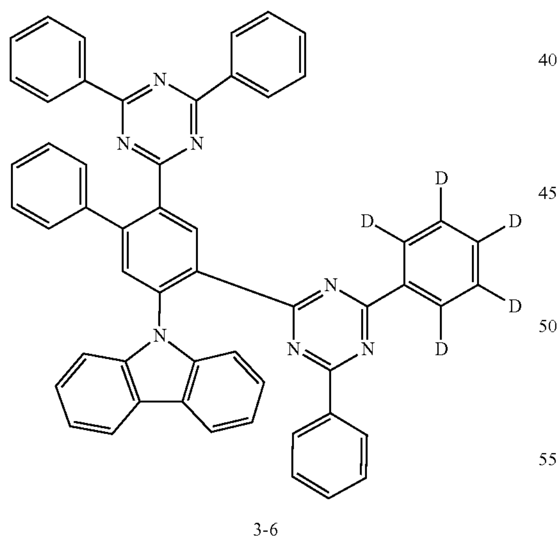

3-6

Compound 3-6 (MS: $[M+H]^+$=787.4) was prepared in the same manner as in the Preparation of Compound 3-1, except that in Synthesis Example 14, (5-chloro-2-fluorophenyl) boronic acid, 2-chloro-4,6-diphenyl-1,3,5-triazine and 9H-carbazole-1,3,4,5,6,8-d6 were changed to (2-chloro-5-fluoro-[1,1'-biphenyl]-4-yl)boronic acid, 2-chloro-4-phenyl-6-(phenyl-d5)-1,3,5-tri azine and 9H-carbazole.

Synthesis Example 20: Synthesis of Compound 3-7

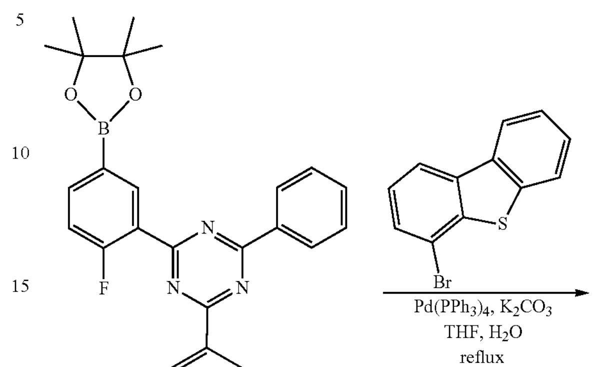

3-1-b

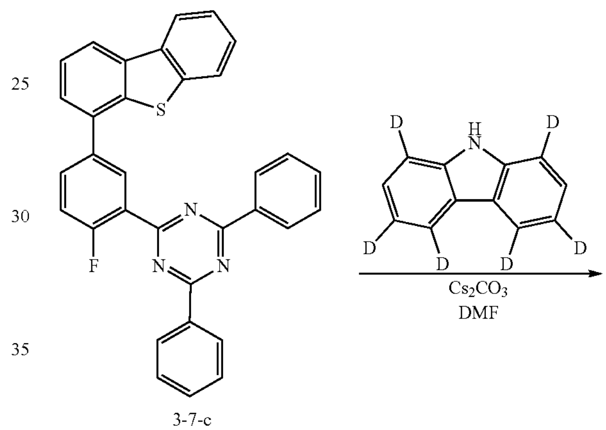

3-7-c

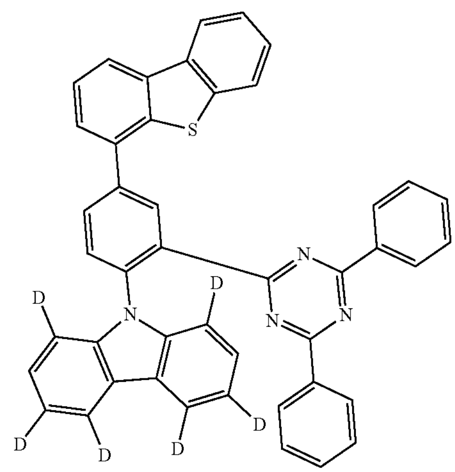

3-7

Compound 3-7 (MS: $[M+H]^+$=663.4) was prepared in the same manner as in the Preparation of Compound 3-1, except that in Synthesis Example 14, 2-chloro-4,6-diphenyl-1,3,5-triazine was changed to 4-bromodibenzo[b,d]-thiophene.

Synthesis Example 21: Synthesis of Compound 3-8

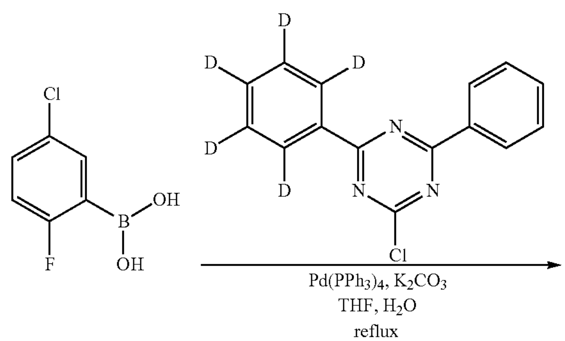

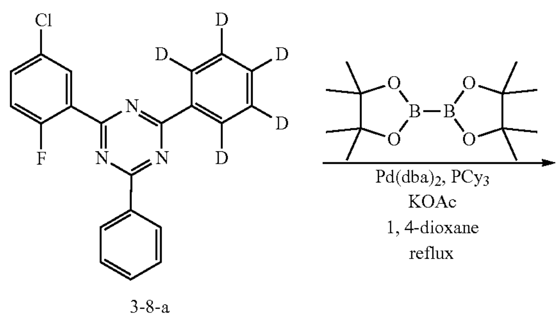

3-8-a

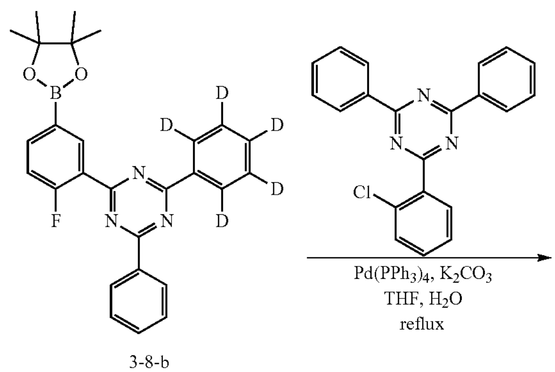

3-8-b

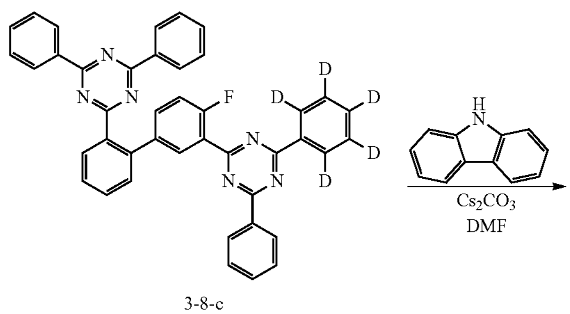

3-8-c

-continued

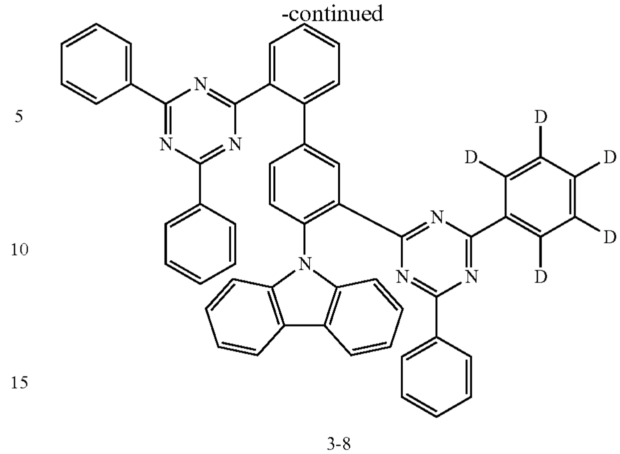

3-8

Compound 3-8 (MS: $[M+H]^+$=787.4) was prepared in the same manner as in the Preparation of Compound 3-1, except that in Synthesis Example 14, 2-chloro-4,6-diphenyl-1,3,5-triazine of step 1), 2-chloro-4,6-diphenyl-1,3,5-triazine of step 3) and 9H-carbazole-1,3,4,5,6,8-d6 were changed to 2-chloro-4-phenyl-6-(phenyl-d5)-1,3,5-triazine, 2-(2-chlorophenyl)-4,6-diphenyl-1,3,5-triazine and 9H-carbazole.

EXAMPLES

Example 1: Manufacture of Organic Light Emitting Device

A glass substrate on which a thin film of ITO (indium tin oxide) was coated in a thickness of 1,400 Å was put into distilled water containing a detergent dissolved therein and ultrasonically washed. In this case, the detergent used was a product commercially available from Fisher Co. and the distilled water was one which had been twice filtered by using a filter commercially available from Millipore Co. The ITO was washed for 30 minutes, and ultrasonic washing was then repeated twice for 10 minutes using distilled water. After the washing with distilled water was completed, the substrate was ultrasonically washed with isopropyl alcohol, acetone, and methanol solvent, and dried, after which it was transported to a plasma cleaner. Then, the substrate was cleaned with oxygen plasma for 5 minutes, and then transferred to a vacuum evaporator.

On the ITO transparent electrode thus prepared, 95 wt % of the following compound HT-A and 5 wt % of the following compound PD were thermally vacuum-deposited to a thickness of 100 Å to form a hole injection layer, and then only the following compound HT-A was deposited to a thickness of 1150 Å to form a hole transport layer. The following compound HT-B was thermally vacuum-deposited to a thickness of 450 Å thereon to form an electron blocking layer.

Then, 92 wt % of the host in which the compound 1-1 previously prepared as a first host, the compound 2-1 previously prepared as a second host, and the compound 3-1 previously prepared as a third host were mixed in a weight ratio of 35:35:30, and 8 wt % of the following compound GD were vacuum-deposited to a thickness of 350 Å on the electron blocking layer to form a light emitting layer.

Then, the following compound ET-A was vacuum-deposited to a thickness of 50 Å to form a hole blocking layer. Then, the following compound ET-B and the following compound Liq were thermally vacuum-deposited in a ratio of 1:1 to a thickness of 300 Å to form an electron transport layer, and Yb was vacuum-deposited to a thickness of 10 Å to form an electron injection layer.

Magnesium and silver were deposited in a weight ratio of 1:4 to a thickness of 150 Å on the electron injection layer to form a cathode, thereby completing the manufacture of an organic light emitting device.

HT - A

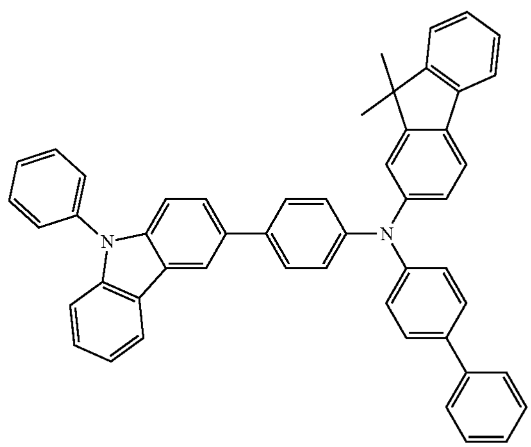

PD

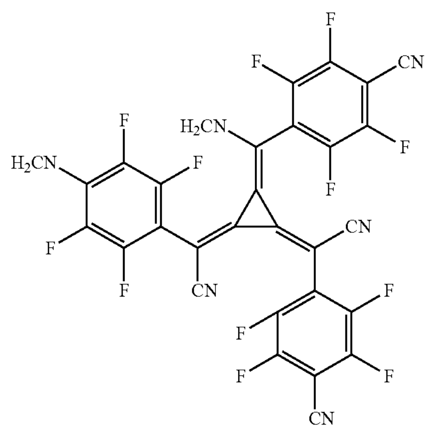

HT- B

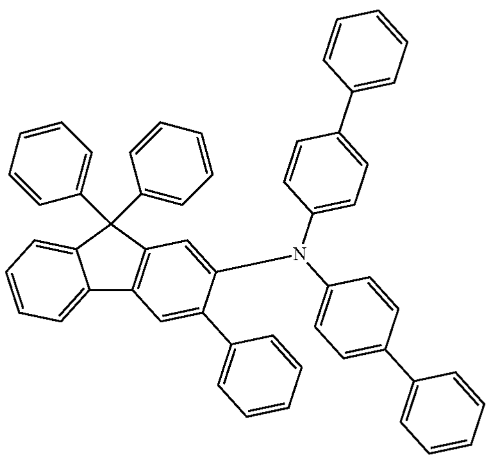

-continued

GD

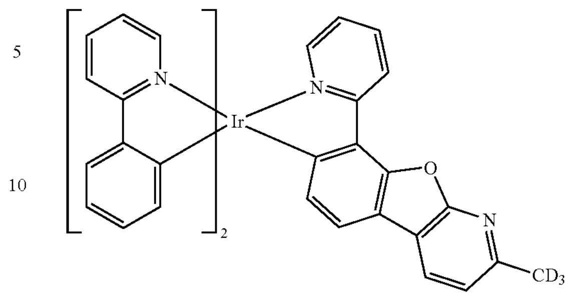

ET - A

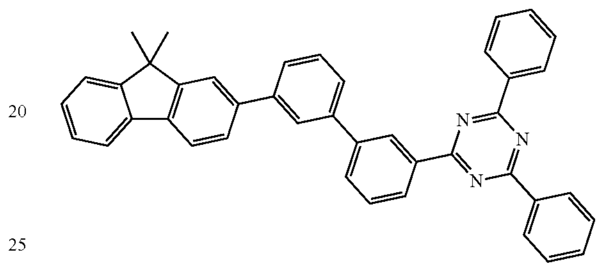

ET - B

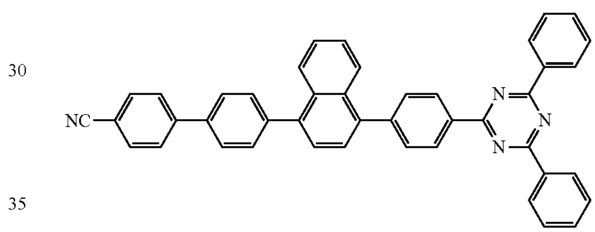

Liq

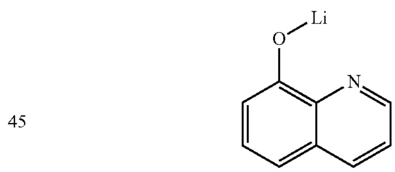

In the above-mentioned process, the vapor deposition rate of the organic material was maintained at 0.4 to 0.7 Å/sec, the deposition rate of magnesium and silver were maintained at 2 Å/sec, and the degree of vacuum during the deposition was maintained at $2\times10^{-7}$ to $5\times10^{-6}$ torr, thereby manufacturing an organic light emitting device.

Examples 2 to 21, and Comparative Examples 1 to 13

The organic light emitting devices of Examples 2 to 21, and Comparative Examples 1 to 13 were respectively manufactured in the same manner as in Example 1, except that the host material was changed as shown in Table 1 below. At this time, the ratio means a weight ratio of the first host, the second host, and the third host. Further, the compounds C1, C2 and C3 shown in Table 1 are as follows, respectively.

C1

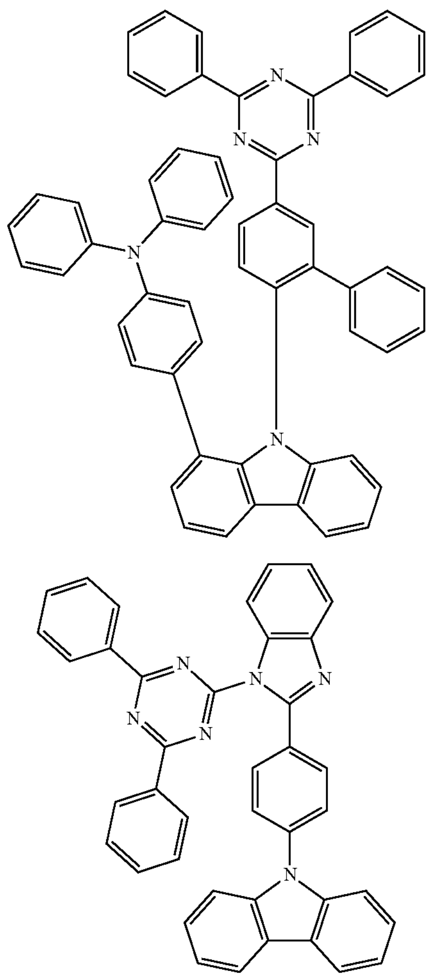

C2

-continued

C3

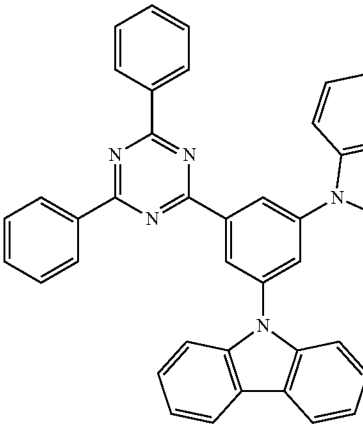

Experimental Example: Evaluation of Device Characteristics

The organic light emitting devices manufactured in Examples 1 to 21 and Comparative Examples 1 to 13 were heat-treated in an oven at 120° C. for 30 minutes, then taken out, and the voltage, efficiency, and lifetime (T95) were measured by applying a current, and the results are shown in Table 1 below. At this time, the voltage and efficiency were measured by applying a current density of 10 $mA/cm^2$, and the lifetime (T95) means the time (hr) required for the luminance to be reduced to 95% of the initial luminance at a current density of 20 $mA/cm^2$.

TABLE 1

| | | | | | @10 $mA/cm^2$ | | @20 $mA/cm^2$ |
|---|---|---|---|---|---|---|---|
| | First host | Second host | Third host | Ratio | Voltage (V) | Efficiency (cd/A) | Lifetime (T95, hr) |
| Example 1 | Compound 1-1 | Compound 2-1 | Compound 3-1 | 35:35:30 | 3.74 | 78.4 | 265 |
| Example 2 | Compound 1-1 | Compound 2-1 | Compound 3-2 | 35:35:30 | 3.79 | 78.1 | 278 |
| Example 3 | Compound 1-1 | Compound 2-1 | Compound 3-3 | 35:35:30 | 3.80 | 78.2 | 225 |
| Example 4 | Compound 1-1 | Compound 2-2 | Compound 3-4 | 35:35:30 | 3.85 | 77.5 | 213 |
| Example 5 | Compound 1-2 | Compound 2-2 | Compound 3-5 | 35:35:30 | 3.77 | 76.1 | 236 |
| Example 6 | Compound 1-2 | Compound 2-2 | Compound 3-6 | 35:35:30 | 3.98 | 75.2 | 222 |
| Example 7 | Compound 1-2 | Compound 2-2 | Compound 3-7 | 35:35:30 | 3.50 | 77.3 | 227 |
| Example 8 | Compound 1-3 | Compound 2-1 | Compound 3-1 | 35:35:30 | 3.88 | 78.1 | 219 |
| Example 9 | Compound 1-3 | Compound 2-1 | Compound 3-2 | 35:35:30 | 3.60 | 78.6 | 231 |
| Example 10 | Compound 1-3 | Compound 2-2 | Compound 3-3 | 35:35:30 | 3.90 | 77.9 | 242 |
| Example 11 | Compound 1-4 | Compound 2-2 | Compound 3-4 | 35:35:30 | 3.67 | 77.0 | 210 |
| Example 12 | Compound 1-4 | Compound 2-3 | Compound 3-5 | 35:35:30 | 3.76 | 75.2 | 198 |

TABLE 1-continued

| | First host | Second host | Third host | Ratio | @10 mA/cm² Voltage (V) | @10 mA/cm² Efficiency (cd/A) | @20 mA/cm² Lifetime (T95, hr) |
|---|---|---|---|---|---|---|---|
| Example 13 | Compound 1-4 | Compound 2-3 | Compound 3-6 | 35:35:30 | 3.88 | 74.3 | 196 |
| Example 14 | Compound 1-4 | Compound 2-4 | Compound 3-7 | 35:35:30 | 3.50 | 76.7 | 215 |
| Example 15 | Compound 1-5 | Compound 2-1 | Compound 3-1 | 35:35:30 | 3.77 | 76.4 | 206 |
| Example 16 | Compound 1-5 | Compound 2-1 | Compound 3-3 | 35:35:30 | 3.88 | 76.1 | 213 |
| Example 17 | Compound 1-6 | Compound 2-2 | Compound 3-5 | 35:35:30 | 3.92 | 76.0 | 203 |
| Example 18 | Compound 1-6 | Compound 2-2 | Compound 3-7 | 35:35:30 | 3.94 | 75.3 | 219 |
| Example 19 | Compound 1-7 | Compound 2-3 | Compound 3-2 | 35:35:30 | 3.99 | 74.1 | 209 |
| Example 20 | Compound 1-8 | Compound 2-4 | Compound 3-4 | 35:35:30 | 4.06 | 73.9 | 196 |
| Example 21 | Compound 1-8 | Compound 2-5 | Compound 3-8 | 35:35:30 | 4.03 | 73.3 | 197 |
| Comparative Example 1 | Compound 1-1 | — | — | 100:0:0 | 6.93 | 20.7 | 25 |
| Comparative Example 2 | — | Compound 2-1 | — | 0:100:0 | 5.77 | 6.7 | 55 |
| Comparative Example 3 | — | — | Compound 3-1 | 0:0:100 | 6.06 | 78.6 | 10 |
| Comparative Example 4 | Compound 1-1 | Compound 2-1 | — | 50:50:0 | 7.26 | 15.3 | 41 |
| Comparative Example 5 | Compound 1-1 | — | Compound 3-1 | 70:0:30 | 4.23 | 67.2 | 126 |
| Comparative Example 6 | — | Compound 2-1 | Compound 3-1 | 0:70:30 | 3.76 | 71.5 | 183 |
| Comparative Example 7 | Compound 1-2 | Compound 2-2 | — | 50:50:0 | 7.31 | 16.2 | 32 |
| Comparative Example 8 | Compound 1-3 | — | Compound 3-5 | 70:0:30 | 4.21 | 64.9 | 143 |
| Comparative Example 9 | — | Compound 2-3 | Compound 3-4 | 0:70:30 | 4.49 | 70.8 | 176 |
| Comparative Example 10 | Compound 1-1 | — | C1 | 70:0:30 | 4.60 | 66.5 | 103 |
| Comparative Example 11 | Compound 1-1 | Compound 2-1 | C1 | 35:35:30 | 4.77 | 68.3 | 143 |
| Comparative Example 12 | Compound 1-6 | — | C2 | 70:0:30 | 4.44 | 64.5 | 59 |
| Comparative Example 13 | Compound 1-3 | — | C3 | 70:0:30 | 4.64 | 69.1 | 89 |

As shown in Table 1, it was confirmed that Examples 1 to 21 are significantly lower in the driving voltage of the device and significantly improved in the efficiency and lifetime, as compared with Comparative Examples 1 to 13.

Examples 1 to 21 in which a P-type host and an N-type host are mixed and applied as a host of the light emitting layer, are significantly reduced in the driving voltage of the device and significantly improved in the efficiency and lifetime, as compared with Comparative Examples 1 to 4 and 7 in which only one of the P-type host and the N-type host are applied.

In addition, when two types of P-type hosts of Chemical Formulas 1 and 2 and the N-type host of Chemical Formula 3 are mixed and used, the characteristics of the device can be improved as compared with the case where one type of the P-type hosts of the Chemical Formulas 1 and 2 is mixed with the N type host of the Chemical Formula 3. The P-type host of Chemical Formula 1 has a structure containing indolocarbazole, and thus exhibits low voltage characteristics, and the P-type host of Chemical Formula 2 exhibits high efficiency and long lifetime characteristics due to a structure containing biscarbazole. Therefore, it is judged that using these as the mixture is advantageous for uniformly improving the voltage, efficiency, and lifetime characteristics of the device.

In fact, in Examples 1 to 21 in which two types of P-type hosts of Chemical Formulas 1 and 2 are mixed with the N-type host of Chemical Formula 3, the voltage, efficiency, and lifetime characteristics of the device are improved as a whole, as compared with Comparative Examples 5, 6, 8, 9, 10, 12 and 13 in which only one type of P-type hosts of Chemical Formulas 1 and 2 is mixed with the N-type host.

It can be seen that in Examples 1 to 21 (particularly, Examples 1 to 4) in which two types of P-type hosts of Chemical Formulas 1 and 2 are mixed with the N-type host of Chemical Formula 3, the overall improvement in the voltage, efficiency, and lifetime characteristics of the device is caused by the effect due to the N-type host of Chemical Formula 3, as compared with Comparative Example 11 in which the compound having a structure completely different from that of Chemical Formula 3 is replaced with the N-type host.

EXPLANATION OF SYMBOLS

| | |
|---|---|
| 1: substrate | 2: anode |
| 3: light emitting layer | 4: cathode |
| 5: hole injection layer | 6: hole transport layer |
| 7: electron transport layer | 8: electron injection layer |
| 9: electron blocking layer | 10: hole blocking layer |

The invention claimed is:

1. An organic light emitting device, comprising:

an anode, a cathode, and a light emitting layer between the anode and the cathode, wherein the light emitting layer comprises a compound of the following Chemical Formula 1, a compound of the following Chemical Formula 2, and a compound of the following Chemical Formula 3:

[Chemical Formula 1]

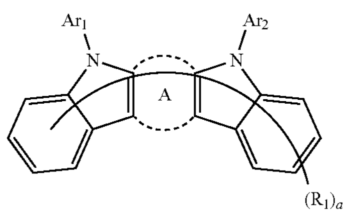

wherein in Chemical Formula 1:

A is a benzene ring;

$Ar_1$ and $Ar_2$ are each independently a substituted or unsubstituted $C_{6-60}$ aryl or a substituted or unsubstituted $C_{2-60}$ heteroaryl containing any one or more heteroatoms selected from the group consisting of N, O and S;

$R_1$ is hydrogen, deuterium, a substituted or unsubstituted $C_{1-60}$ alkyl, a substituted or unsubstituted $C_{6-60}$ aryl, or a substituted or unsubstituted $C_{2-60}$ heteroaryl containing any one or more heteroatoms selected from the group consisting of N, O and S; and a is an integer of 0 to 10;

[Chemical Formula 2]

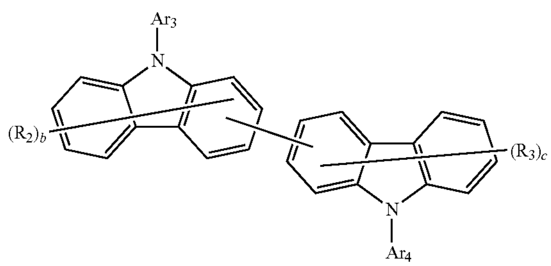

wherein in Chemical Formula 2:

$Ar_3$ and $Ar_4$ are each independently a substituted or unsubstituted $C_{6-60}$ aryl or a substituted or unsubstituted $C_{2-60}$ heteroaryl containing any one or more heteroatoms selected from the group consisting of N, O and S;

$R_2$ and $R_3$ are each independently hydrogen, deuterium, a substituted or unsubstituted $C_{1-60}$ alkyl, a substituted or unsubstituted $C_{6-60}$ aryl, or a substituted or unsubstituted $C_{2-60}$ heteroaryl containing any one or more heteroatoms selected from the group consisting of N, O and S; and b and c are each independently an integer of 0 to 7;

[Chemical Formula 3]

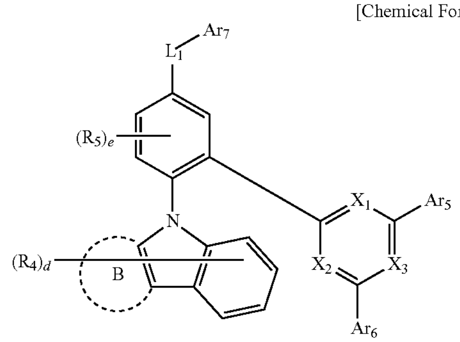

wherein in Chemical Formula 3:

B is a substituted or unsubstituted $C_{6-60}$ aromatic ring or a substituted or unsubstituted $C_{2-60}$ heteroaromatic ring containing any one or more heteroatoms selected from the group consisting of N, O and S;

$X_1$ to $X_3$ are each independently N or CH, provided that at least one of $X_1$ to $X_3$ is N;

$Ar_5$ and $Ar_6$ are each independently a substituted or unsubstituted $C_{6-60}$ aryl or a substituted or unsubstituted $C_{2-60}$ heteroaryl containing any one or more heteroatoms selected from the group consisting of N, O and S;

$L_1$ is a single bond, a substituted or unsubstituted $C_{6-60}$ arylene, or a substituted or unsubstituted $C_{2-60}$ heteroarylene containing any one or more heteroatoms selected from the group consisting of N, O and S;

$R_4$ and $R_5$ are each independently hydrogen, deuterium, a substituted or unsubstituted $C_{1-60}$ alkyl, a substituted or unsubstituted $C_{6-60}$ aryl, or a substituted or unsubstituted $C_{2-60}$ heteroaryl containing any one or more heteroatoms selected from the group consisting of N, O and S;

d is an integer of 0 to 10;

e is an integer of 0 to 3; and $Ar_7$ is dibenzothiophenyl, or any one substituent selected from the group consisting of the following substituents:

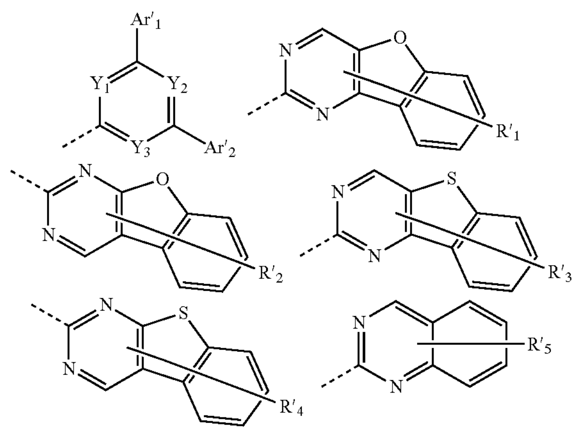

-continued

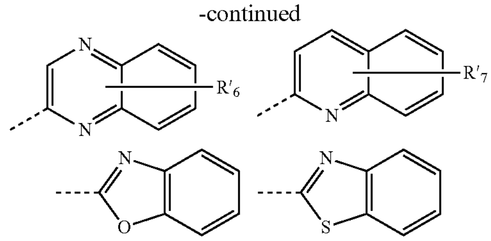

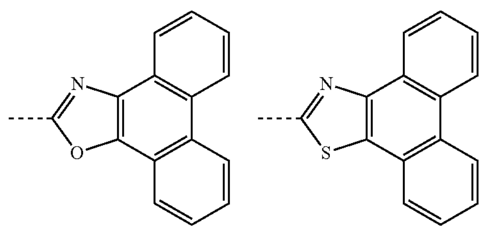

wherein in the above group of substituents:

$Y_1$ to $Y_3$ are each independently N or CH, provided that at least one of $Y_1$ to $Y_3$ is N;

$Ar'_1$ and $Ar'_2$ are each independently a substituted or unsubstituted $C_{6-60}$ aryl or a substituted or unsubstituted $C_{2-60}$ heteroaryl containing any one or more heteroatoms selected from the group consisting of N, O and S; and $R'_1$ to $R'_7$ are each independently hydrogen, deuterium, a substituted or unsubstituted $C_{6-60}$ aryl, or a substituted or unsubstituted $C_{2-60}$ heteroaryl containing any one or more heteroatoms selected from the group consisting of N, O and S.

2. The organic light emitting device according to claim 1, wherein:

the Chemical Formula 1 is any one of the following Chemical Formula 1-1 to Chemical Formula 1-5:

[Chemical Formula 1-1]

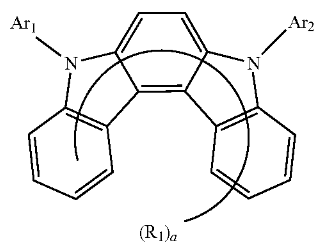

[Chemical Formula 1-2]

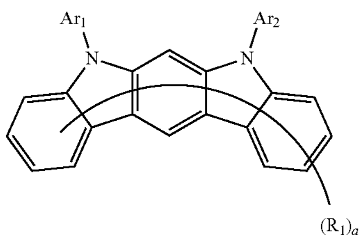

-continued

[Chemical Formula 1-3]

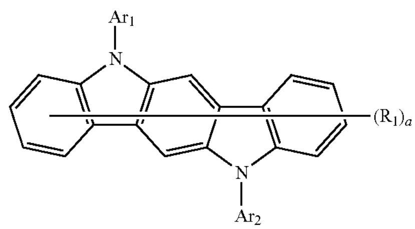

[Chemical Formula 1-4]

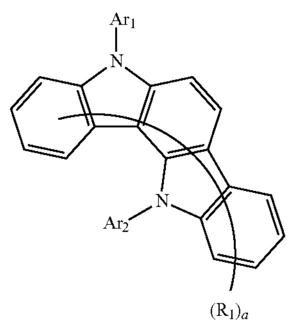

[Chemical Formula 1-5]

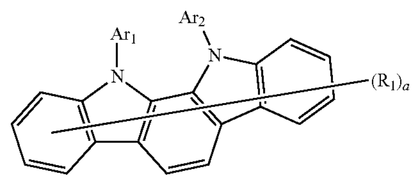

wherein in Chemical Formulas 1-1 to 1-5:

$Ar_1$, $Ar_2$, $R_1$ and a are as defined in claim 1.

3. The organic light emitting device according to claim 1, wherein:

$Ar_1$ and $Ar_2$ are each independently phenyl, biphenylyl, phenyl biphenylyl, terphenylyl, dimethylfluorenyl, dimethylfluorenyl phenyl, dibenzofuranyl phenyl, dibenzothiophenyl phenyl, dibenzofuranyl, dibenzothiophenyl, phenyl substituted with 5 deuteriums, biphenylyl substituted with 5 deuteriums, or terphenylyl substituted with 5 deuteriums.

4. The organic light emitting device according to claim 1, wherein:

at least one of $Ar_1$ and $Ar_2$ is a substituted or unsubstituted $C_{6-20}$ aryl.

5. The organic light emitting device according to claim 1, wherein:

the compound of Chemical Formula 1 is any one compound selected from the group consisting of the following compounds:

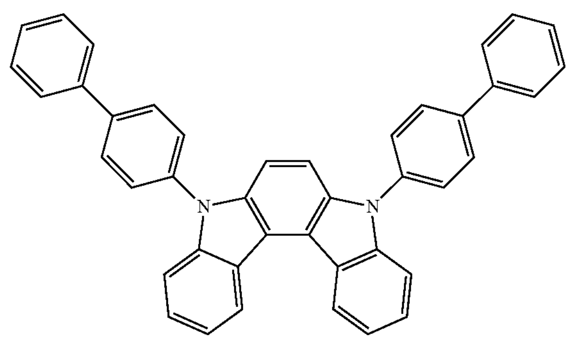
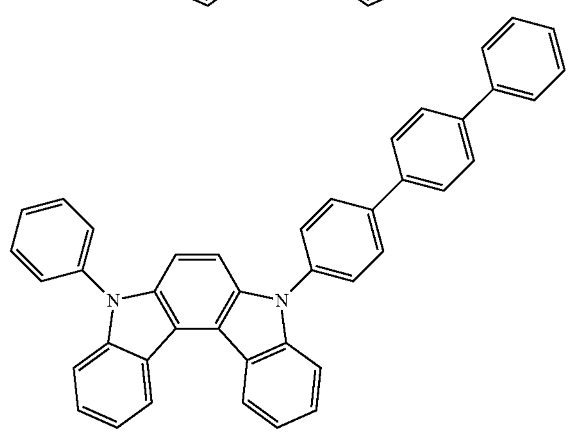
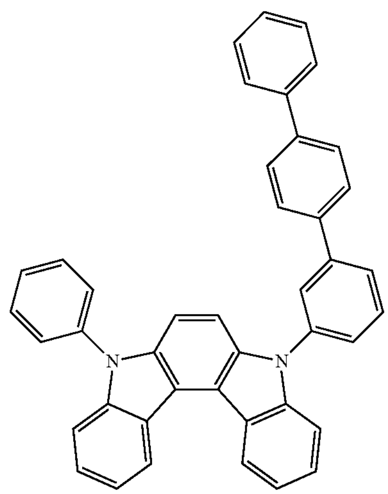
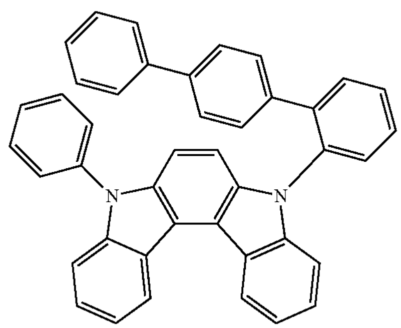
-continued
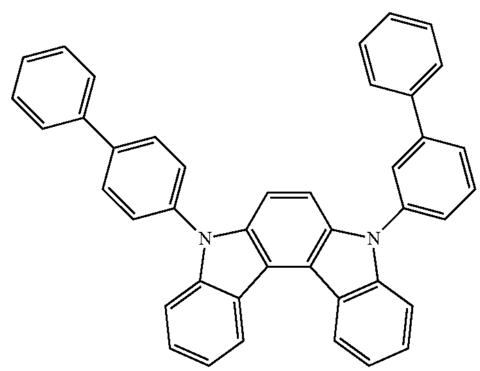
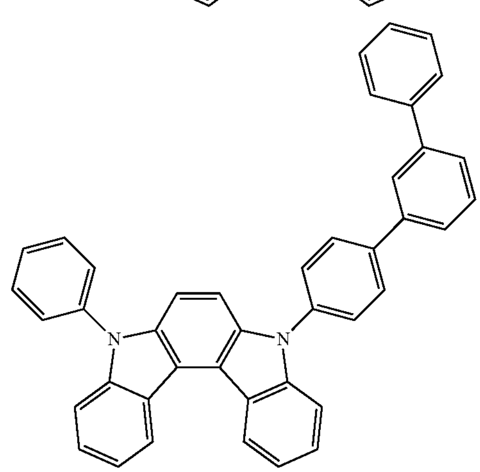
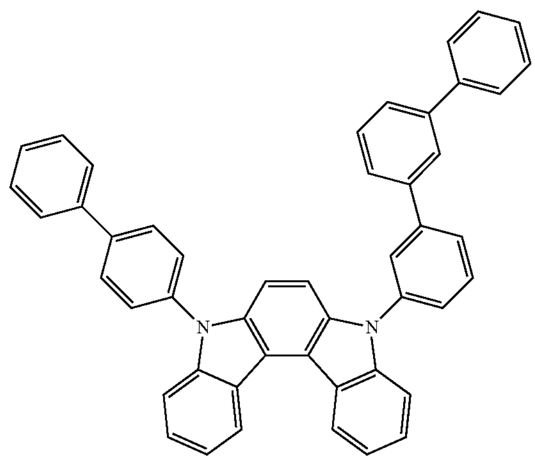
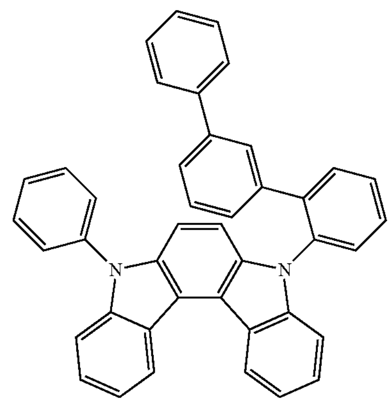

-continued
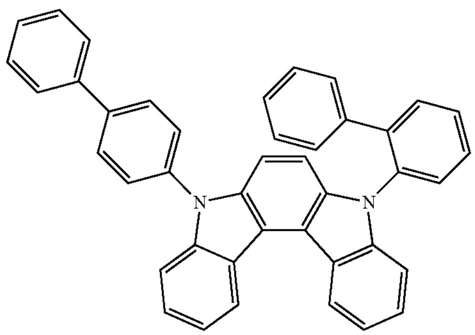
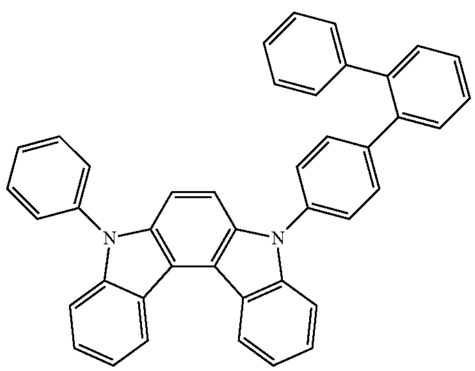
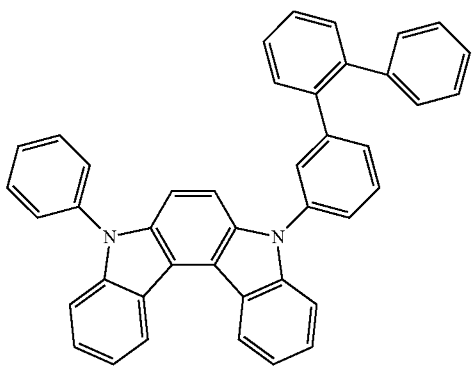
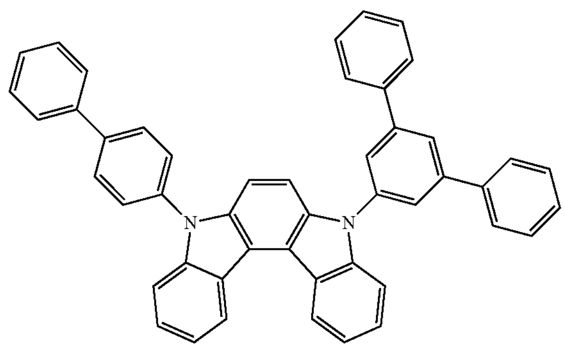
-continued
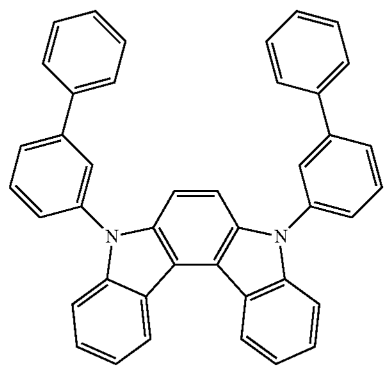
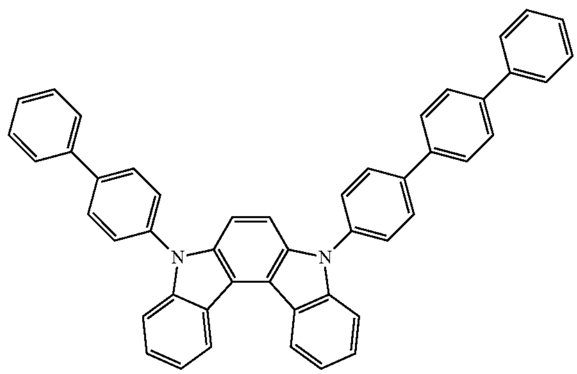
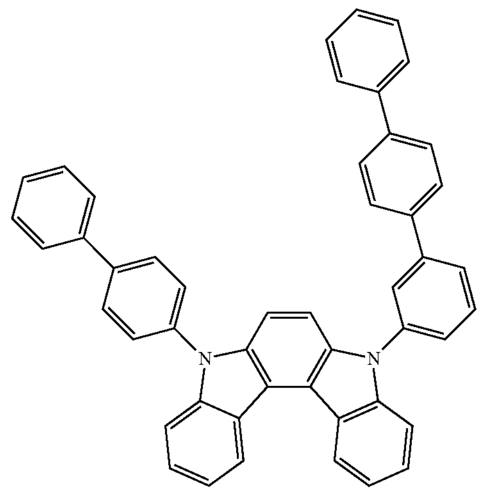
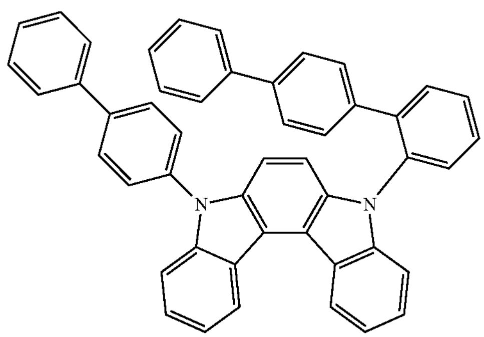

-continued
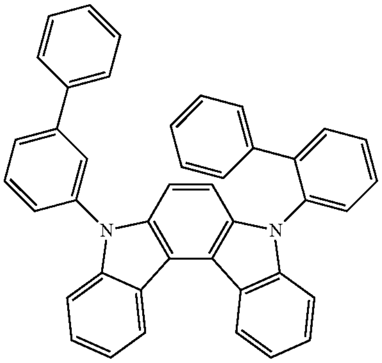
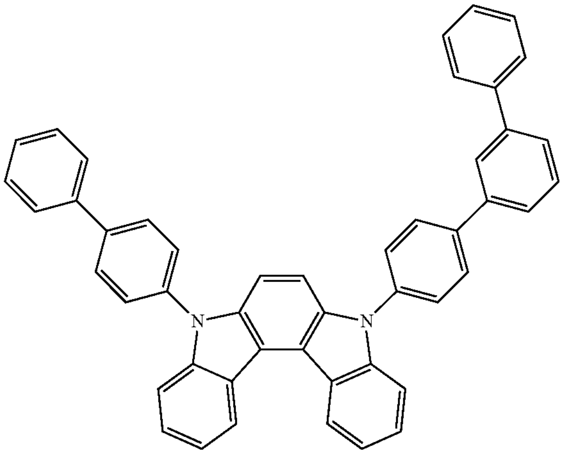
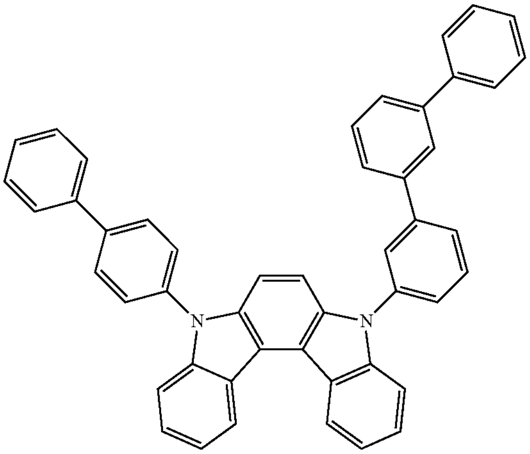
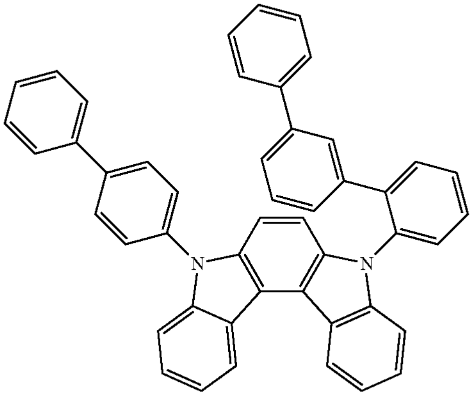
-continued
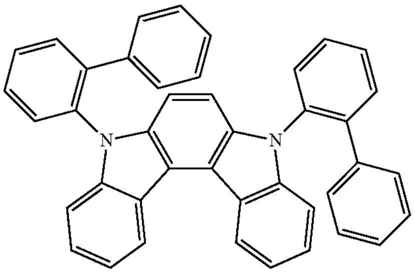
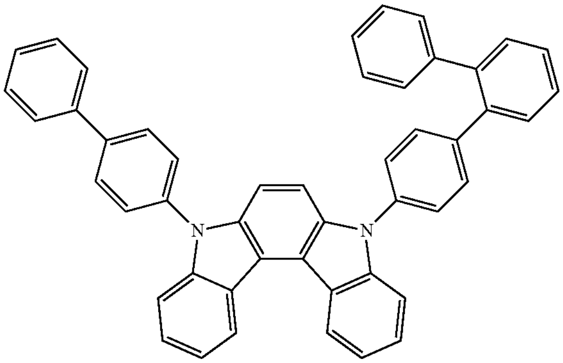
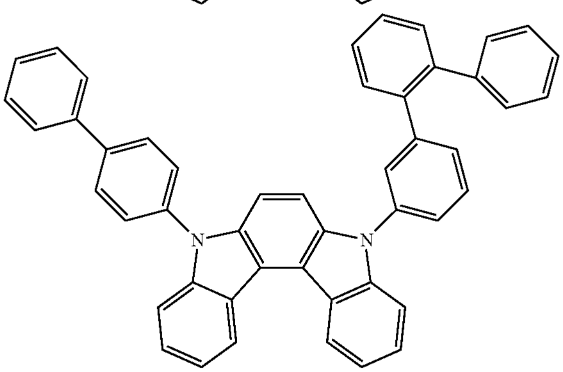
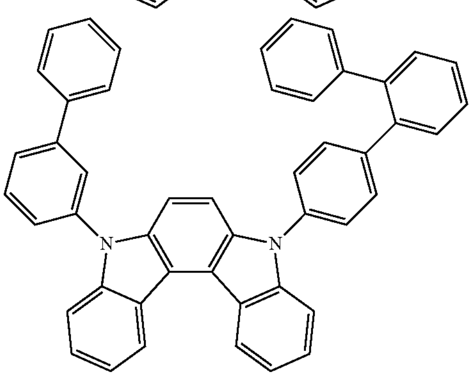
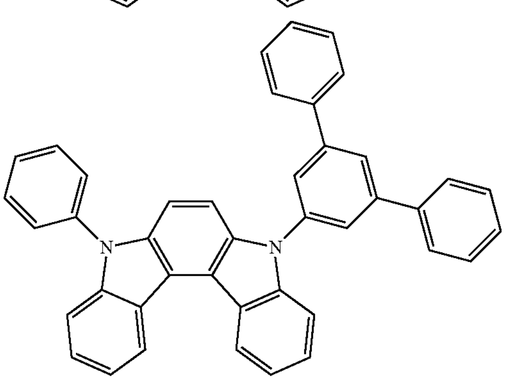

-continued
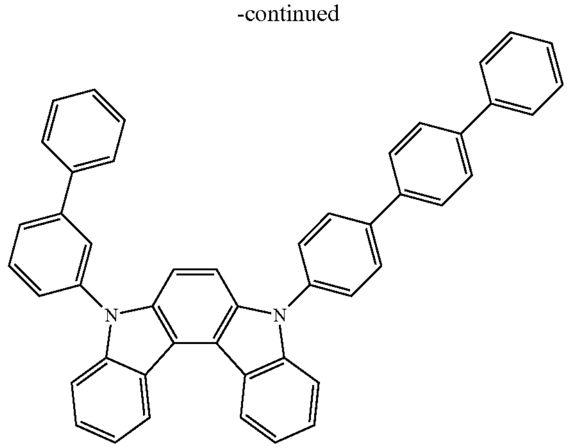
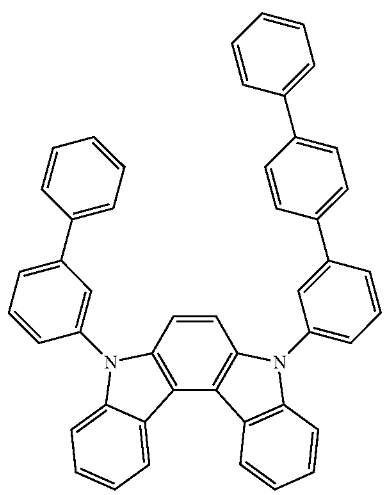
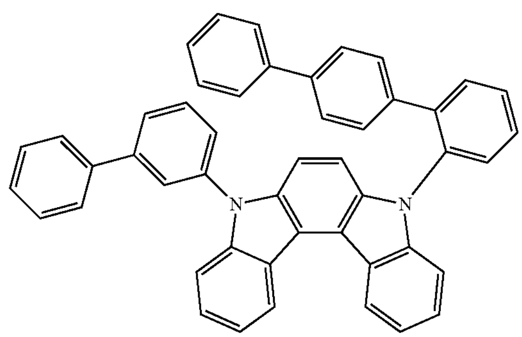
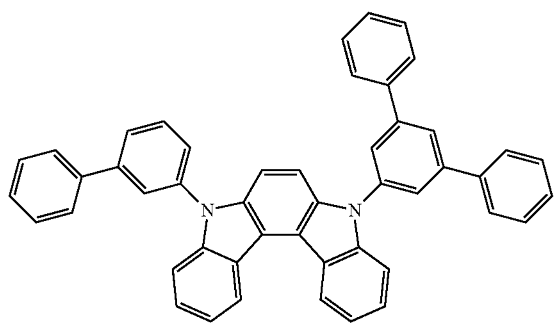
-continued
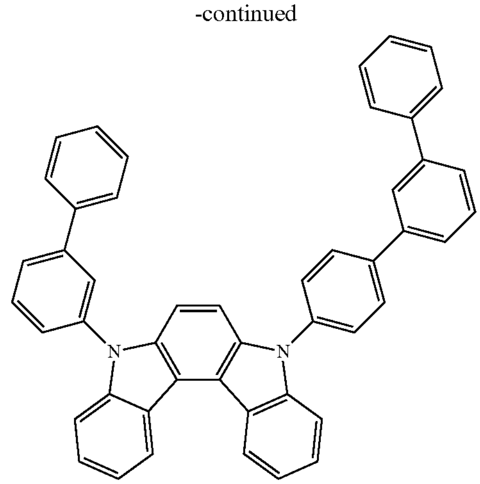
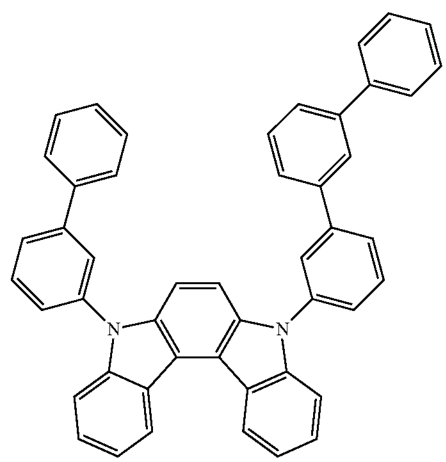
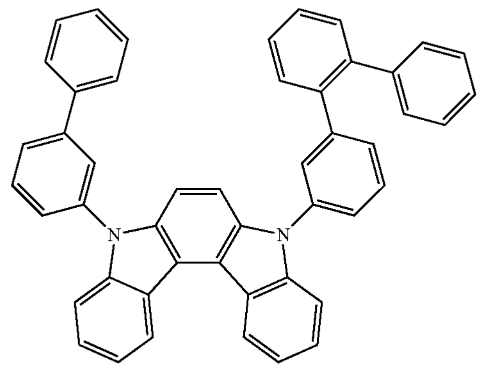
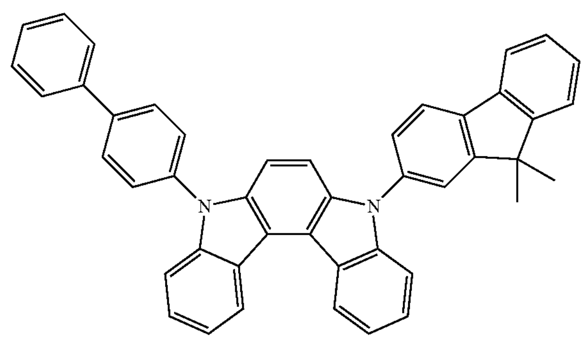

-continued
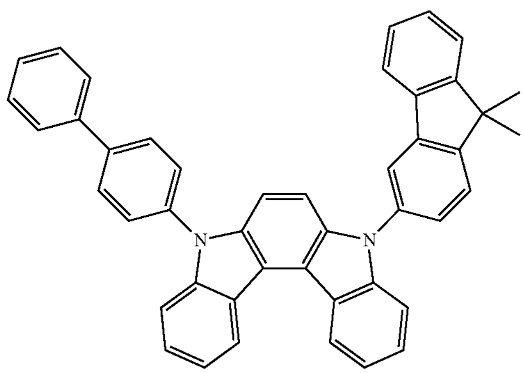
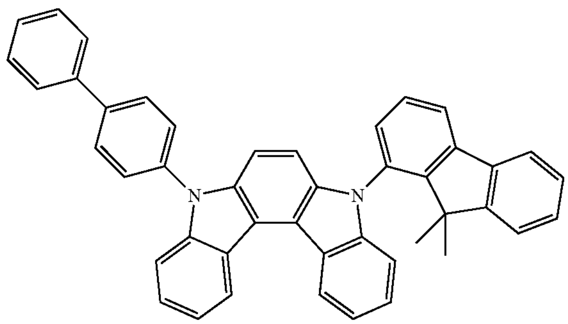
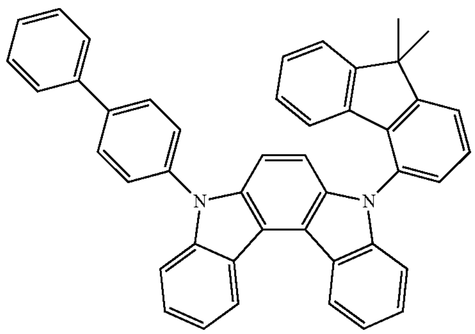
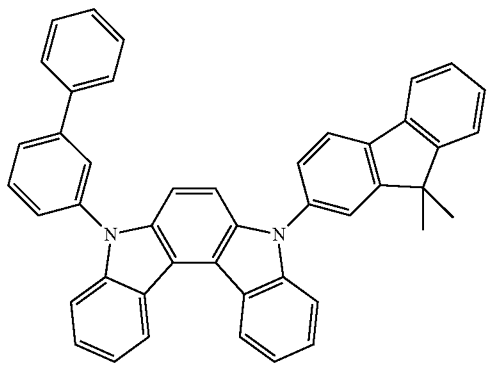
-continued
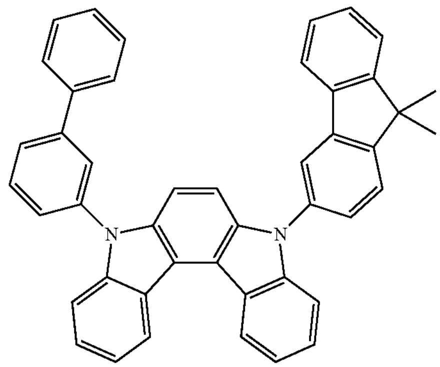
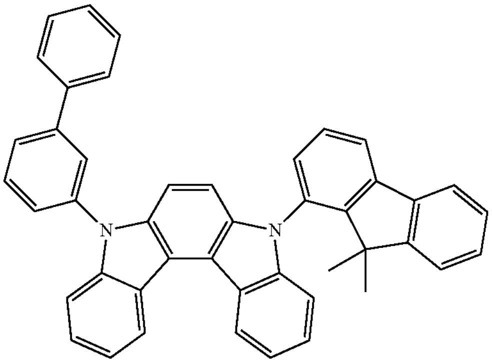
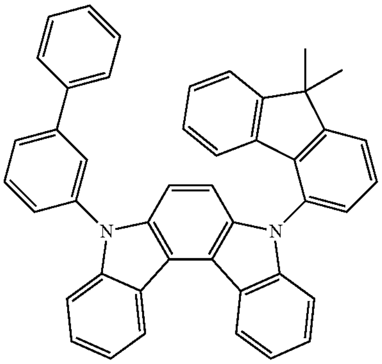
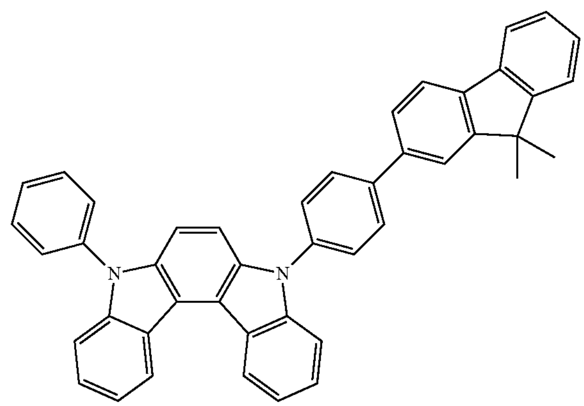

-continued
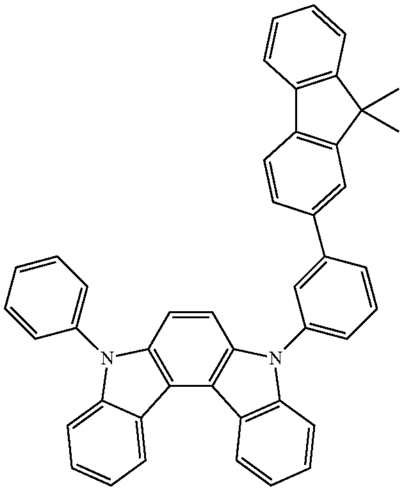
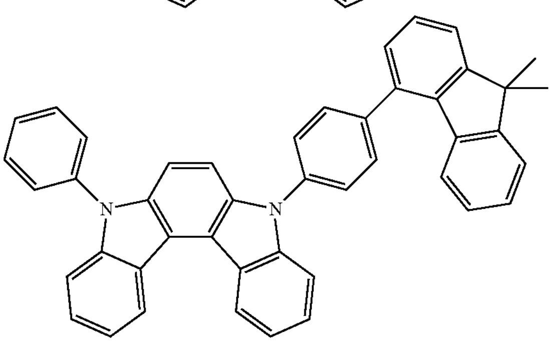
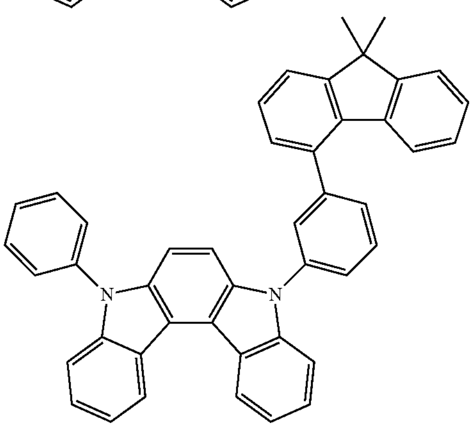
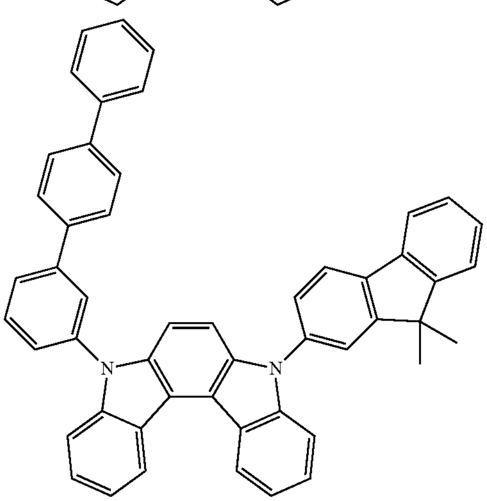
-continued
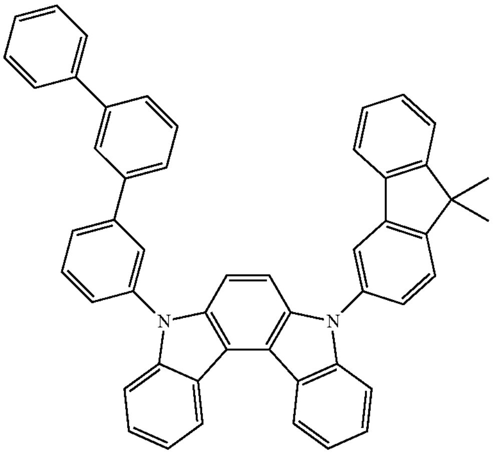
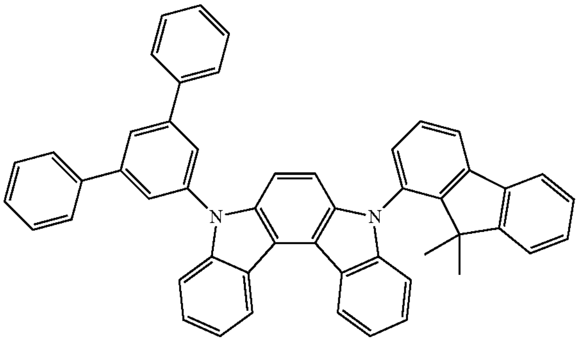
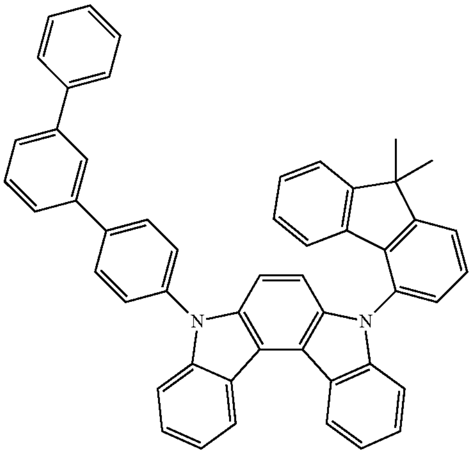
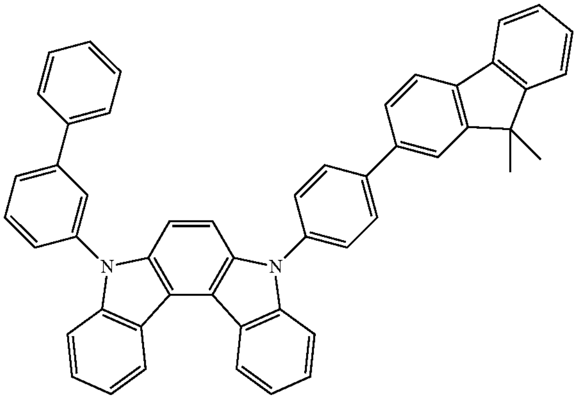

-continued
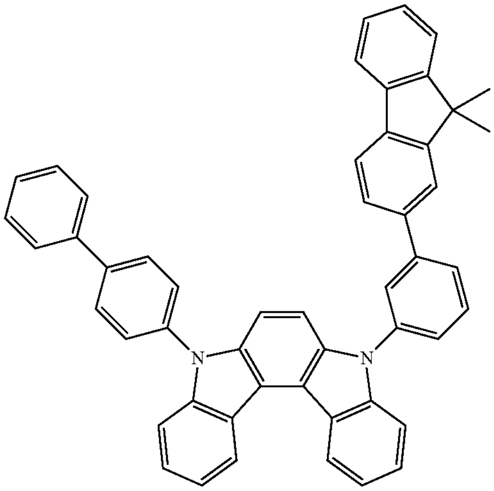
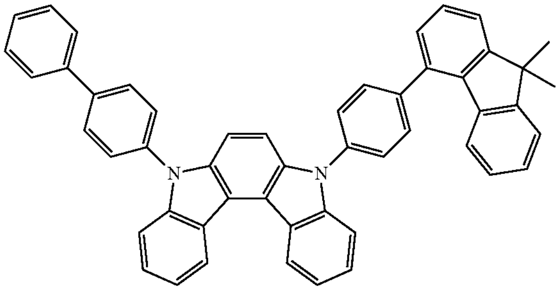
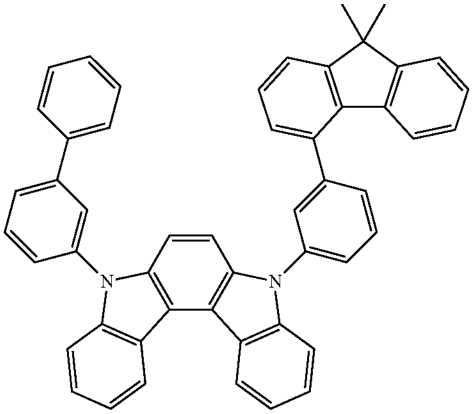
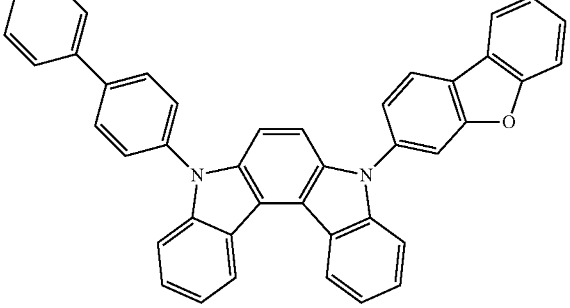
-continued
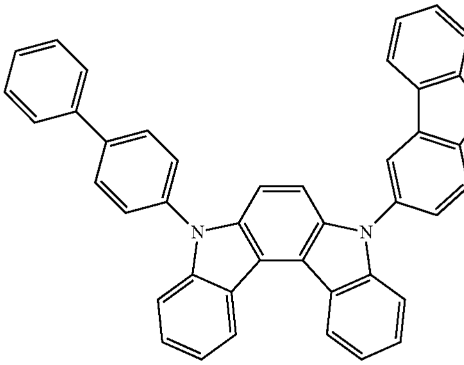
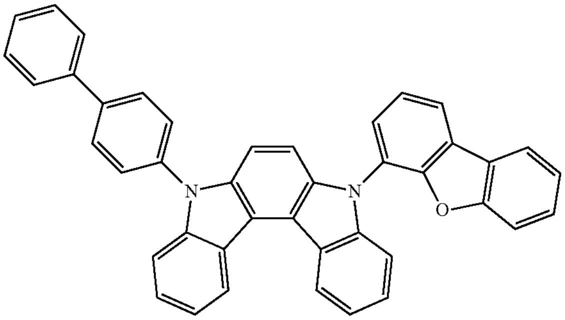
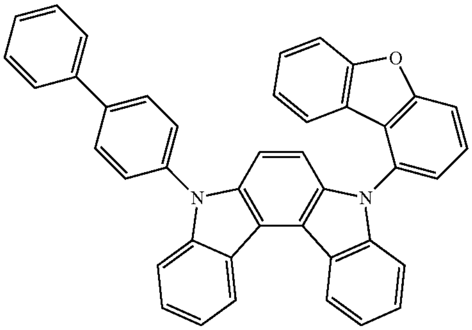
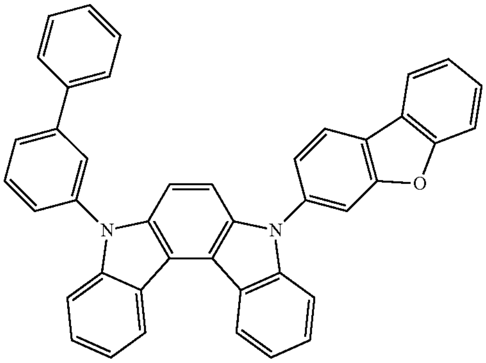

-continued
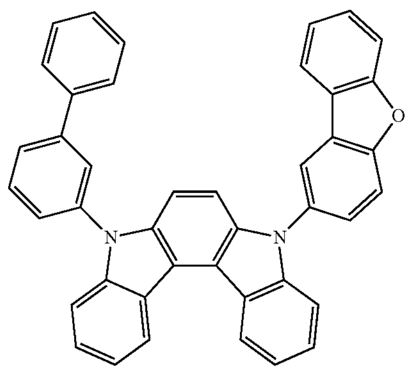
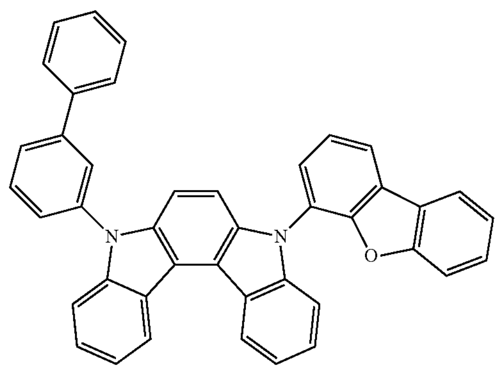
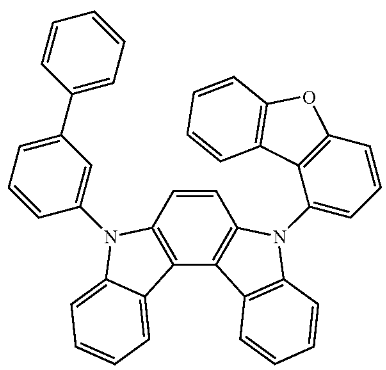
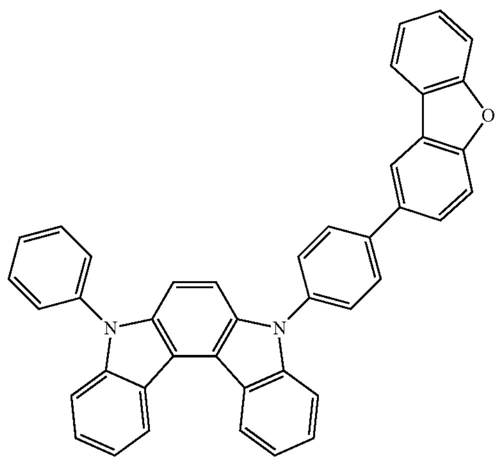
-continued
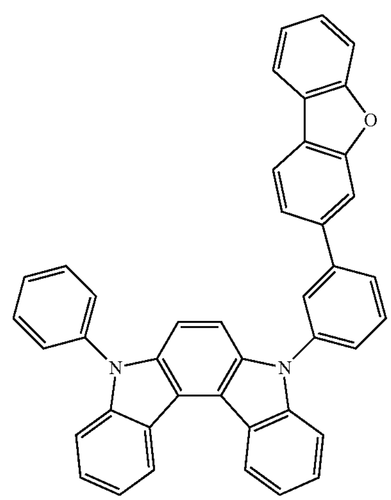
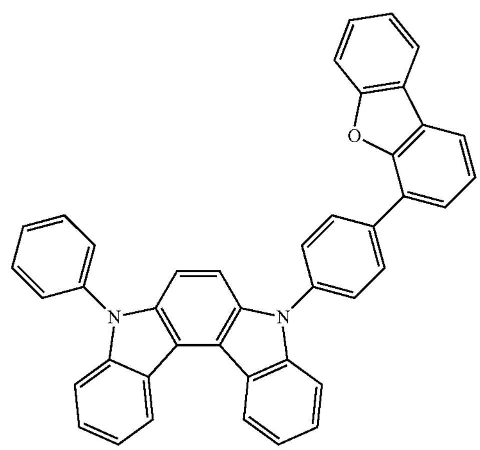
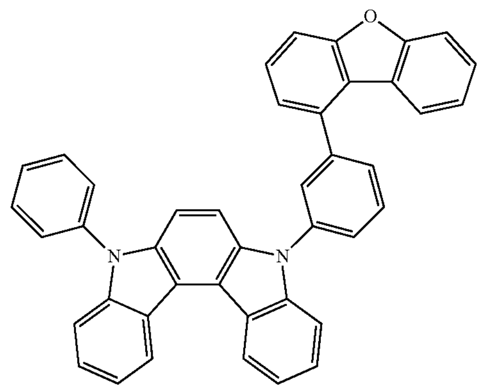

-continued
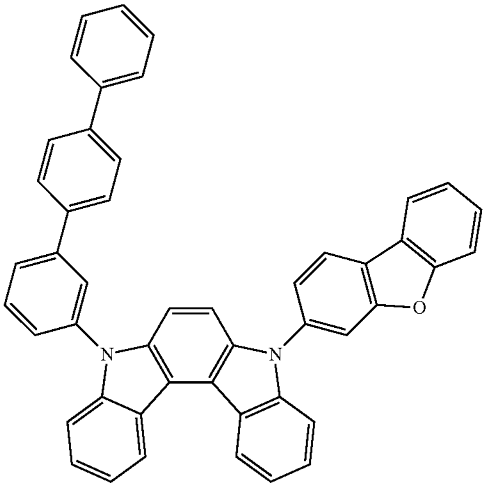
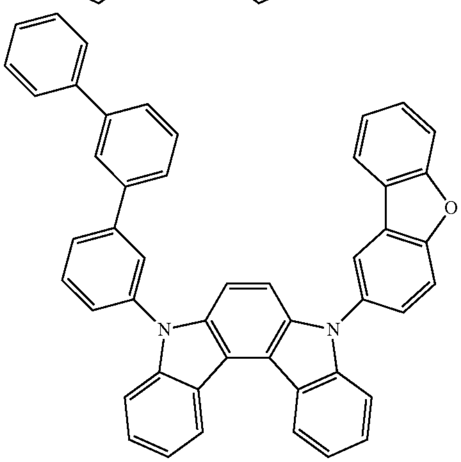
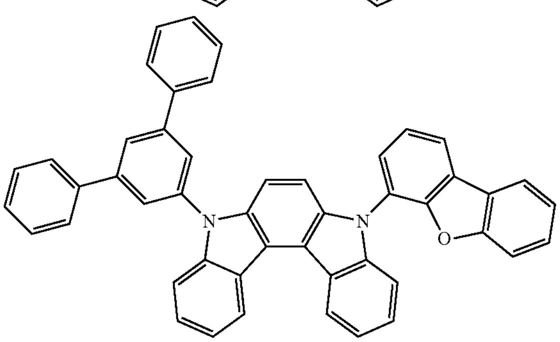
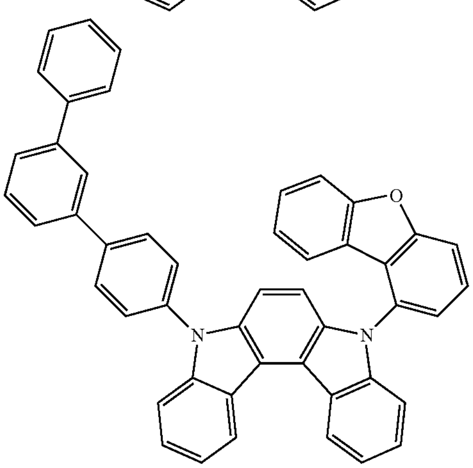
-continued
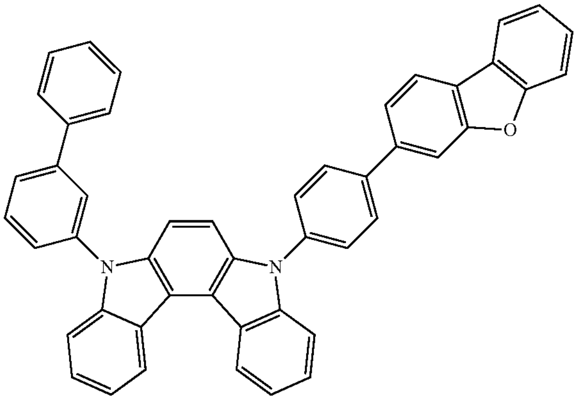
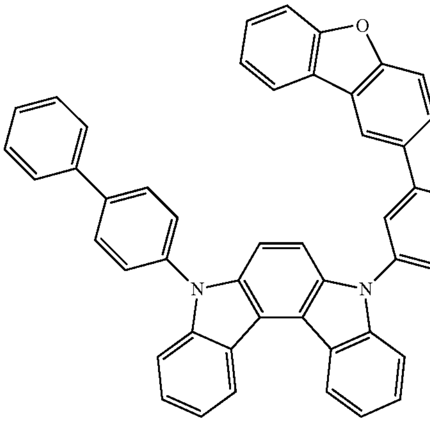
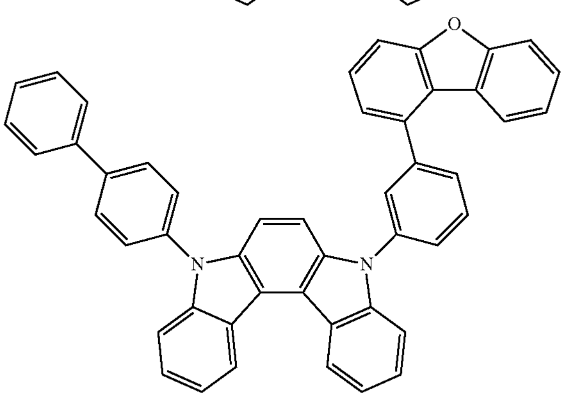
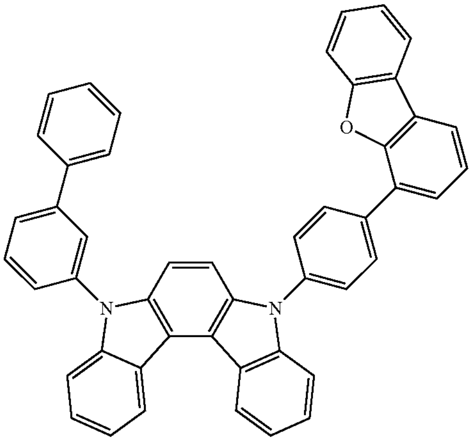

-continued
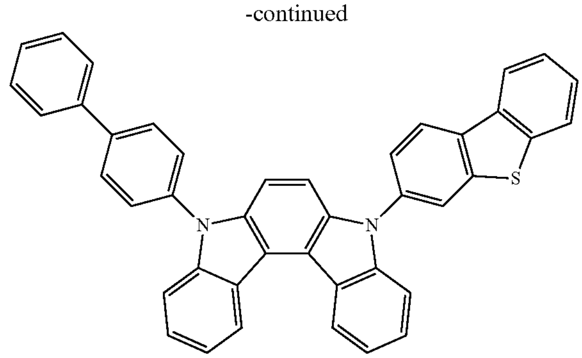
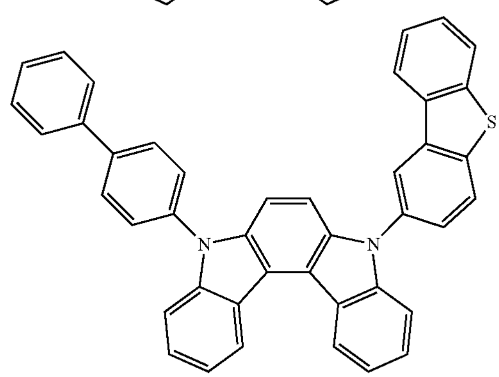
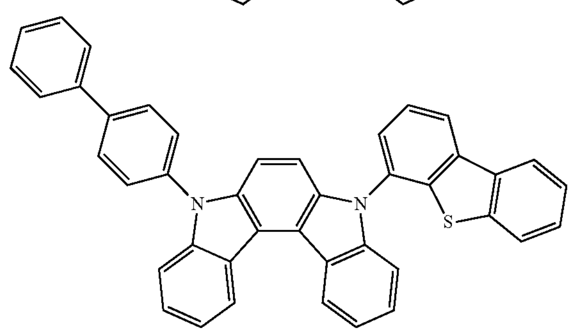
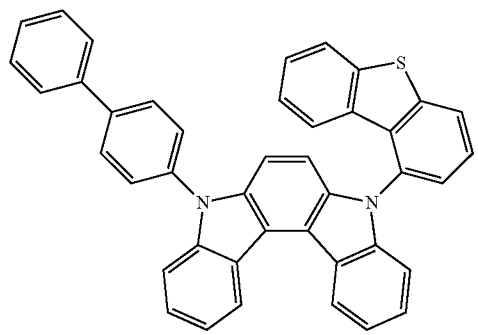
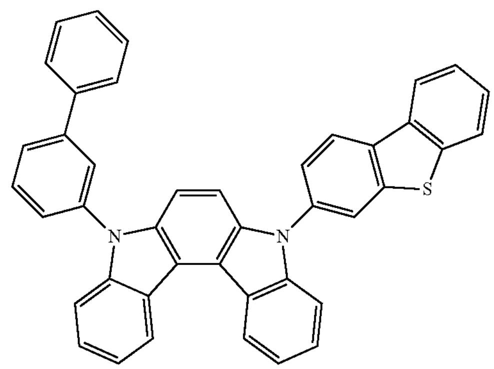
-continued
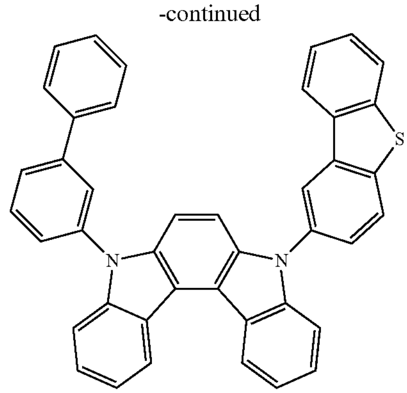
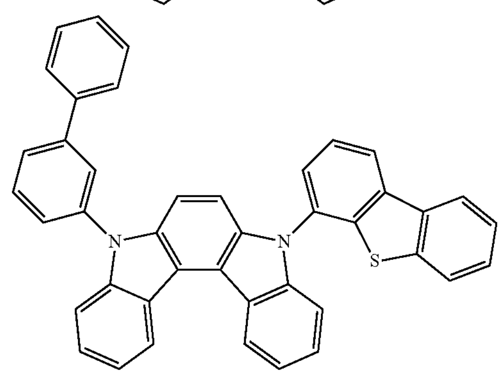
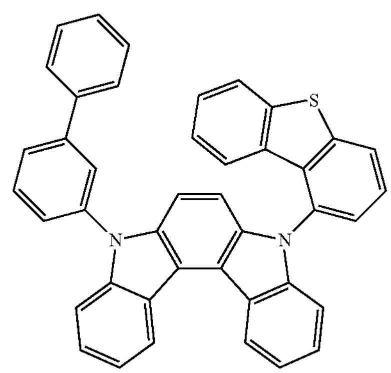
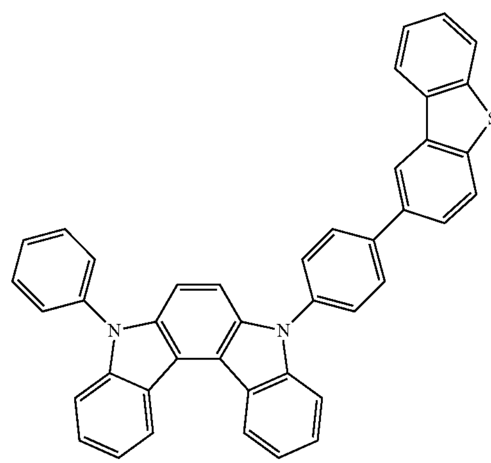

-continued
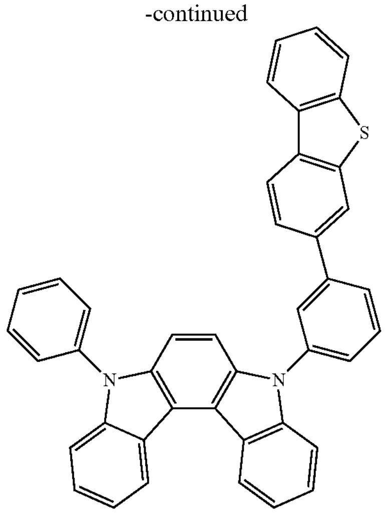
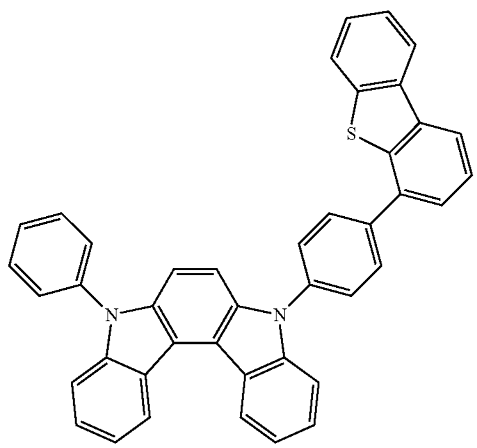
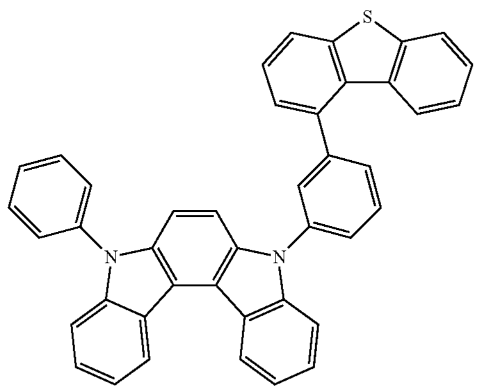
-continued
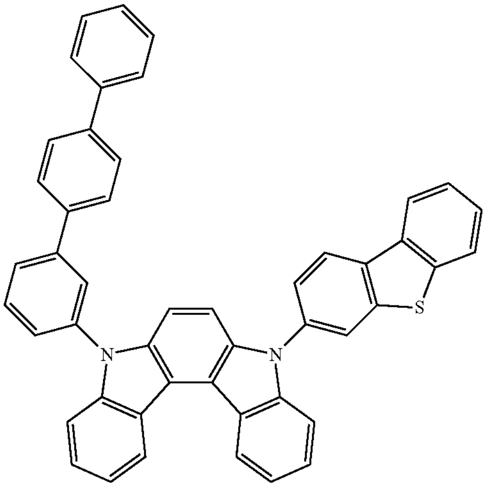
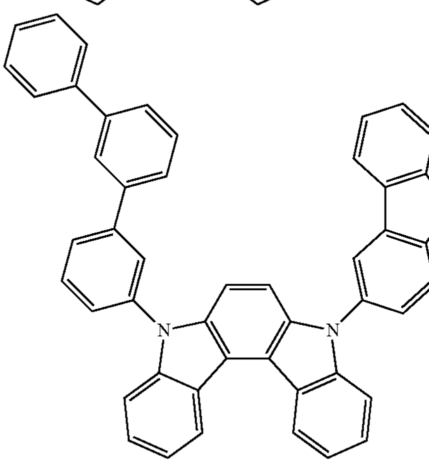
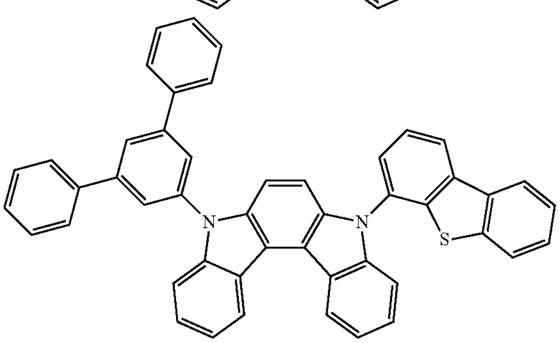
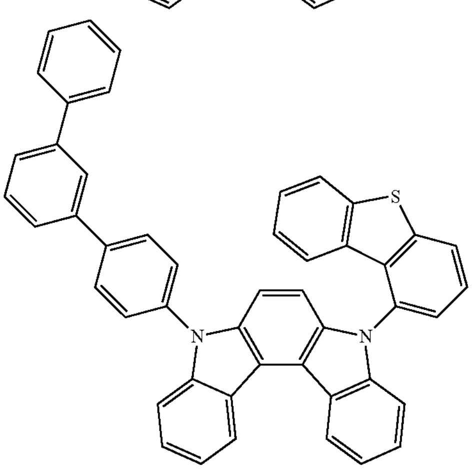

-continued
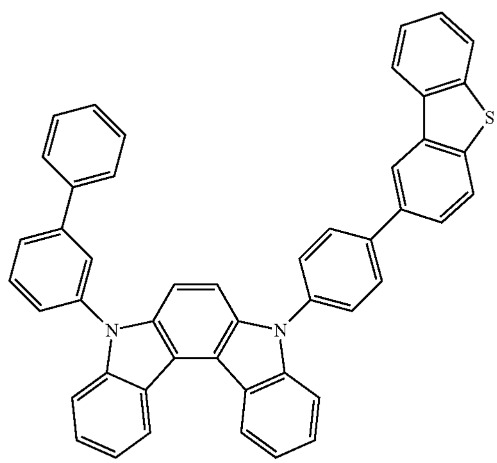
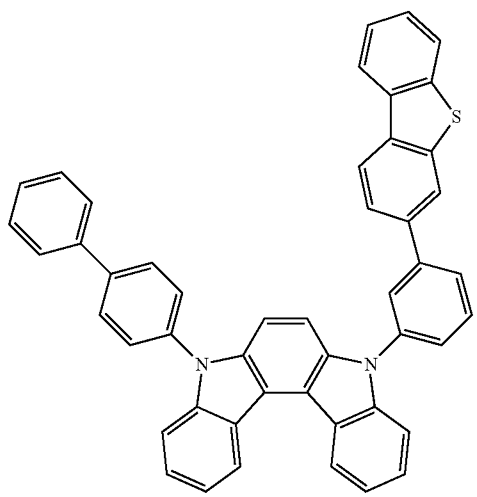
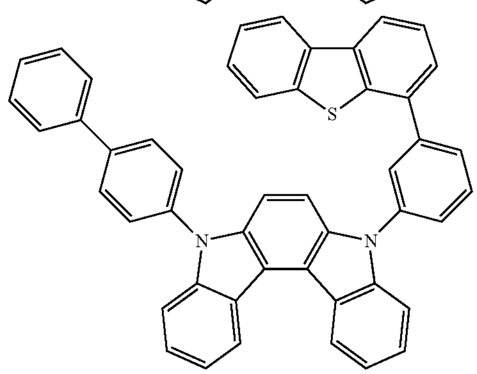
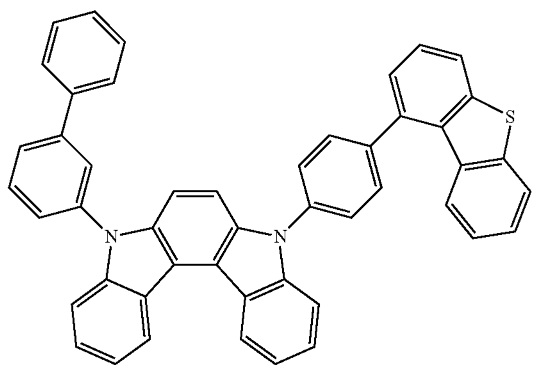
-continued
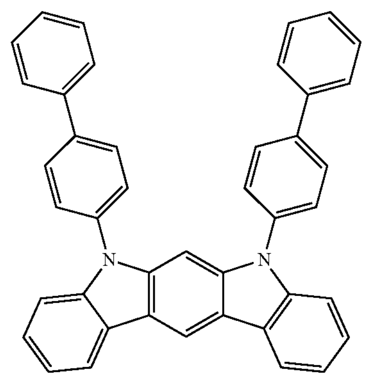
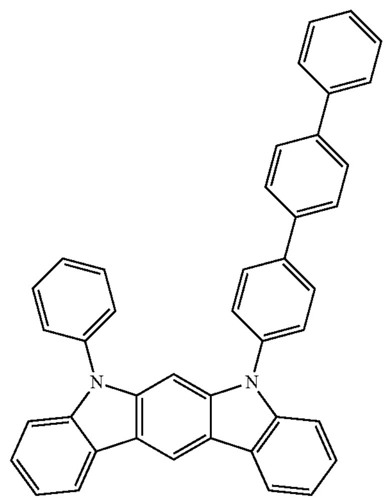
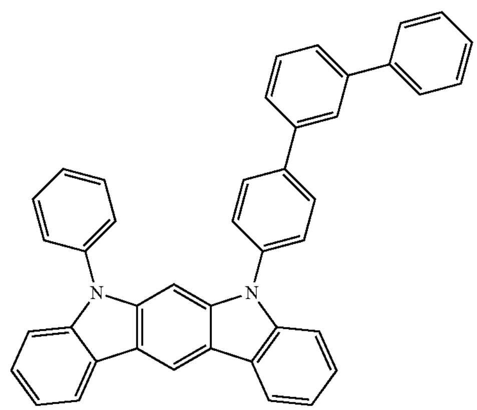
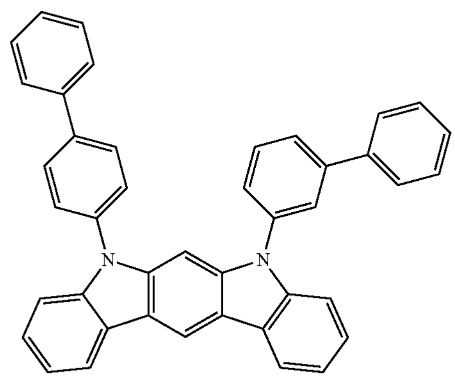

-continued
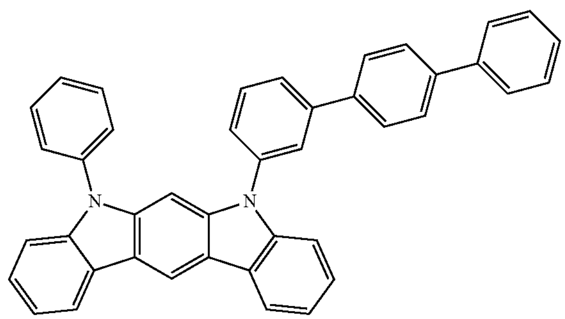
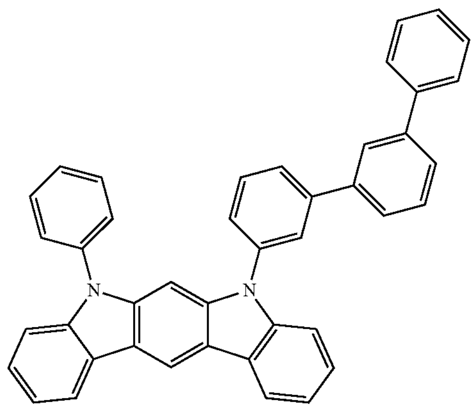
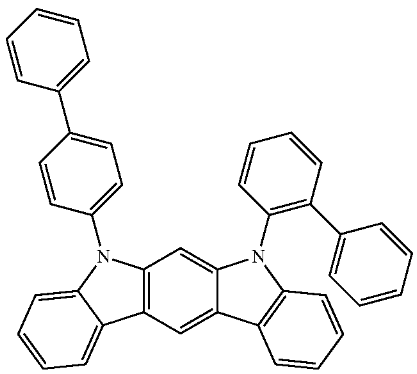
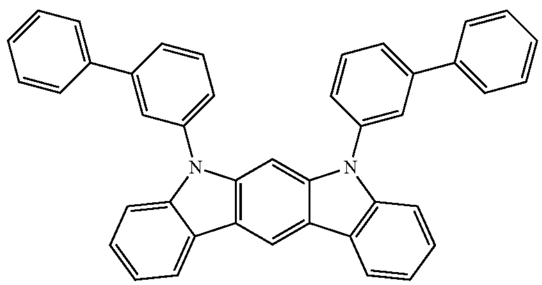
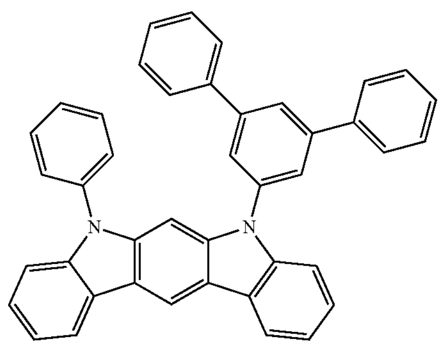
-continued
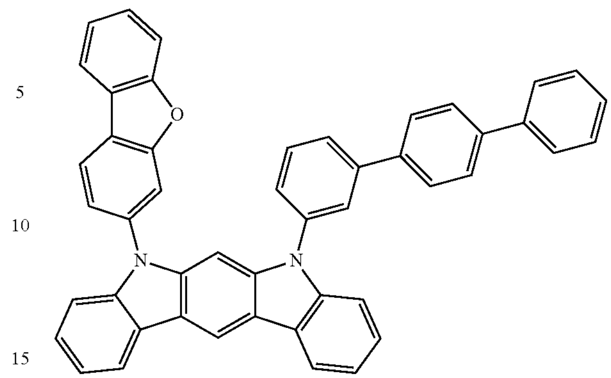
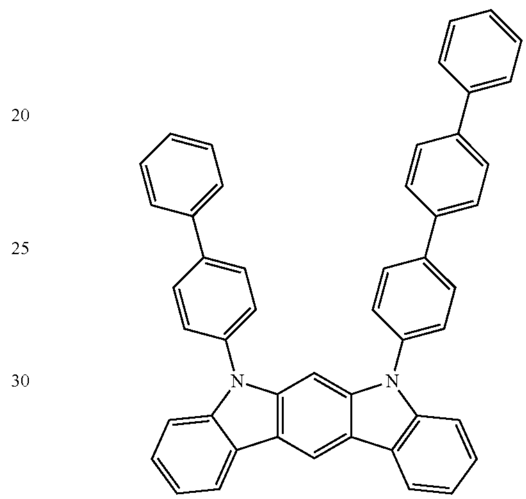
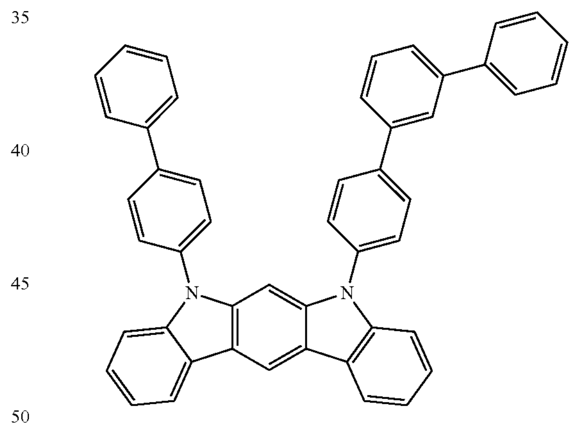
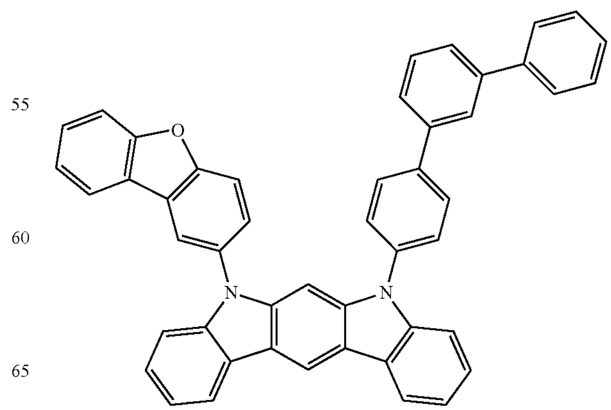

-continued
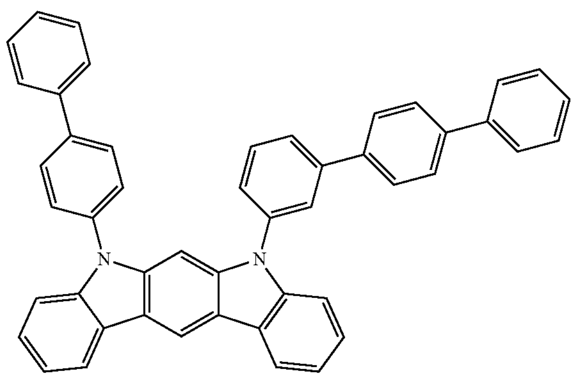
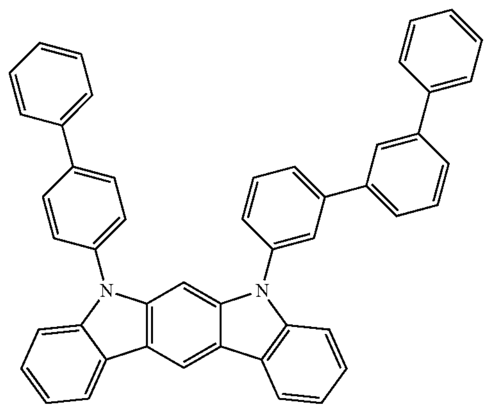
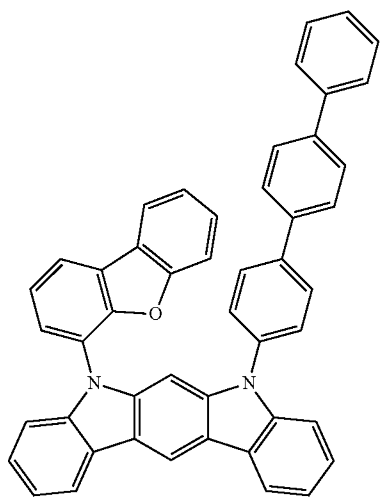
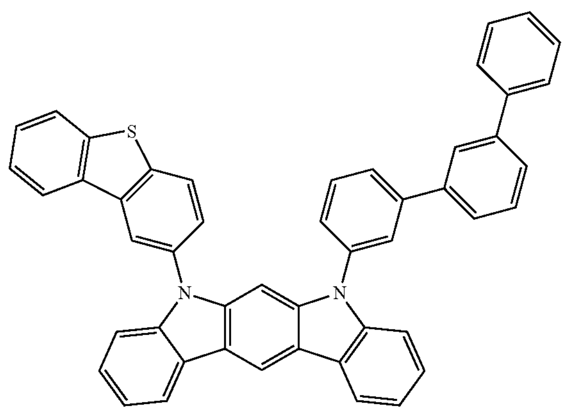
-continued
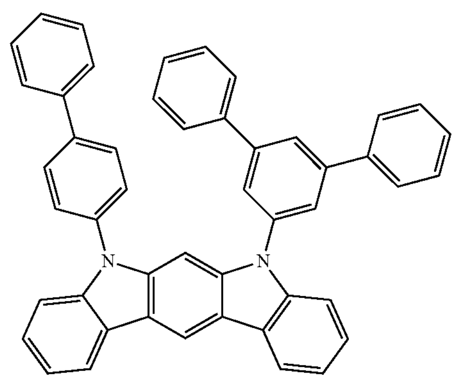
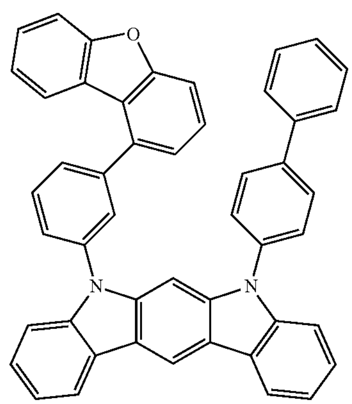
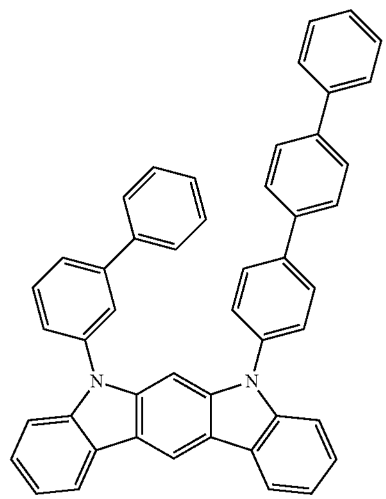
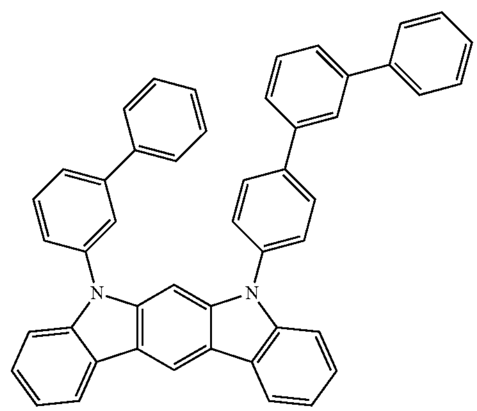

-continued
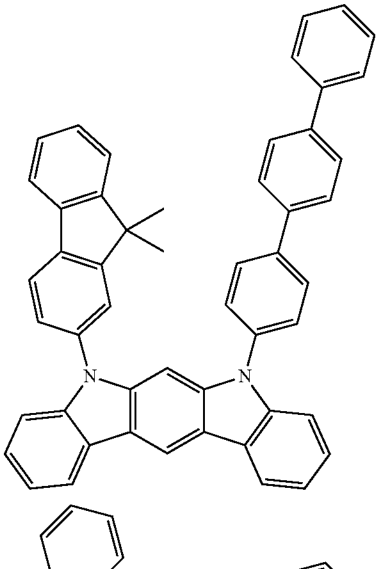
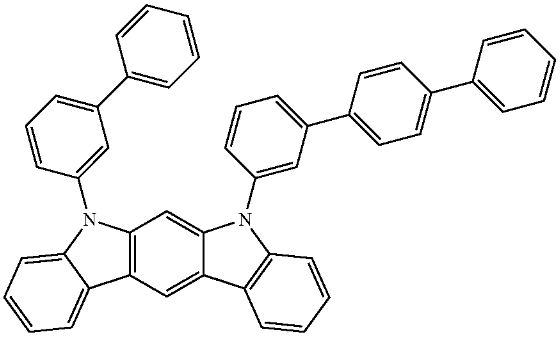
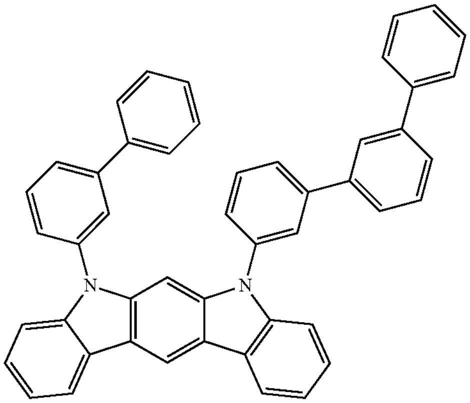
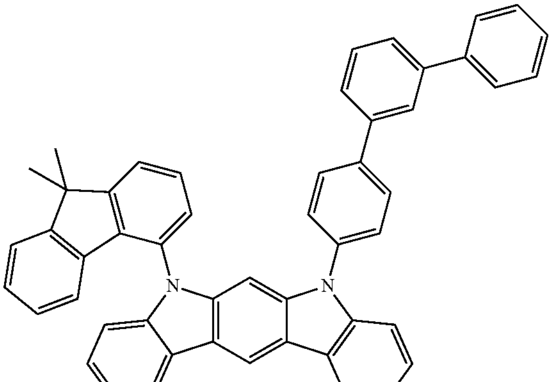
-continued
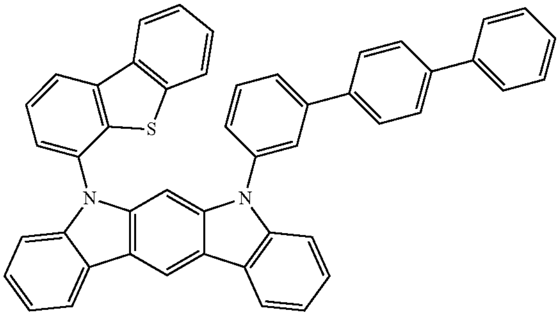
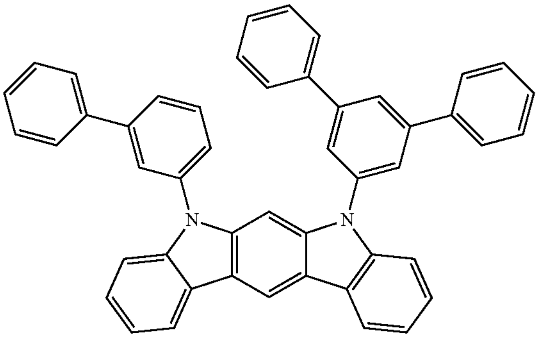
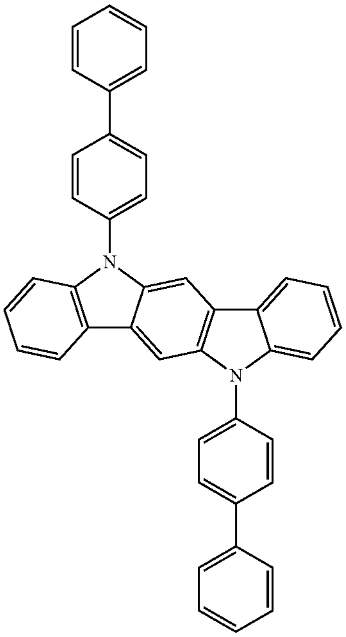

-continued
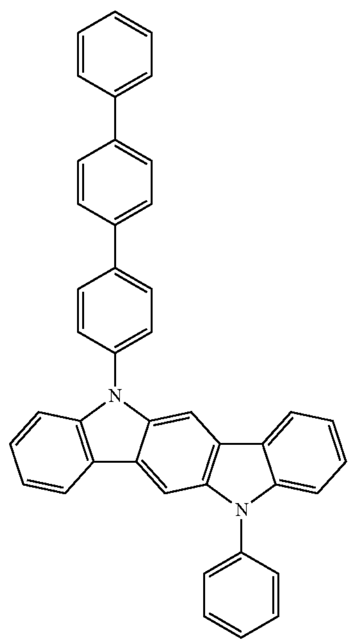
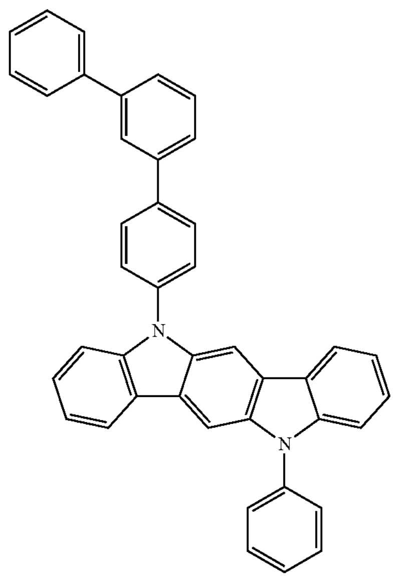
-continued
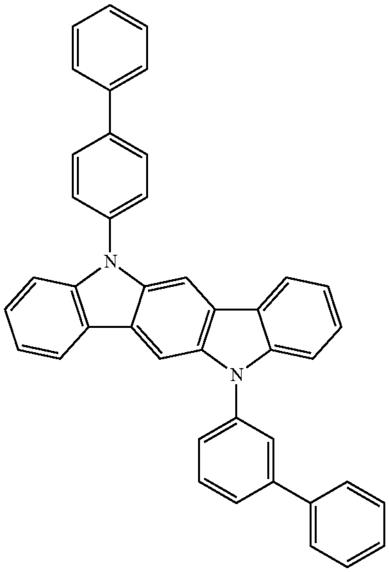
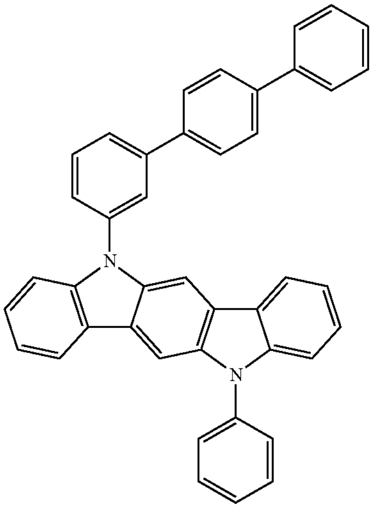
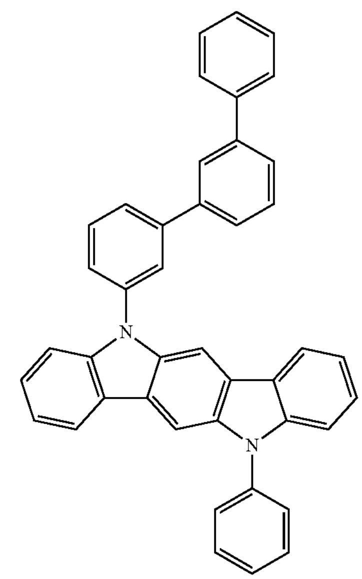

-continued
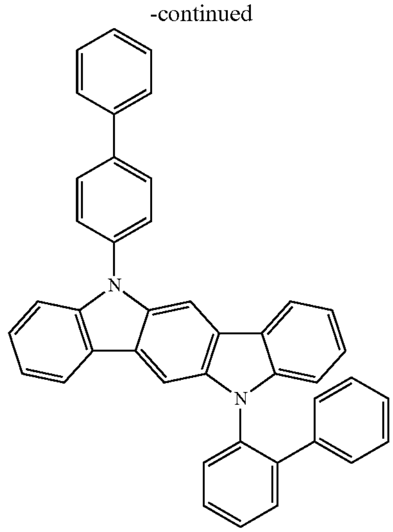
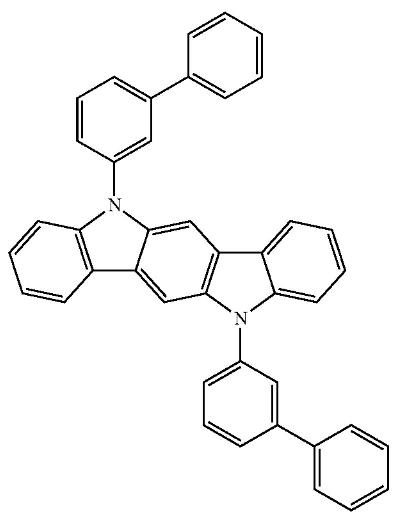
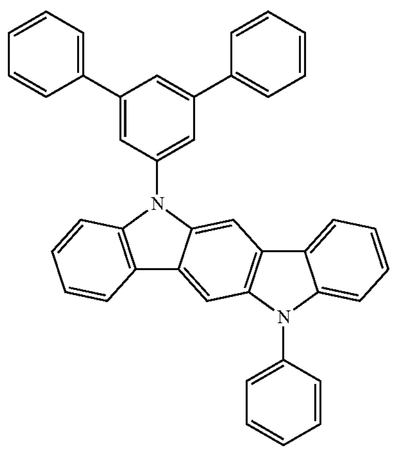
-continued
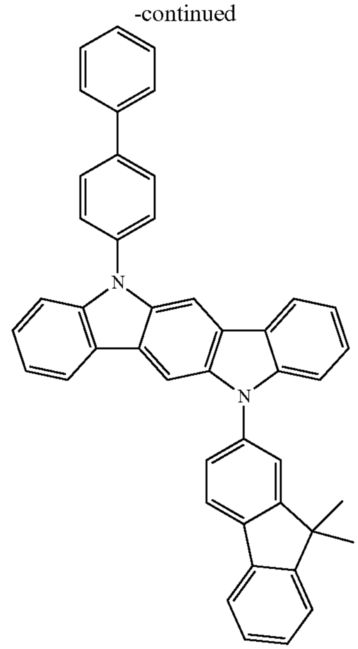
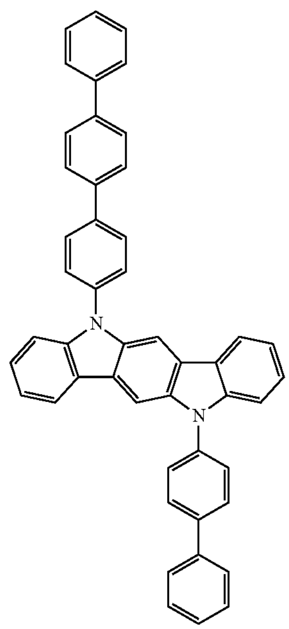

-continued
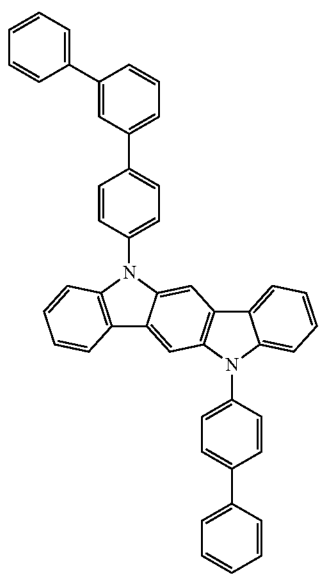
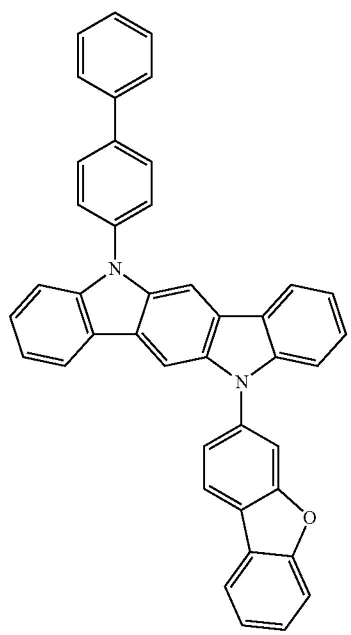
-continued
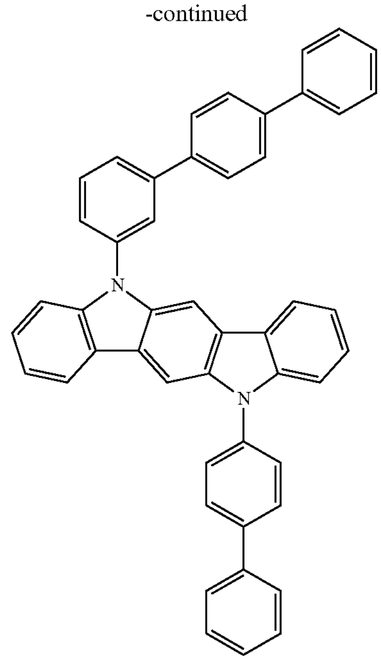
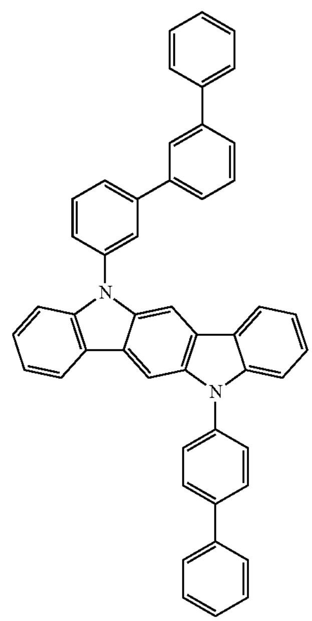

-continued
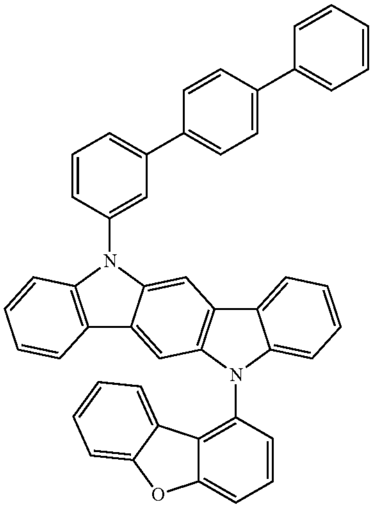
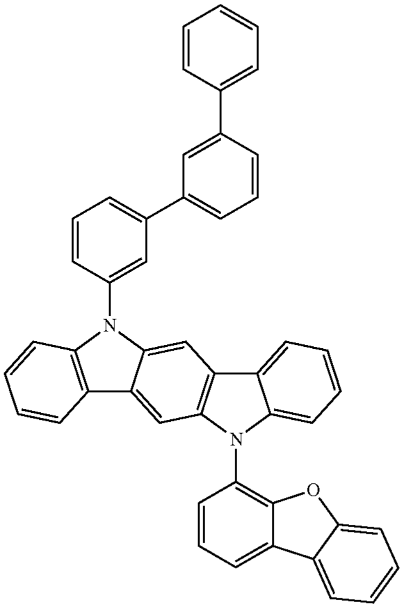
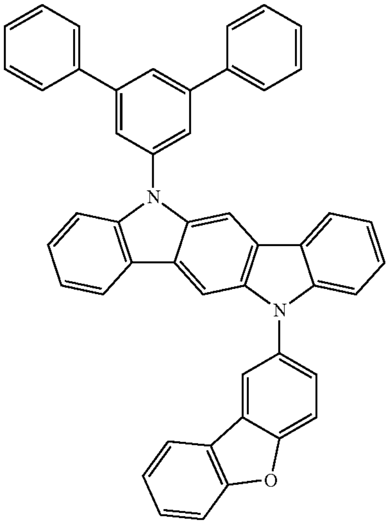
-continued
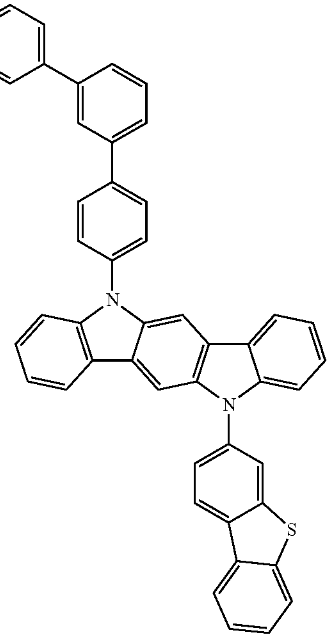
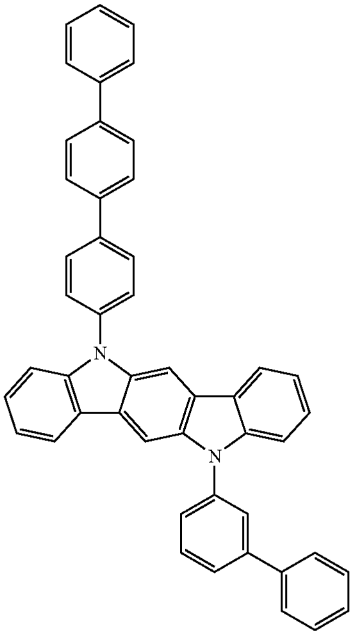

-continued
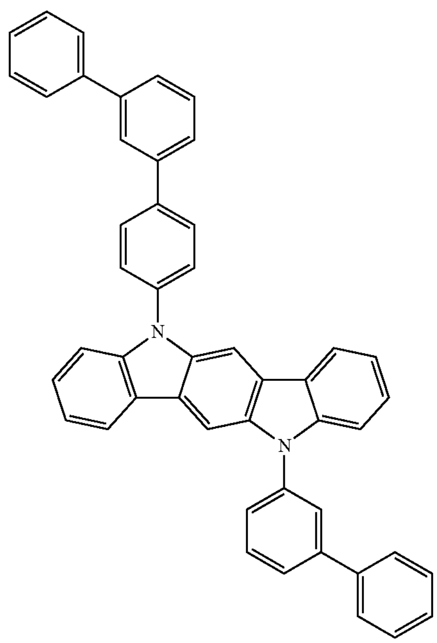
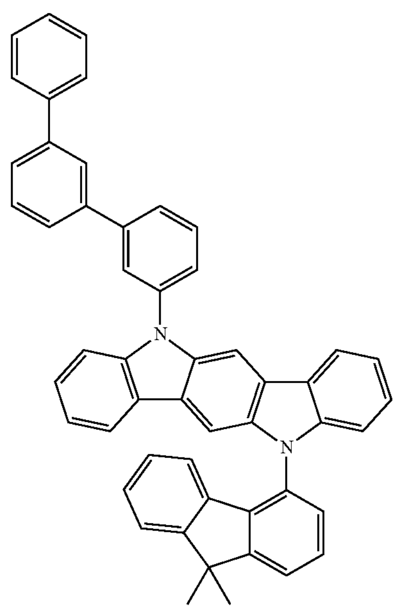
-continued
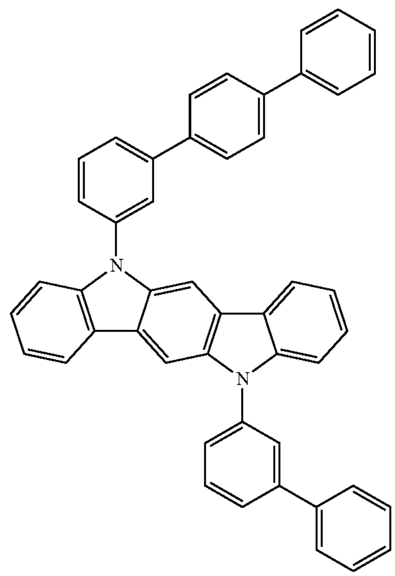
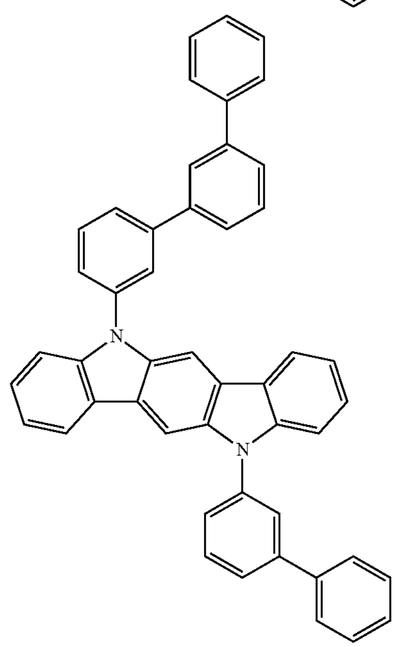
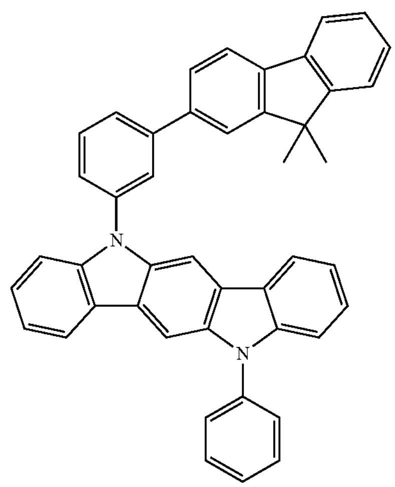

-continued
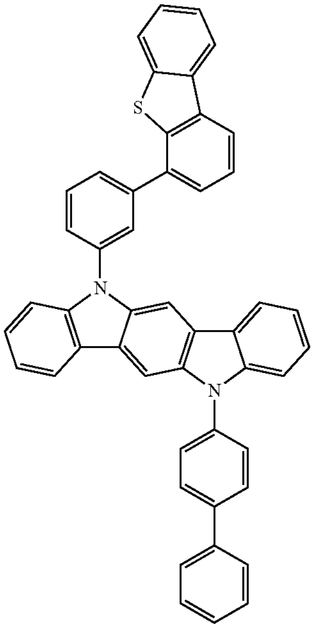
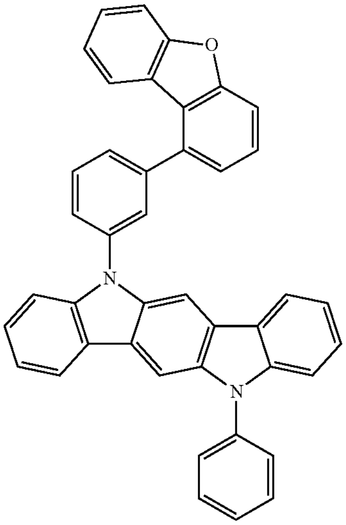
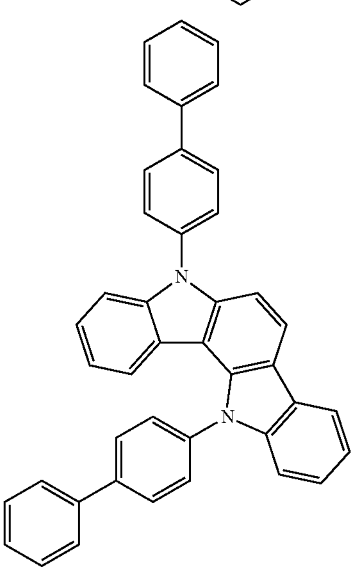
-continued
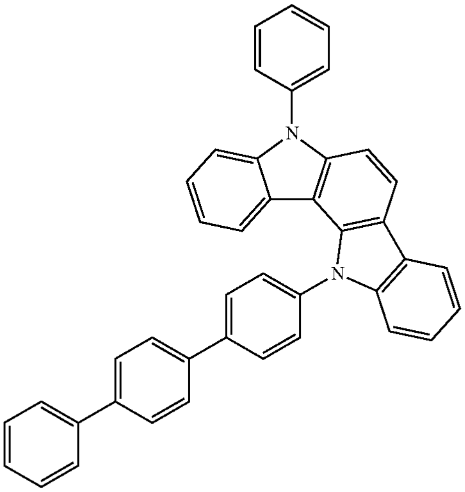
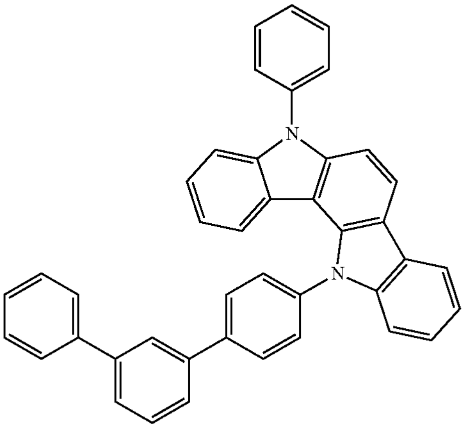
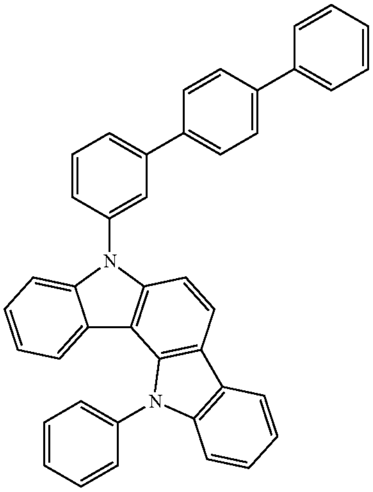

-continued
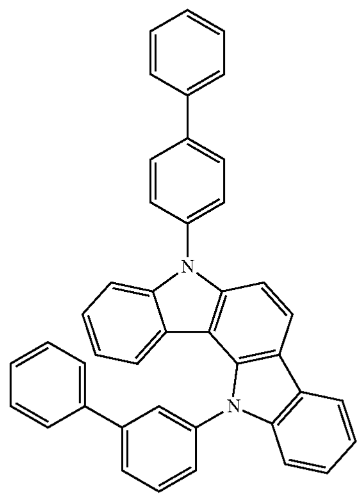
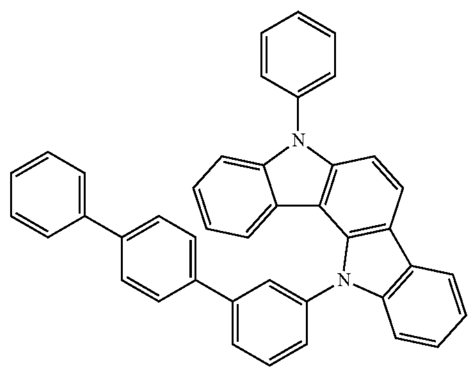
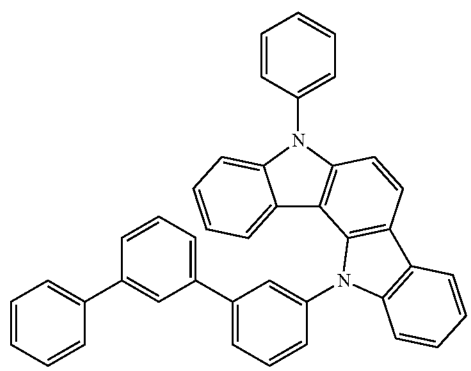
-continued
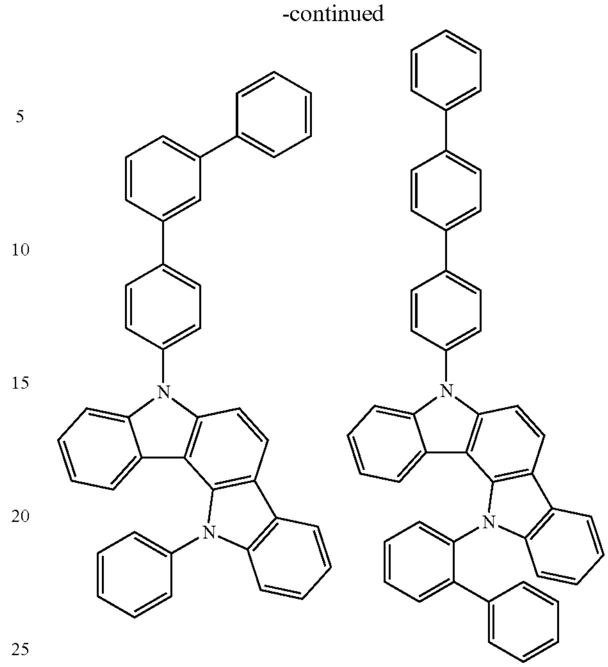
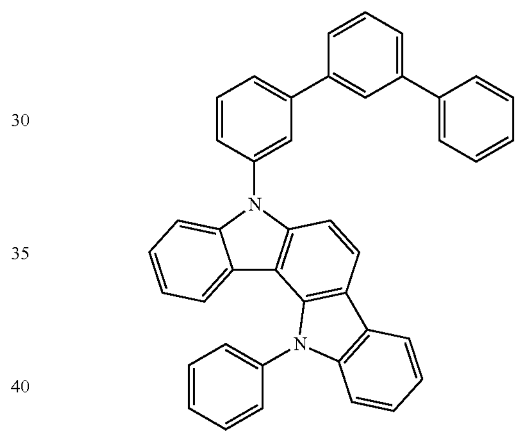
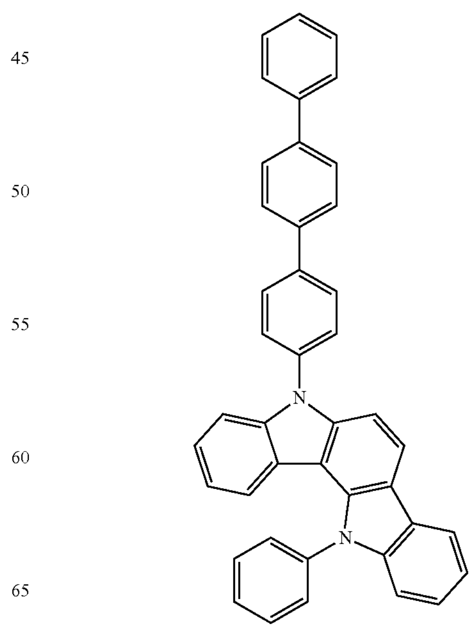

-continued
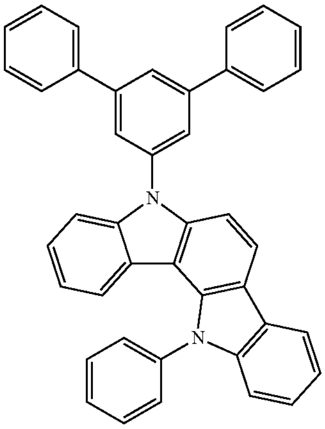
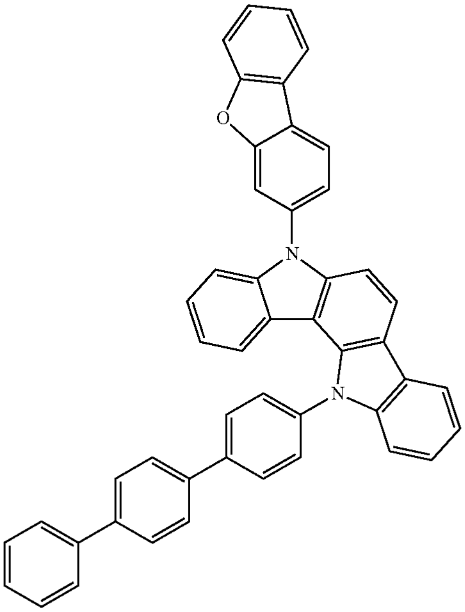
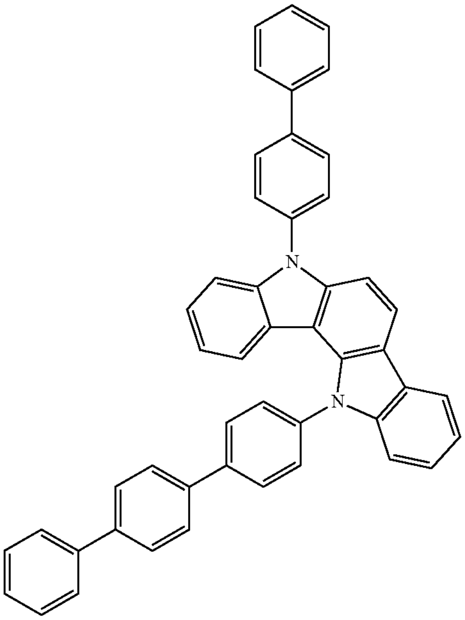
-continued
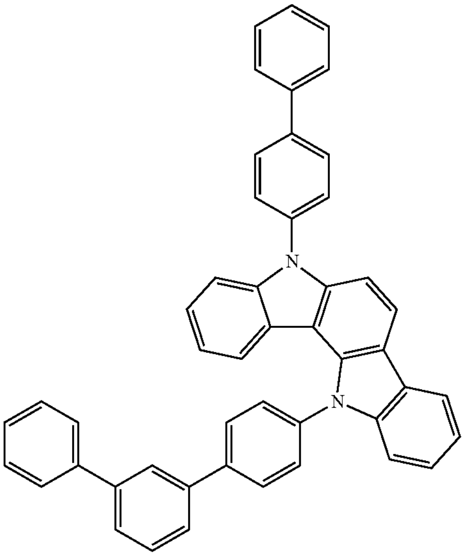
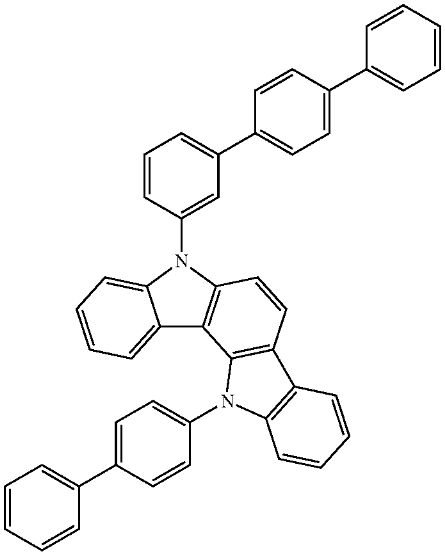
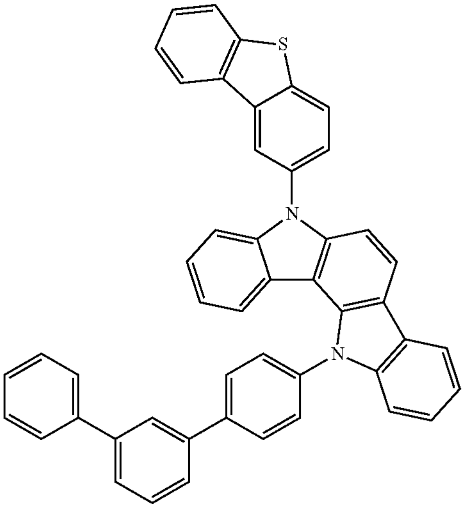

-continued
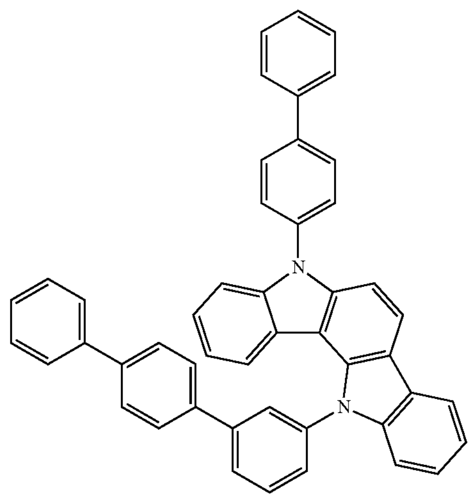
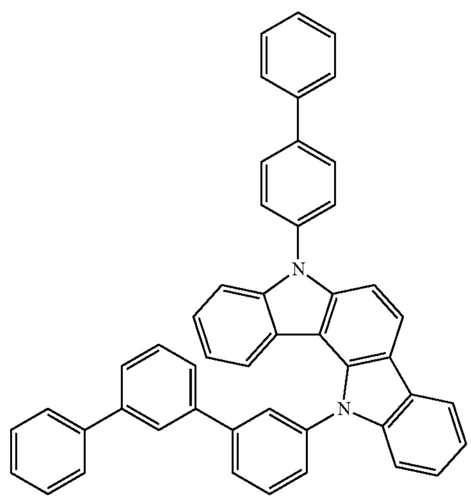
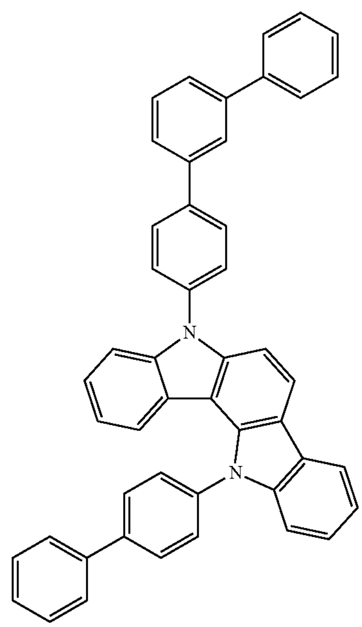
-continued
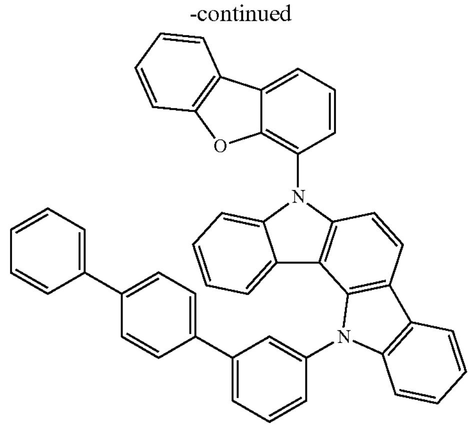
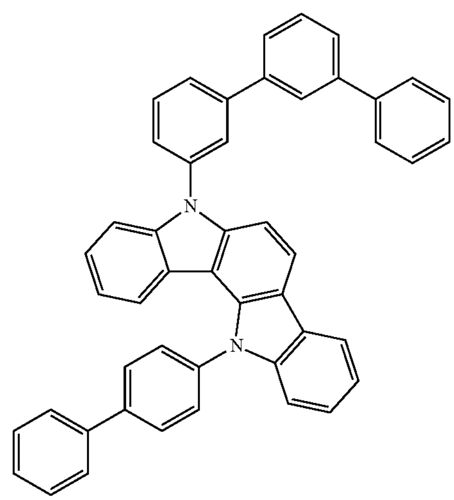
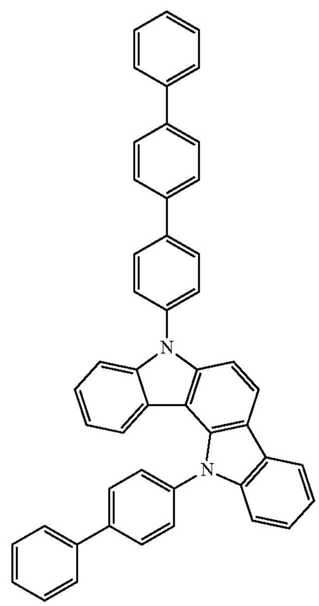

-continued
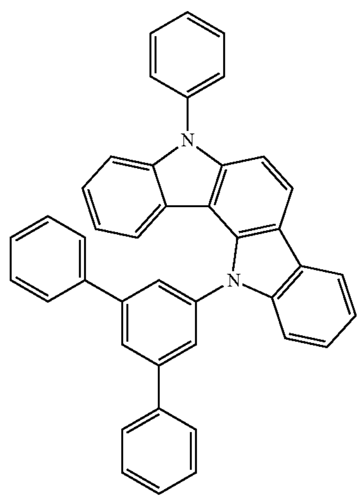
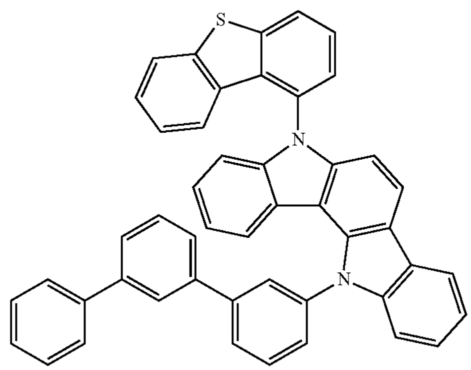
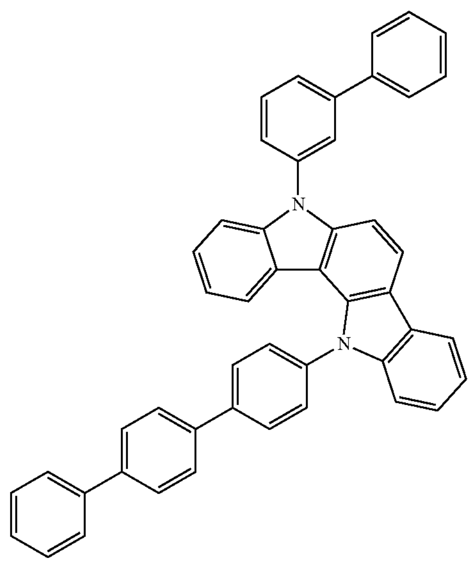
-continued
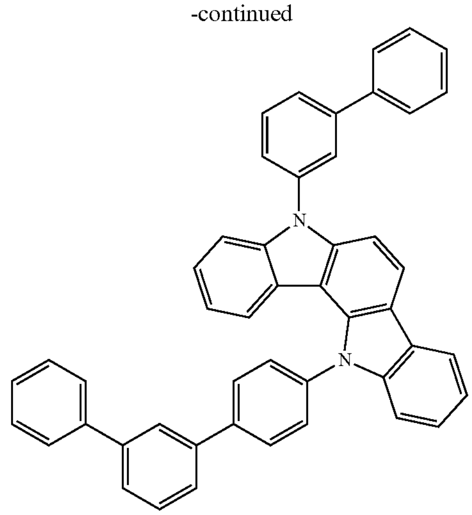
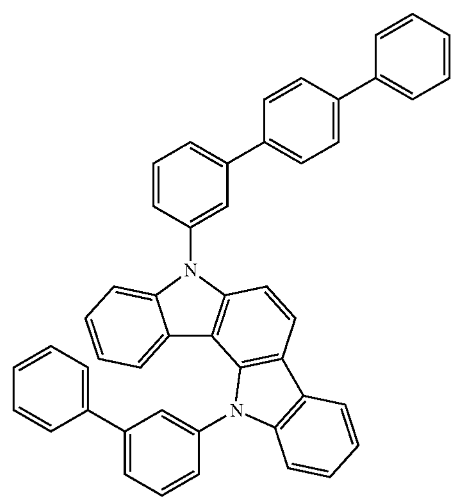
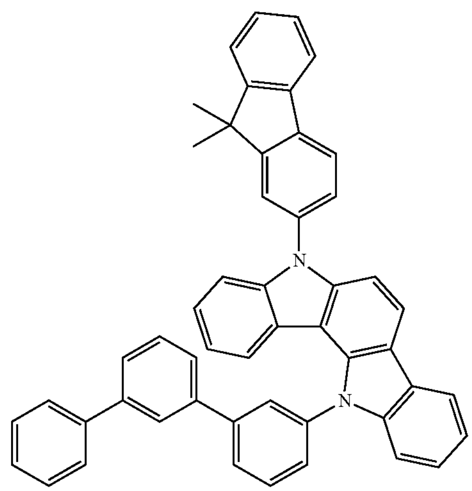

-continued
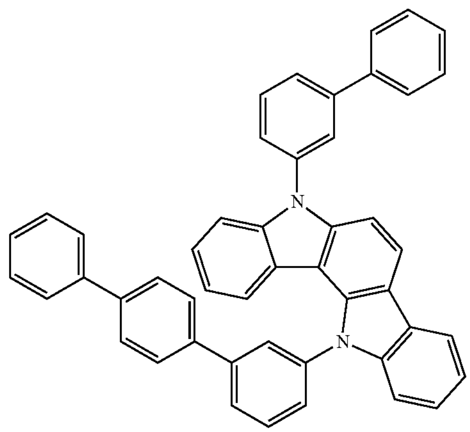
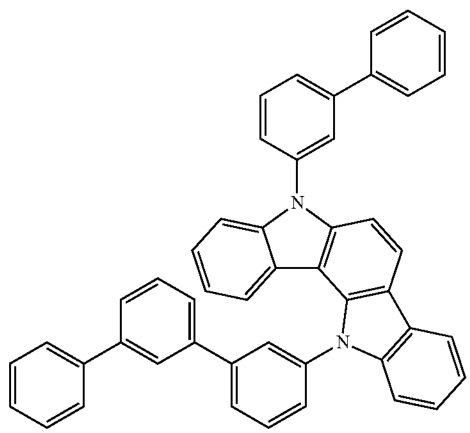
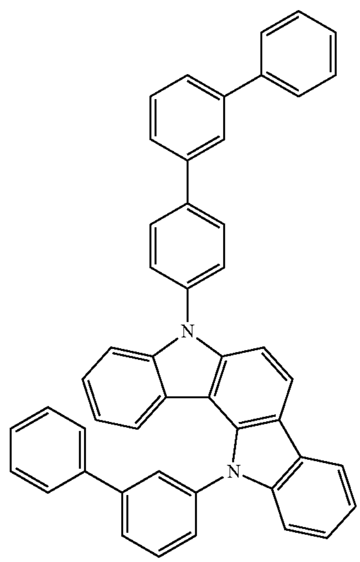
-continued
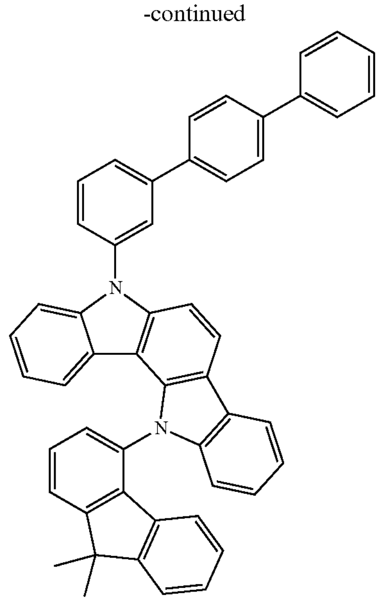
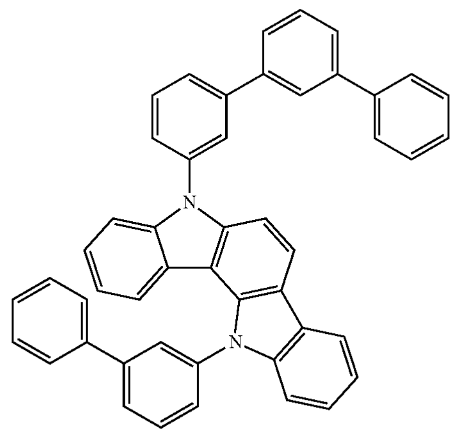
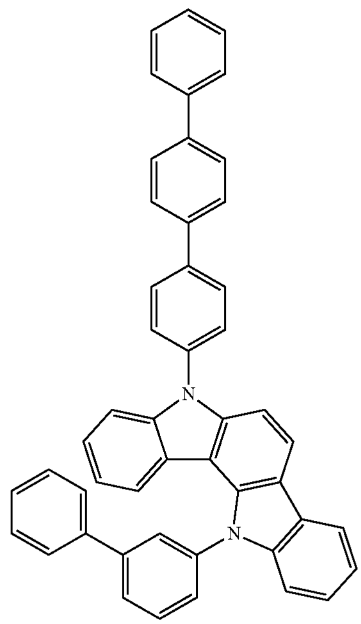

-continued
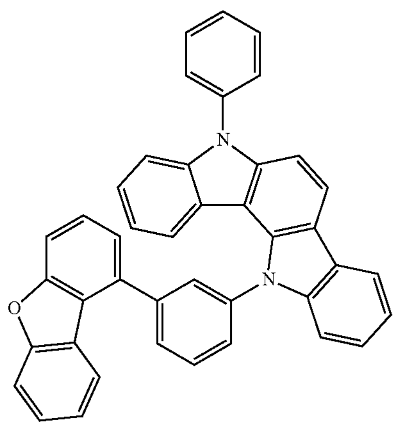
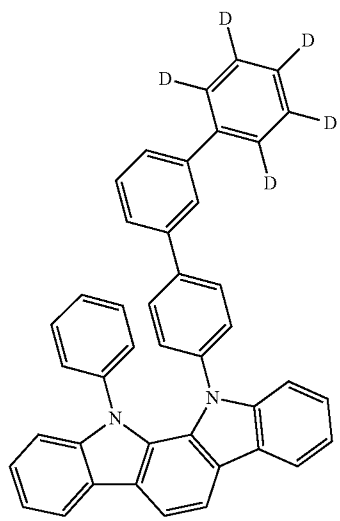
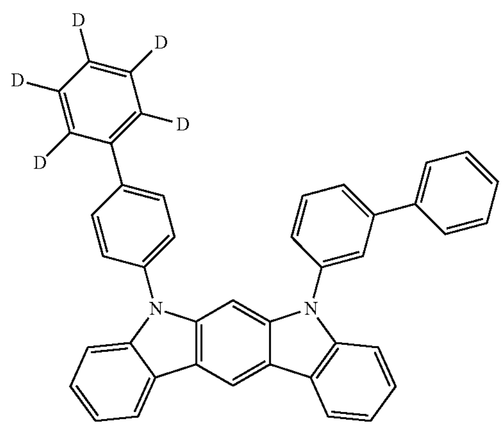
-continued
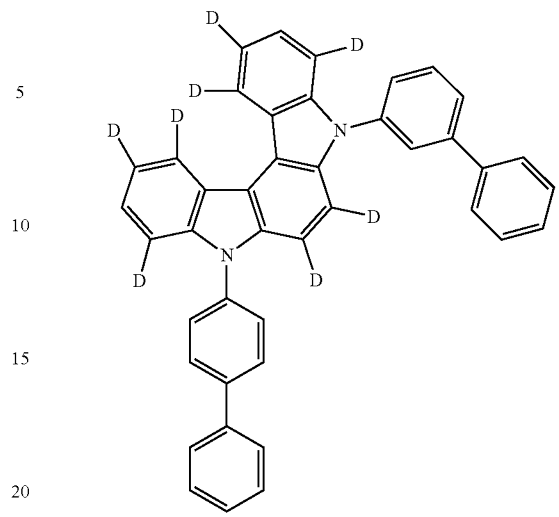
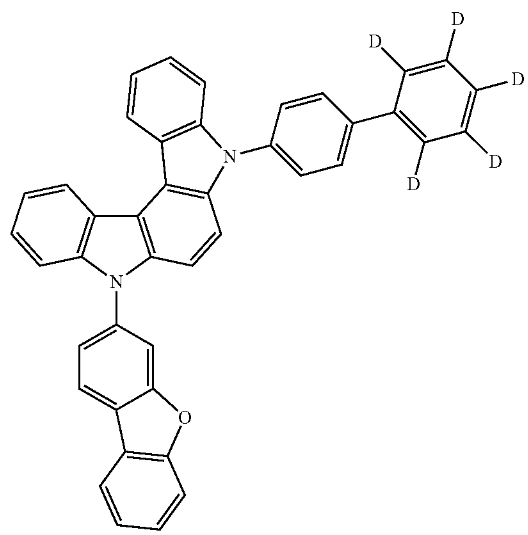
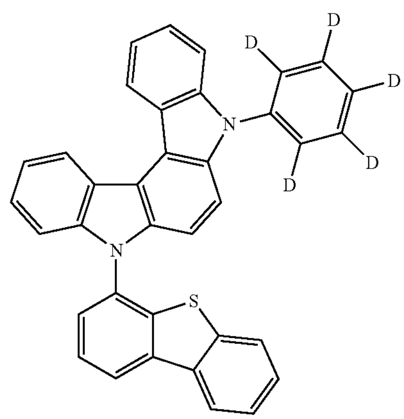

-continued
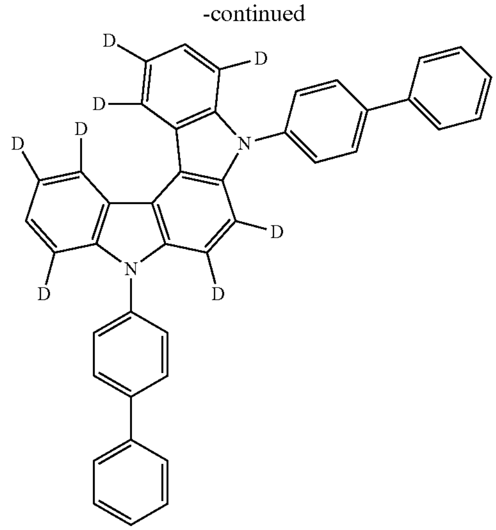
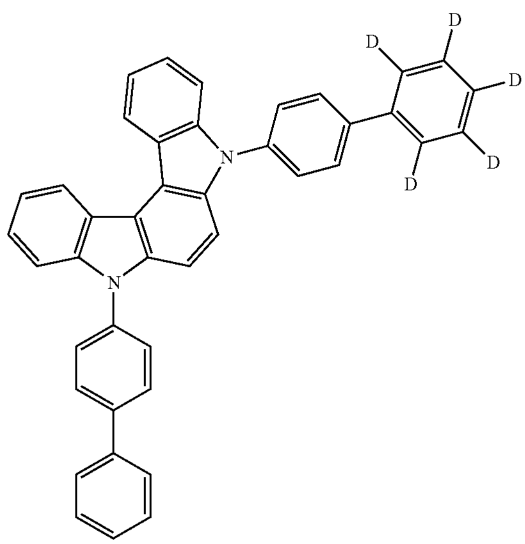
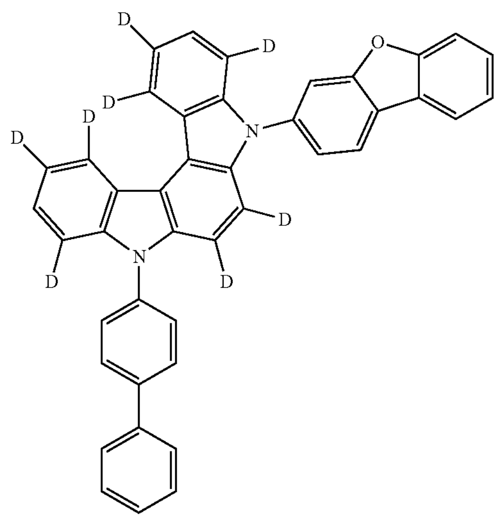
-continued
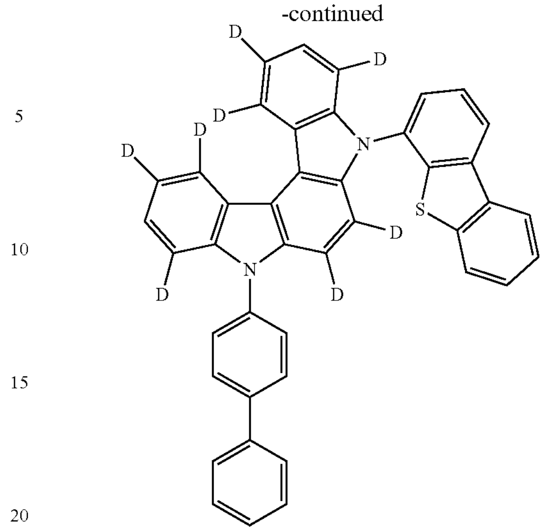
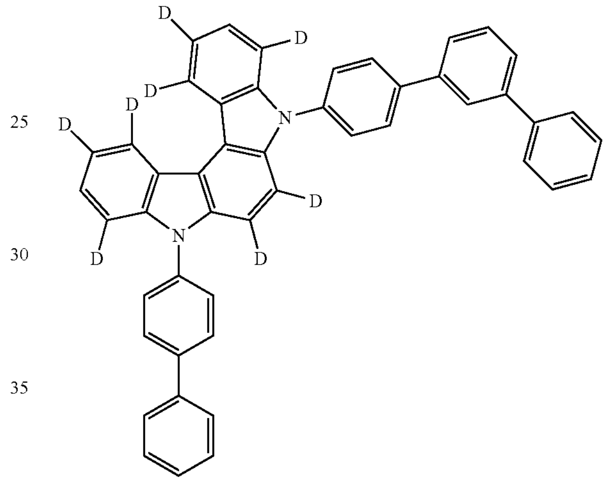
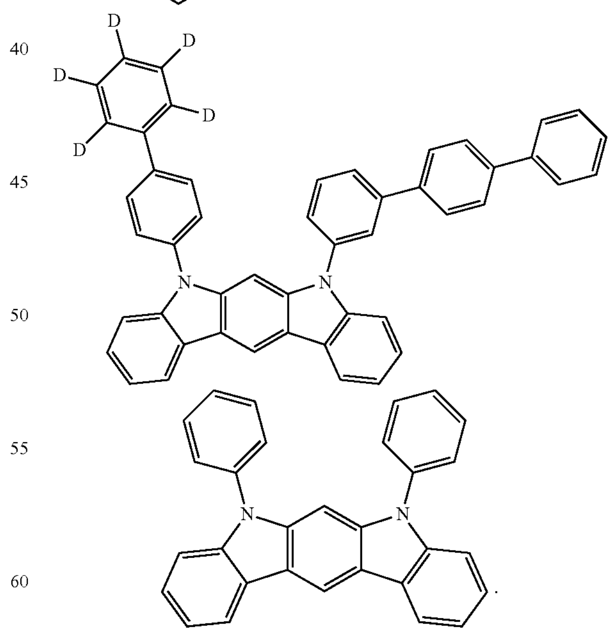
6. The organic light emitting device according to claim 1, wherein:
the Chemical Formula 2 is the following Chemical Formula 2-1:

[Chemical Formula 2-1]

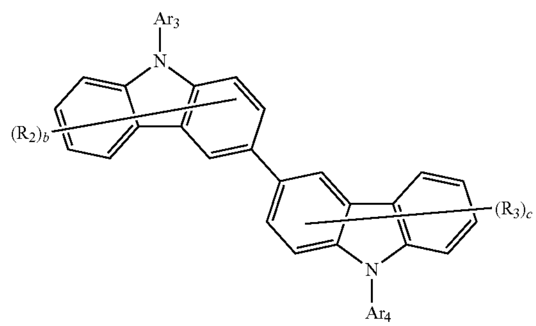

wherein in Chemical Formula 2-1:

$Ar_3$, $Ar_4$, $R_2$, $R_3$, b and c are as defined in claim 1.

7. The organic light emitting device according to claim 1, wherein:

$Ar_3$ and $Ar_4$ are each independently phenyl, biphenylyl, phenyl biphenylyl, terphenylyl, naphthyl, dimethylfluorenyl, dibenzofuranyl, dibenzothiophenyl, phenyl substituted with 5 deuteriums, or biphenylyl substituted with 1 to 5 deuteriums.

8. The organic light emitting device according to claim 1, wherein:

$R_2$ and $R_3$ are each independently hydrogen, deuterium or phenyl.

9. The organic light emitting device according to claim 1, wherein:

b and c are each independently 0, 1 or 5.

10. The organic light emitting device according to claim 1, wherein:

the compound of Chemical Formula 2 is any one compound selected from the group consisting of the following compounds:

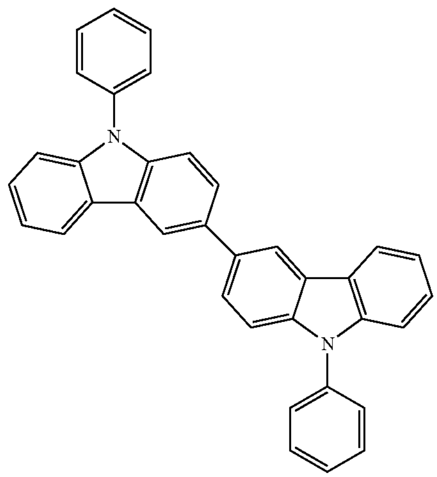

-continued

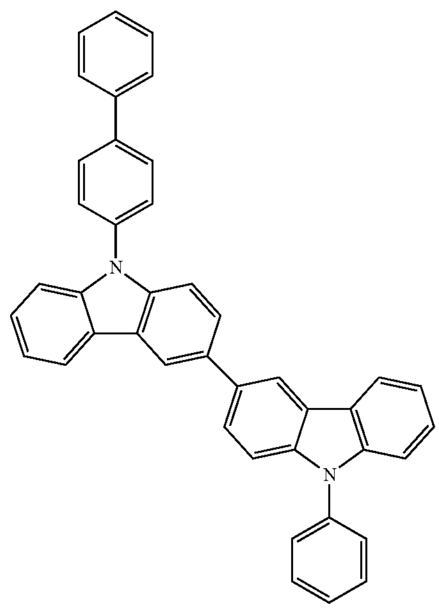

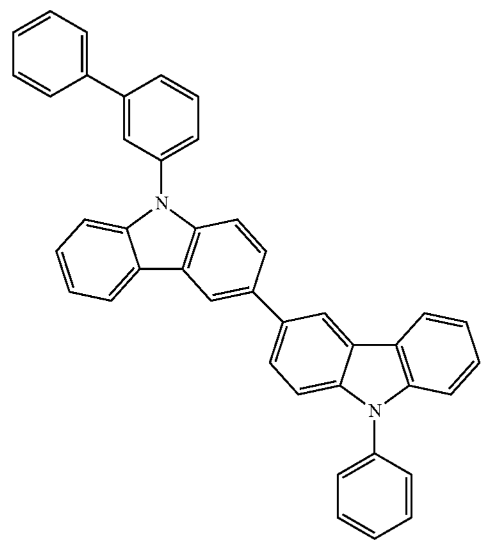

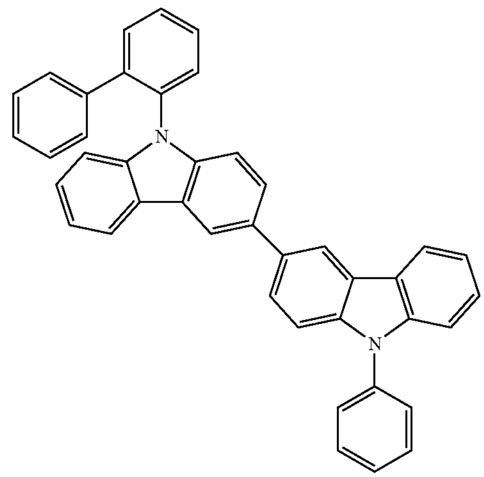

-continued
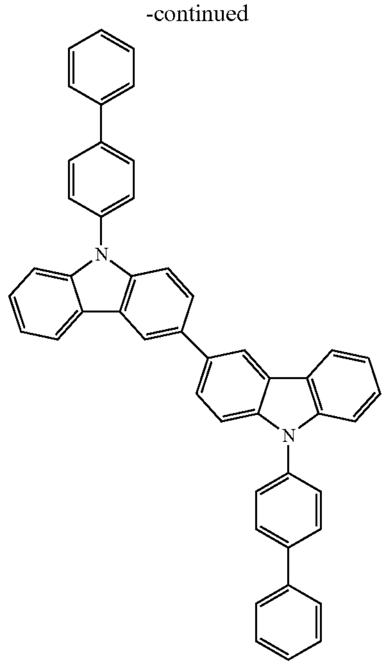
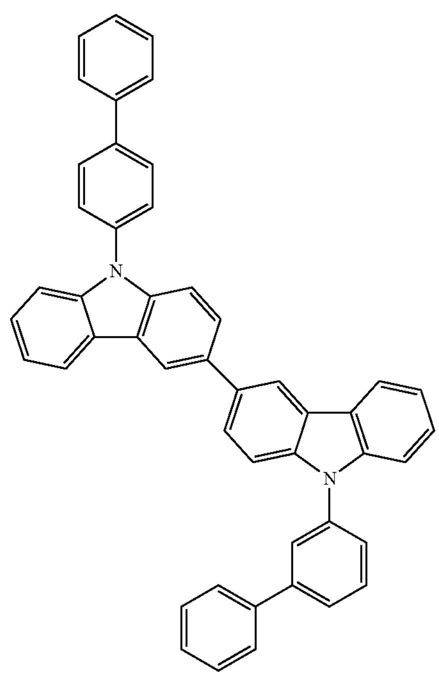
-continued
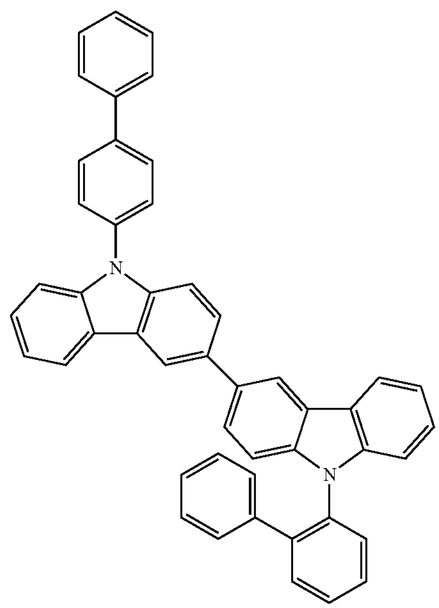
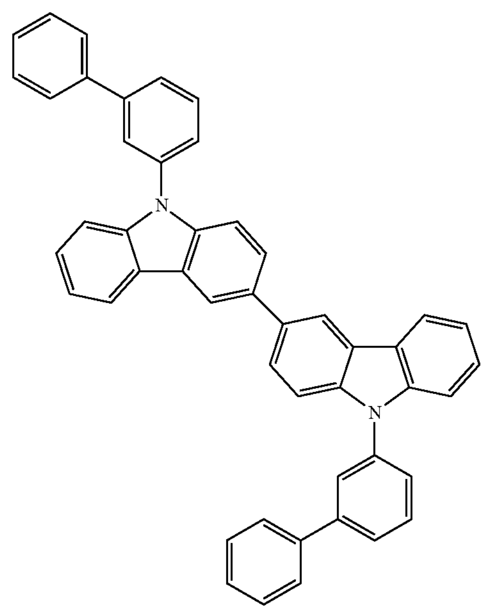

-continued
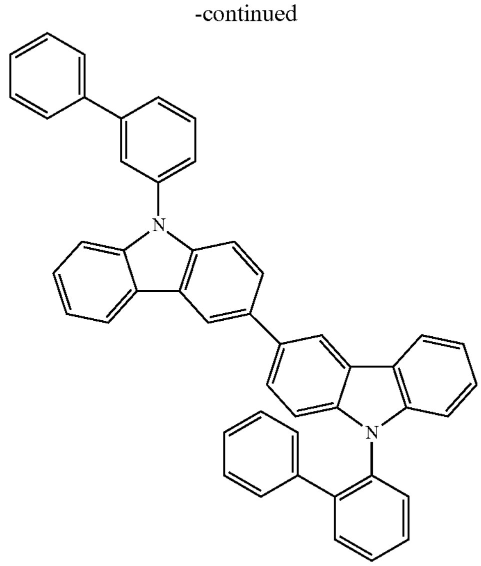
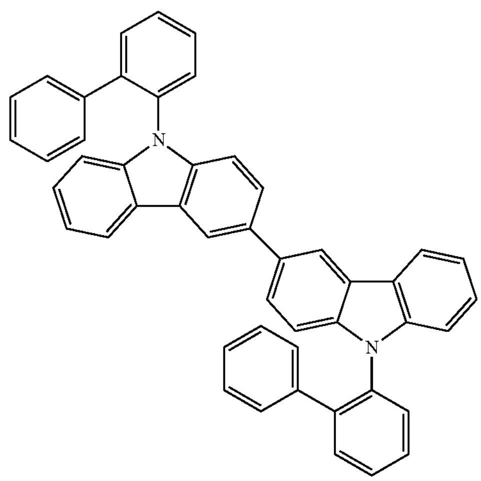
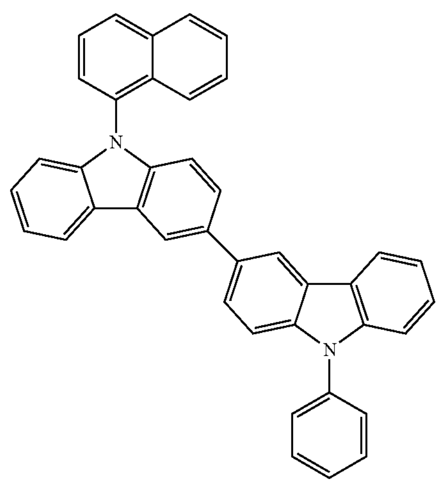
-continued
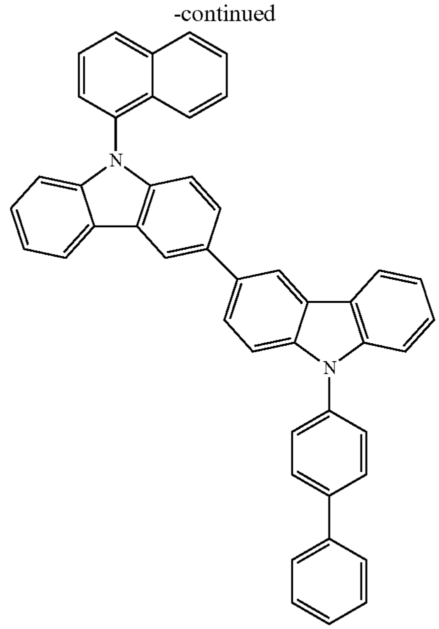
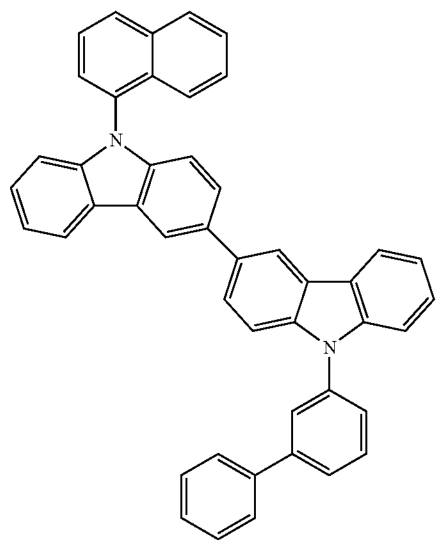
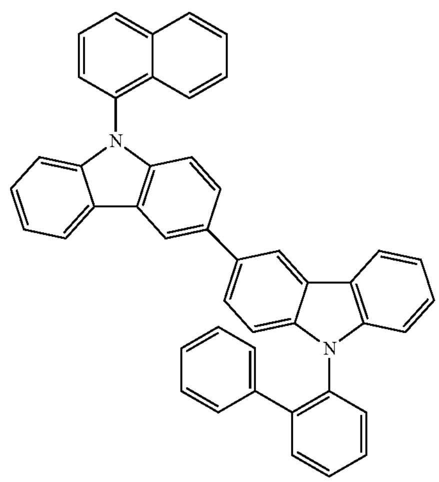

-continued
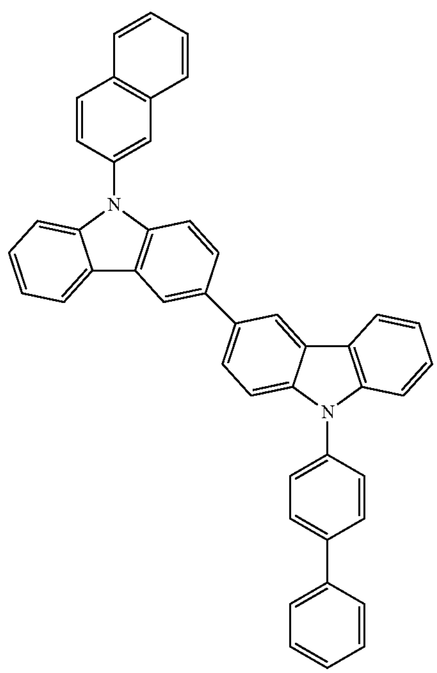
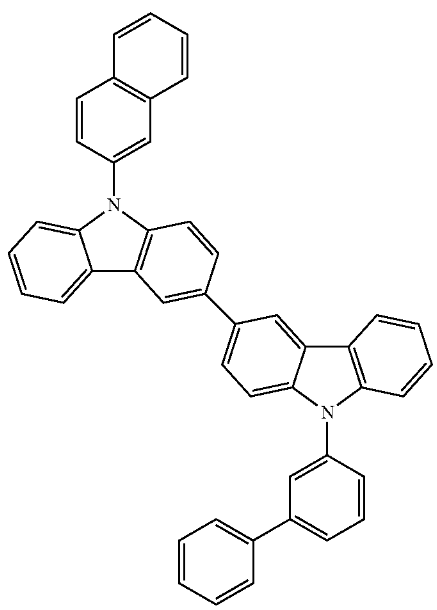
-continued
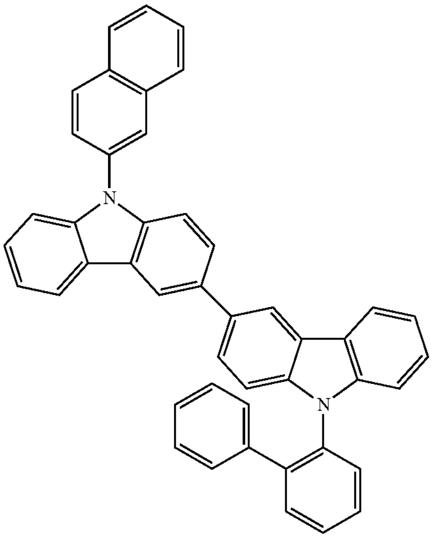
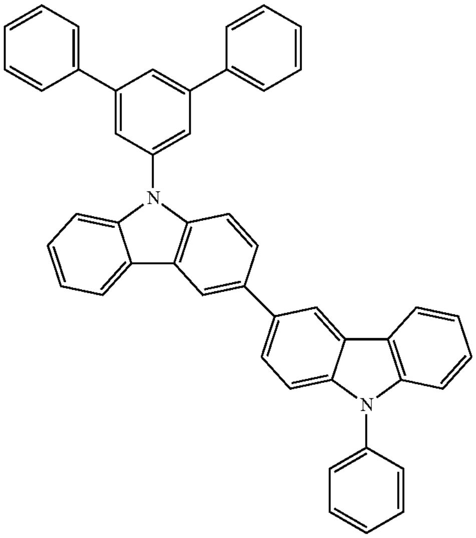
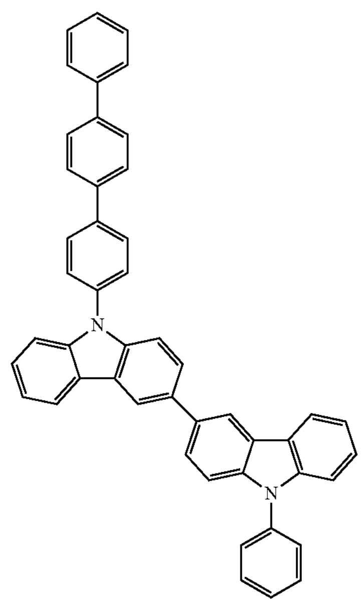

-continued
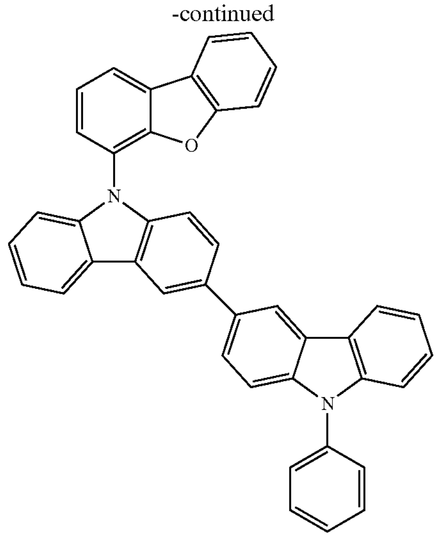
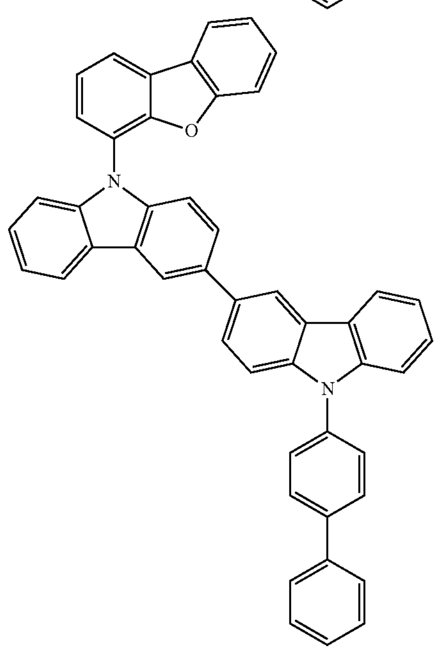
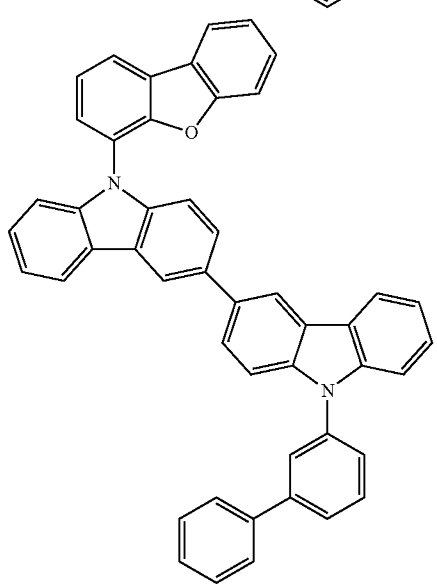
-continued
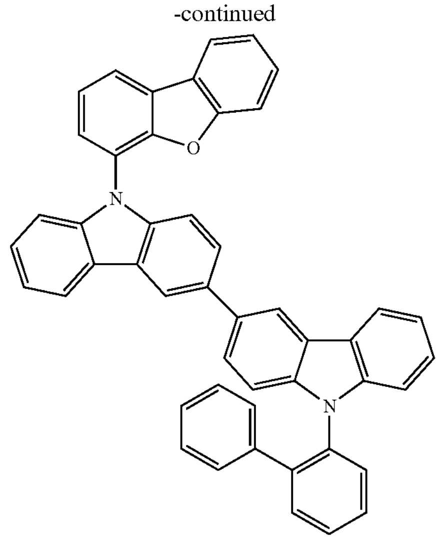
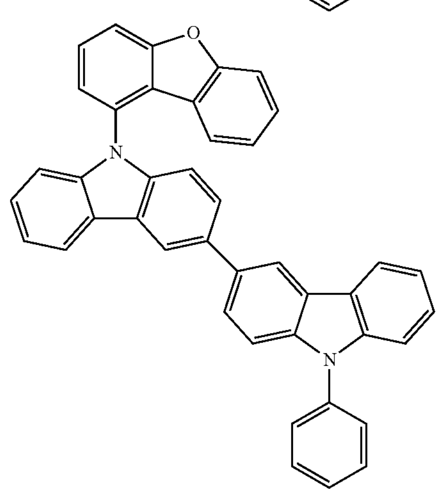
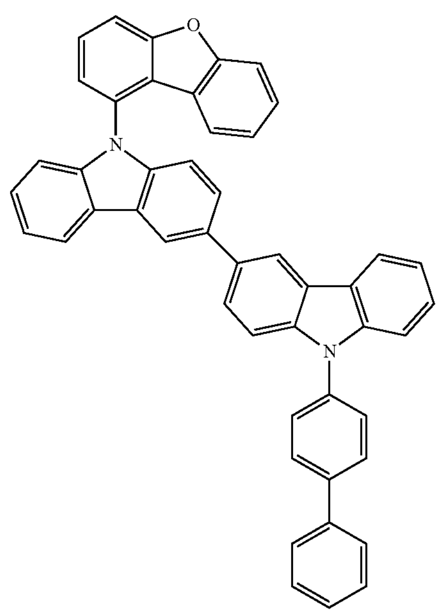

-continued
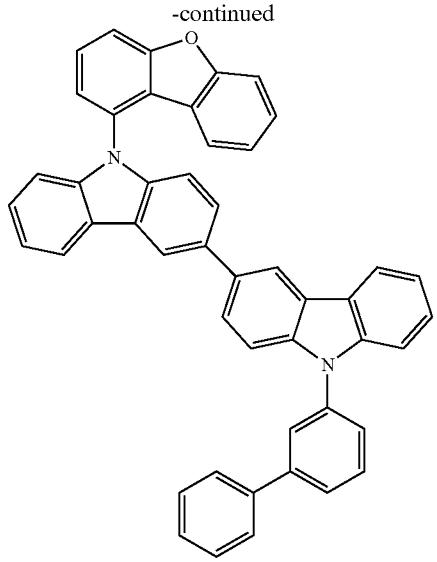
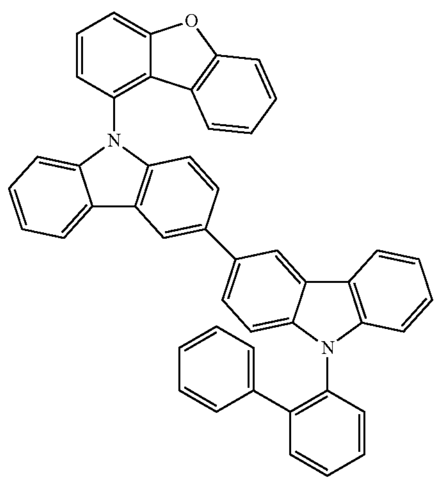
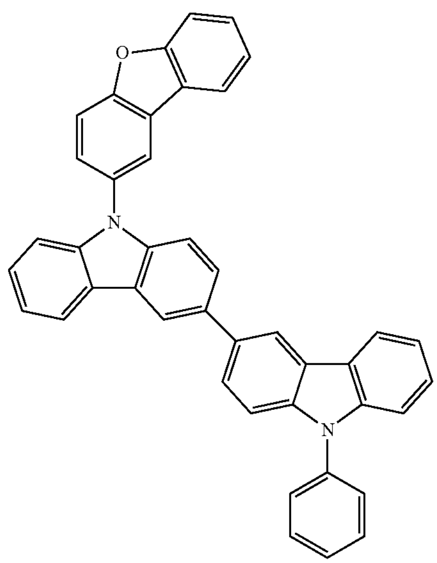
-continued
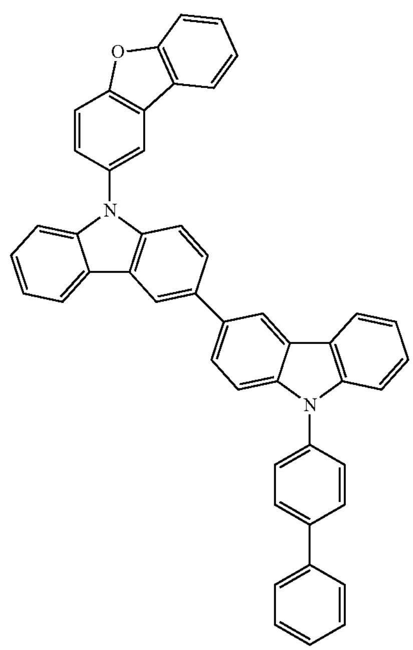
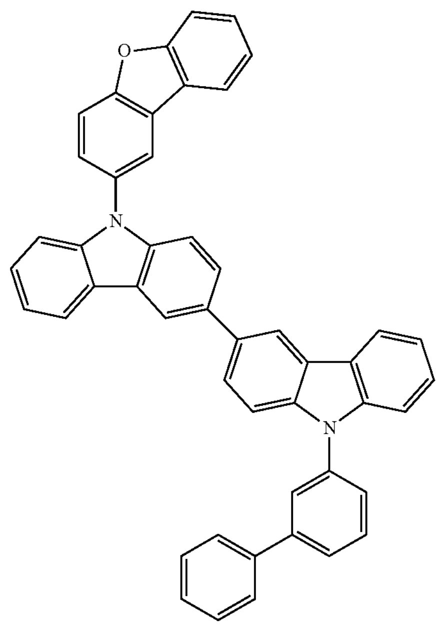

-continued
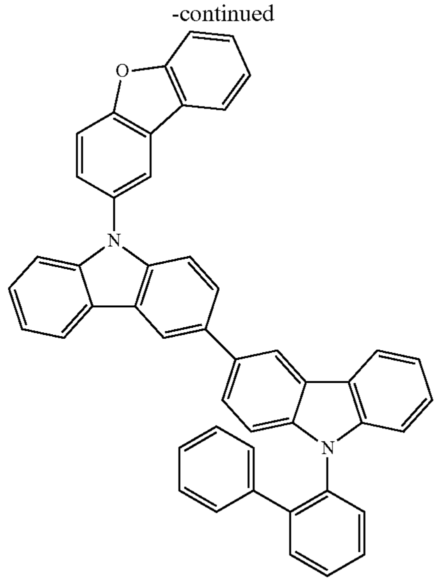
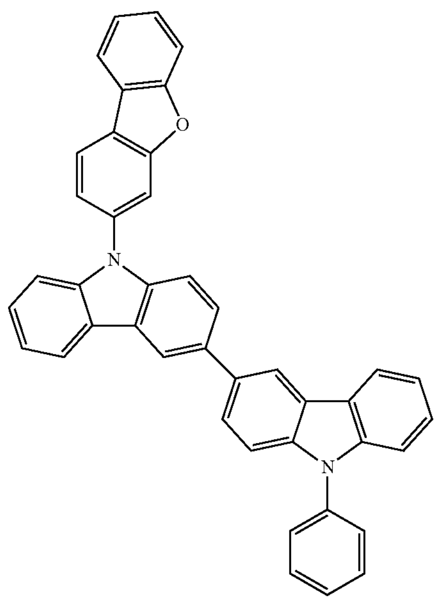
-continued
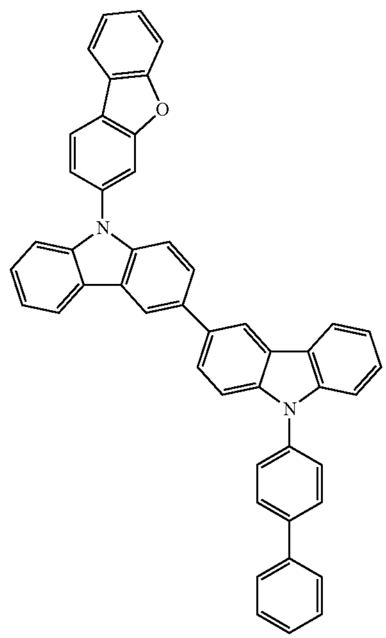
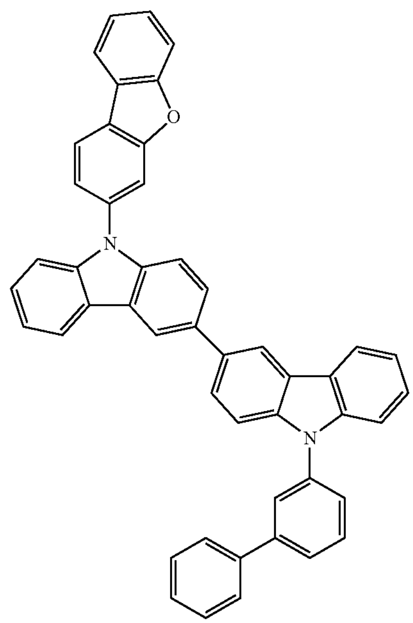

-continued
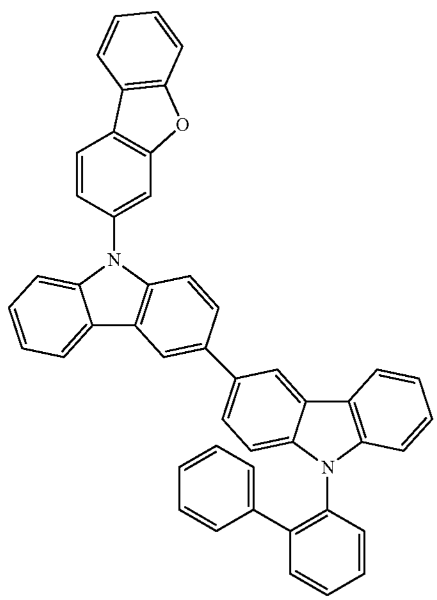
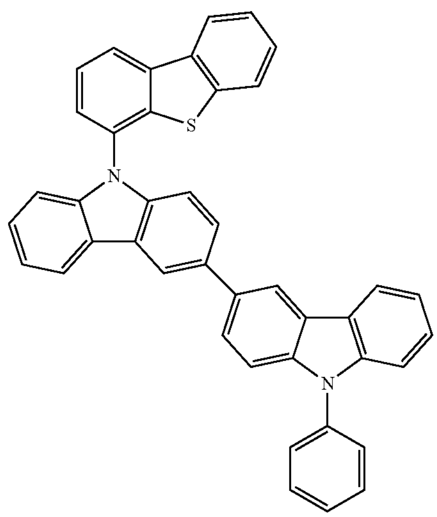
-continued
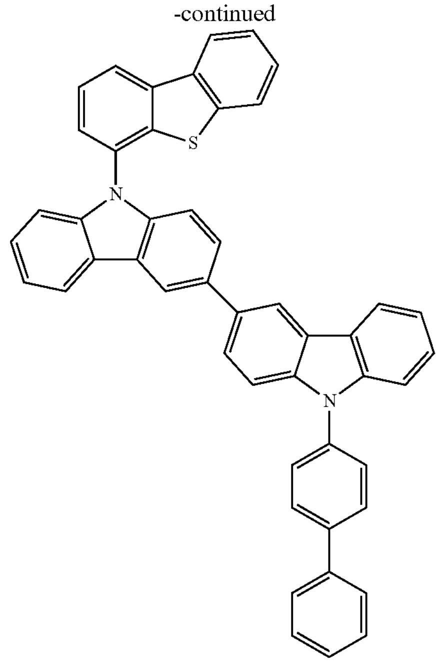
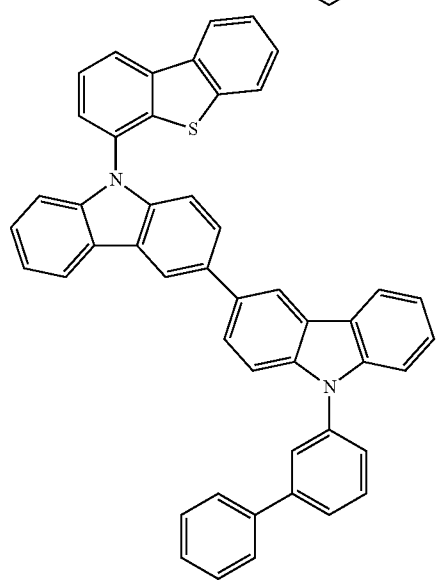
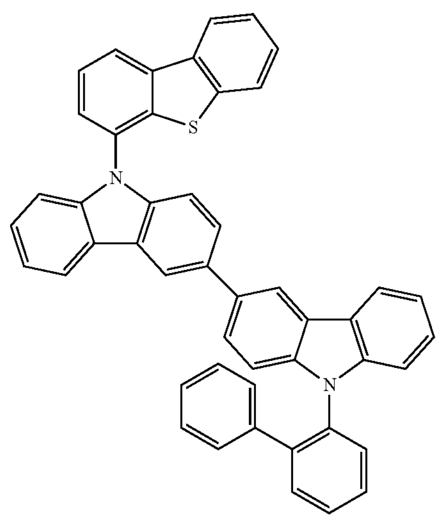

-continued
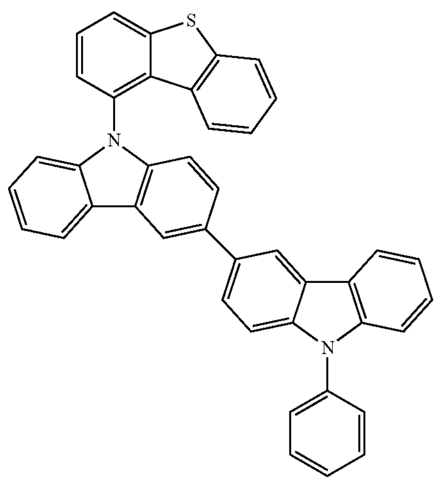
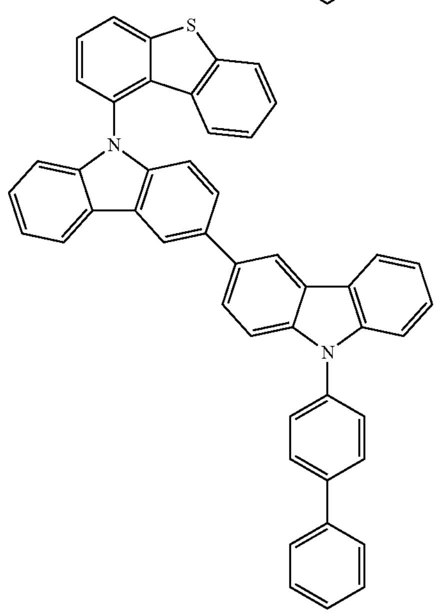
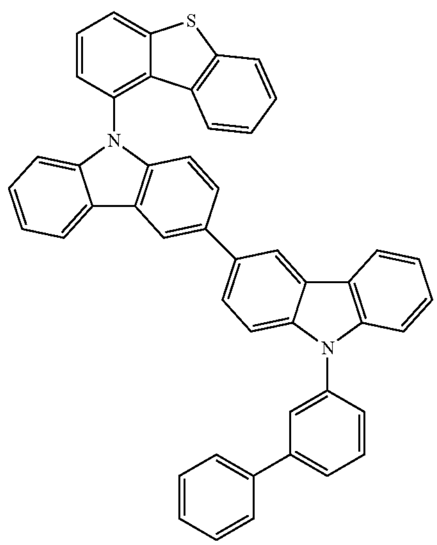
-continued
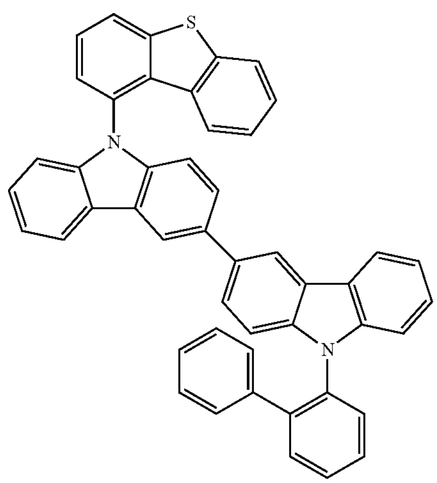
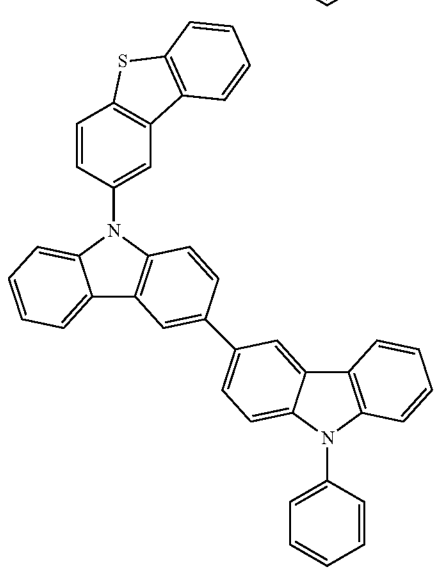
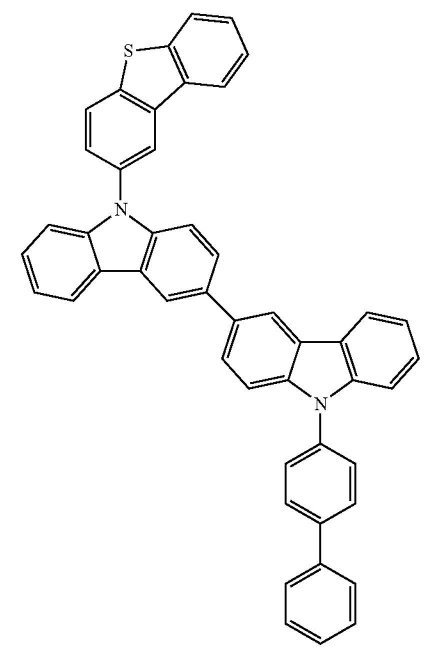

-continued
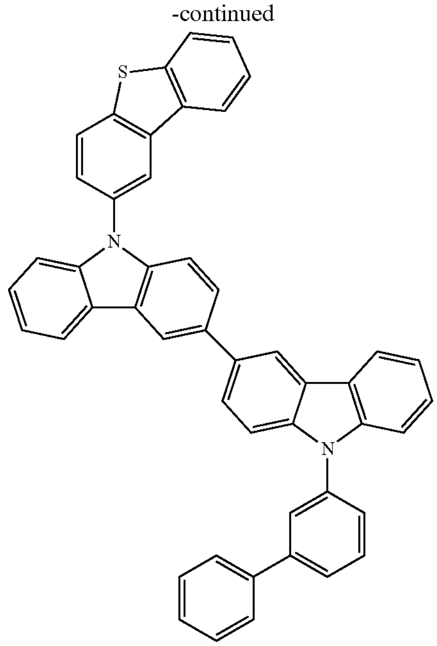
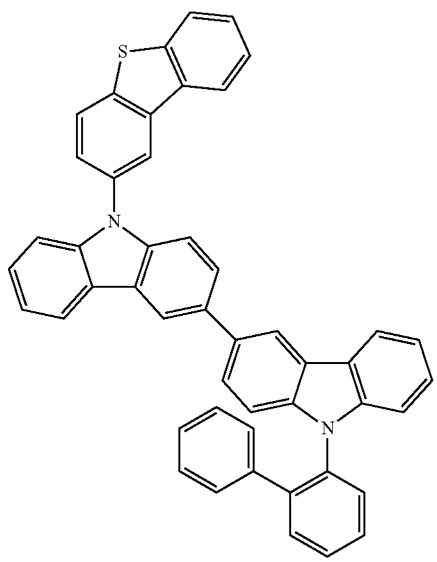
-continued
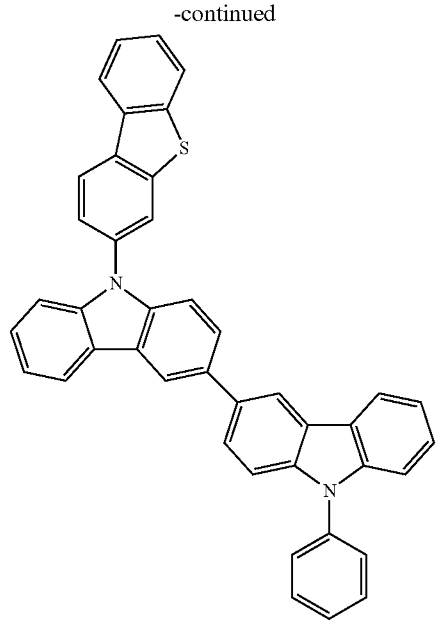
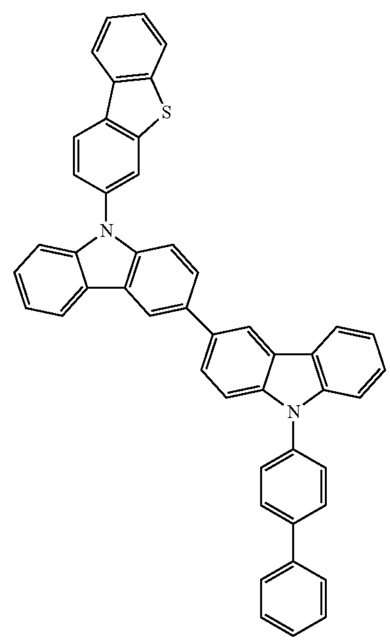

-continued
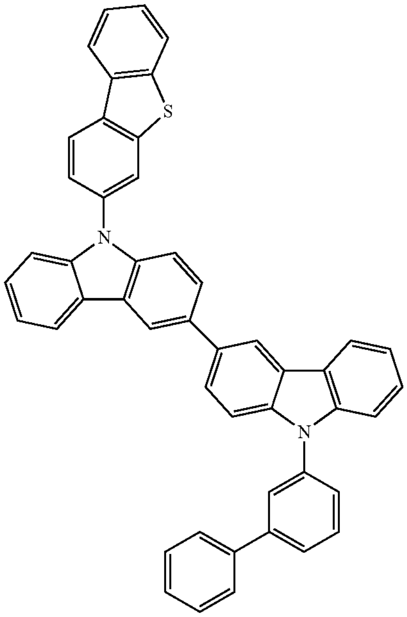
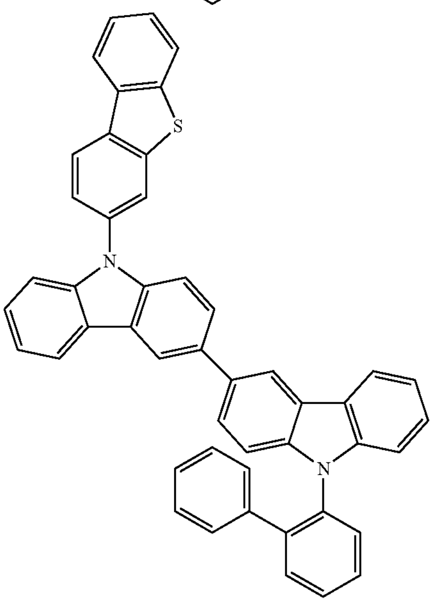
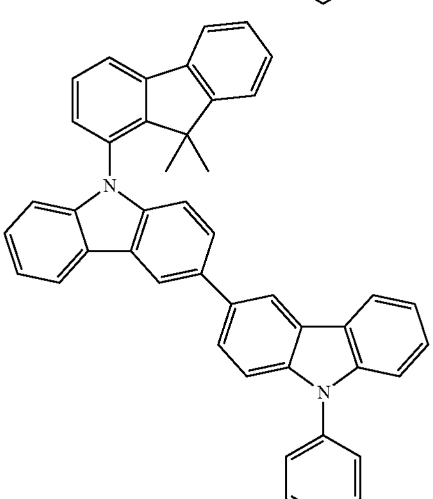
-continued
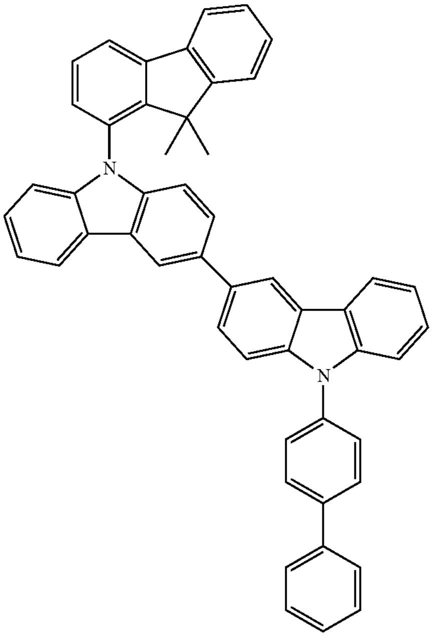
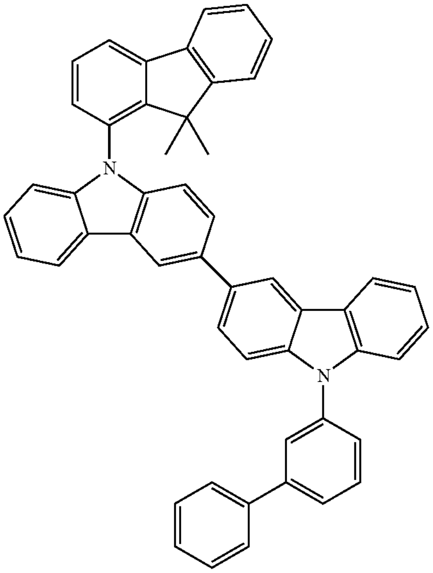
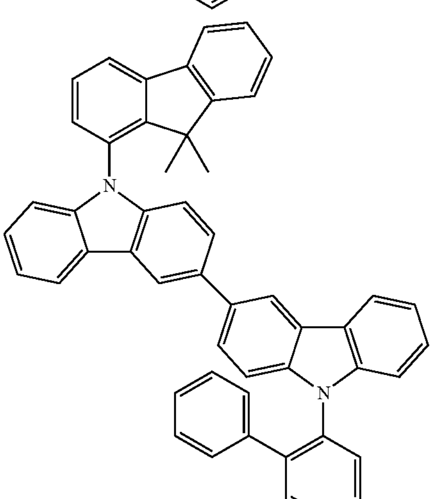

-continued
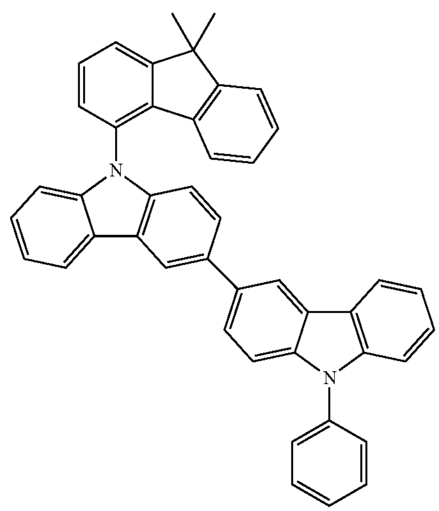
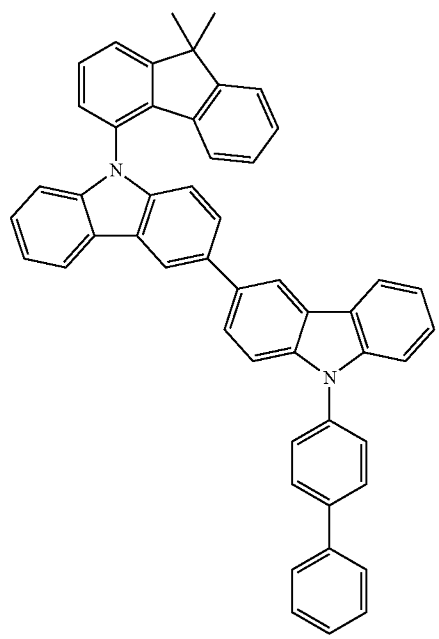
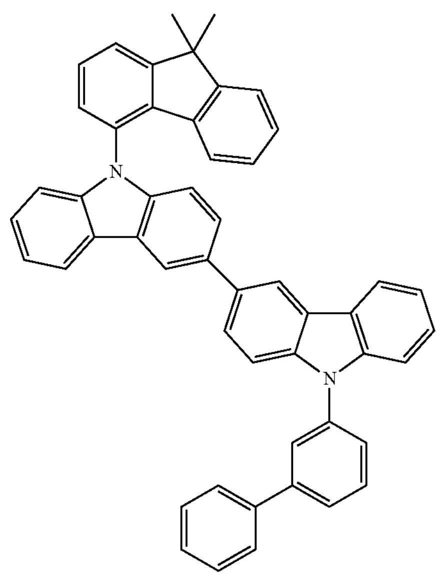
-continued
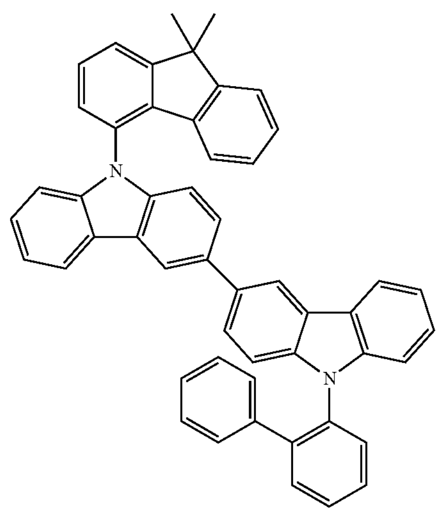
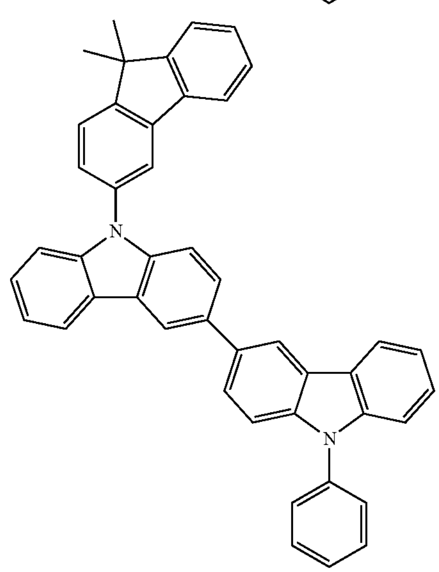
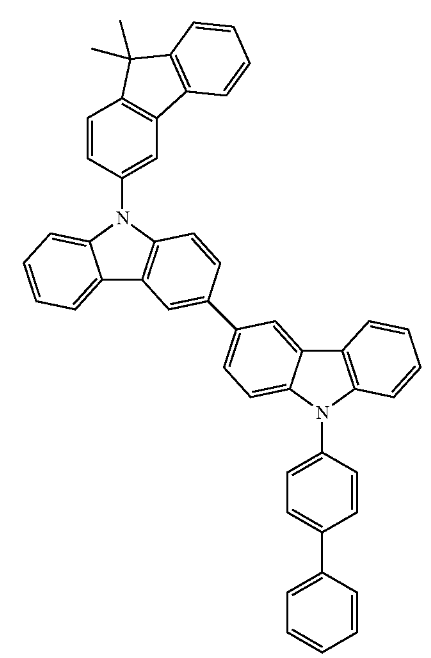

-continued
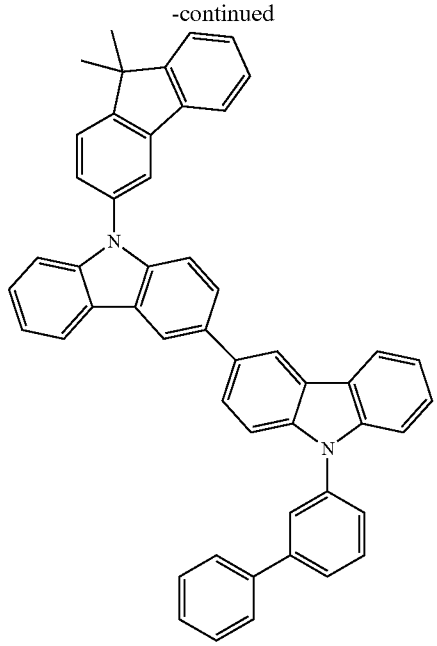
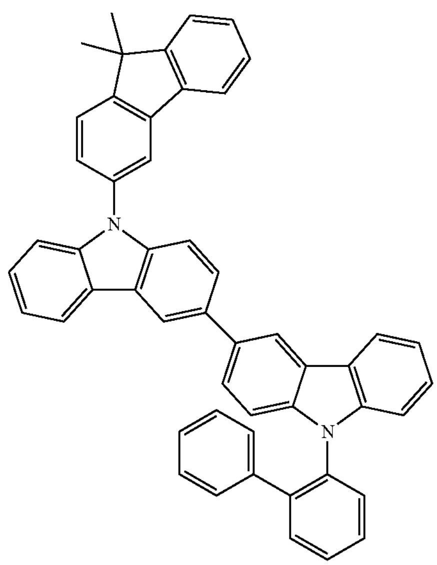
-continued
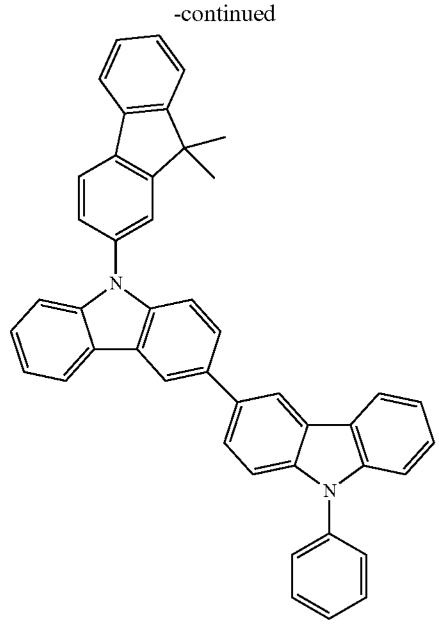
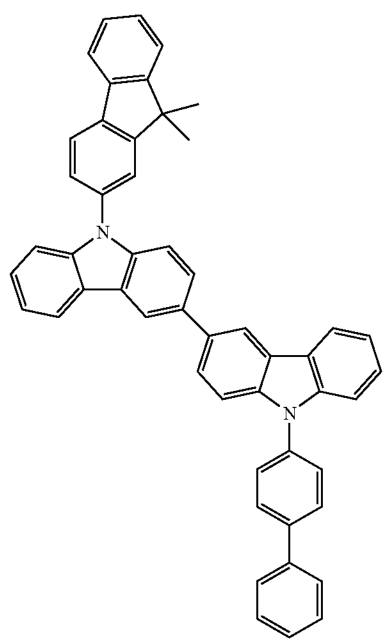

-continued
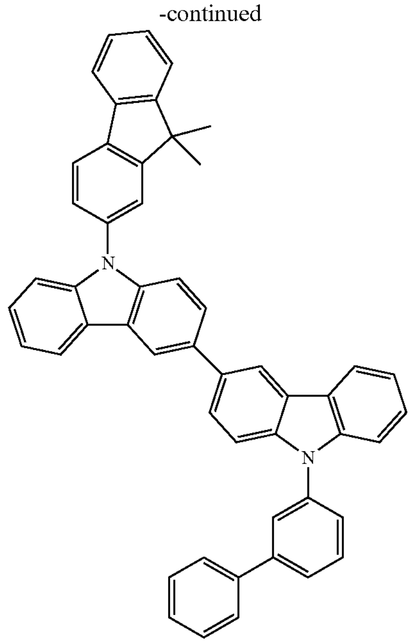
-continued
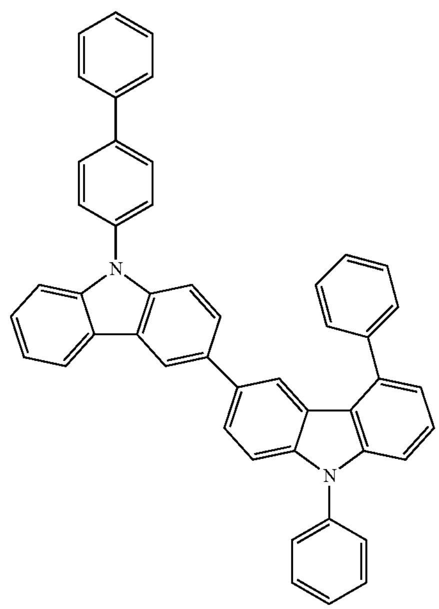
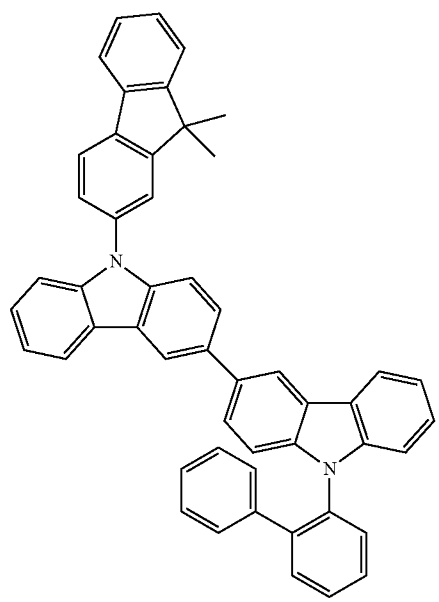
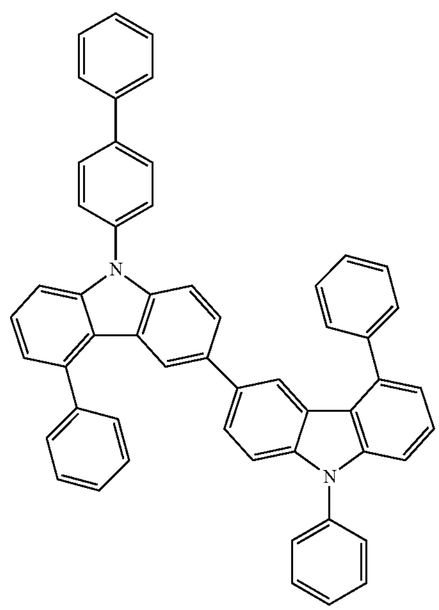

-continued
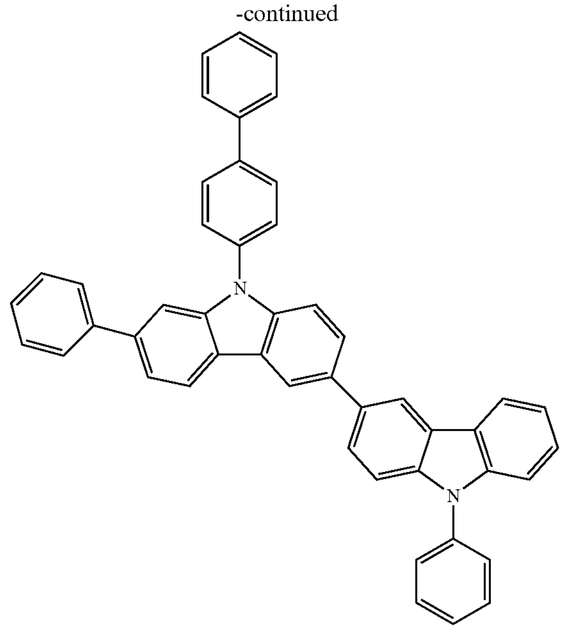
-continued
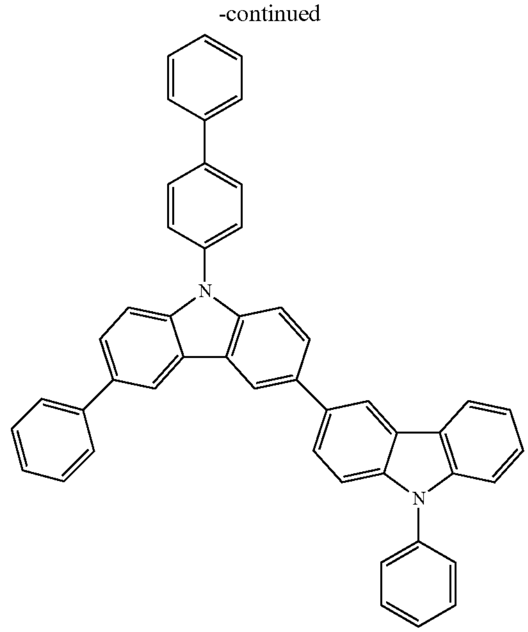
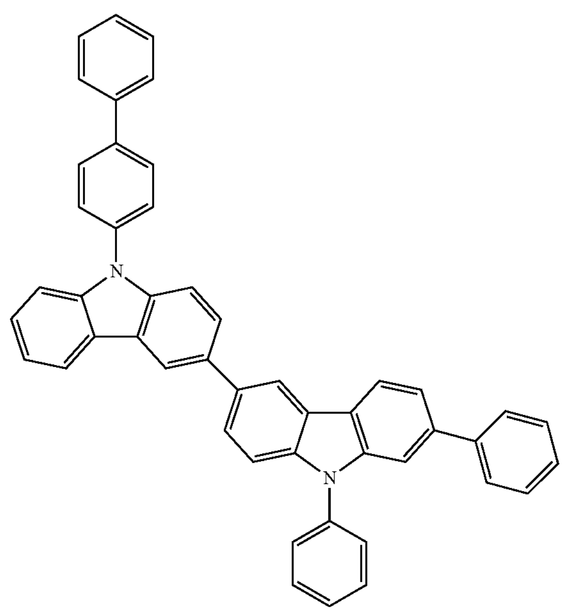
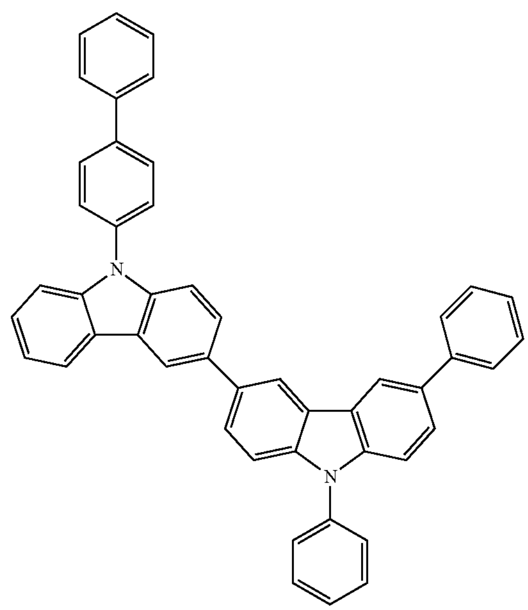

-continued
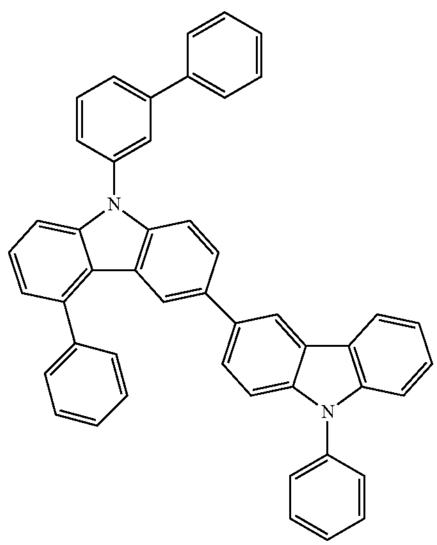
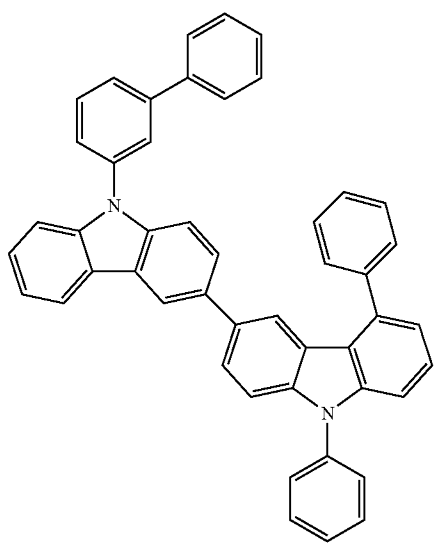
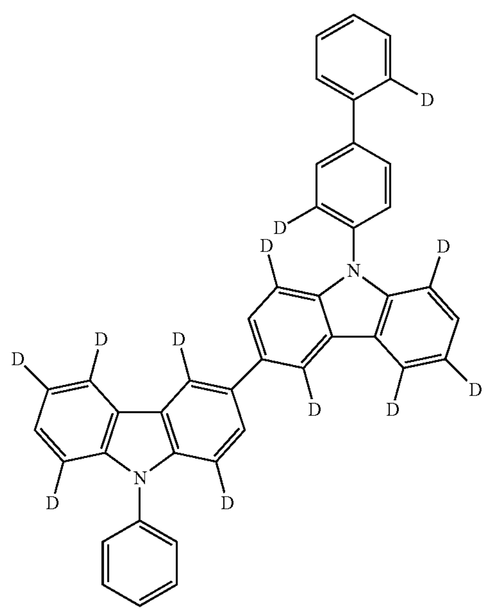
-continued
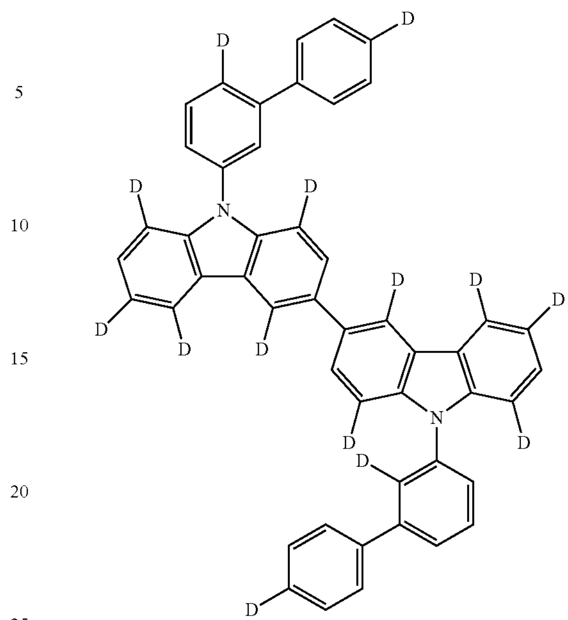
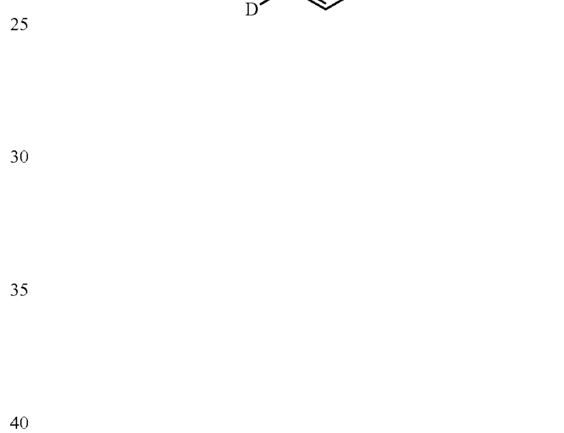
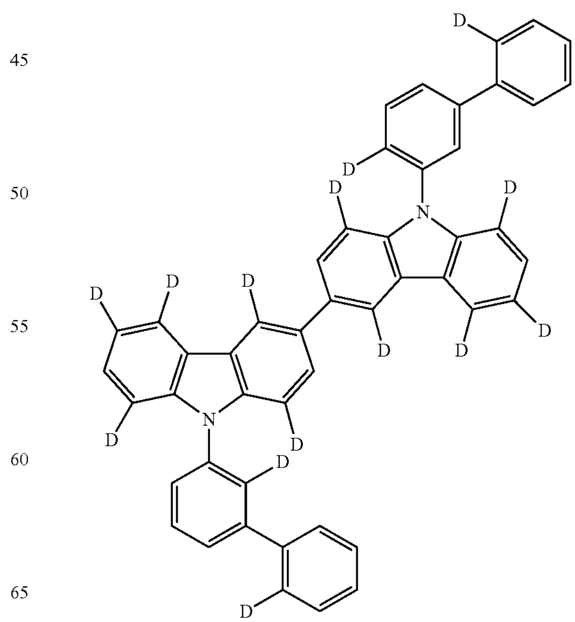

-continued
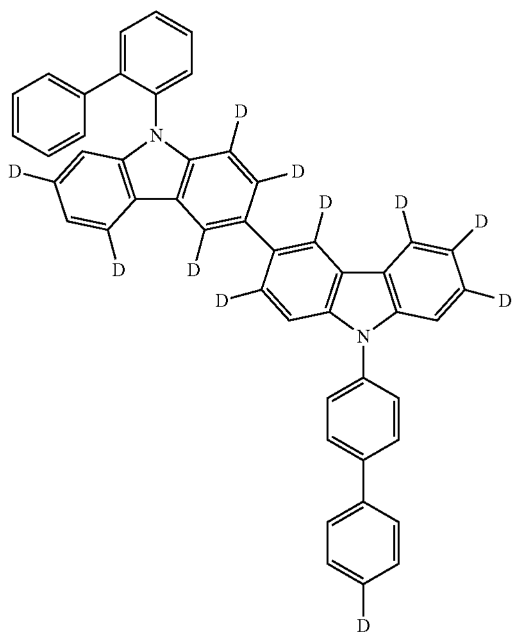
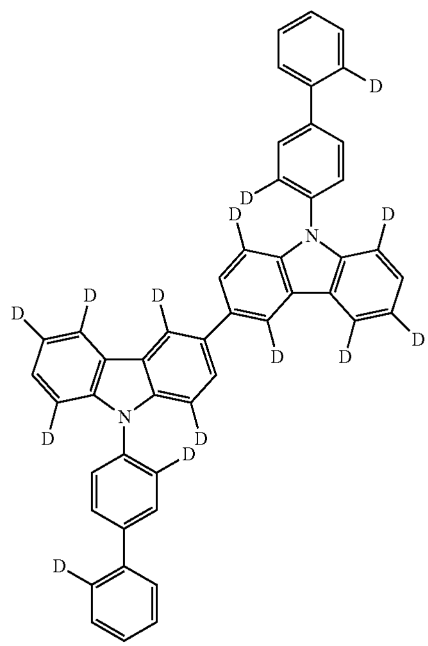
-continued
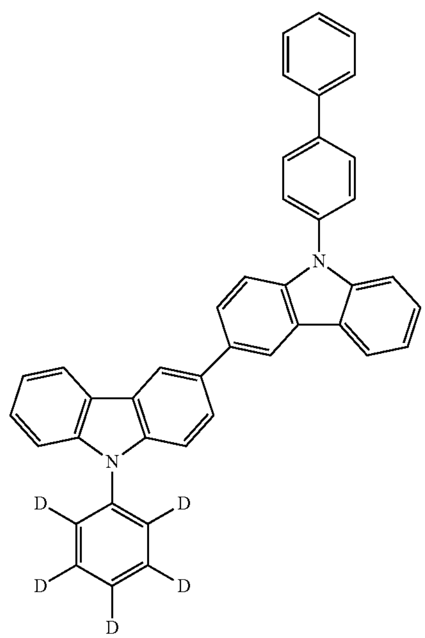
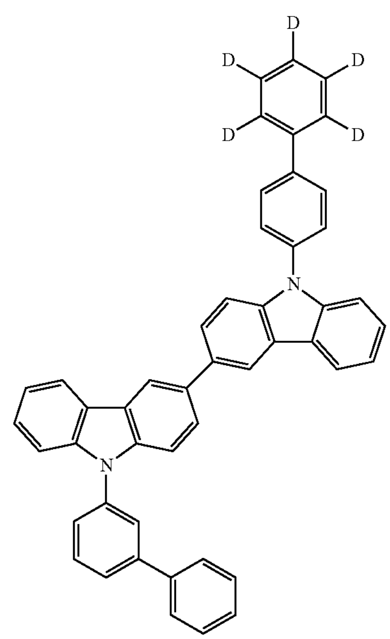

-continued

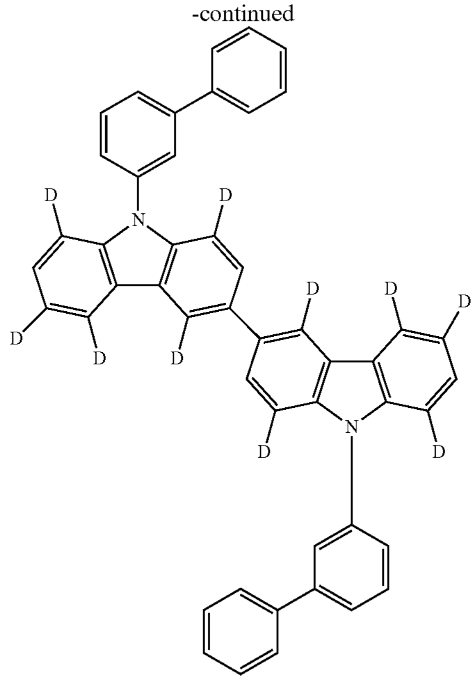

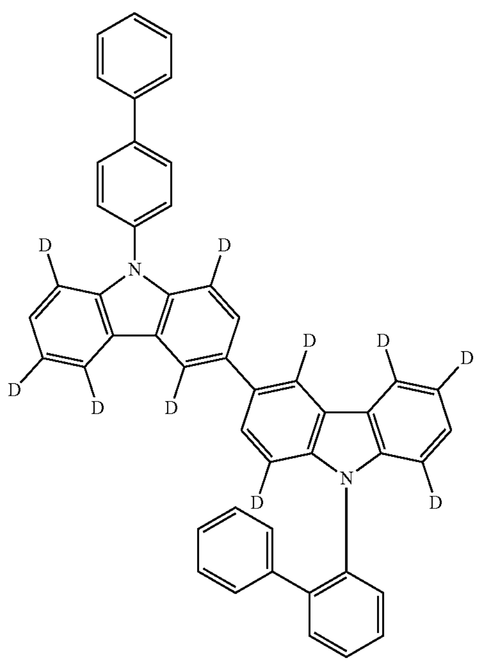

-continued

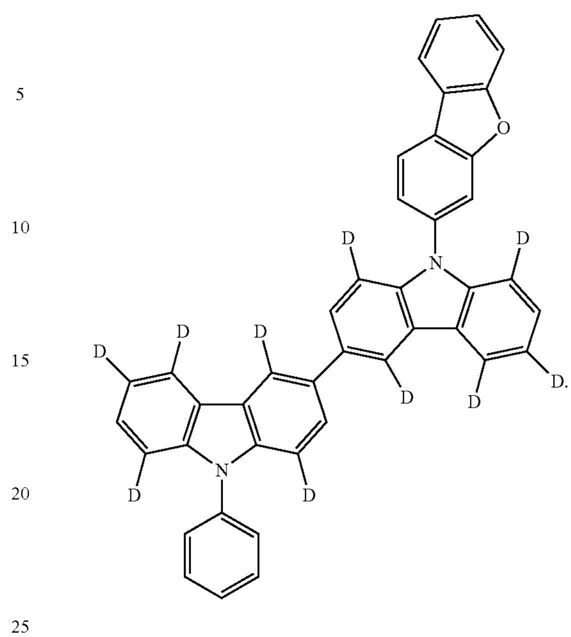

11. The organic light emitting device according to claim 1, wherein:

B is a benzene ring, a naphthalene ring, a phenanthrene ring, a triphenylene ring, a phenyl carbazole ring, a dimethylfluorene ring, a dibenzofuran ring, or a dibenzothiophene ring.

12. The organic light emitting device according to claim 1, wherein:

the Chemical Formula 3 is any one of the following Chemical Formula 3-1 to Chemical Formula 3-10:

3-1

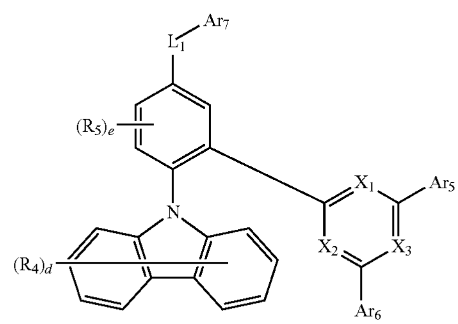

3-2

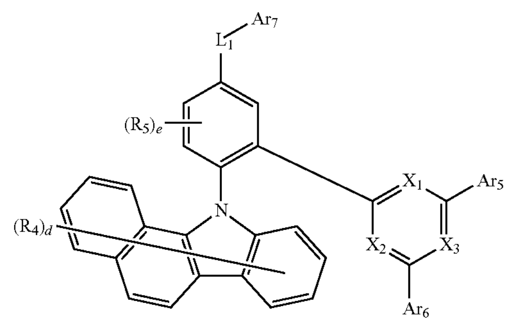

-continued
3-3
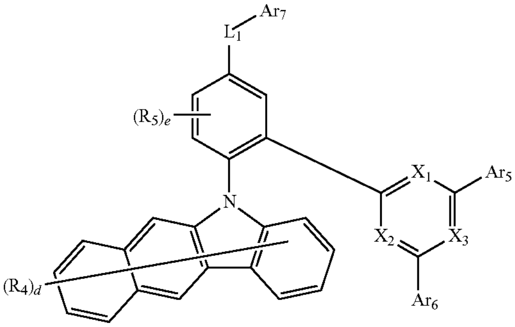
3-4
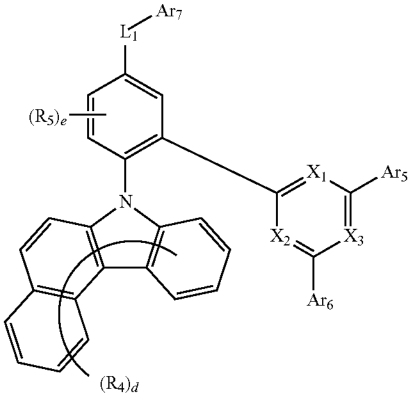
3-5
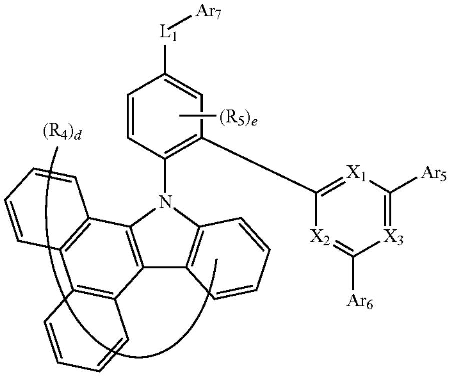
3-6
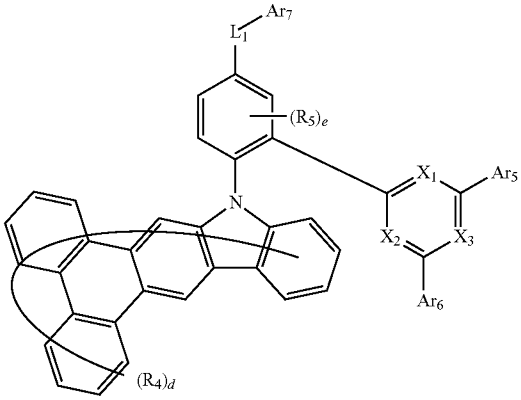
-continued
3-7
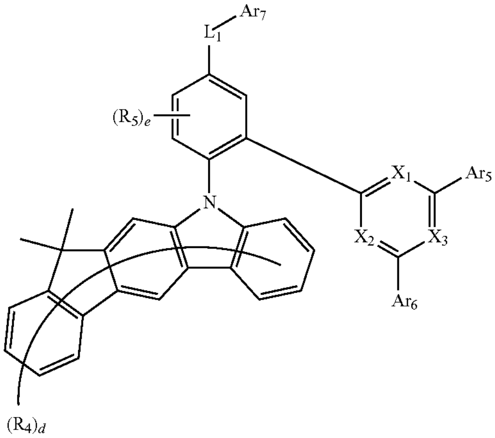
3-8
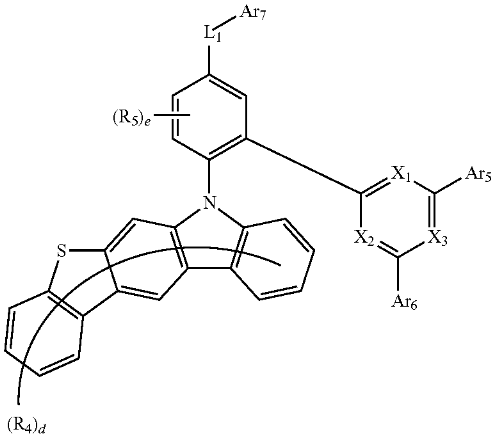
3-9
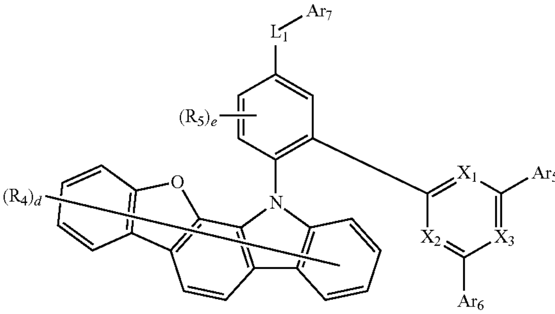

-continued 3-10

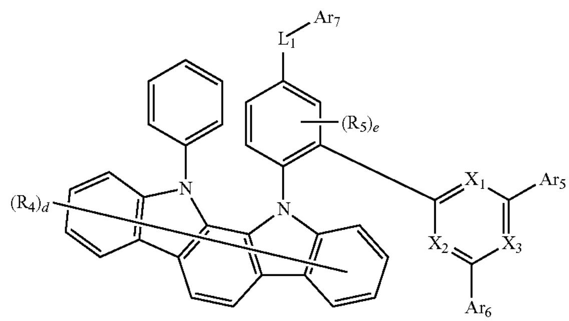

wherein in Chemical Formulas 3-1 to 3-10:

$X_1$ to $X_3$, $Ar_5$, $Ar_6$, $Ar_7$, $L_1$, $R_4$, $R_5$, d and e are as defined in claim 1.

13. The organic light emitting device according to claim 1, wherein:

$Ar_5$ and $Ar_6$ are each independently phenyl, phenyl substituted with 5 deuteriums, naphthyl, phenanthrenyl, triphenylenyl, dimethylfluorenyl, carbazolyl, carbazolyl substituted with 8 deuteriums, dibenzofuranyl, dibenzothiophenyl, or

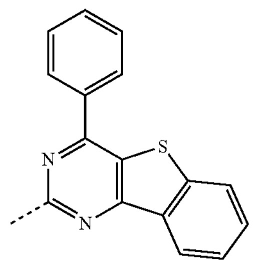

14. The organic light emitting device according to claim 1, wherein:

$Ar'_1$ and $Ar'_2$ are each independently phenyl, biphenylyl, naphthyl, phenanthrenyl, triphenylenyl, phenyl substituted with 5 deuteriums, phenyl substituted with one cyano, phenyl substituted with one trifluoromethyl, benzothiophenyl, dibenzofuranyl, or dibenzothiophenyl.

15. The organic light emitting device according to claim 1, wherein:

$R'_1$ to $R'_7$ are each independently hydrogen, deuterium, or phenyl.

16. The organic light emitting device according to claim 1, wherein:

$L_1$ is a single bond, phenylene, naphthyldiyl, dibenzofuranyldiyl, or dibenzothiophenyldiyl.

17. The organic light emitting device according to claim 1, wherein:

$R_4$ and $R_5$ are each independently hydrogen, deuterium, phenyl, naphthyl, carbazolyl, benzothiophenyl, dibenzofuranyl, dibenzothiophenyl, phenyl substituted with 4 deuteriums, or phenyl substituted with 5 deuteriums.

18. The organic light emitting device according to claim 1, wherein:

the compound of Chemical Formula 3 is any one compound selected from the group consisting of the following compounds:

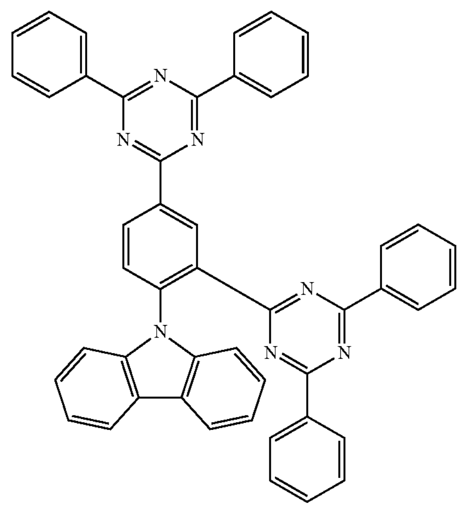

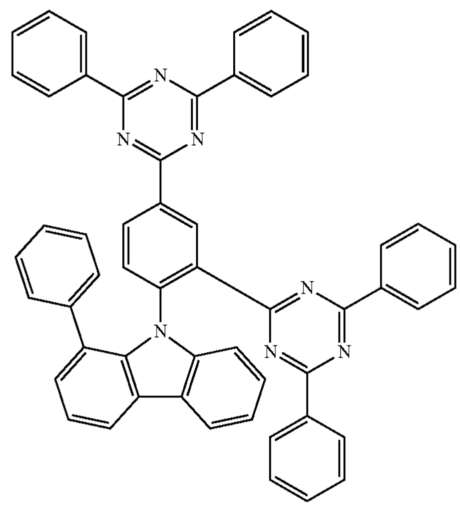

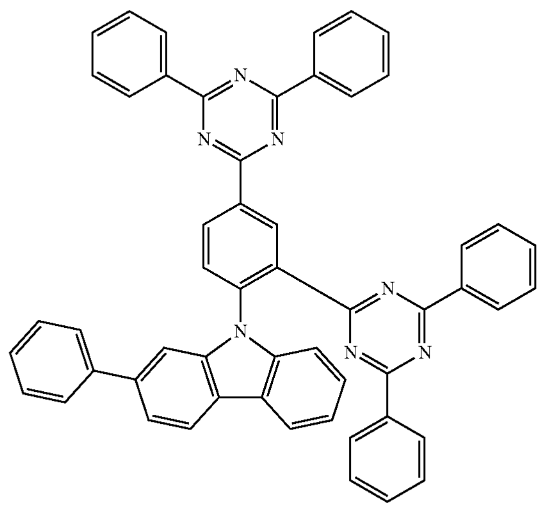

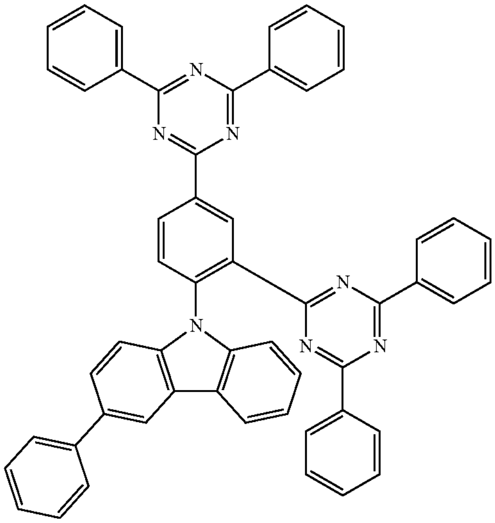
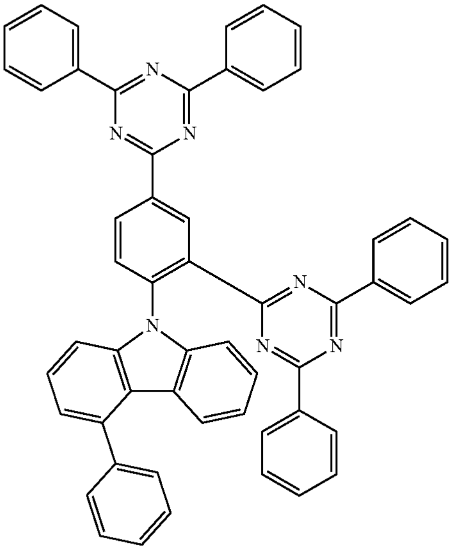
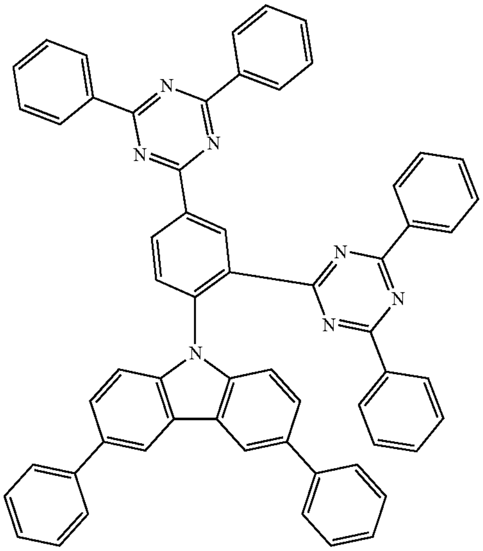
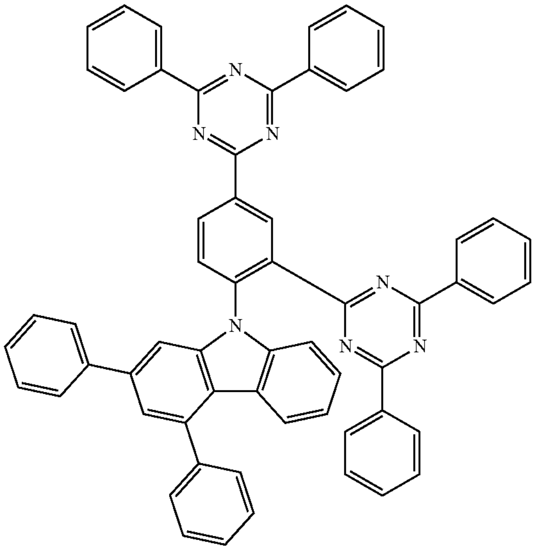
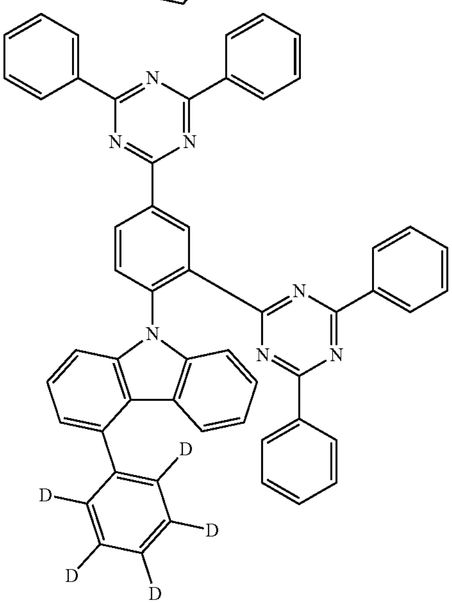
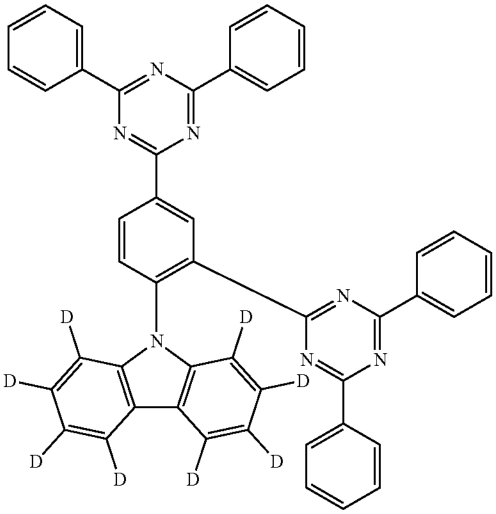

-continued
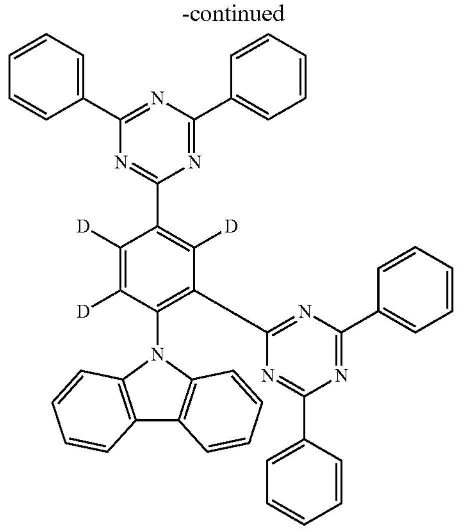
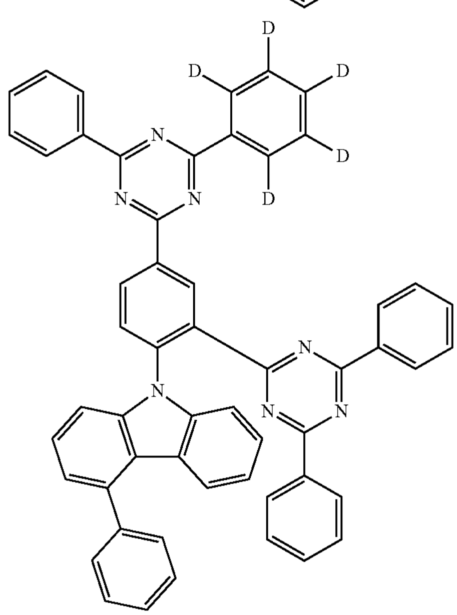
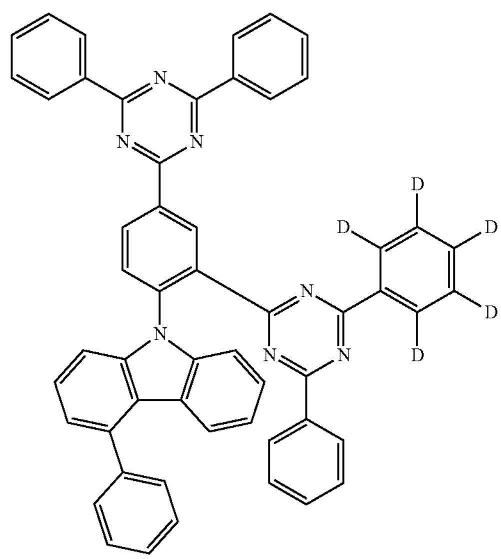
-continued
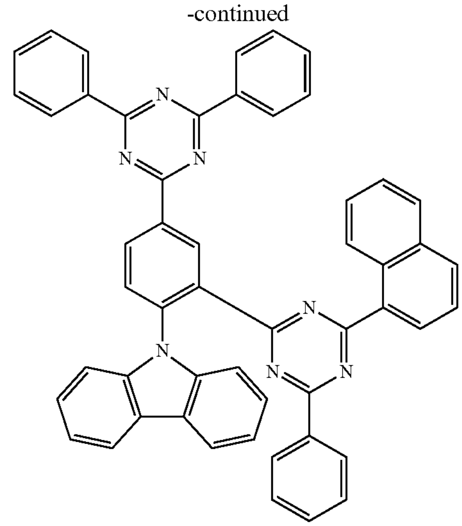
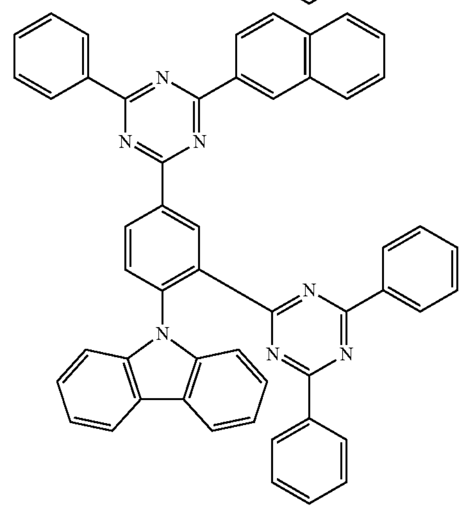
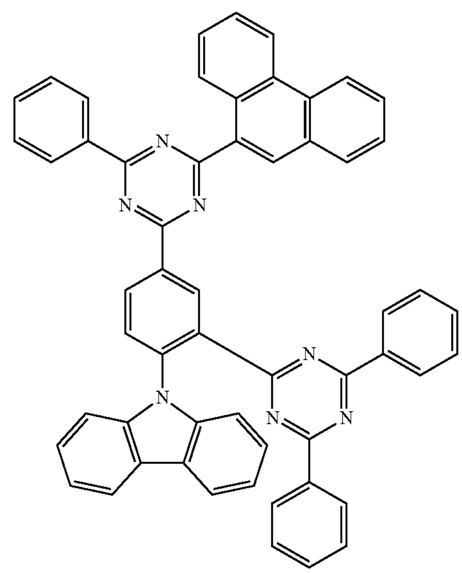

-continued
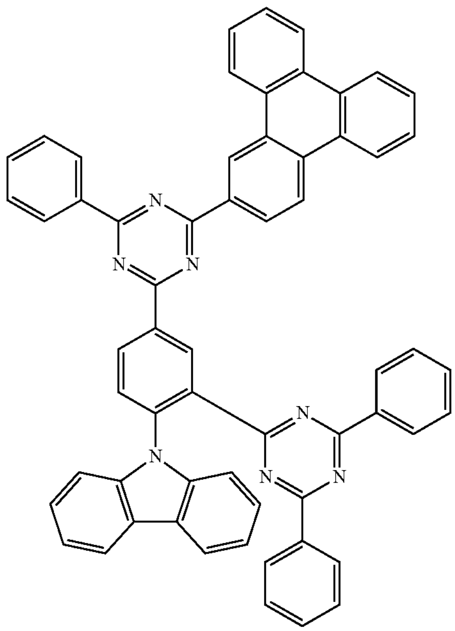
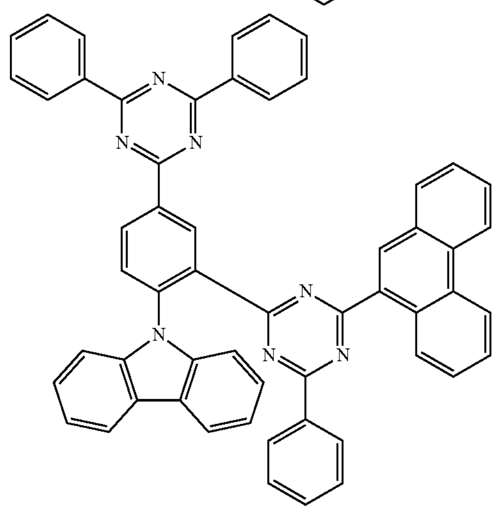
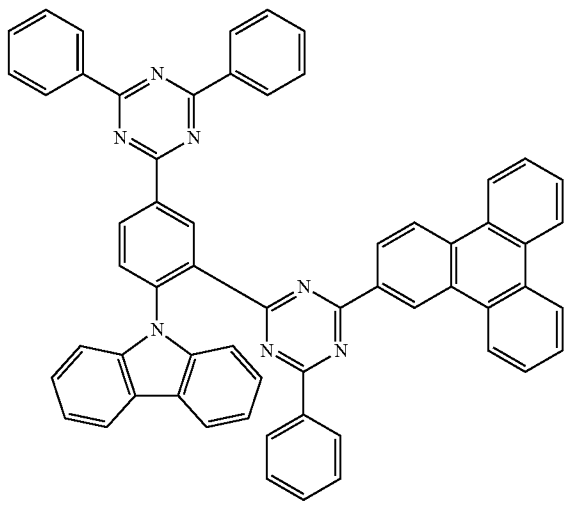
-continued
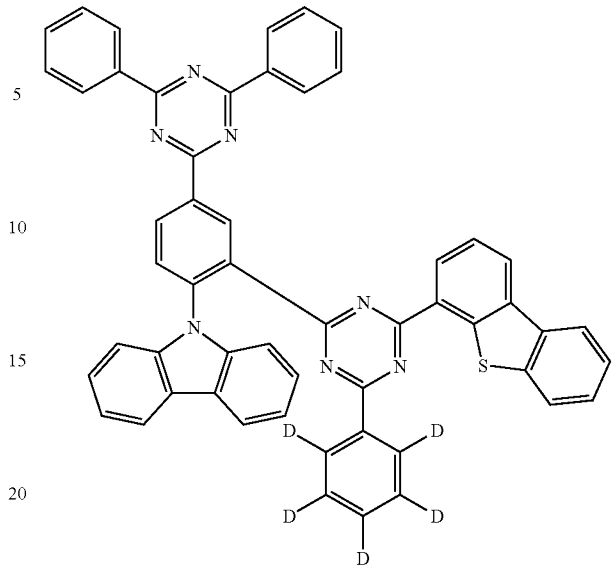
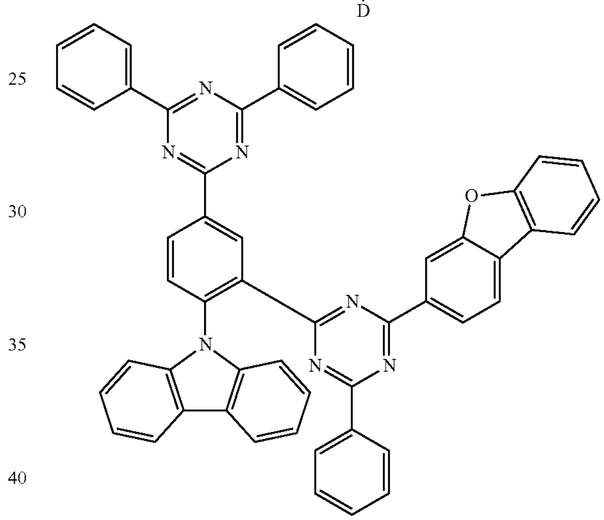
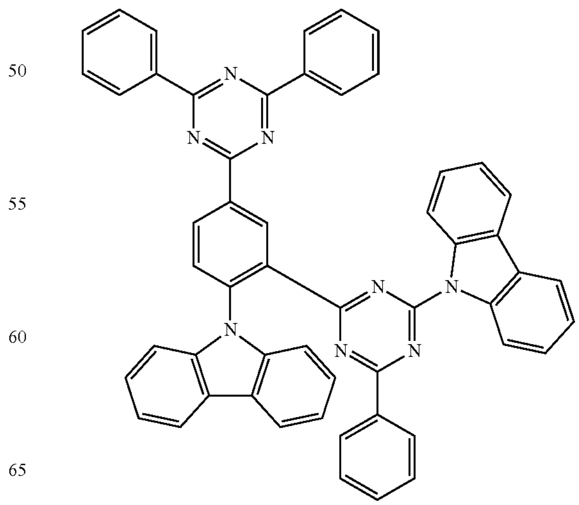

-continued
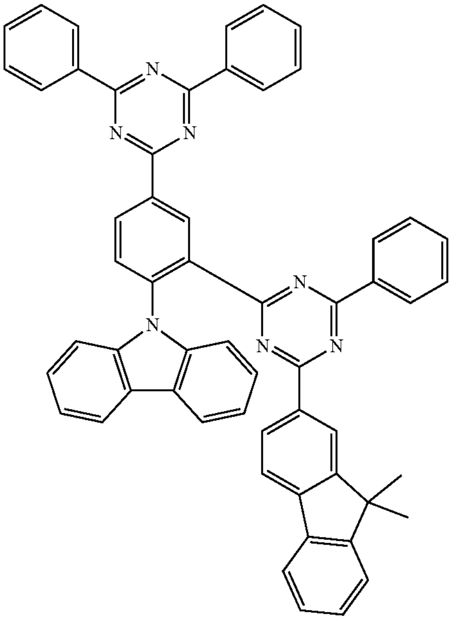
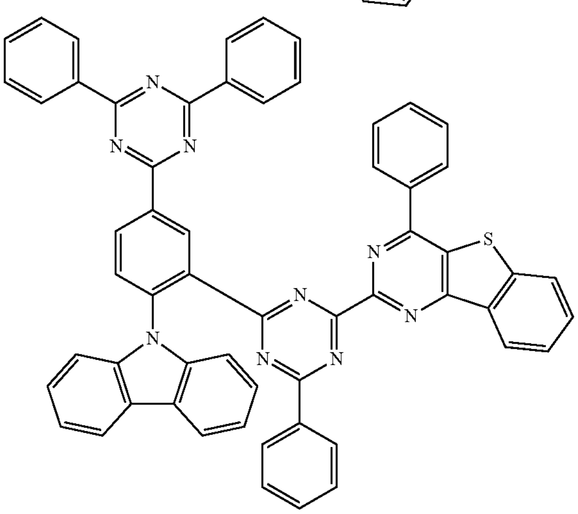
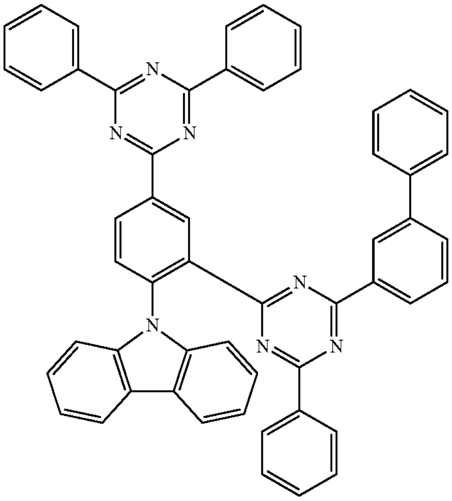
-continued
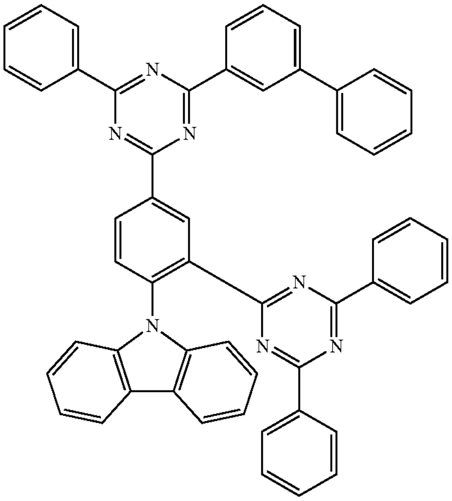
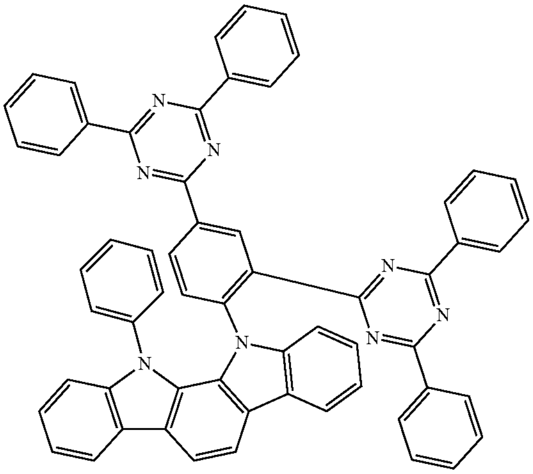
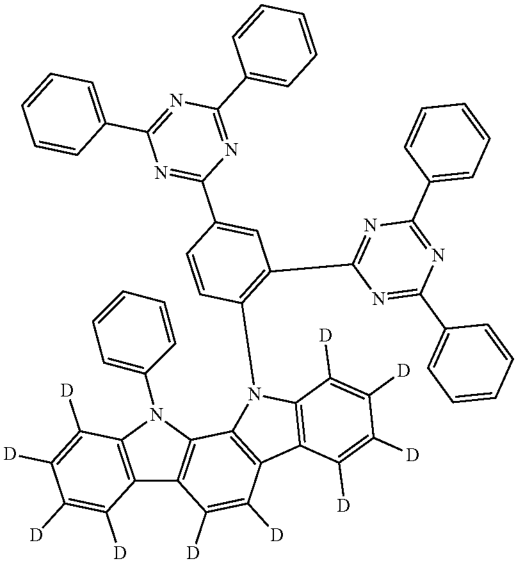

-continued
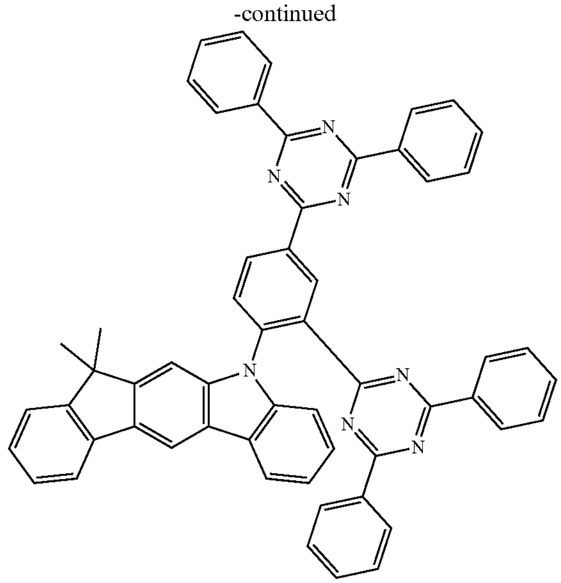
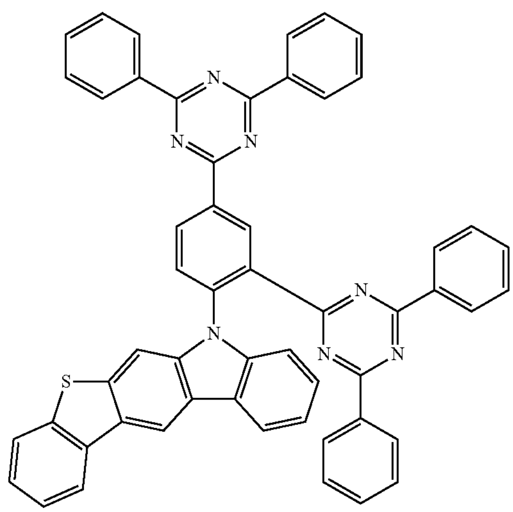
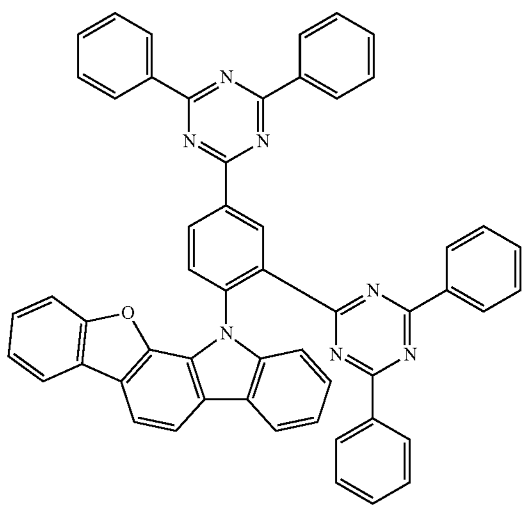
-continued
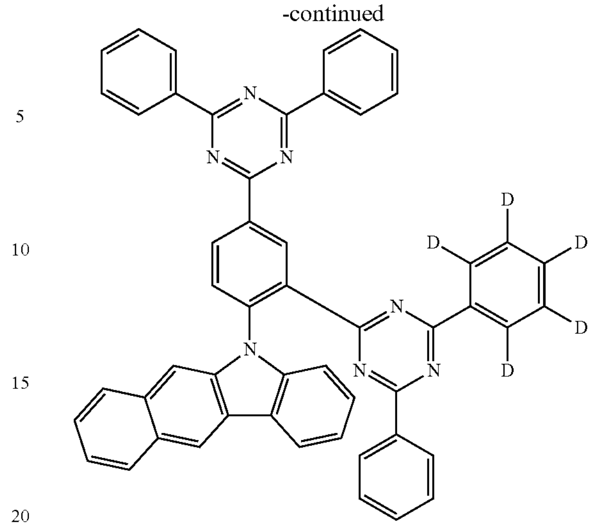
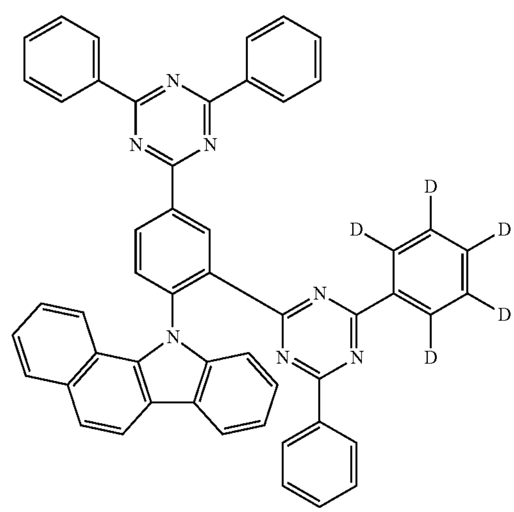
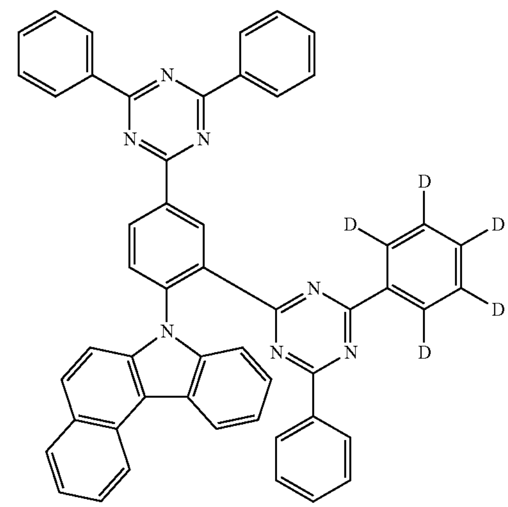

-continued
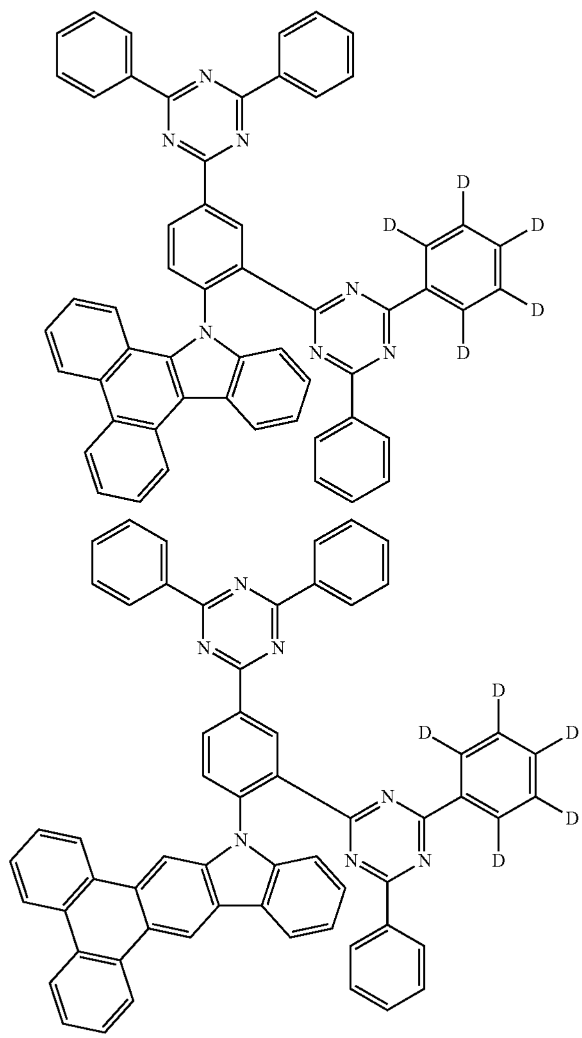
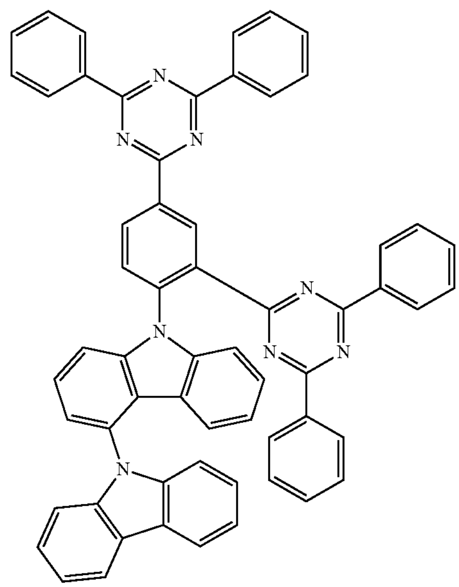
-continued
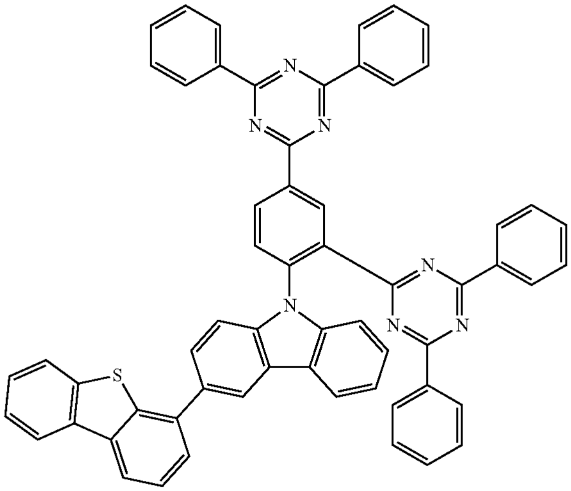
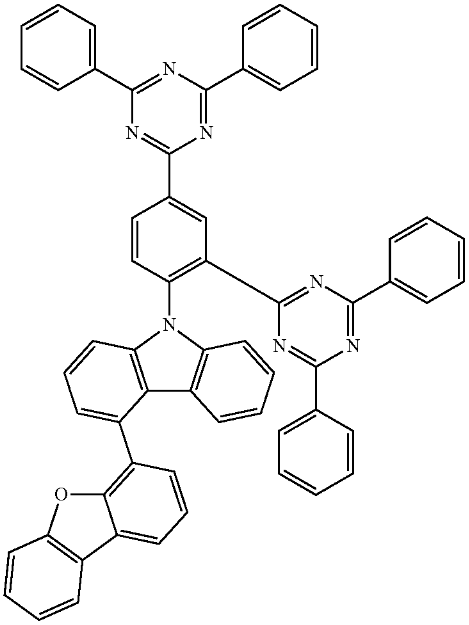
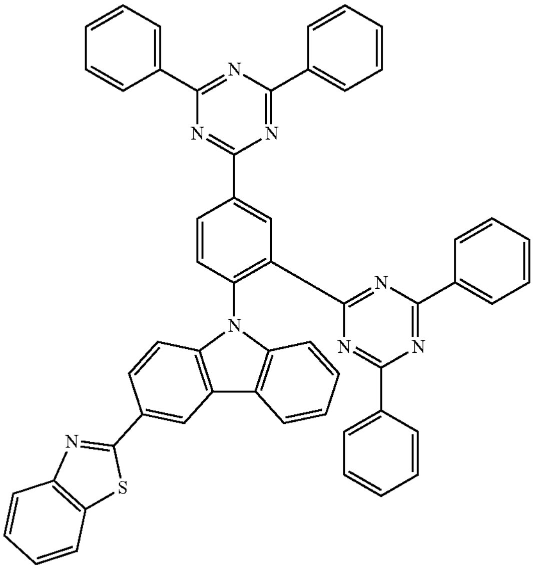

-continued
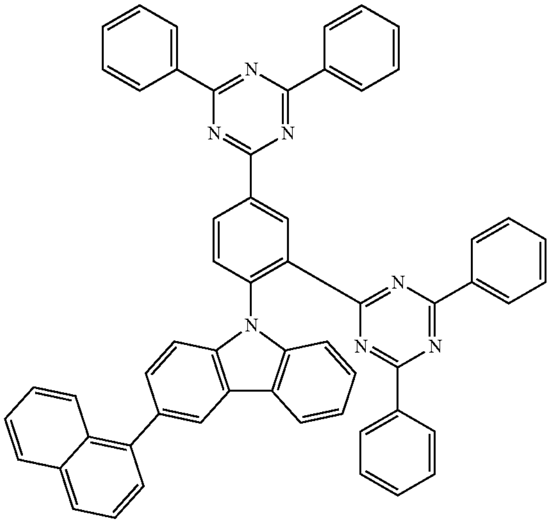
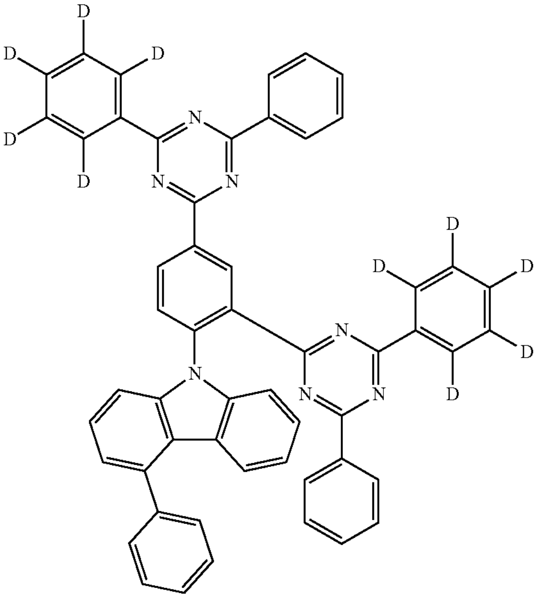
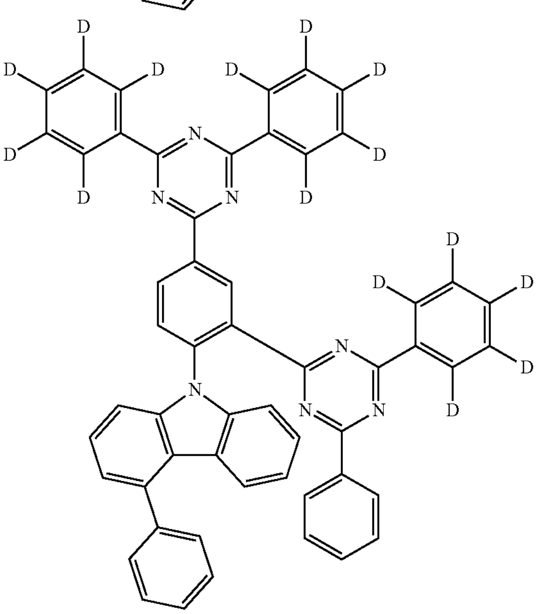
-continued
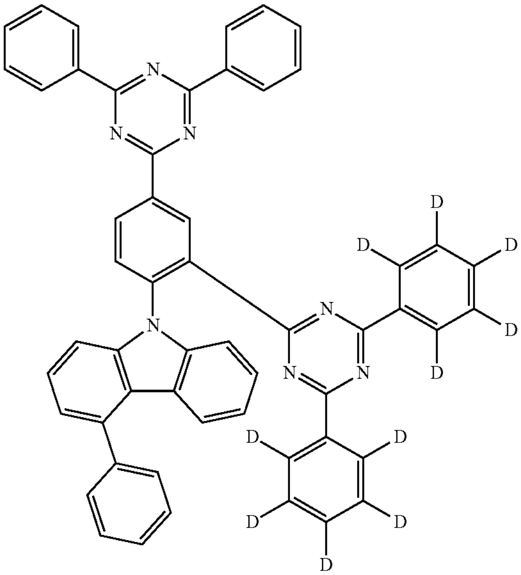
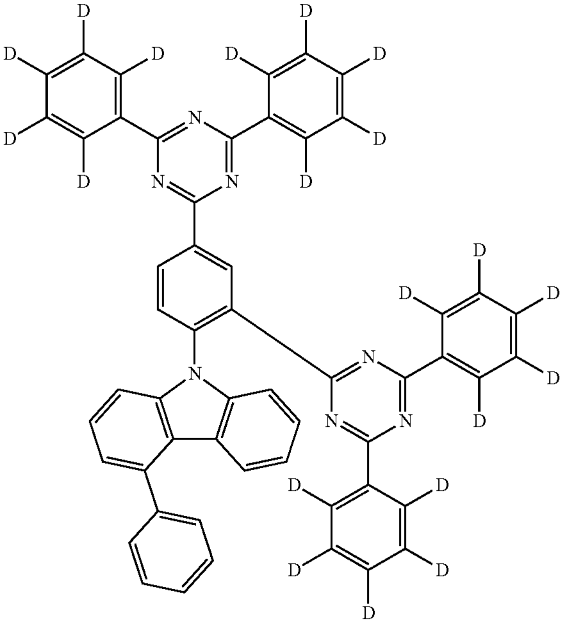

-continued
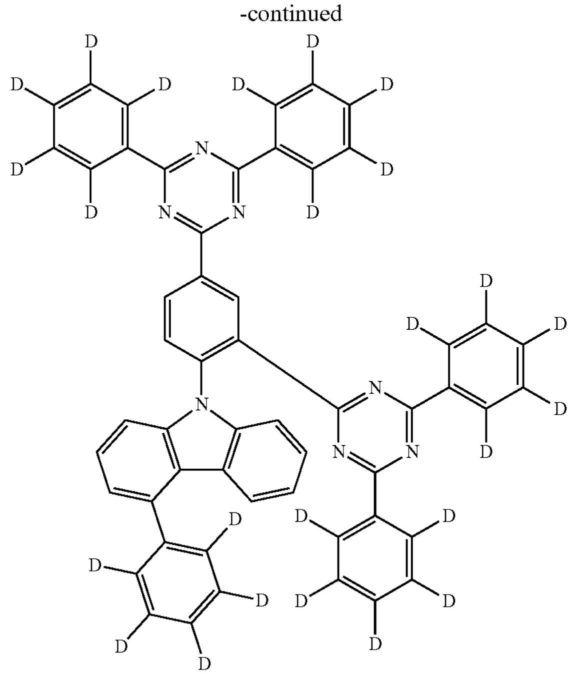
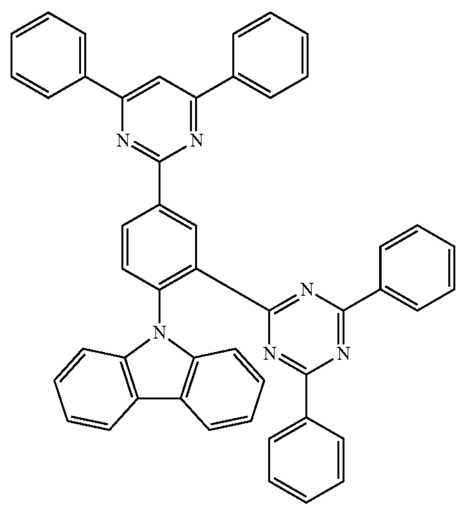
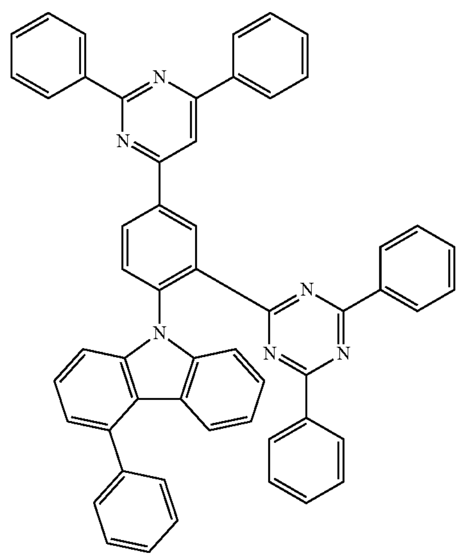
-continued
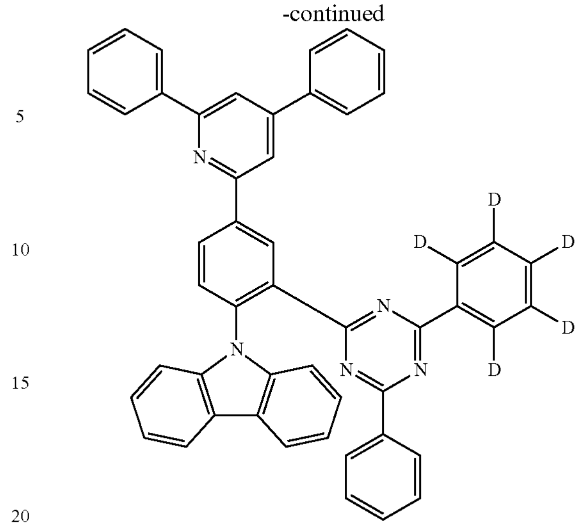
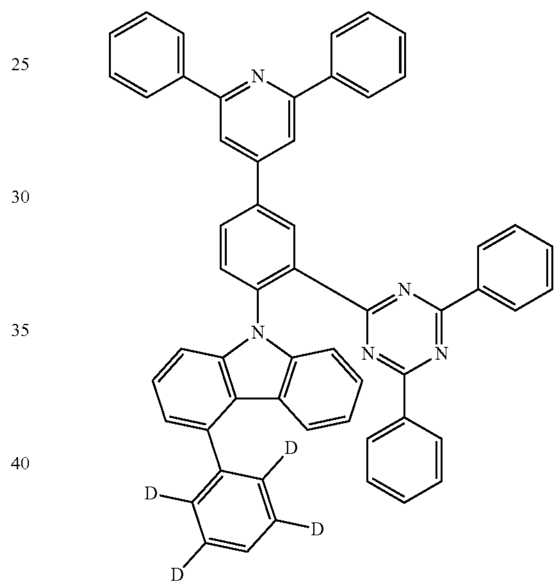
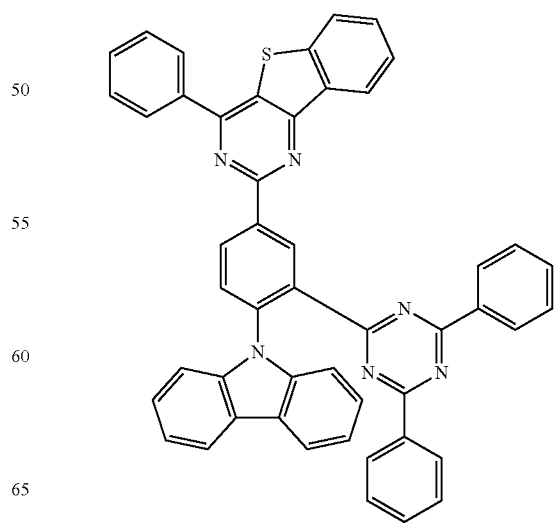

-continued
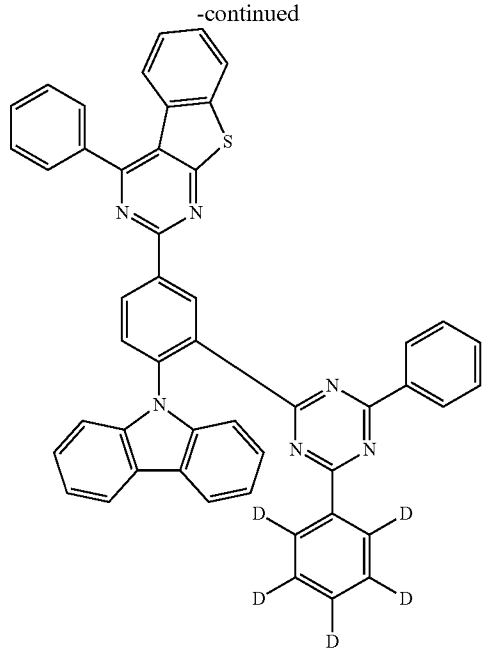
-continued
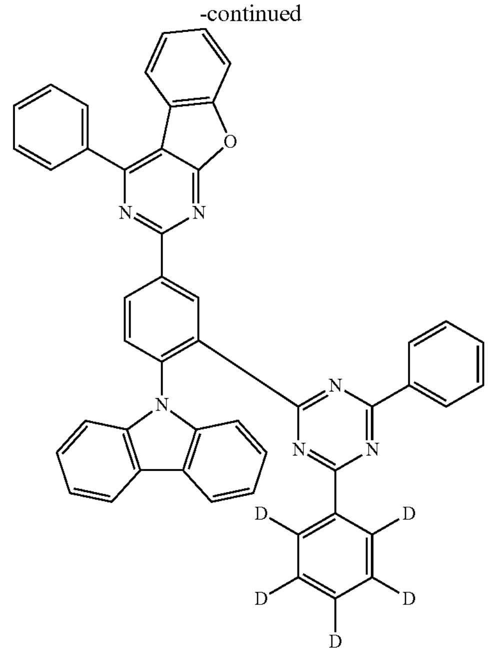
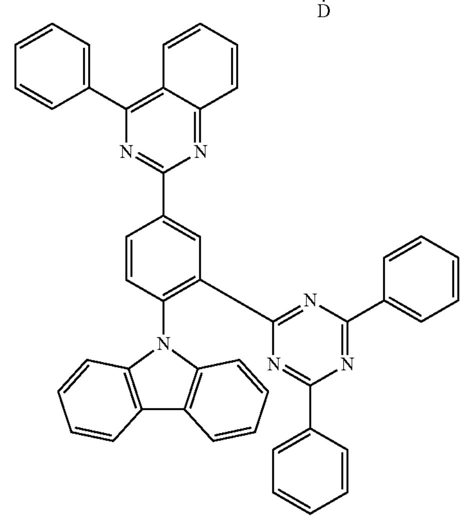
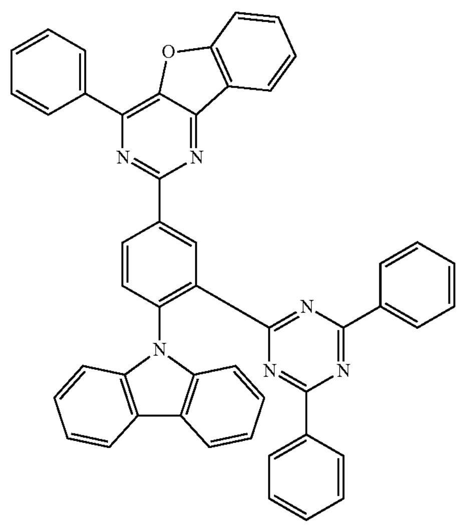
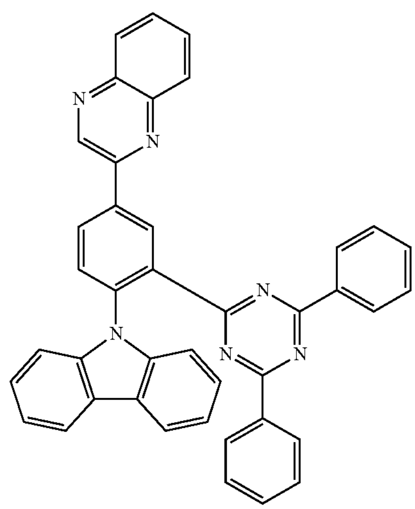

-continued
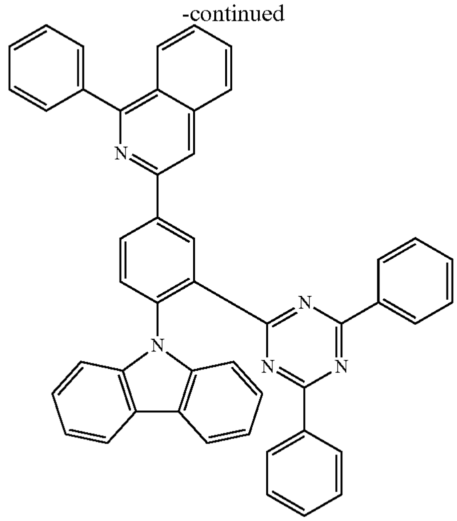
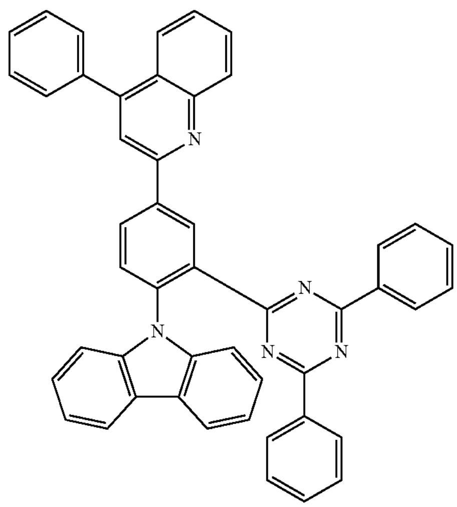
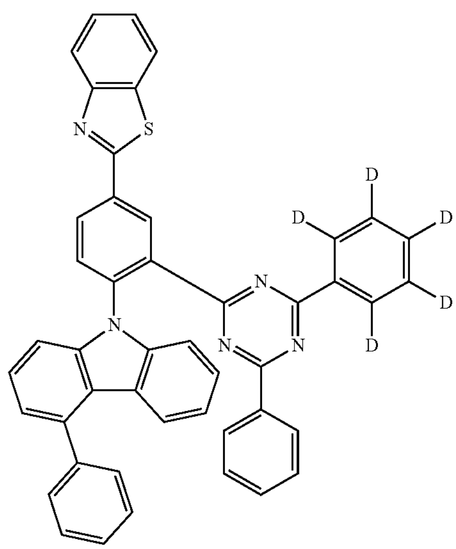
-continued
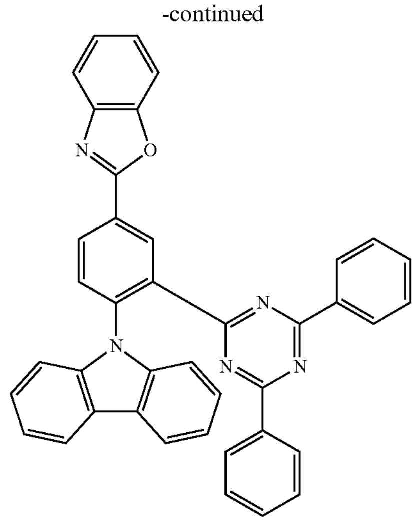
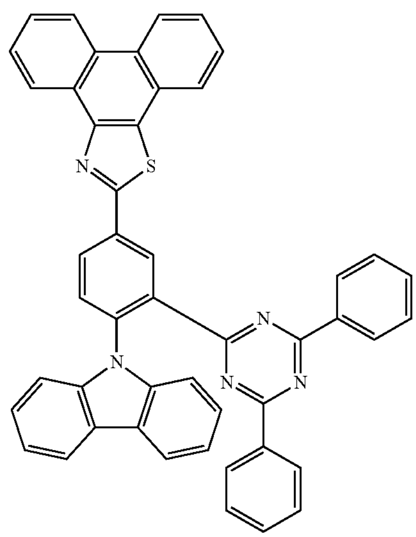
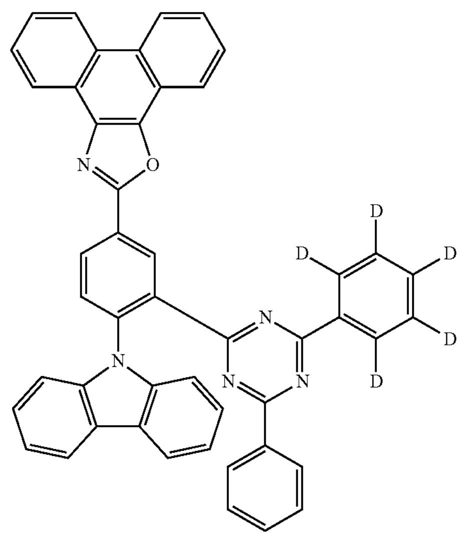

-continued
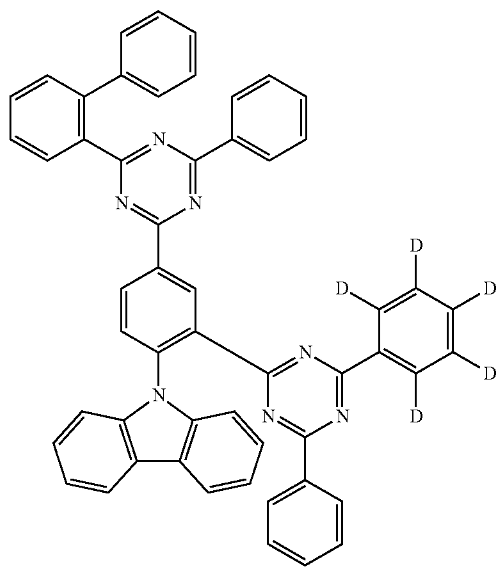
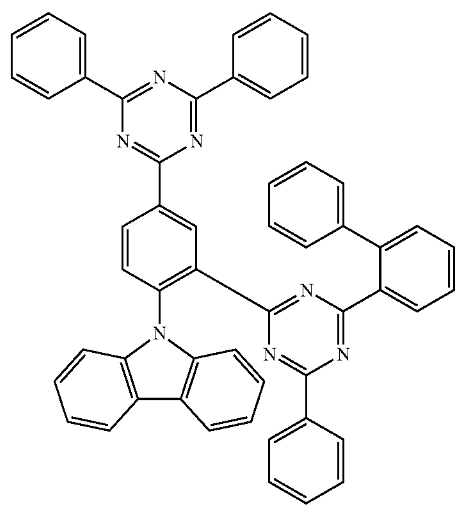
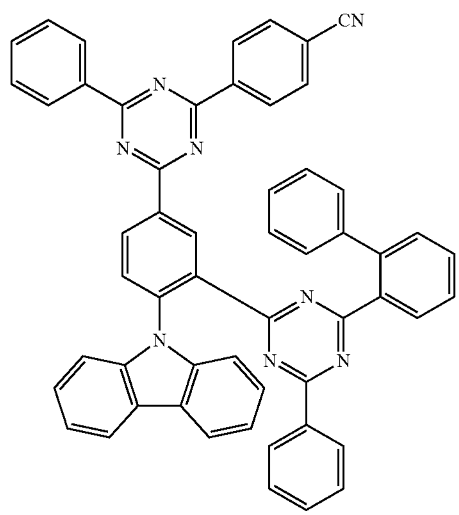
-continued
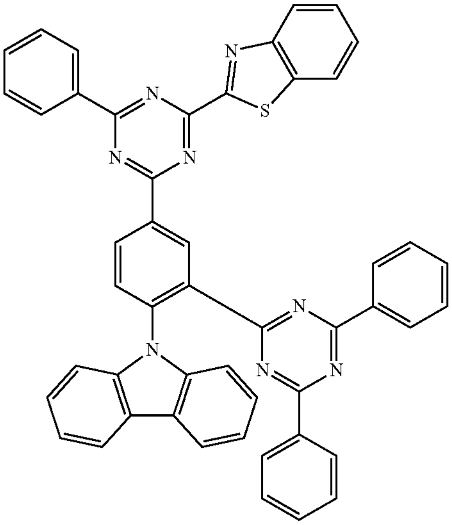
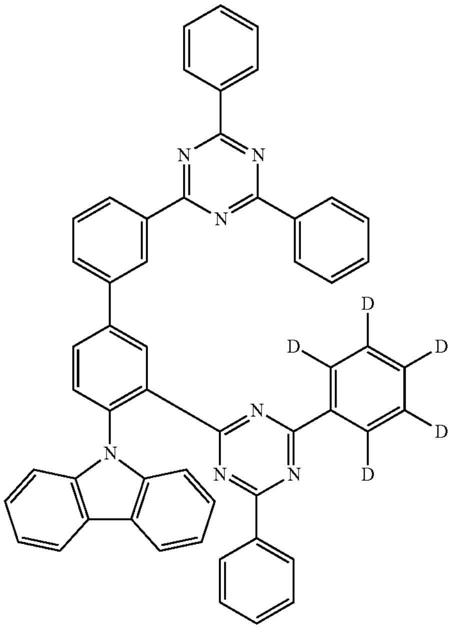
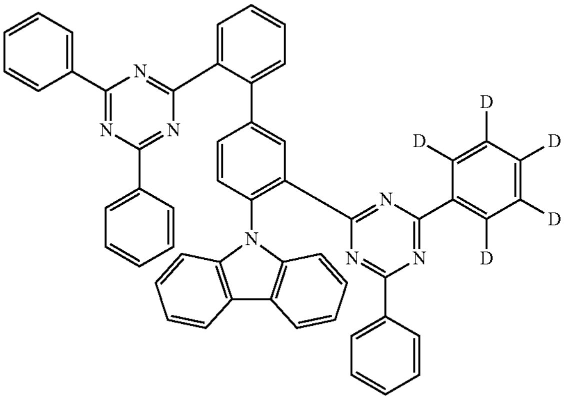

-continued
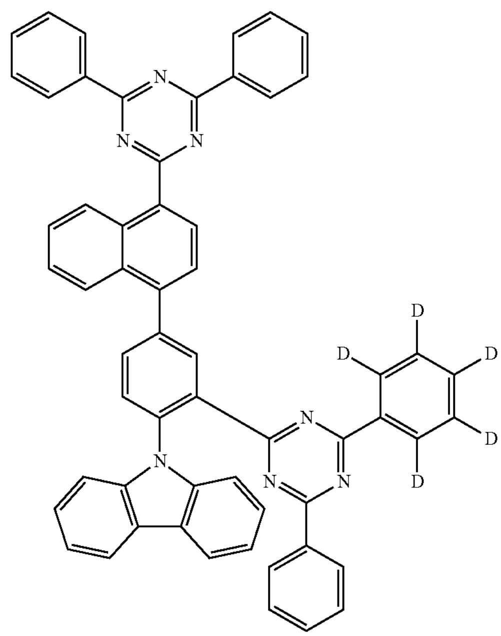
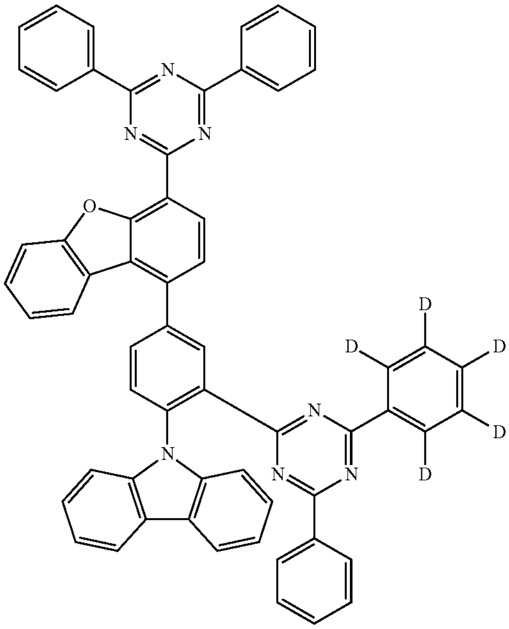
-continued
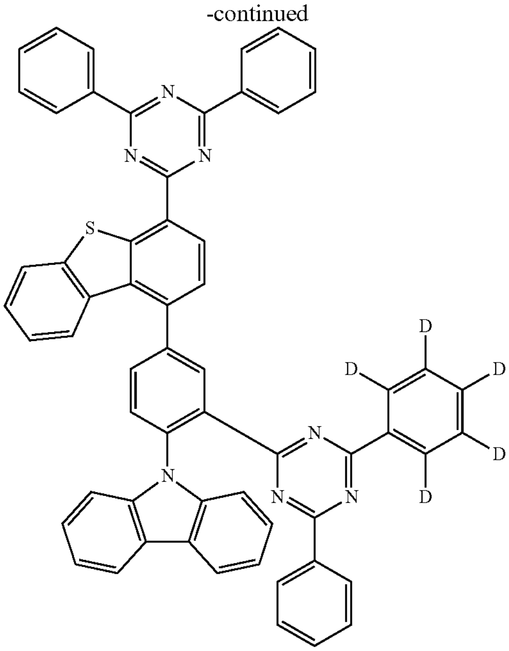
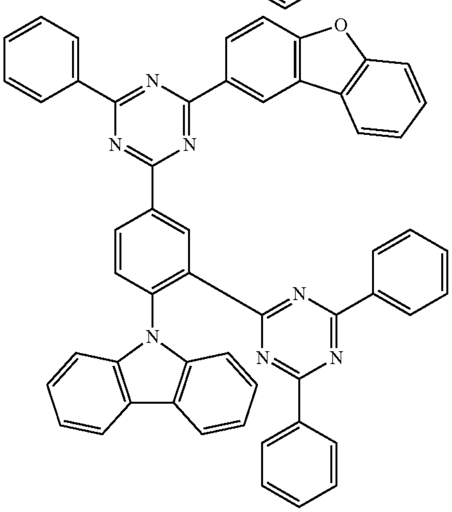
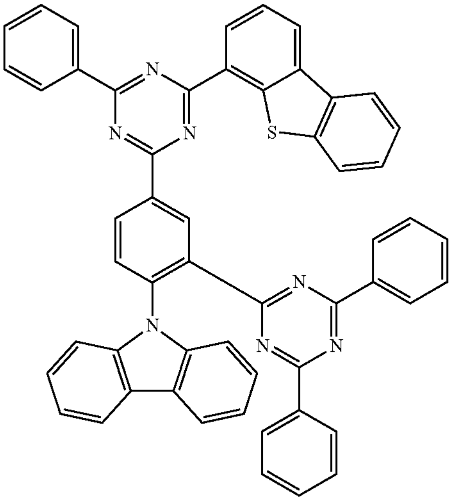

-continued
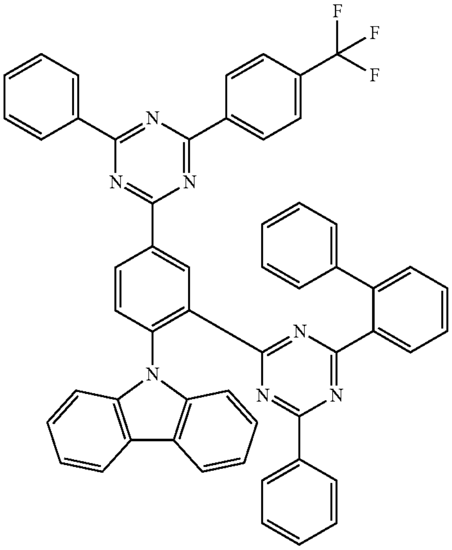
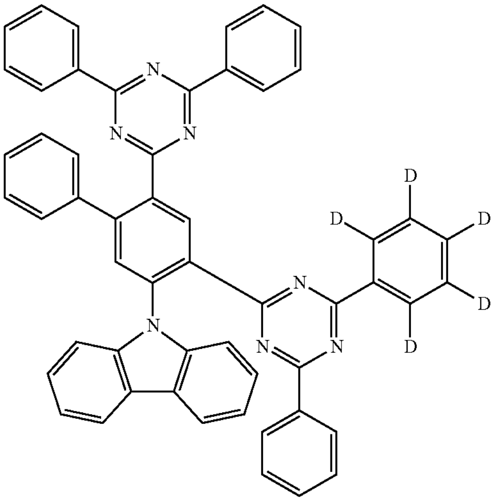
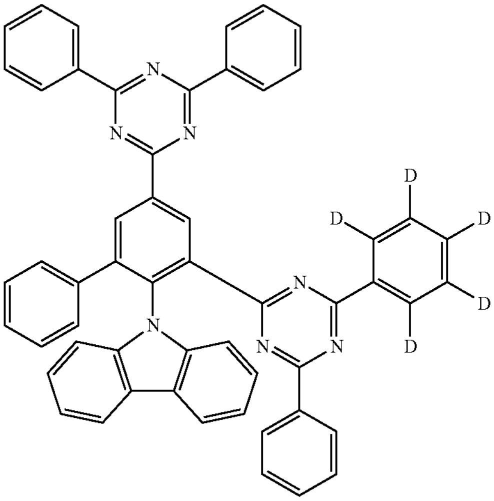
-continued
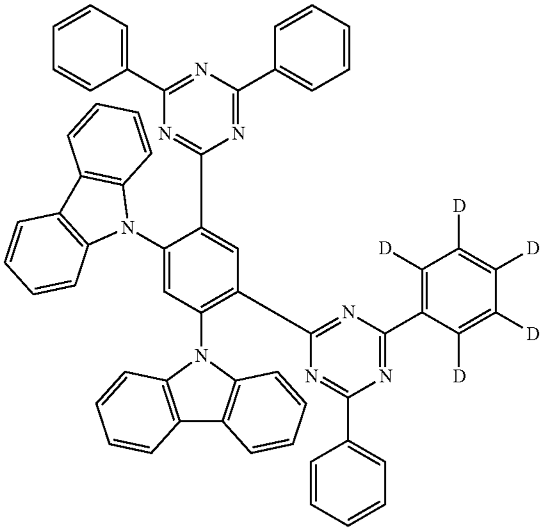
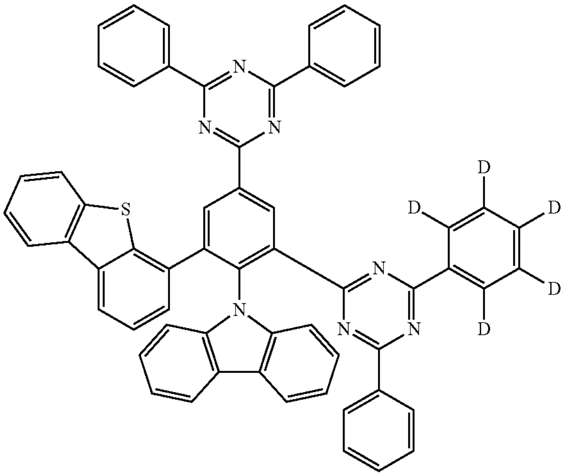
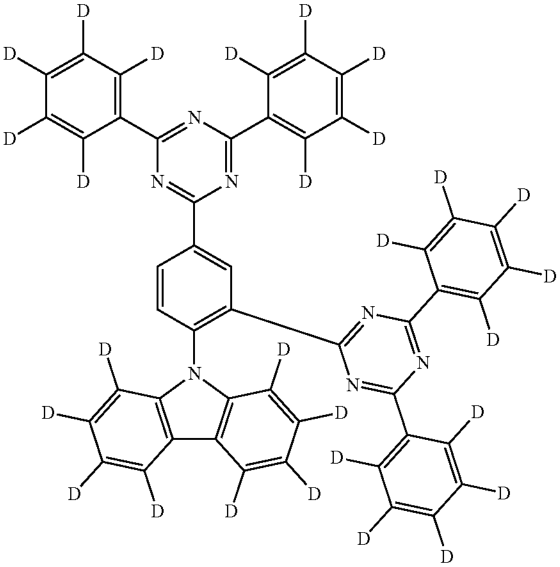

-continued
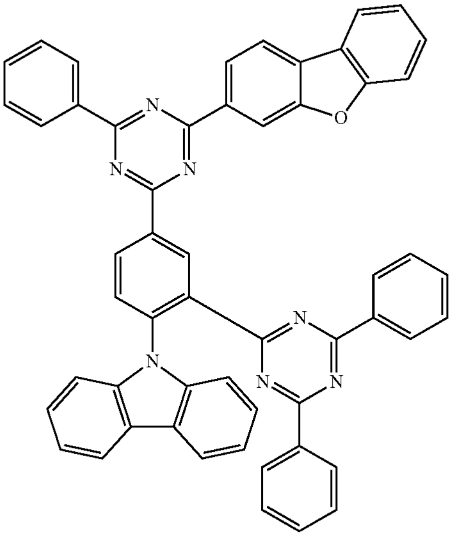
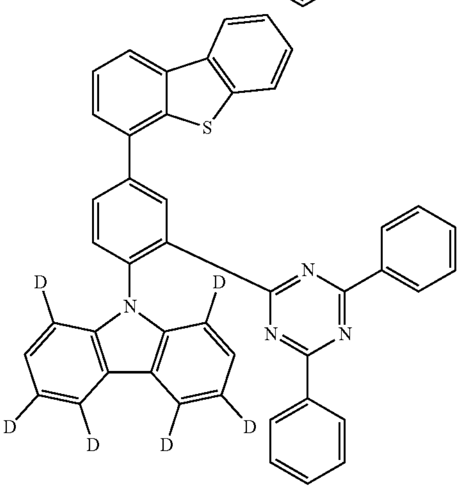
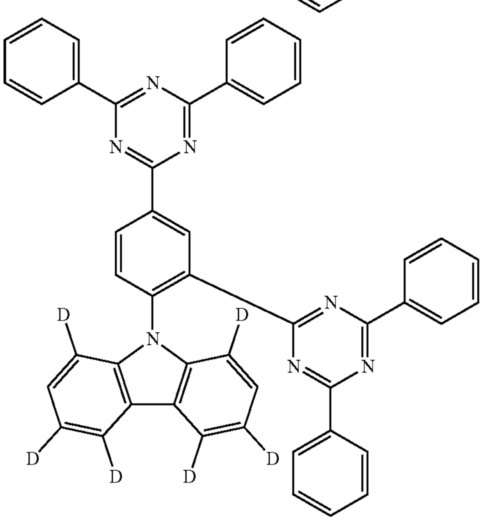
-continued
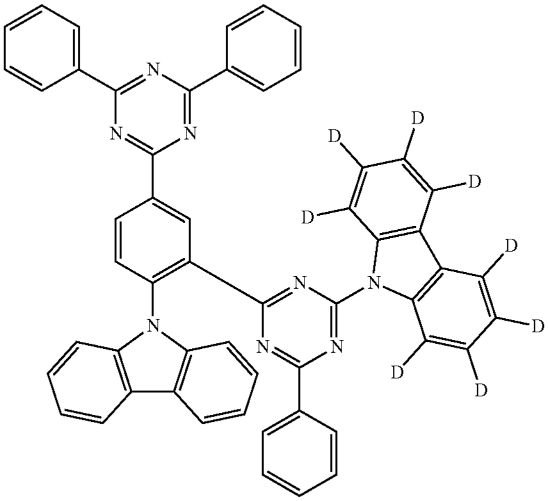
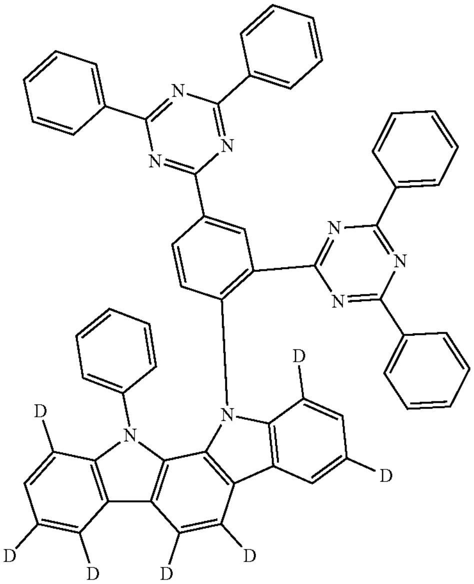
* * * * *